US012286450B2

(12) United States Patent
Kim et al.

(10) Patent No.: US 12,286,450 B2
(45) **Date of Patent: *Apr. 29, 2025**

(54) ORGANIC ELECTROLUMINESCENT ELEMENT

(71) Applicant: MATERIAL SCIENCE CO., LTD., Seoul (KR)

(72) Inventors: Sung Hoon Kim, Gwangmyeong-si (KR); Jae Ho Jeong, Incheon (KR); Hyun Bin Kang, Suwon-si (KR); Jin-sung Kim, Anyang-Si (KR); Tae-ho Kwak, Suwon-Si (KR)

(73) Assignee: MATERIAL SCIENCE CO., LTD., Seoul (KR)

( * ) Notice: Subject to any disclaimer, the term of this patent is extended or adjusted under 35 U.S.C. 154(b) by 830 days.

This patent is subject to a terminal disclaimer.

(21) Appl. No.: 16/976,276

(22) PCT Filed: Jul. 23, 2019

(86) PCT No.: PCT/KR2019/009104

§ 371 (c)(1),
(2) Date: Aug. 27, 2020

(87) PCT Pub. No.: WO2020/022751

PCT Pub. Date: Jan. 30, 2020

(65) Prior Publication Data

US 2021/0053998 A1 Feb. 25, 2021

(30) Foreign Application Priority Data

Jul. 24, 2018 (KR) ........................ 10-2018-0086077

(51) Int. Cl.

| | |
|---|---|
| ***C07F 5/02*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/30*** | (2023.01) |
| ***H10K 85/60*** | (2023.01) |

(52) U.S. Cl.

CPC ........... *C07F 5/027* (2013.01); *H10K 85/322* (2023.02); *H10K 85/615* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 50/15* (2023.02); *H10K 50/16* (2023.02); *H10K 50/171* (2023.02); *H10K 50/18* (2023.02)

(58) Field of Classification Search

None

See application file for complete search history.

(56) References Cited

U.S. PATENT DOCUMENTS

2013/0181201 A1* 7/2013 Lecloux .............. H01L 51/0058 257/40
2018/0301629 A1* 10/2018 Hatakeyama ......... H01L 51/008
2019/0181350 A1* 6/2019 Hatakeyama ....... H01L 51/0059
2019/0312207 A1* 10/2019 Hatakeyama ....... H01L 51/0058
2021/0053998 A1 2/2021 Kim et al.
2022/0246864 A1* 4/2022 Yoon ................... H01L 51/0073
2022/0352473 A1* 11/2022 Kim .................... H01L 51/0072

FOREIGN PATENT DOCUMENTS

JP 2013503860 A 2/2013
JP 2021523567 A 9/2021
KR 1020120058602 A 6/2012
KR 1020130010633 A1 1/2013
KR 1020170130434 A 11/2017
KR 1020170130435 A 11/2017
KR 101876763 B1 7/2018
WO WO2016152544 A1 9/2016
WO WO2017188111 A1 11/2017

OTHER PUBLICATIONS

Takuji Hatakeyama et al. "Ultrapure Blue Thermally Activated Delayed Fluorescence Molecules: Effi cient HOMO-LUMO Separation by the Multiple Resonance Effect", Adv. Mater. 2016, vol. 28, p. 2777-2781 (Year: 2016).*

English translation of KR 2010/0069216 A and the original KR 2010/0069216 A, Jin Seok Hong, Jun. 24, 2010 (Year: 2010).*

International Search Report of PCT/KR2019/009104, Oct. 24, 2019, English translation.

Frederik C. Krebs et al, Synthesis, Structure, and Properties of 4,8,12-Trioxa-12c-phospha-4,8, 12, 12c-tetrahydrodibenzo-[cd,mn]pyrene, a Molecular Pyroelectric, Journal of the American Chemical Society, 1997. vol. 119, No. 6, pp. 1208-1216, ACS Publications, Washington, D.C., USA.

English Translation of Notice of Allowance for Japanese related application No. 2020-562592, Jun. 13, 2023, 4 pages.

* cited by examiner

*Primary Examiner* — Seokmin Jeon

(74) *Attorney, Agent, or Firm* — Carter, DeLuca & Farrell LLP

(57) ABSTRACT

The present disclosure relates to an organic electroluminescent element, and more particularly to an organic electroluminescent element including a novel boron-based organic compound and anthracene-based organic compound in one or more organic layers included in the organic electroluminescent element. The present disclosure may provide an organic electroluminescent element, which is prevented from deterioration in color characteristics and has characteristics such as long lifetimes, as a result of using a host material having a specific structural formula despite having high polarity.

3 Claims, No Drawings

ORGANIC ELECTROLUMINESCENT ELEMENT

CROSS-REFERENCE TO RELATED APPLICATIONS

This application is the U.S. National Phase under 35 U.S.C. § 371 of International Application No. PCT/KR2019/009104 filed on Jul. 23, 2019, which in turn claims the benefit of Korean Application No. 10-2018-0086077, filed on Jul. 24, 2018, the disclosures of which are incorporated by reference into the present application.

TECHNICAL FIELD

The present disclosure relates to an organic electroluminescent element, and more particularly to an organic electroluminescent element including a novel boron-based organic compound and anthracene-based organic compound in one or more organic layers included in the organic electroluminescent element.

BACKGROUND ART

An organic electroluminescent element has a structure including a cathode (electron injection electrode), an anode (hole injection electrode) and one or more organic layers provided between the two electrodes.

The organic electroluminescent element includes a hole injection layer (HIL), a hole transport layer (HTL), a light-emitting layer (EML), an electron transport layer (ETL) and an electron injection layer (EIL), stacked in that order from the anode, and may further include an electron-blocking layer (EBL) and a hole-blocking layer (HBL) over and under the light-emitting layer, respectively, in order to increase the efficiency of the light-emitting layer.

Among the organic layers of this organic electroluminescent element, the light-emitting layer is composed of two materials: a host and a dopant. The dopant is required to have high quantum efficiency, and the host material preferably has a larger energy gap than the dopant material, so that energy transfer to the dopant is facilitated.

As conventional blue dopant materials, fluorescent molecules have been predominantly used, such as perylene, coumarine, anthracene and pyrene. However, the full-width at half maximum of these dopants is wide at 40 nm, making it difficult to display deep blue. In addition, optical loss occurs even when a certain wavelength region is amplified through optical resonance in a top-emission element.

In an attempt to solve these problems, boron-based dopants have recently been introduced, which, when applied to elements, exhibit a narrow emission spectrum and high efficiency. Although these dopants exhibit high efficiency and realize excellent color, they remain difficult to commercialize due to their low lifetime.

Accordingly, the present inventors have made efforts to improve the color purity of an organic electroluminescent element and solve the short lifetime problem thereof through an ideal host/dopant combination, while maintaining the excellent properties of the dopant.

PRIOR ART DOCUMENTS

Patent Documents (Patent Document 1) KR 10-2013-0010633 A1

Non-Patent Documents (Non-Patent Document 1) Krebs, Frederik C., et al., "Synthesis, Structure, and Properties of 4,8,12-Trioxa-12c-phospha-4,8,12,12c-tetrahydrodibenzo[cd, mn]pyrene, a Molecular Pyroelectric" Journal of the American Chemical Society, 119.6 (1997): 1208-1216

DISCLOSURE

Technical Problem

An object of the present disclosure is to provide an organic electroluminescent element that may exhibit improved efficiency, color characteristics and lifetime.

In particular, an object of the present disclosure is to provide an organic electroluminescent element, which is prevented from deterioration in color characteristics and has characteristics such as long lifetimes, as a result of using a host material having a specific structural formula despite having high polarity.

Technical Solution

To achieve the above object, the present disclosure provides an organic electroluminescent element including: a first electrode; a second electrode; and at least one organic layer disposed between the first electrode and the second electrode, wherein the organic layer includes a light-emitting layer, wherein the light-emitting layer includes a compound represented by the following Formula 1 and a compound represented by the following Formula 2:

[Formula 1]

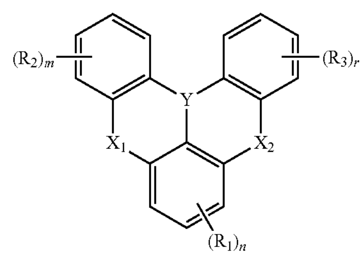

[Formula 2]

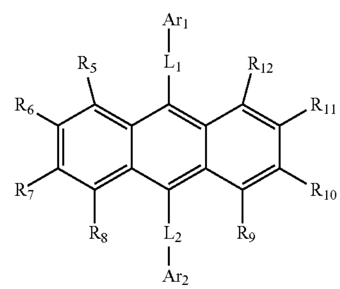

wherein n is an integer ranging from 0 to 3;

m and r are the same or different and are each independently an integer ranging from 0 to 4;

Y is B, N,

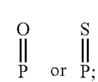

$X_1$ and $X_2$ are the same or different and are each independently selected from the group consisting of O, S, Se and $N(R_4)$;

$R_1$ to $R_4$ are same or different and are each independently selected from the group consisting of hydrogen, deuterium, a cyano group, a nitro group, a halogen group, a hydroxyl group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_5$-$C_{30}$ aryl group, a substituted or unsubstituted heteroaryl group having 5 to 60 nuclear atoms, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine to an adjacent group to form a substituted or unsubstituted ring;

$L_1$ and $L_2$ are the same or different and are each independently selected from the group consisting of a single bond, a substituted or unsubstituted $C_5$-$C_{30}$ arylene group, a substituted or unsubstituted heteroarylene group having 6 to 30 nuclear atoms, a substituted or unsubstituted $C_2$-$C_{10}$ alkylene group, a substituted or unsubstituted $C_2$-$C_{10}$ cycloalkylene group, a substituted or unsubstituted $C_2$-$C_{10}$ alkenylene group, a substituted or unsubstituted $C_2$-$C_{10}$ cycloalkenylene group, a substituted or unsubstituted $C_2$-$C_{10}$ heteroalkylene group, a substituted or unsubstituted $C_2$-$C_{10}$ heterocycloalkylene group, a substituted or unsubstituted $C_2$-$C_{10}$ heteroalkenylene group, and a substituted or unsubstituted $C_2$-$C_{10}$ heterocycloalkenylene group;

$Ar_1$ and $Ar_2$ are the same or different and are each independently selected from the group consisting of a substituted or unsubstituted $C_3$-$C_{30}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_2$-$C_{30}$ heteroalkyl group, a substituted or unsubstituted $C_6$-$C_{30}$ aralkyl group, a substituted or unsubstituted $C_5$-$C_{30}$ aryl group, a substituted or unsubstituted $C_2$-$C_{30}$ heteroaryl group, a substituted or unsubstituted $C_3$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group;

at least one of $R_5$ to $R_{12}$ is deuterium, and the others of $R_5$ to $R_{12}$ are each independently selected from the group consisting of hydrogen, deuterium, a cyano group, a nitro group, a halogen group, a hydroxyl group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_5$-$C_{30}$ aryl group, a substituted or unsubstituted heteroaryl group having 5 to 60 nuclear atoms, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine to an adjacent group to form a substituted or unsubstituted ring; and $R_1$ to $R_{12}$, $L_1$, $L_2$, $Ar_1$ and $Ar_2$ may each independently be substituted with one or more substituents selected from the group consisting of hydrogen, deuterium, a cyano group, a nitro group, a halogen group, a hydroxyl group, a $C_1$-$C_{30}$ alkyl group, a $C_2$-$C_{30}$ alkenyl group, a $C_2$-$C_{24}$ alkynyl group, a $C_2$-$C_{30}$ heteroalkyl group, a $C_6$-$C_{30}$ aralkyl group, a $C_5$-$C_{30}$ aryl group, a $C_2$-$C_{30}$ heteroaryl group, a $C_3$-$C_{30}$ heteroarylalkyl group, a $C_1$-$C_{30}$ alkoxy group, a $C_1$-$C_{30}$ alkylamino group, a $C_6$-$C_{30}$ arylamino group, a $C_6$-$C_{30}$ aralkylamino group, and a $C_2$-$C_{24}$ heteroarylamino group, and when the substituents are plural, they are the same or different.

In addition, the light-emitting layer of the present disclosure may include the compound represented by Formula 1 as a dopant and the compound represented by Formula 2 as a host.

In the present specification, "halogen group" is fluorine, chlorine, bromine or iodine.

In the present disclosure, "alkyl" means a monovalent substituent derived from a $C_1$-$C_{40}$ straight or branched-chain saturated hydrocarbon. Examples thereof include, but are not limited to, methyl, ethyl, propyl, isobutyl, sec-butyl, pentyl, iso-amyl, hexyl, and the like.

In the present disclosure, "alkenyl" means a monovalent substituent derived from a $C_2$-$C_{40}$ straight or branched-chain unsaturated hydrocarbon having one or more carbon-carbon double bonds. Examples thereof include, but are not limited to, vinyl, allyl, isopropenyl, 2-butenyl, and the like.

In the present disclosure, "alkynyl" means a monovalent substituent derived from a $C_2$-$C_{40}$ straight or branched-chain unsaturated hydrocarbon having one or more carbon-carbon triple bonds. Examples thereof include, but are not limited to, ethynyl, 2-propynyl, and the like.

In the present disclosure, "aryl" means a monovalent substituent derived from a $C_6$-$C_{60}$ aromatic hydrocarbon having a single ring or a combination of two or more rings. In addition, aryl may also include a form in which two or more rings are simply pendant to each other or are fused together. Examples of this aryl include, but are not limited to, phenyl, naphthyl, phenanthryl, anthryl, fluorenyl, dimethylfluorenyl, and the like.

In the present disclosure, "heteroaryl" means a monovalent substituent derived from a $C_6$-$C_{30}$ monoheterocyclic or polyheterocyclic aromatic hydrocarbon. Here, one or more carbon atoms, preferably 1 to 3 carbon atoms, in the ring, are substituted with a heteroatom such as N, O, S or Se. In addition, heteroaryl may also include a form in which two or more rings are simply pendant or are fused together, and furthermore, may also include a form fused with an aryl group. Examples of this heteroaryl include, but are not limited to, 6-membered monocyclic rings such as pyridyl, pyrazinyl, pyrimidinyl, pyridazinyl, and triazinyl; polycyclic rings such as phenoxathienyl, indolizinyl, indolyl, purinyl, quinolyl, benzothiazole, and carbazolyl; 2-furanyl, N-imidazolyl, 2-isoxazolyl, 2-pyridinyl, 2-pyrimidinyl, and the like.

In the present disclosure, "aryloxy" means a monovalent substituent represented by RO—, wherein R represents a $C_6$ to $C_{60}$ aryl. Examples of this aryloxy include, but are not limited to, phenyloxy, naphthyloxy, diphenyloxy, and the like.

In the present disclosure, "alkyloxy" means a monovalent substituent represented by R'O—, wherein R' represents a $C_1$-$C_{40}$ alkyl, and may include a linear, branched or cyclic structure. Examples of alkyloxy include, but are not limited to, methoxy, ethoxy, n-propoxy, 1-propoxy, t-butoxy, n-butoxy, pentoxy, and the like.

In the present disclosure, "alkoxy" may be a straight, branched or cyclic chain. The carbon number of alkoxy is not particularly limited, but is preferably 1 to 20. Specific examples of alkoxy include, but are not limited to, methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like.

In the present disclosure, "aralkyl" means an aryl-alkyl group in which the aryl and the alkyl are as defined above. Preferred aralkyls include a lower alkyl group. Non-limiting examples of suitable aralkyl groups include benzyl, 2-phenethyl, and naphthalenylmethyl. The bond to the parent moiety is through the alkyl.

In the present disclosure, "arylamino group" means an amine substituted with a $C_6$-$C_{30}$ aryl group.

In the present disclosure, "alkylamino group" means an amine substituted with a $C_1$-$C_{30}$ alkyl group.

In the present disclosure, "aralkylamino group" means an amine substituted with a $C_6$-$C_{30}$ aryl-alkyl group.

In the present disclosure, "heteroarylamino group" means an amine group substituted with a $C_6$-$C_{30}$ aryl group and a heterocyclic group.

In the present disclosure, "heteroaralkyl group" means an aryl-alkyl group substituted with a heterocyclic group.

In the present disclosure, "cycloalkyl" means a monovalent substituent derived from a $C_3$-$C_{40}$ monocyclic or polycyclic non-aromatic hydrocarbon. Examples of this cycloalkyl include, but are not limited to, cyclopropyl, cyclobutyl, cyclopentyl, cyclohexyl, norbornyl, adamantyl, and the like.

In the present disclosure, "heterocycloalkyl" means a monovalent substituent derived from a $C_3$-$C_{40}$ non-aromatic hydrocarbon, and one or more carbon atoms, preferably 1 to 3 carbon atoms, in the ring, are substituted with a heteroatom such as N, O, S or Se. Examples of this heterocycloalkyl include, but are not limited to, morpholine, piperazine, and the like.

In the present disclosure, "alkylsilyl" means a silyl substituted with $C_1$-$C_{40}$ alkyl, and "arylsilyl" means a silyl substituted with $C_6$-$C_{60}$ aryl.

In the present disclosure, "fused ring" means a fused aliphatic ring, a fused aromatic ring, a fused heteroaliphatic ring, a fused heteroaromatic ring, or a combination thereof.

In the present disclosure, "combine to an adjacent group to form a ring" means combining with an adjacent group to form a substituted or unsubstituted aliphatic hydrocarbon ring, a substituted or unsubstituted aromatic hydrocarbon ring, a substituted or unsubstituted aliphatic heterocyclic ring, a substituted or unsubstituted aromatic heterocyclic ring, or a fused ring thereof.

In the present specification, "aliphatic hydrocarbon ring" means a non-aromatic ring consisting only of carbon and hydrogen atoms.

In the present specification, examples of "aromatic hydrocarbon ring" include, but are not limited to, a phenyl group, a naphthyl group, an anthracenyl group, and the like.

In the present specification, "aliphatic heterocyclic ring" means an aliphatic ring containing one or more heteroatoms.

In the present specification, "aromatic heterocyclic ring" means an aromatic ring containing one or more heteroatoms.

In the present specification, the aliphatic hydrocarbon ring, the aromatic hydrocarbon ring, the aliphatic heterocyclic ring and the aromatic heterocyclic ring may be monocyclic or polycyclic.

In the present specification, "substituted" means that the hydrogen atom attached to the carbon atom of a compound is substituted with another substituent. The position to be substituted is not limited as long as it is a position where the hydrogen atom is substituted, that is, a position that may be substituted with a substituent. If two or more hydrogen atoms are substituted, two or more substituents may be the same or different. The substituent may be one or more selected from the group consisting of hydrogen, deuterium, a cyano group, a nitro group, a halogen group, a hydroxyl group, a $C_1$-$C_{30}$ alkyl group, a $C_2$-$C_{30}$ alkenyl group, a $C_2$-$C_{24}$ alkynyl group, a $C_2$-$C_{30}$ heteroalkyl group, a $C_6$-$C_{30}$ aralkyl group, a $C_5$-$C_{30}$ aryl group, a $C_2$-$C_{30}$ heteroaryl group, a $C_3$-$C_{30}$ heteroarylalkyl group, a $C_1$-$C_{30}$ alkoxy group, a $C_1$-$C_{30}$ alkylamino group, a $C_6$-$C_{30}$ arylamino group, a $C_6$-$C_{30}$ aralkylamino group, and a $C_2$-$C_{24}$ heteroarylamino group, but is not limited thereto.

Advantageous Effects

The present disclosure provides an organic electroluminescent element that may exhibit improved efficiency, color characteristics and lifetime.

In particular, the present disclosure provides an organic electroluminescent element, which is prevented from deterioration in color characteristics and has characteristics such as long lifetimes, as a result of using a host material having a specific structural formula despite having high polarity.

BEST MODE

The present disclosure is directed to an organic electroluminescent element including: a first electrode; a second electrode; and at least one organic layer disposed between the first electrode and the second electrode, wherein the organic layer includes a light-emitting layer, wherein the light-emitting layer includes a compound represented by the following Formula 1 and a compound represented by the following Formula 2:

[Formula 1]

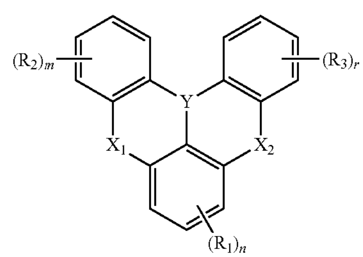

[Formula 2]

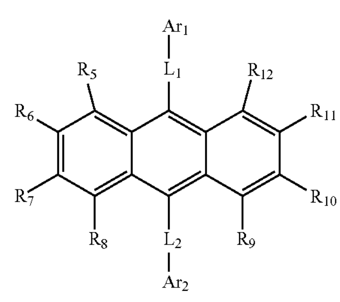

wherein n is an integer ranging from 0 to 3;

m and r are the same or different and are each independently an integer ranging from 0 to 4;

Y is B, N, $$\overset{O}{\overset{\|}{P}} \text{ or } \overset{S}{\overset{\|}{P}};$$

$X_1$ and $X_2$ are the same or different and are each independently selected from the group consisting of O, S, Se and $N(R_4)$;

$R_1$ to $R_4$ are same or different and are each independently selected from the group consisting of hydrogen, deuterium, a cyano group, a nitro group, a halogen group, a hydroxyl group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_5$-$C_{30}$ aryl group, a substituted or unsubstituted heteroaryl group having 5 to 60 nuclear atoms, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine to an adjacent group to form a substituted or unsubstituted ring;

$L_1$ and $L_2$ are the same or different and are each independently selected from the group consisting of a single bond, a substituted or unsubstituted $C_5$-$C_{30}$ arylene group, a substituted or unsubstituted heteroarylene group having 6 to 30 nuclear atoms, a substituted or unsubstituted $C_2$-$C_{10}$ alkylene group, a substituted or unsubstituted $C_2$-$C_{10}$ cycloalkylene group, a substituted or unsubstituted $C_2$-$C_{10}$ alkenylene group, a substituted or unsubstituted $C_2$-$C_{10}$ cycloalkenylene group, a substituted or unsubstituted $C_2$-$C_{10}$ heteroalkylene group, a substituted or unsubstituted $C_2$-$C_{10}$ heterocycloalkylene group, a substituted or unsubstituted $C_2$-$C_{10}$ heteroalkenylene group, and a substituted or unsubstituted $C_2$-$C_{10}$ heterocycloalkenylene group;

$Ar_1$ and $Ar_2$ are the same or different and are each independently selected from the group consisting of a substituted or unsubstituted $C_3$-$C_{30}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_2$-$C_{30}$ heteroalkyl group, a substituted or unsubstituted $C_6$-$C_{30}$ aralkyl group, a substituted or unsubstituted $C_5$-$C_{30}$ aryl group, a substituted or unsubstituted $C_2$-$C_{30}$ heteroaryl group, a substituted or unsubstituted $C_3$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group;

at least one of $R_5$ to $R_{12}$ is deuterium, and the others of $R_5$ to $R_{12}$ are each independently selected from the group consisting of hydrogen, deuterium, a cyano group, a nitro group, a halogen group, a hydroxyl group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_5$-$C_{30}$ aryl group, a substituted or unsubstituted heteroaryl group having 5 to 60 nuclear atoms, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine to an adjacent group to form a substituted or unsubstituted ring; and $R_1$ to $R_{12}$, $L_1$, $L_2$, $Ar_1$ and $Ar_2$ may each independently be substituted with one or more substituents selected from the group consisting of hydrogen, deuterium, a cyano group, a nitro group, a halogen group, a hydroxyl group, a $C_1$-$C_{30}$ alkyl group, a $C_2$-$C_{30}$ alkenyl group, a $C_2$-$C_{24}$ alkynyl group, a $C_2$-$C_{30}$ heteroalkyl group, a $C_6$-$C_{30}$ aralkyl group, a $C_5$-$C_{30}$ aryl group, a $C_2$-$C_{30}$ heteroaryl group, a $C_3$-$C_{30}$ heteroarylalkyl group, a $C_1$-$C_{30}$ alkoxy group, a $C_1$-$C_{30}$ alkylamino group, a $C_6$-$C_{30}$ arylamino group, a $C_6$-$C_{30}$ aralkylamino group, and a $C_2$-$C_{24}$ heteroarylamino group, and when the substituents are plural, they are the same or different.

MODE FOR INVENTION

Hereinafter, embodiments of the present disclosure will be described in detail so that those skilled in the art to which the present disclosure pertains can easily carry out the present disclosure. However, the present disclosure may be embodied in a variety of different forms and is not limited to the embodiments described herein.

The organic electroluminescent element according to the present disclosure is characterized by having a long lifetime effect while maintaining the excellent color purity of the organic electroluminescent element, as a result of introducing a host/dopant system using novel organic compounds.

A novel organic compound that may be used as the host has excellent chemical stability, and more specifically, is characterized by having a structure in which an anthracene structure is substituted with deuterium. As the anthracene structure is substituted with deuterium as described above, it is possible to increase the lifetime of the organic electroluminescent element.

Specifically, the present disclosure is directed to an organic electroluminescent element including: a first electrode; a second electrode; and at least one organic layer disposed between the first electrode and the second electrode, wherein the organic layer includes a light-emitting layer, wherein the light-emitting layer includes a compound represented by the following Formula 1 and a compound represented by the following Formula 2:

[Formula 1]

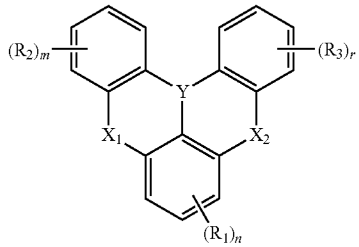

[Formula 2]

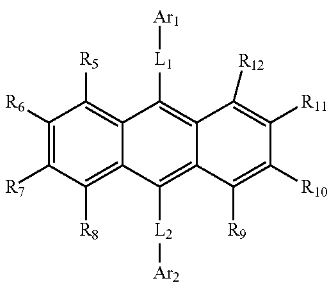

wherein n is an integer ranging from 0 to 3;

m and r are the same or different and are each independently an integer ranging from 0 to 4;

Y is B, N,

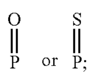

$X_1$ and $X_2$ are the same or different and are each independently selected from the group consisting of O, S, Se and $N(R_4)$;

$R_1$ to $R_4$ are same or different and are each independently selected from the group consisting of hydrogen, deuterium, a cyano group, a nitro group, a halogen group, a hydroxyl group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_5$-$C_{30}$ aryl group, a substituted or unsubstituted heteroaryl group having 5 to 60 nuclear atoms, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine to an adjacent group to form a substituted or unsubstituted ring;

$L_1$ and $L_2$ are the same or different and are each independently selected from the group consisting of a single bond, a substituted or unsubstituted $C_5$-$C_{30}$ arylene group, a substituted or unsubstituted heteroarylene group having 6 to 30 nuclear atoms, a substituted or unsubstituted $C_2$-$C_{10}$ alkylene group, a substituted or unsubstituted $C_2$-$C_{10}$ cycloalkylene group, a substituted or unsubstituted $C_2$-$C_{10}$ alkenylene group, a substituted or unsubstituted $C_2$-$C_{10}$ cycloalkenylene group, a substituted or unsubstituted $C_2$-$C_{10}$ heteroalkylene group, a substituted or unsubstituted $C_2$-$C_{10}$ heterocycloalkylene group, a substituted or unsubstituted $C_2$-$C_{10}$ heteroalkenylene group, and a substituted or unsubstituted $C_2$-$C_{10}$ heterocycloalkenylene group;

$Ar_1$ and $Ar_2$ are the same or different and are each independently selected from the group consisting of a substituted or unsubstituted $C_3$-$C_{30}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_2$-$C_{30}$ heteroalkyl group, a substituted or unsubstituted $C_6$-$C_{30}$ aralkyl group, a substituted or unsubstituted $C_5$-$C_{30}$ aryl group, a substituted or unsubstituted $C_2$-$C_{30}$ heteroaryl group, a substituted or unsubstituted $C_3$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group;

at least one of $R_5$ to $R_{12}$ is deuterium, and the others of $R_5$ to $R_{12}$ are each independently selected from the group consisting of hydrogen, deuterium, a cyano group, a nitro group, a halogen group, a hydroxyl group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_7$-$C_{30}$ aralkyl group, a substituted or unsubstituted $C_5$-$C_{30}$ aryl group, a substituted or unsubstituted heteroaryl group having 5 to 60 nuclear atoms, a substituted or unsubstituted $C_6$-$C_{30}$ heteroarylalkyl group, a substituted or unsubstituted $C_1$-$C_{30}$ alkoxy group, a substituted or unsubstituted $C_1$-$C_{30}$ alkylamino group, a substituted or unsubstituted $C_6$-$C_{30}$ arylamino group, a substituted or unsubstituted $C_6$-$C_{30}$ aralkylamino group, a substituted or unsubstituted $C_2$-$C_{24}$ heteroarylamino group, a substituted or unsubstituted $C_1$-$C_{30}$ alkylsilyl group, a substituted or unsubstituted $C_6$-$C_{30}$ arylsilyl group, and a substituted or unsubstituted $C_6$-$C_{30}$ aryloxy group, and may combine to an adjacent group to form a substituted or unsubstituted ring; and $R_1$ to $R_{12}$, $L_1$, $L_2$, $Ar_1$ and Are may each independently be substituted with one or more substituents selected from the group consisting of hydrogen, deuterium, a cyano group, a nitro group, a halogen group, a hydroxyl group, a $C_1$-$C_{30}$ alkyl group, a $C_2$-$C_{30}$ alkenyl group, a $C_2$-$C_{24}$ alkynyl group, a $C_2$-$C_{30}$ heteroalkyl group, a $C_6$-$C_{30}$ aralkyl group, a $C_5$-$C_{30}$ aryl group, a $C_2$-$C_{30}$ heteroaryl group, a $C_3$-$C_{30}$ heteroarylalkyl group, a $C_1$-$C_{30}$ alkoxy group, a $C_1$-$C_{30}$ alkylamino group, a $C_6$-$C_{30}$ arylamino group, a $C_6$-$C_{30}$ aralkylamino group, and a $C_2$-$C_{24}$ heteroarylamino group, and when the substituents are plural, they are the same or different.

According to one preferred embodiment of the present disclosure, the compound represented by Formula 1 is a compound represented by the following Formula 3:

[Formula 3]

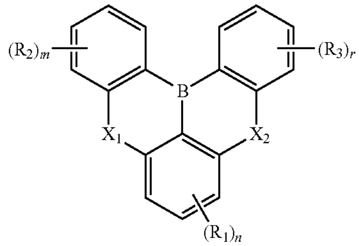

wherein $X_1$ and $X_2$ are the same or different and are each independently O or $N(R_4)$, and n, m, r and $R_1$ to $R_4$ are as defined in Formula 1 above.

According to one preferred embodiment of the present disclosure, the compound represented by Formula 1 is a compound represented by the following Formula 4:

[Formula 4]

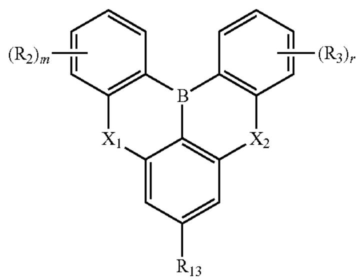

wherein $X_1$ and $X_2$ are the same or different and are each independently O or $N(R_4)$;

$R_{13}$ is selected from the group consisting of hydrogen, deuterium, a cyano group, a trifluoromethyl group, a nitro group, a halogen group, a hydroxyl group, a substituted or unsubstituted $C_1$-$C_4$ alkylthio group, a substituted or unsubstituted $C_1$-$C_{30}$ alkyl group, a substituted or unsubstituted $C_1$-$C_{20}$ cycloalkyl group, a substituted or unsubstituted $C_2$-$C_{30}$ alkenyl group, a substituted or unsubstituted $C_2$-$C_{24}$ alkynyl group, a substituted or unsubstituted $C_5$-$C_{30}$ aryl group, a substituted or unsubstituted heteroaryl group having 5 to 60 nuclear atoms, and a substituted or unsubstituted arylamino group having 6 to 30 nuclear atoms; and m, r and $R_2$ to $R_4$ are as defined in Formula 1 above.

According to one preferred embodiment of the present disclosure, $R_1$ may be selected from the group consisting of hydrogen, deuterium, a substituted or unsubstituted cyclopropyl group, a substituted or unsubstituted cyclobutyl group, a substituted or unsubstituted cyclopentyl group, a substituted or unsubstituted cyclohexyl group, a substituted or unsubstituted cycloheptyl group, a substituted or unsubstituted adamantyl group, a substituted or unsubstituted phenylamino group, and a substituted or unsubstituted diphenylamino group.

According to one preferred embodiment of the present disclosure, $L_1$ and $L_2$ are the same or different and may each independently be selected from the group consisting of a single bond, a substituted or unsubstituted $C_5$-$C_{30}$ arylene group, and a substituted or unsubstituted $C_3$-$C_{30}$ heteroarylene group.

According to one preferred embodiment of the present disclosure, at least four of $R_5$ to $R_{12}$ are deuterium, and more preferably, $R_5$ to $R_{12}$ are deuterium.

According to one preferred embodiment of the present disclosure, $Ar_1$ and $Ar_2$ are the same or different and are each independently a substituted or unsubstituted $C_5$-$C_{30}$ aryl group or a substituted or unsubstituted $C_3$-$C_{30}$ heteroaryl group.

According to one preferred embodiment of the present disclosure, the compound represented by Formula 1 may be selected from the group consisting of the following compounds:

1-1

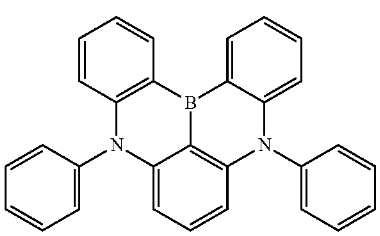

1-2

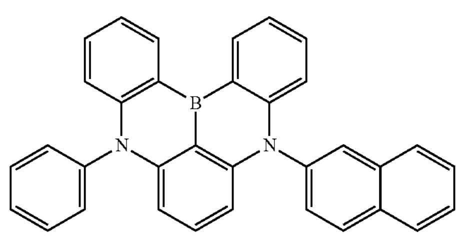

1-3

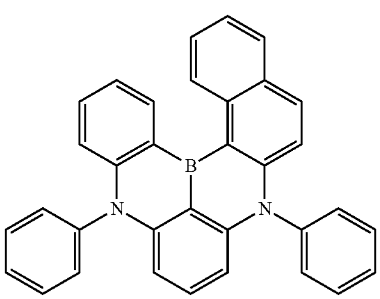

1-4

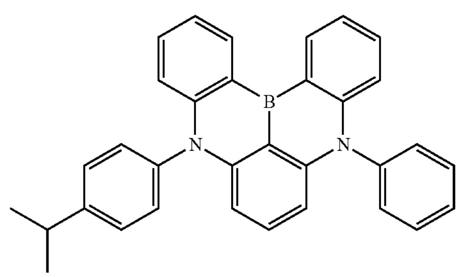

-continued
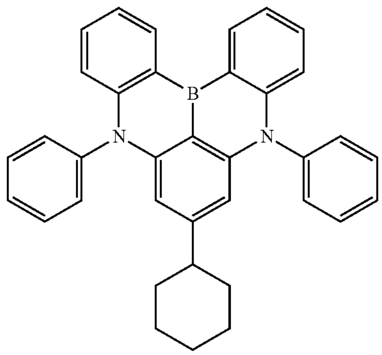
1-5
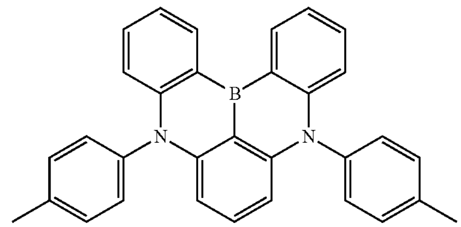
1-6
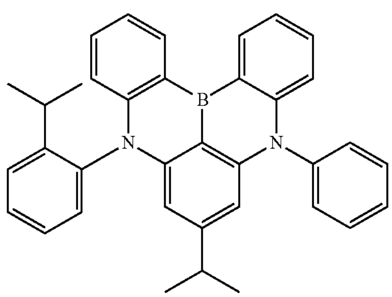
1-7
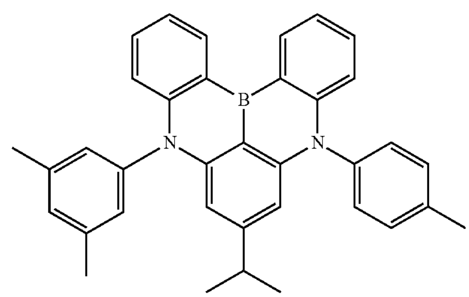
1-8
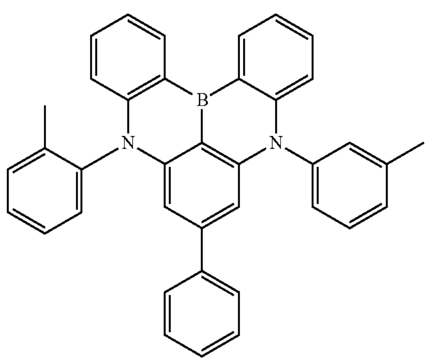
1-9
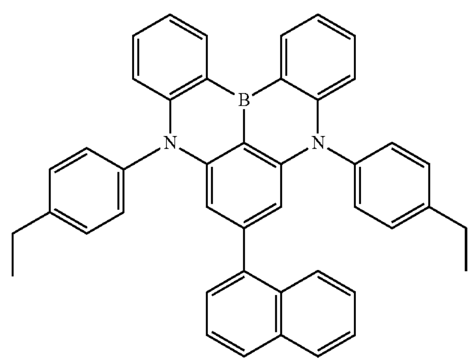
1-10
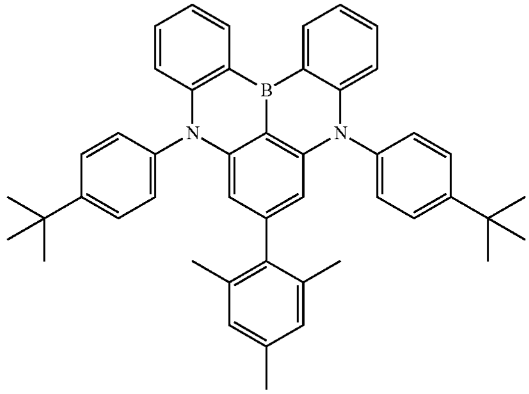
1-11
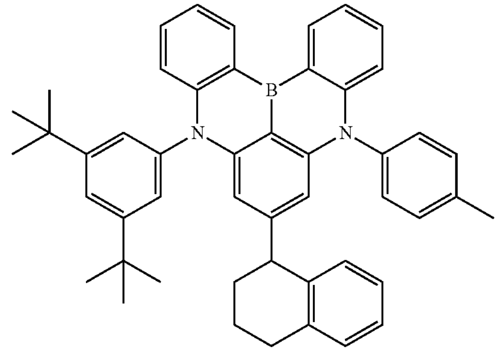
1-12

-continued
1-13
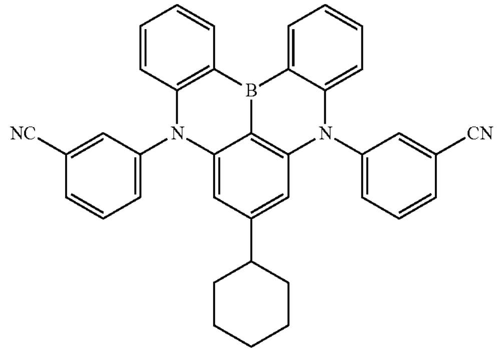
1-14
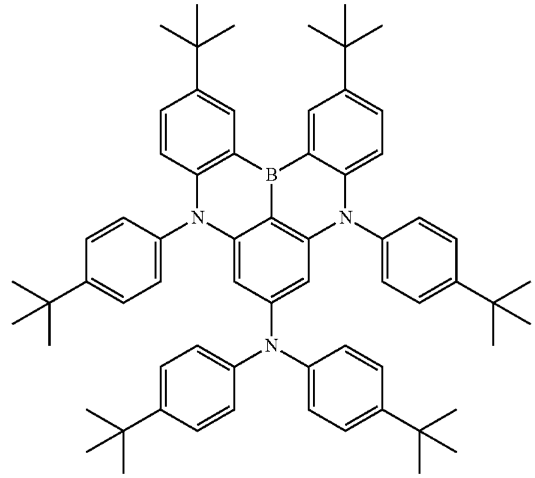
1-15
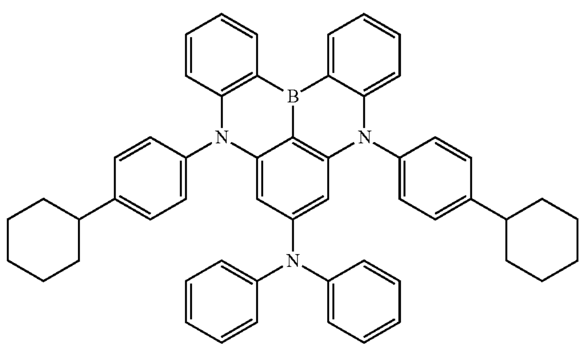
1-16
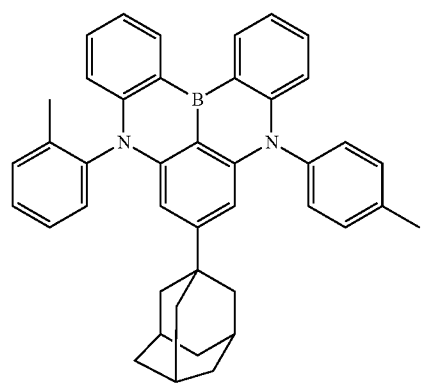
1-17
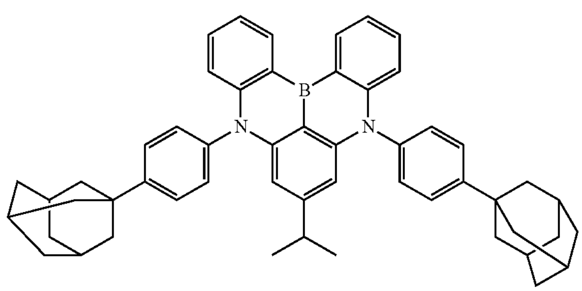
1-18
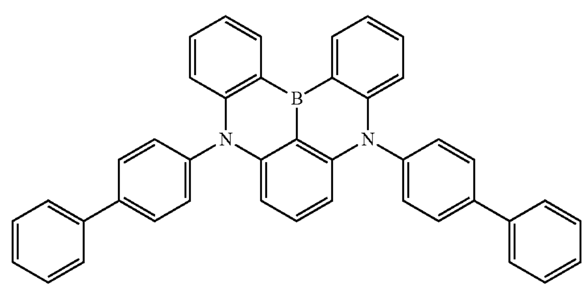
1-19
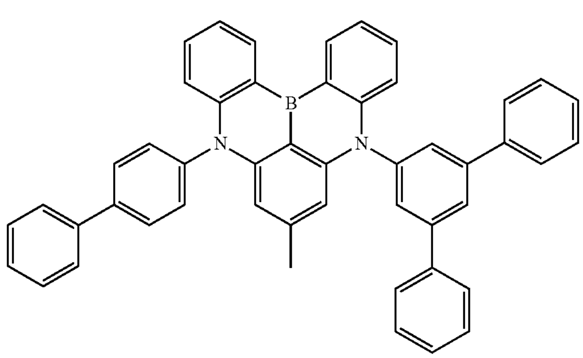
1-20
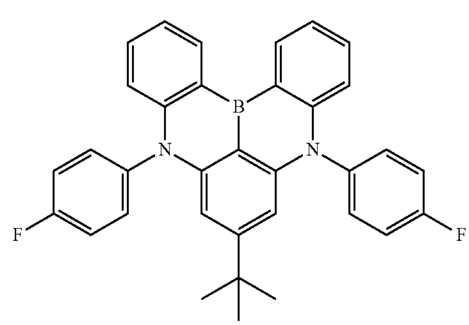

-continued
1-21
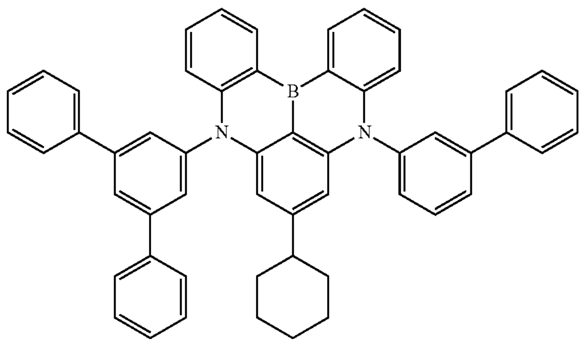
1-22
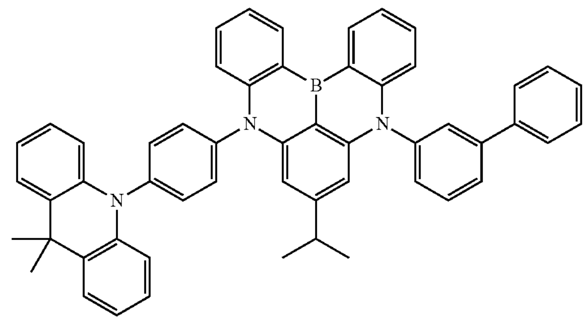
1-23
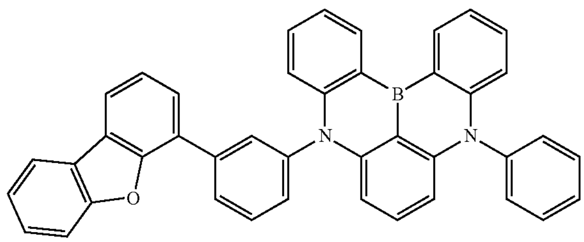
1-24
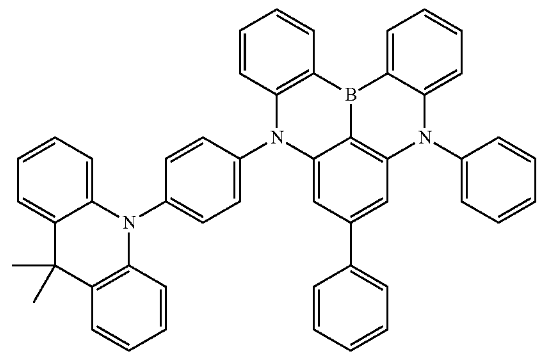
1-25
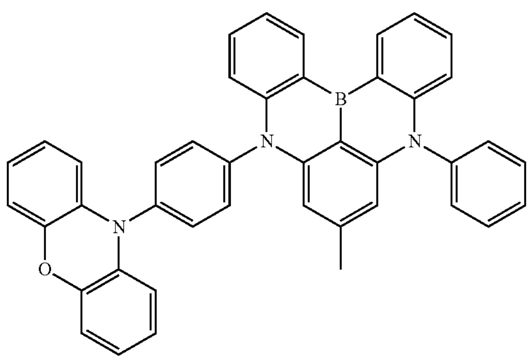
1-26
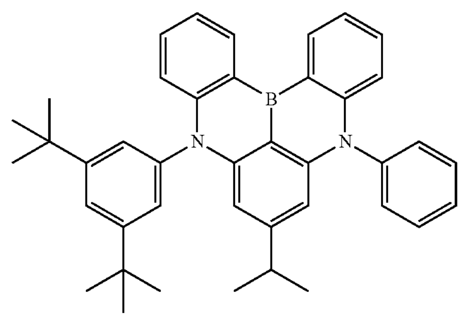
1-27
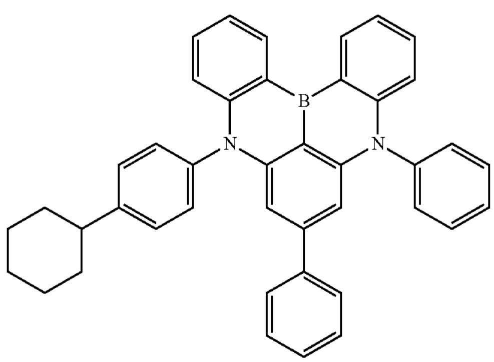
1-28
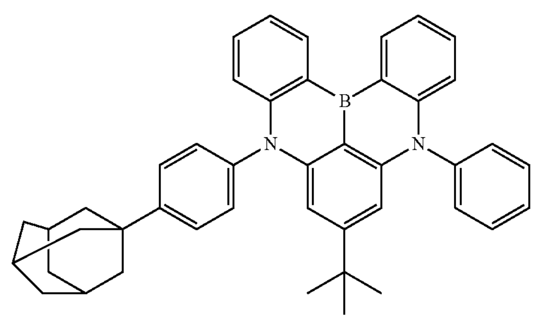

-continued
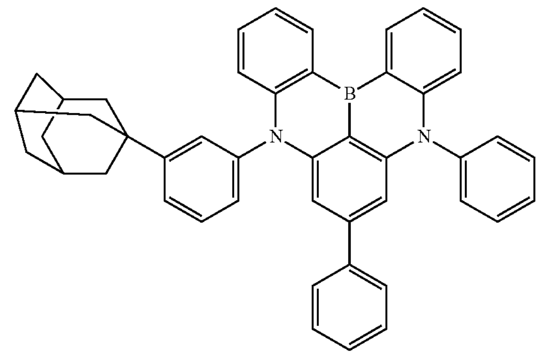
1-29
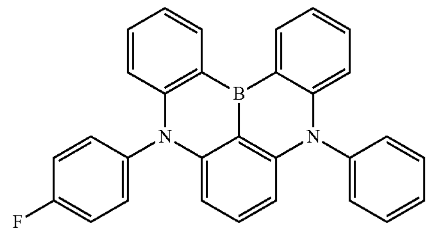
1-30
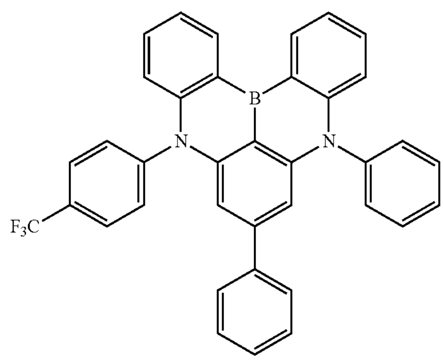
1-31
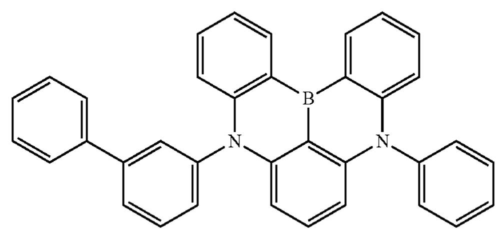
1-32
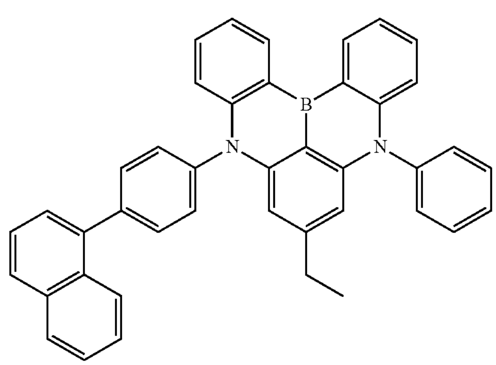
1-33
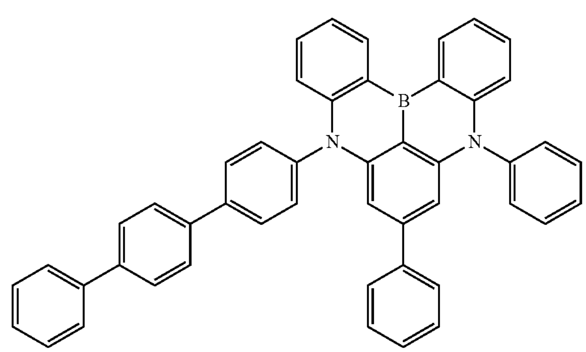
1-34
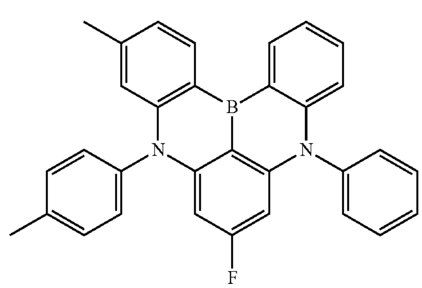
1-35
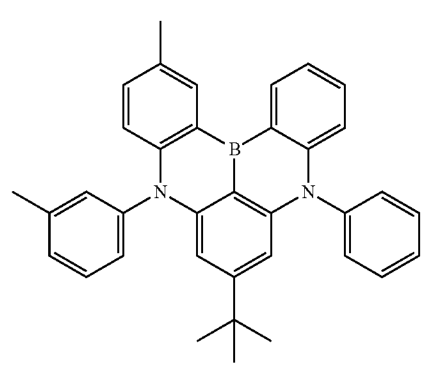
1-36

-continued
1-37
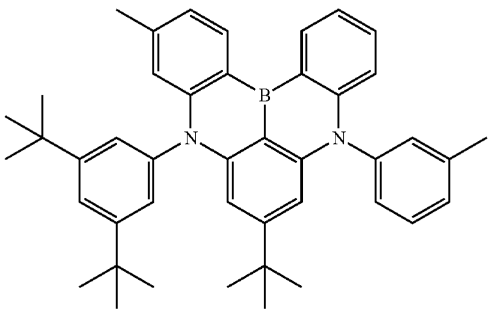
1-38
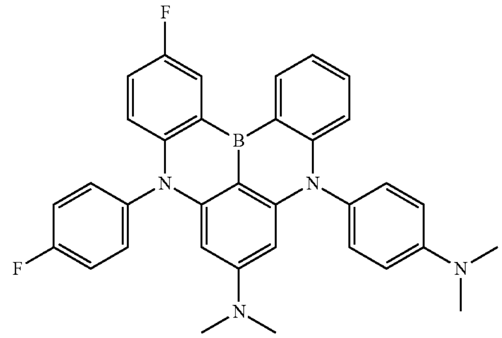
1-39
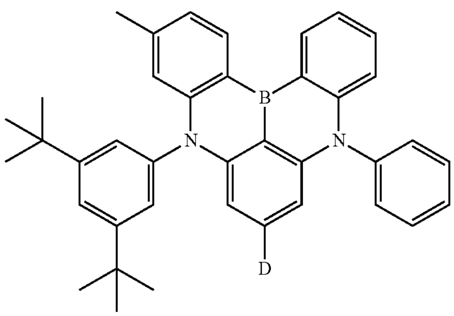
1-40
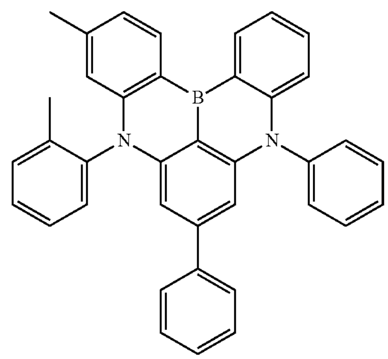
1-41
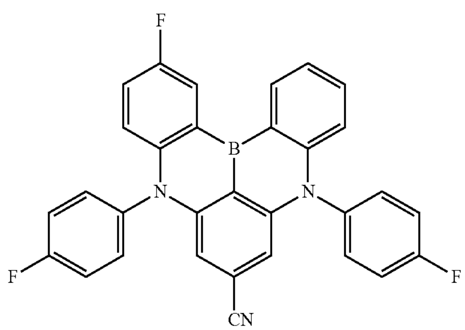
1-42
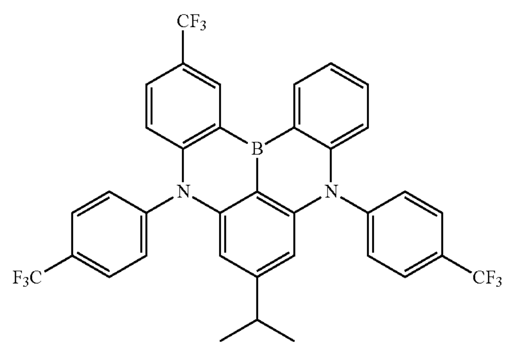
1-43
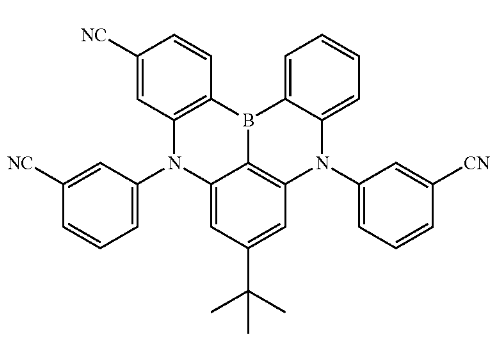
1-44
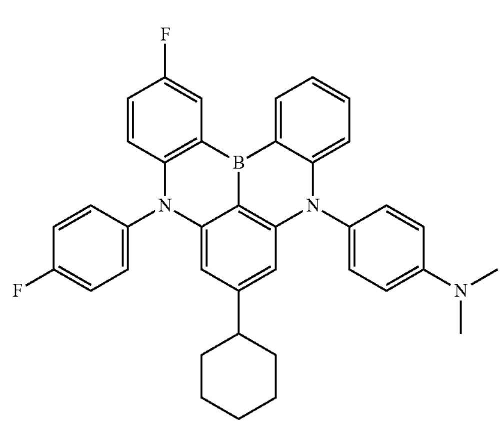

-continued
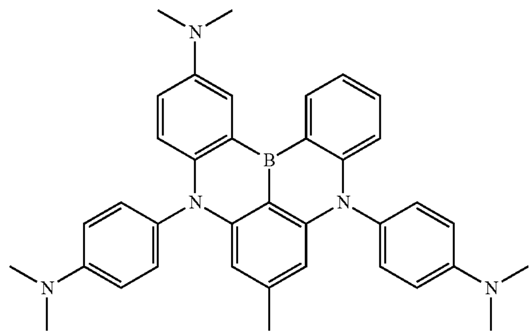
1-45
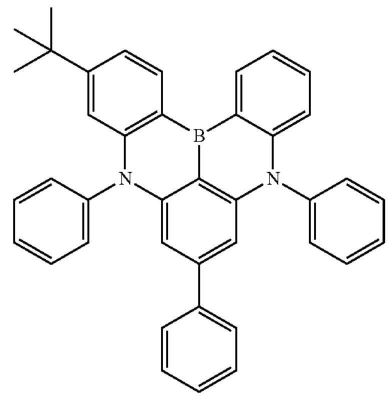
1-46
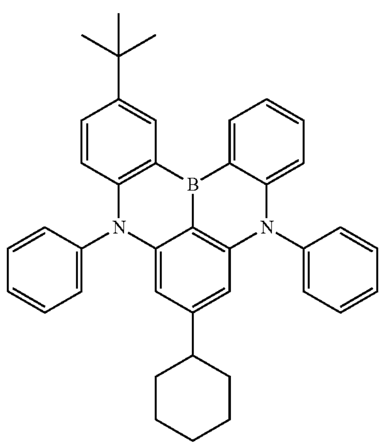
1-47
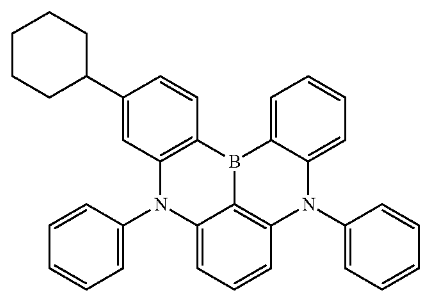
1-48
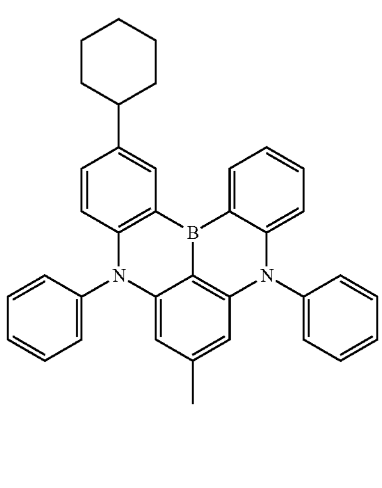
1-49
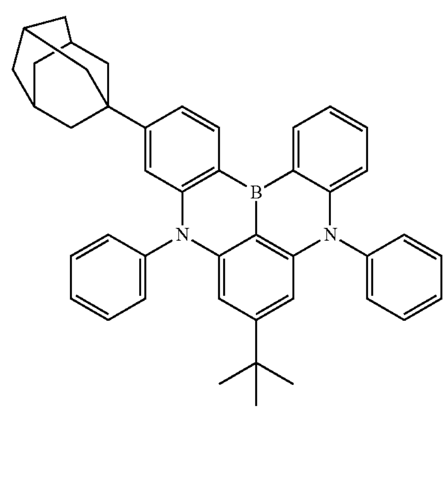
1-50

-continued
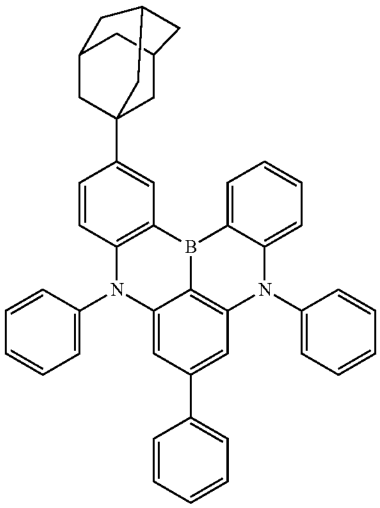
1-51
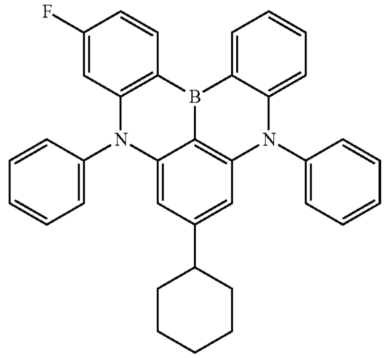
1-52
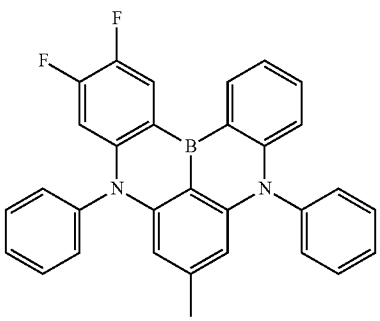
1-53
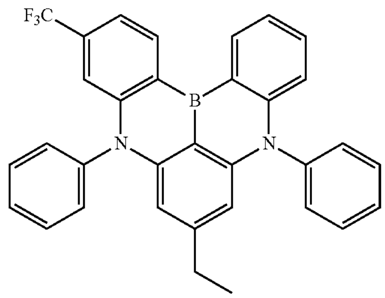
1-54
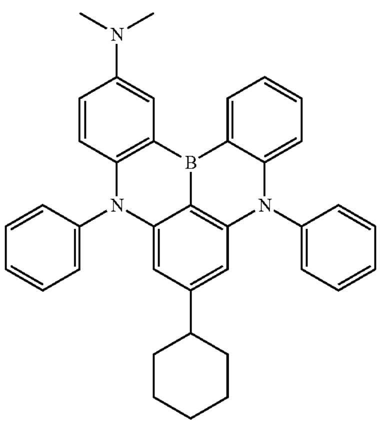
1-55
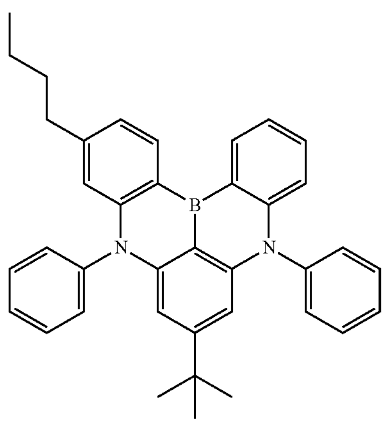
1-56
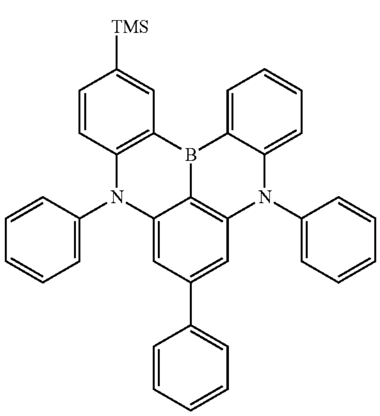
1-57
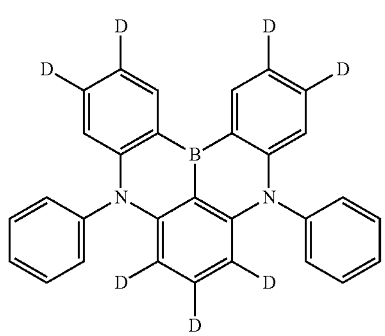
1-58

-continued
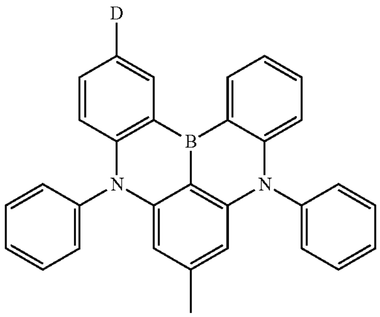
1-59
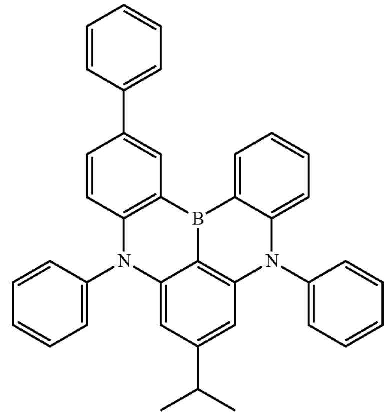
1-60
1-61
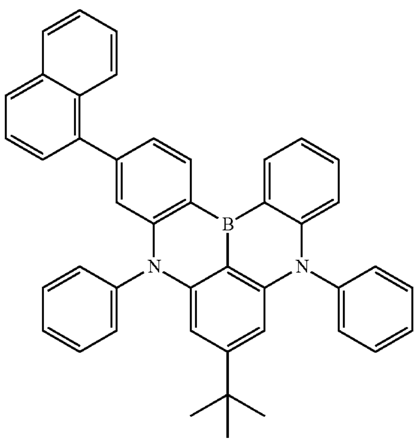
1-62
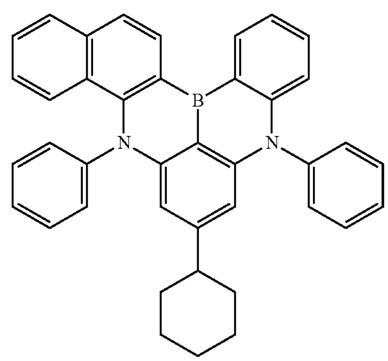
1-63
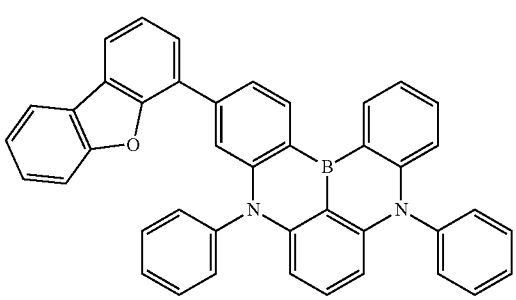
1-64
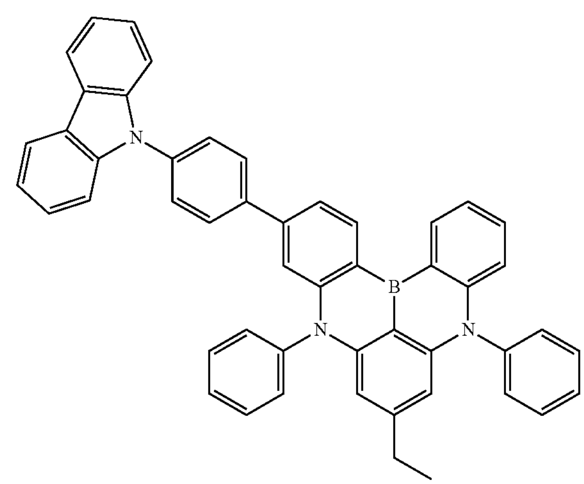

-continued
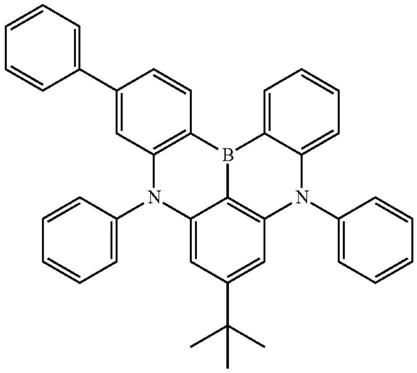
1-65
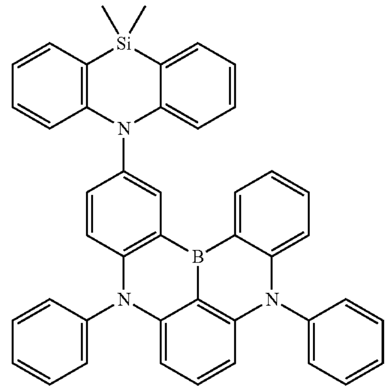
1-66
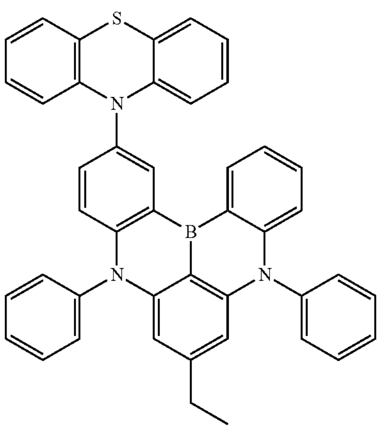
1-67
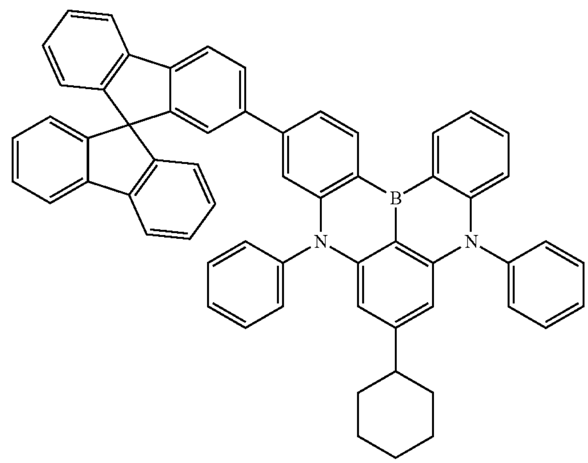
1-68
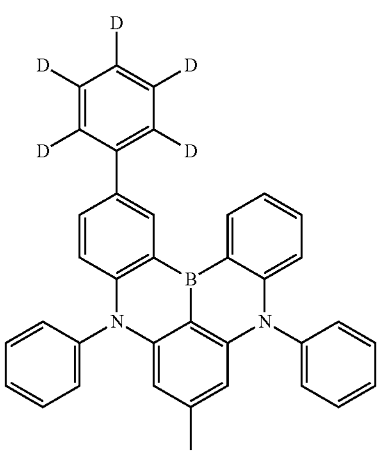
1-69
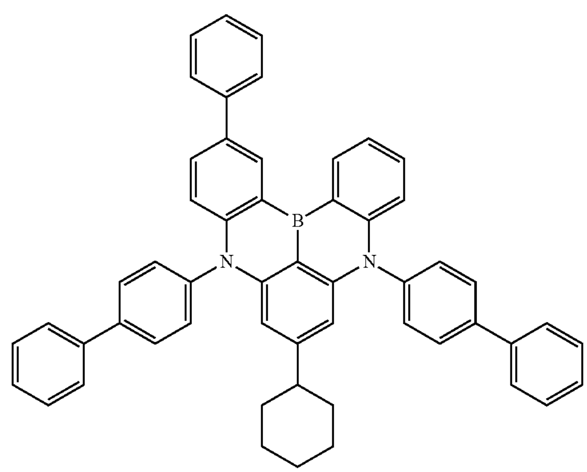
1-70

-continued
1-71
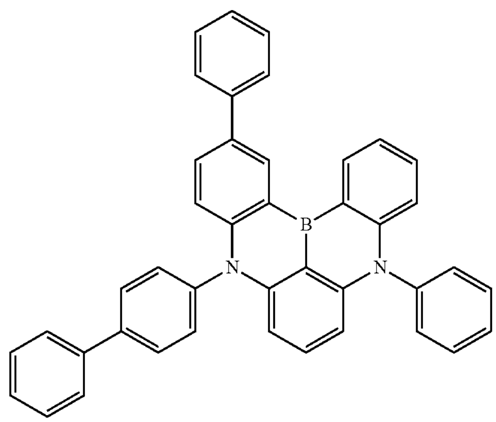
1-72
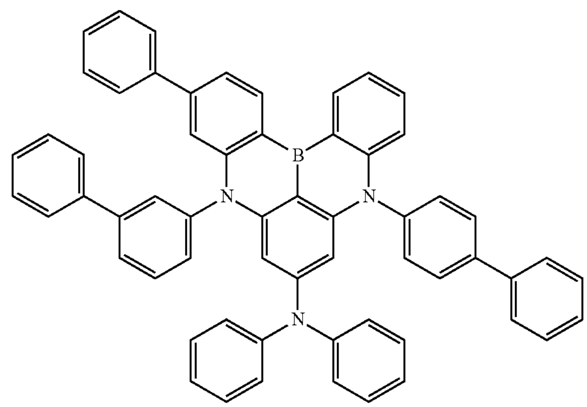
1-73
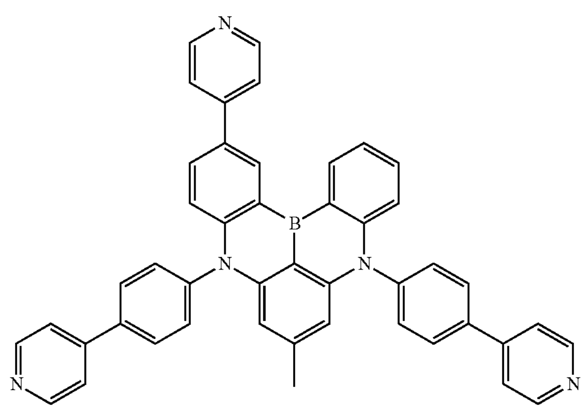
1-74
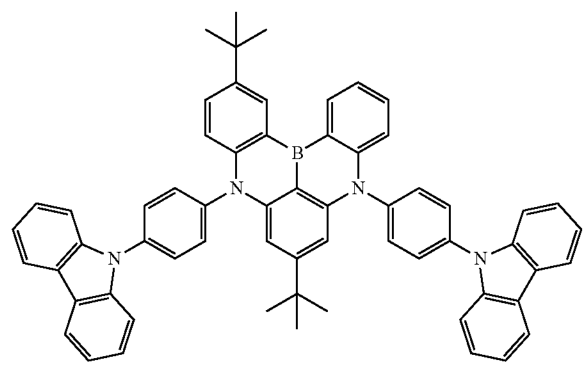
1-75
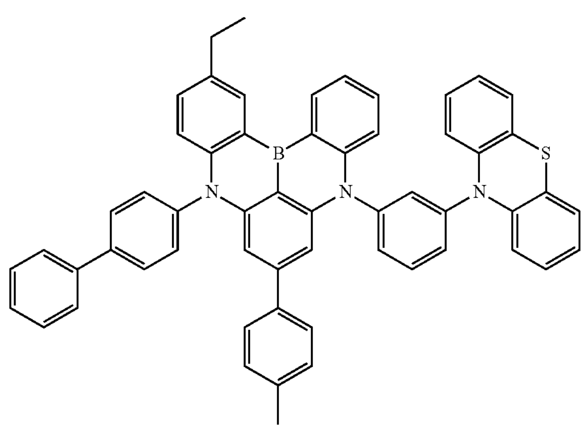
1-76
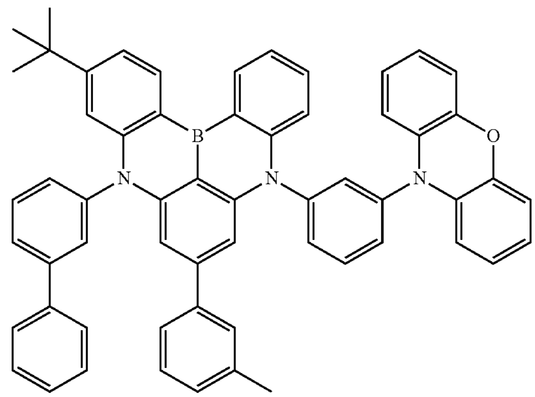

-continued
1-77
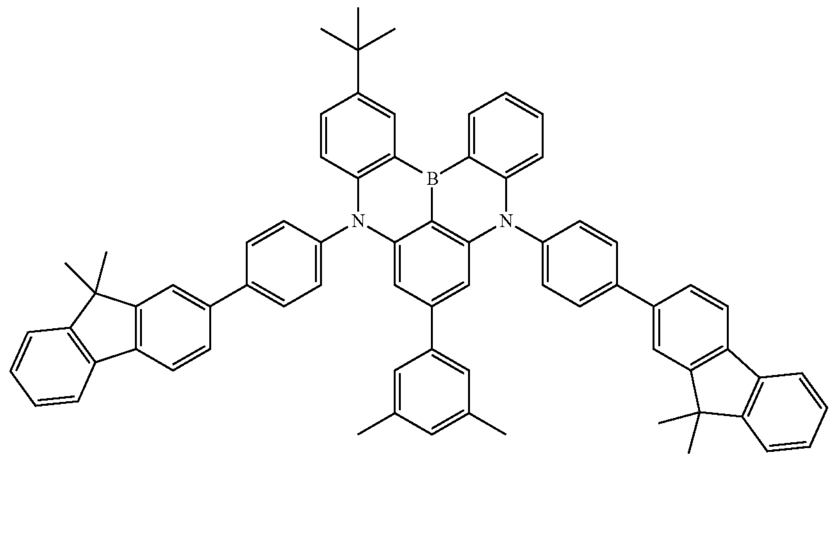
1-78
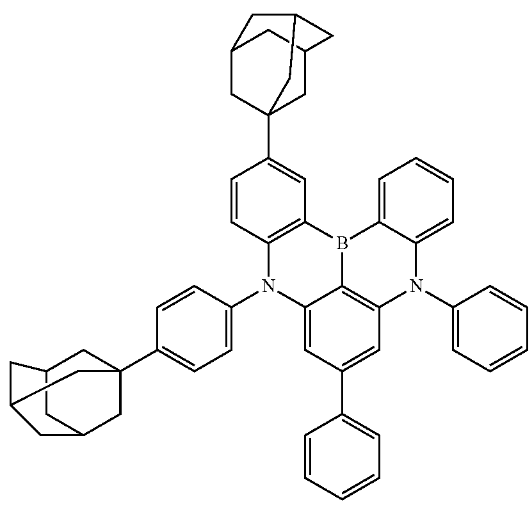
1-79
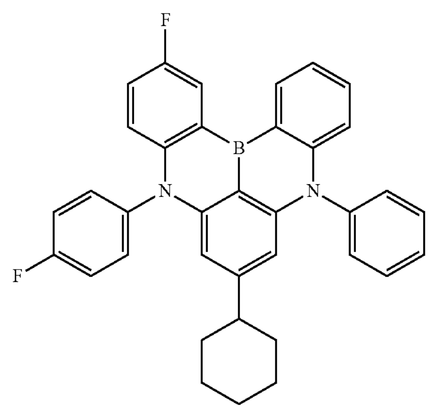
1-80
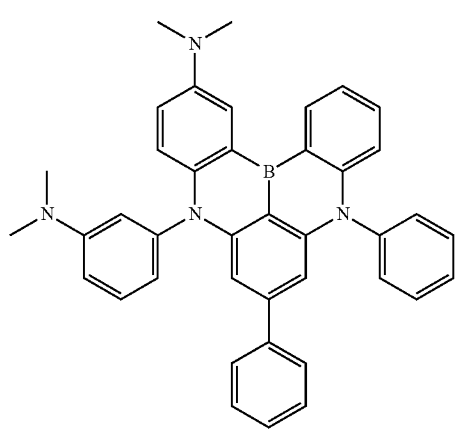
1-81
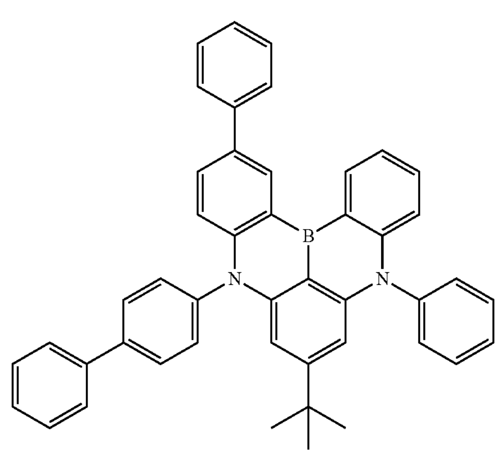

-continued
1-82
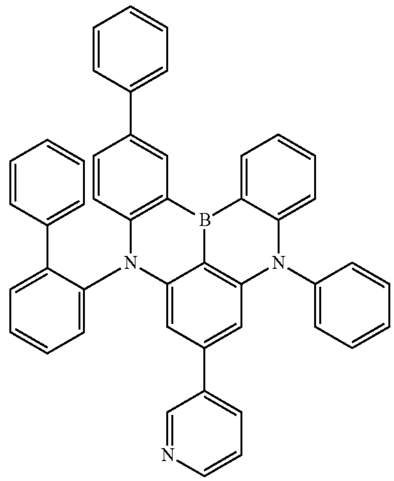
1-83
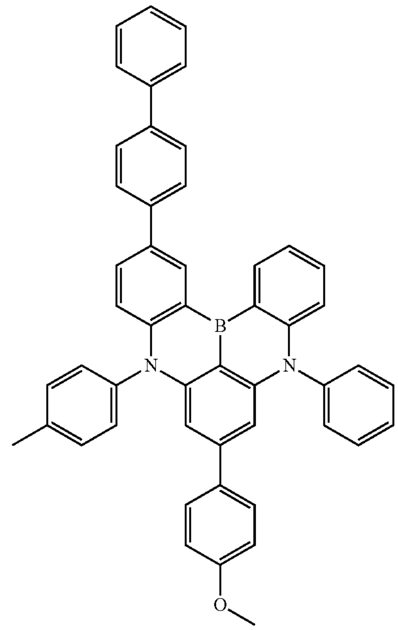
1-84
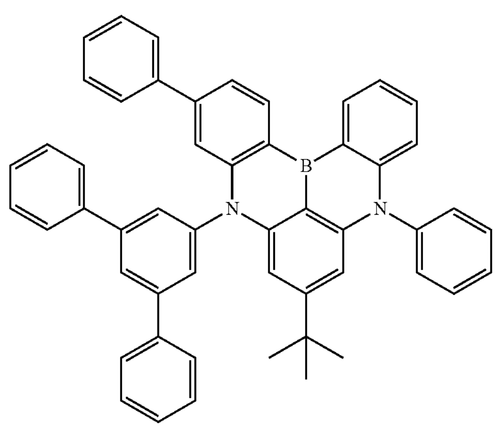
1-85
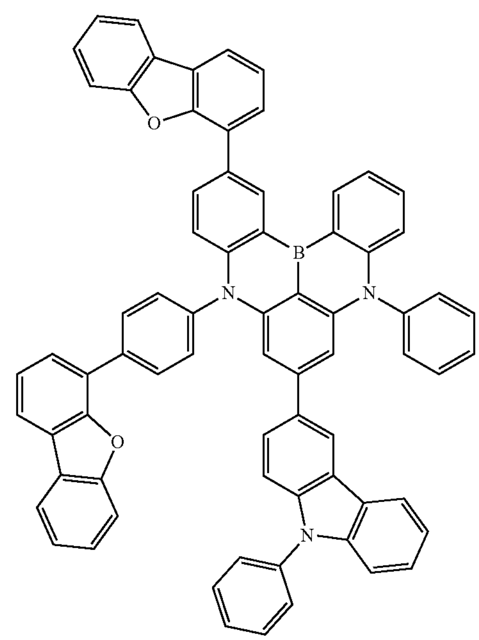

-continued
1-86
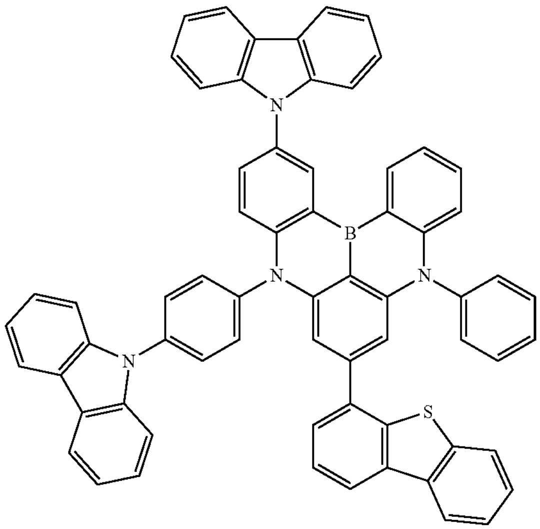
1-87
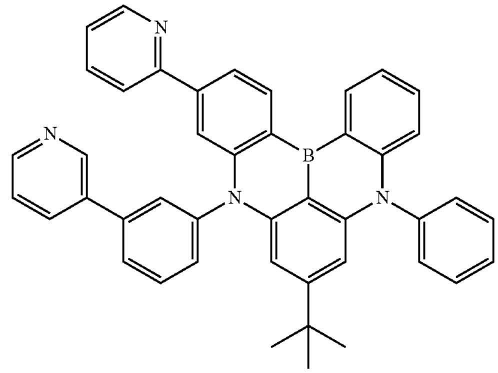
1-88
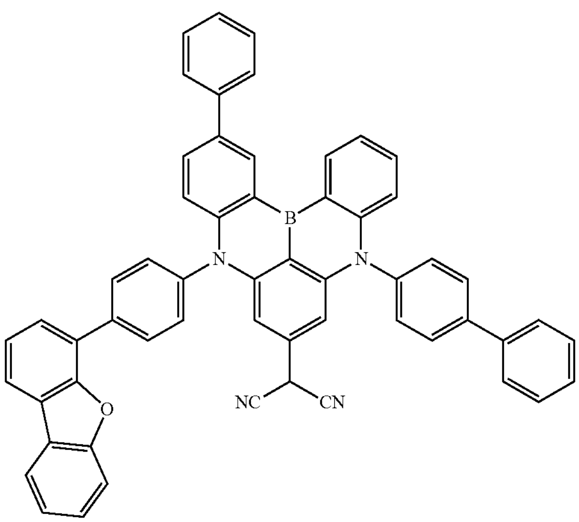
1-89
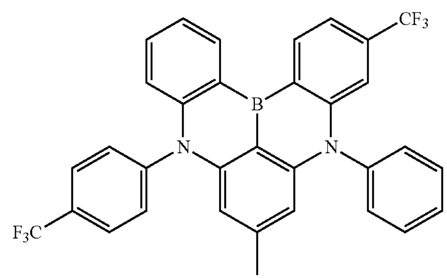
1-90
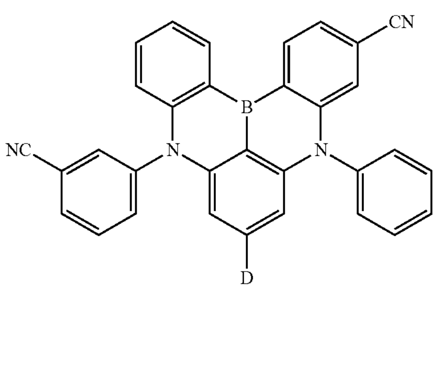
1-91
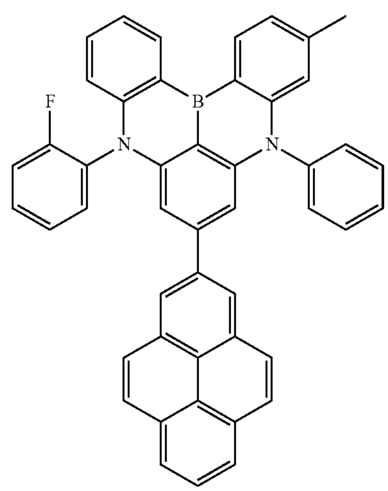

-continued
1-92
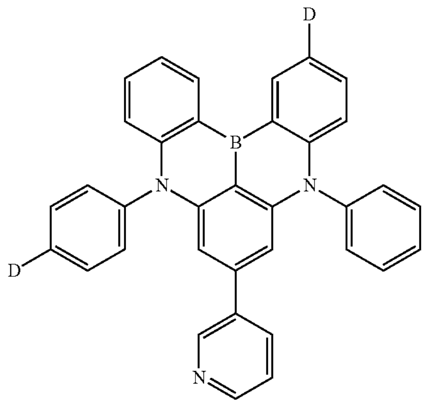
1-93
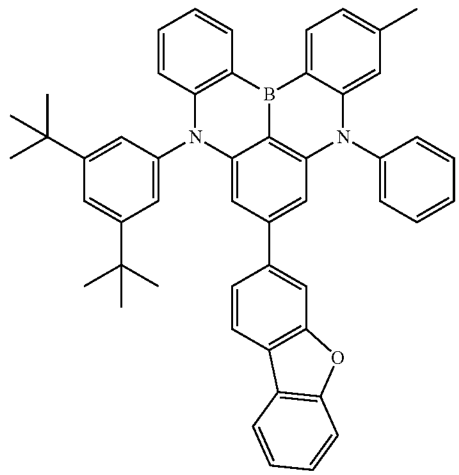
1-94
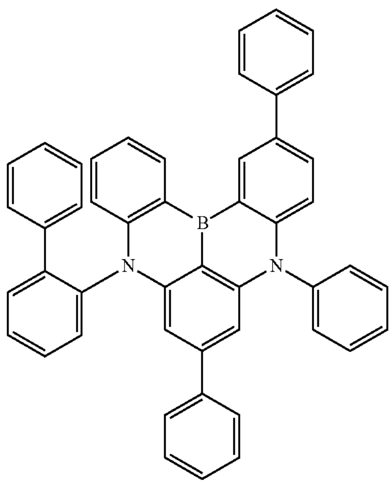
1-95
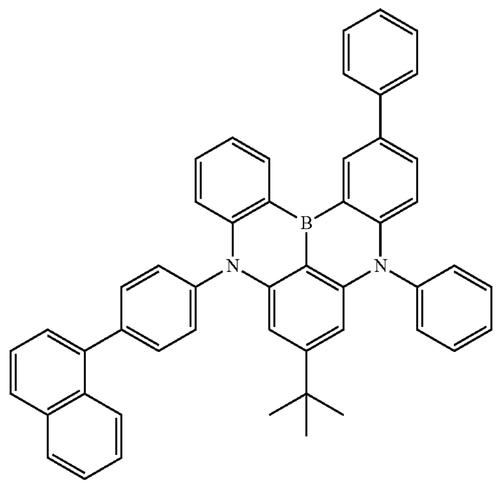
1-96
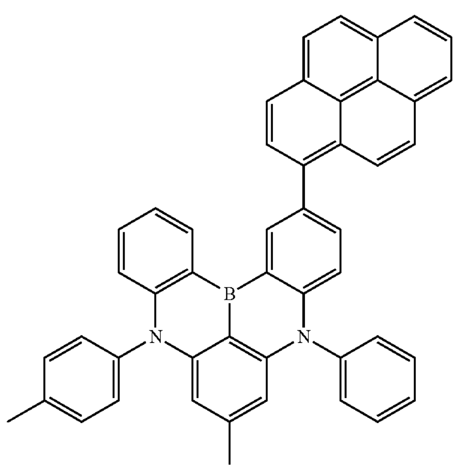
1-97
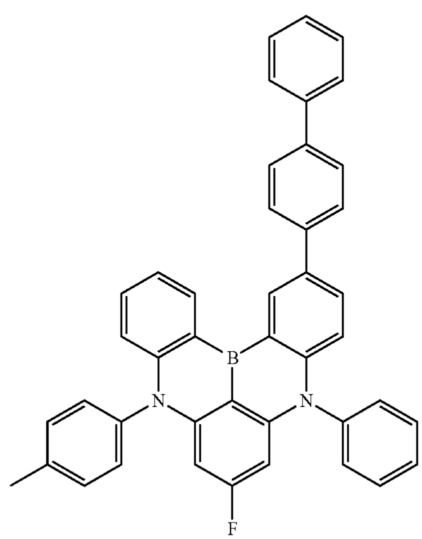

-continued
1-98
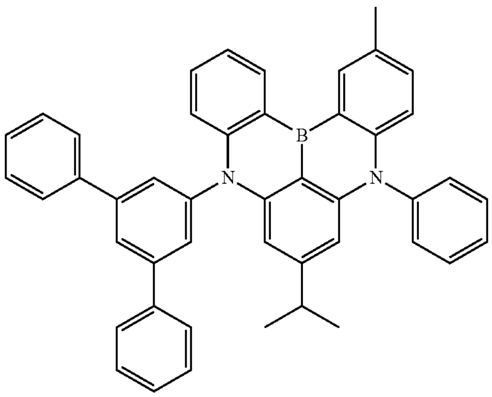
1-99
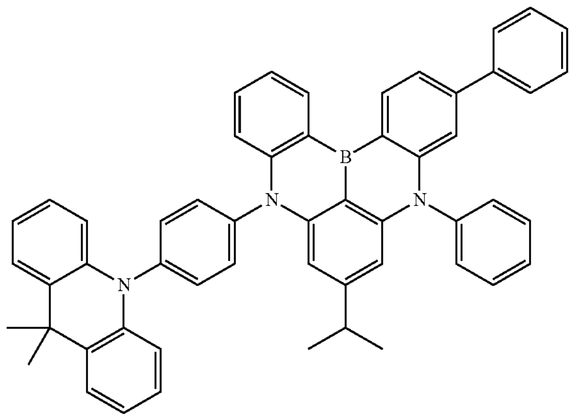
1-100
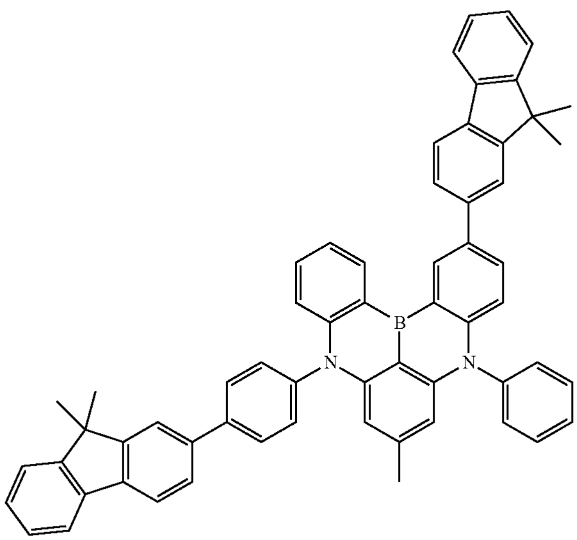
1-101
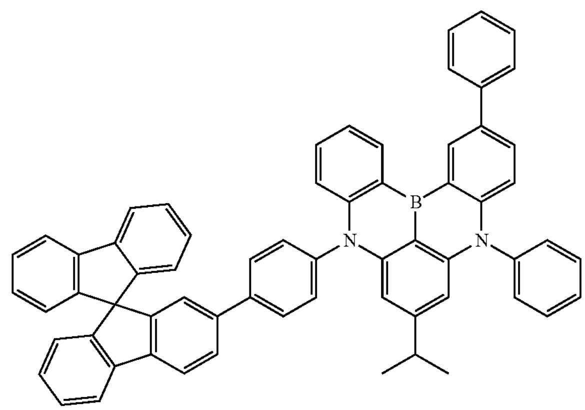
1-102
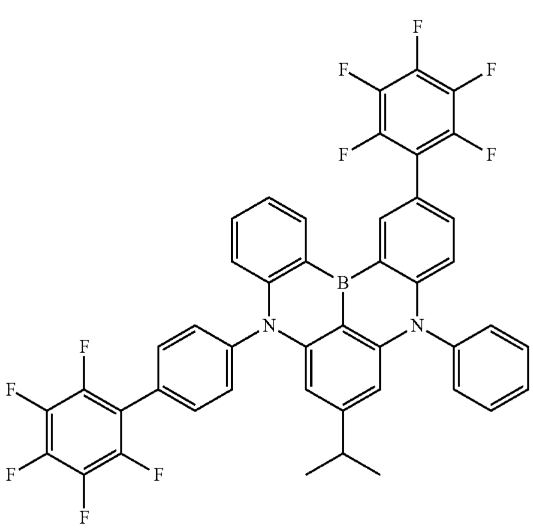
1-103
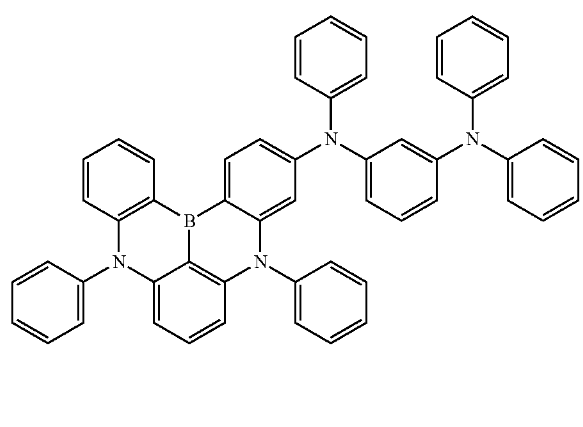

-continued
1-104
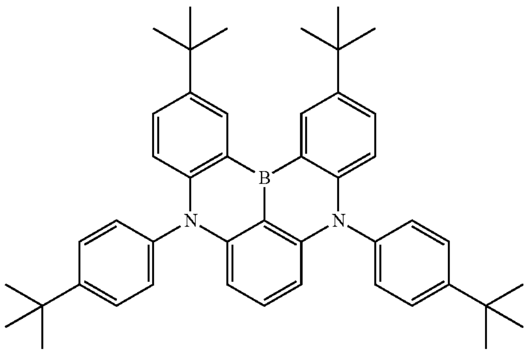
1-105
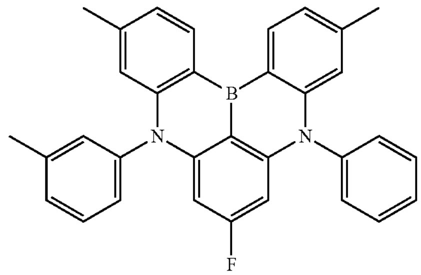
1-106
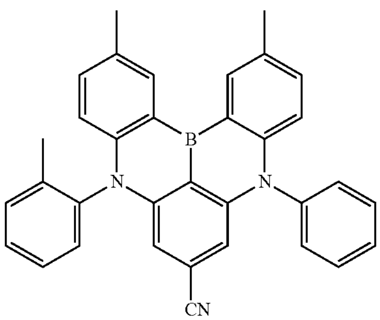
1-107
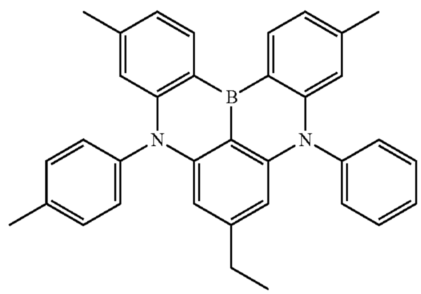
1-108
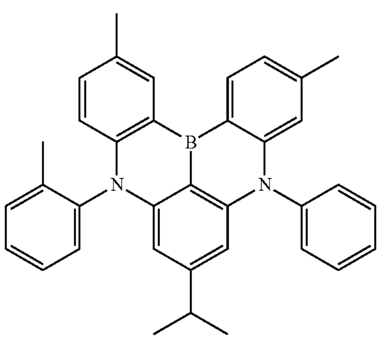
1-109
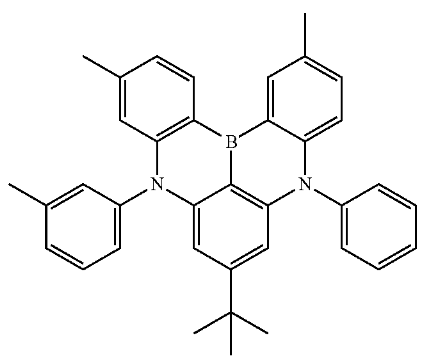
1-110
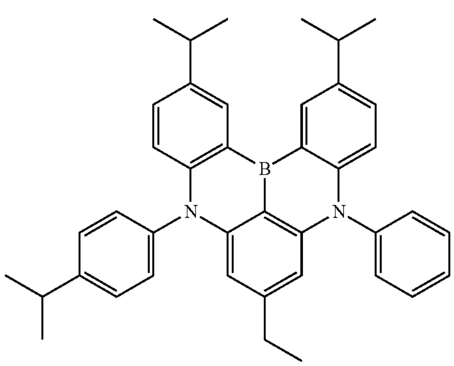
1-111
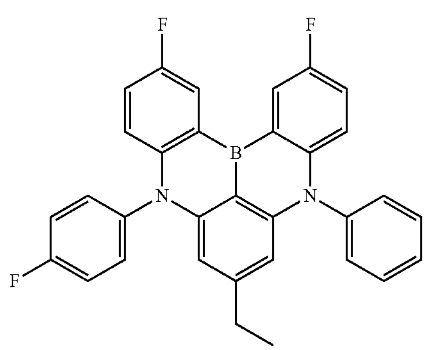

-continued
1-112
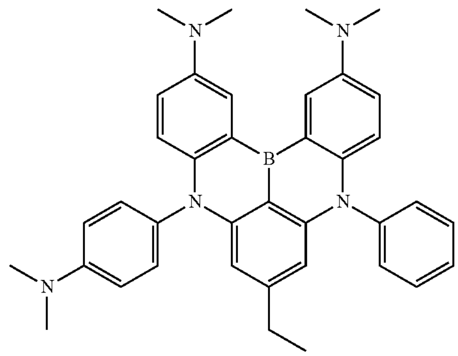
1-113
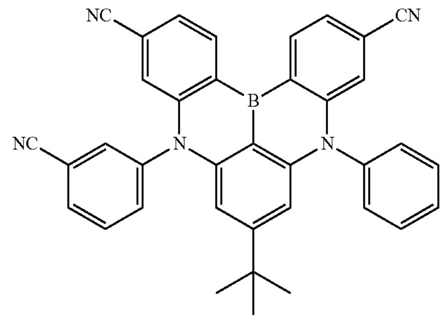
1-114
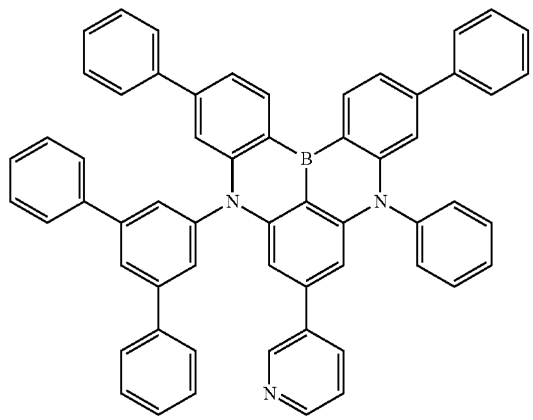
1-115
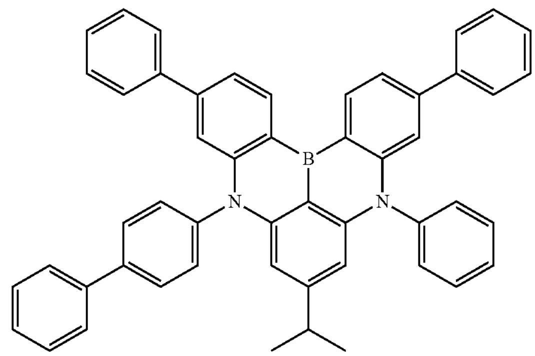
1-116
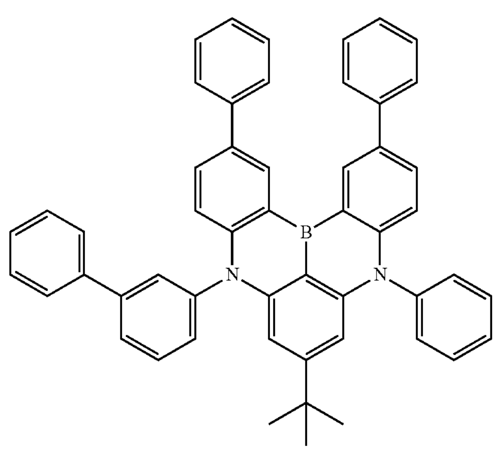
1-117
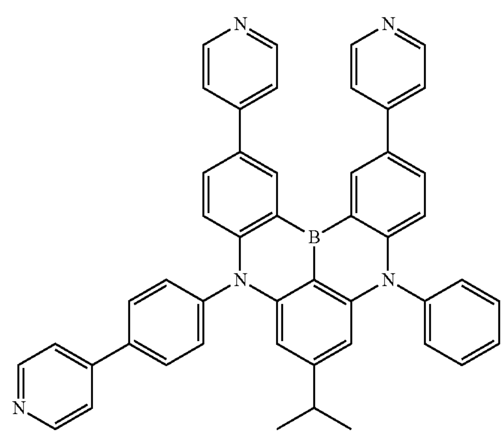

-continued
1-118
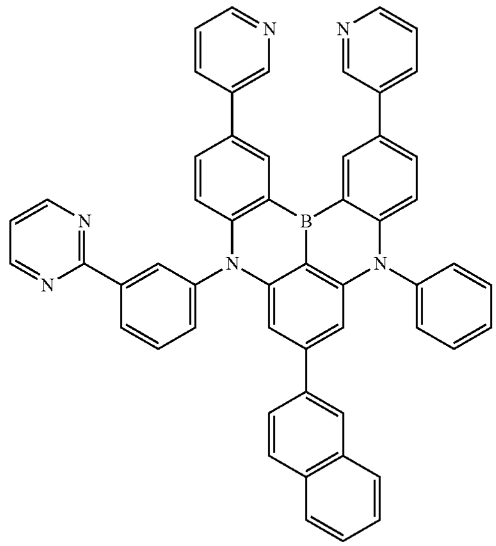
1-119
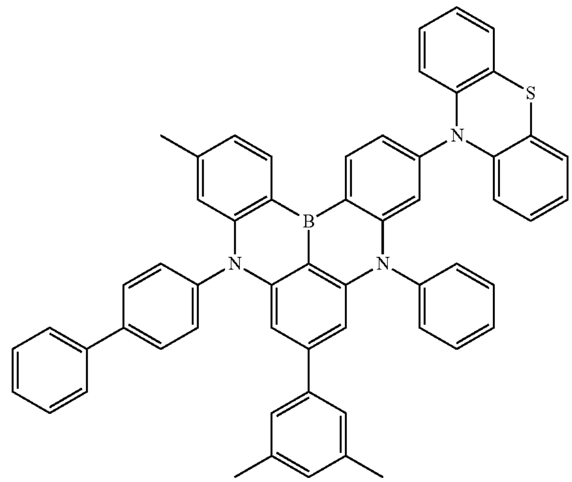
1-120
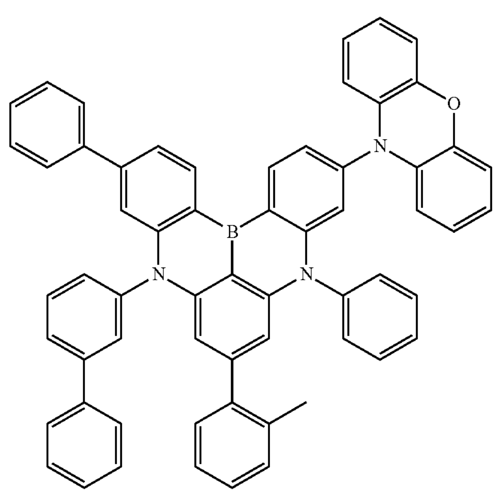
1-121
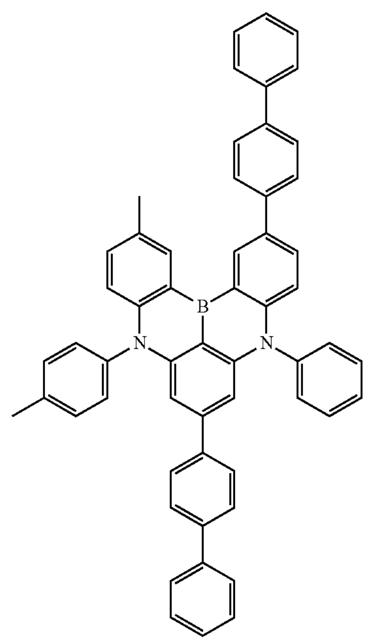

-continued
1-122
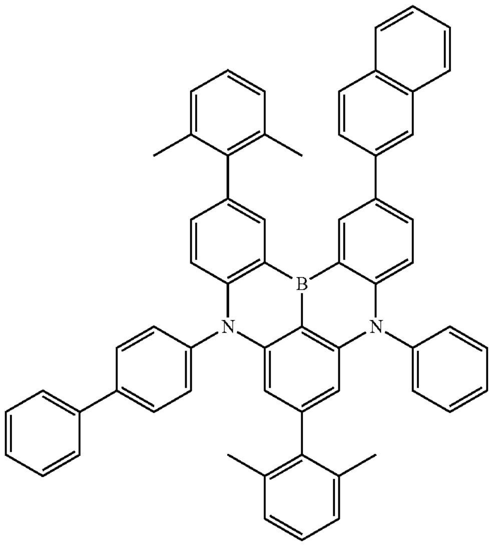
1-123
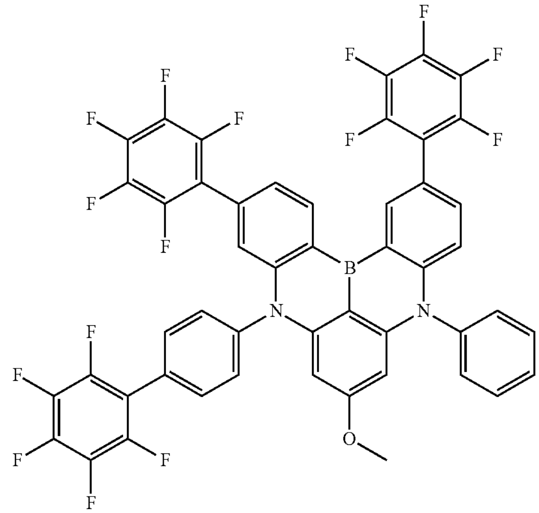
1-124
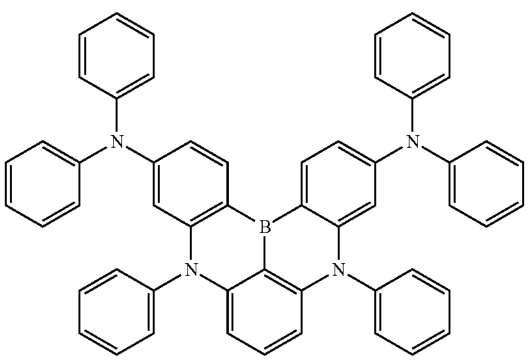
1-125
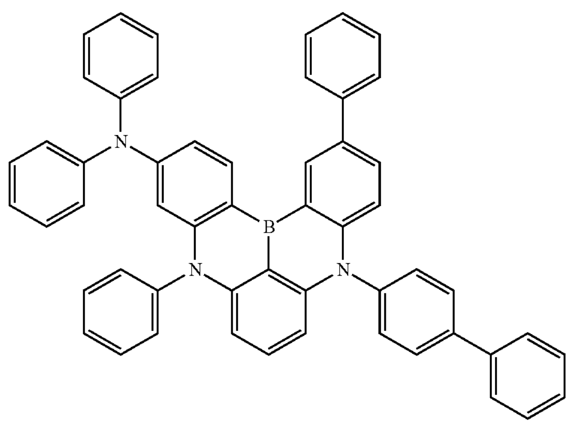
1-126
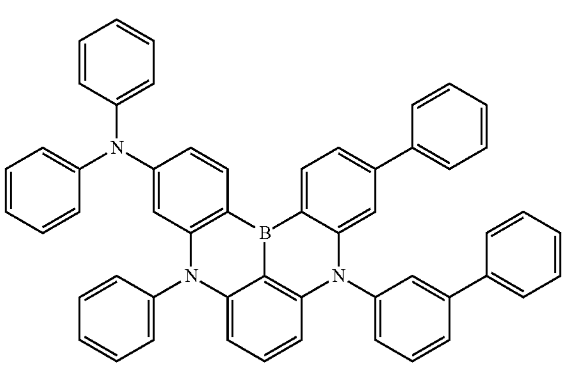
1-127
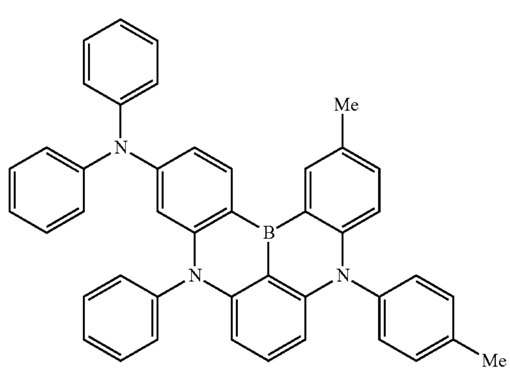

-continued
1-128
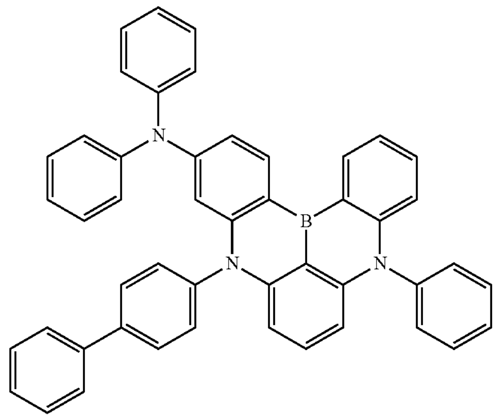
1-129
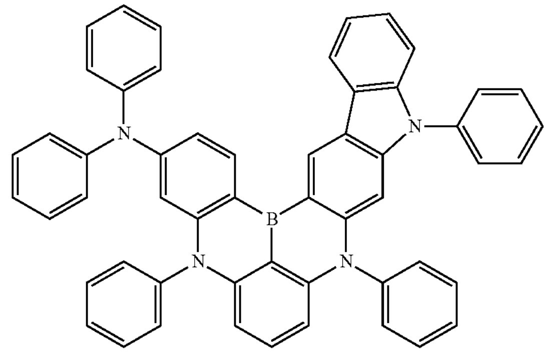
1-130
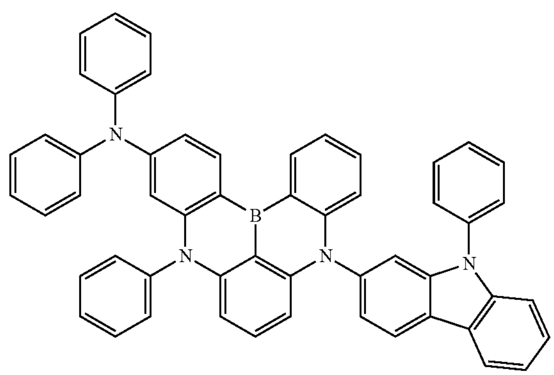
1-131
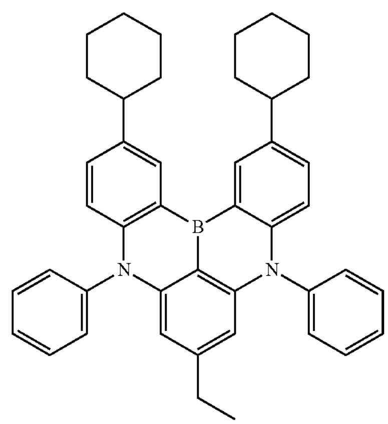
1-132
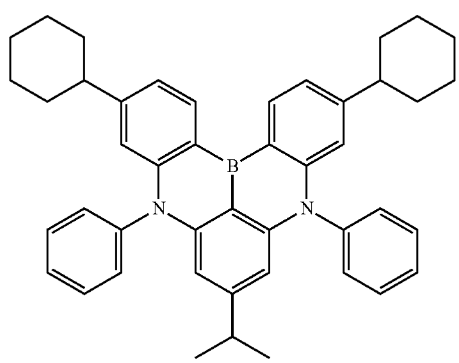
1-133
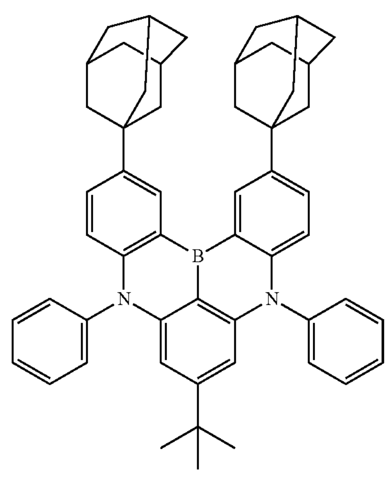

-continued
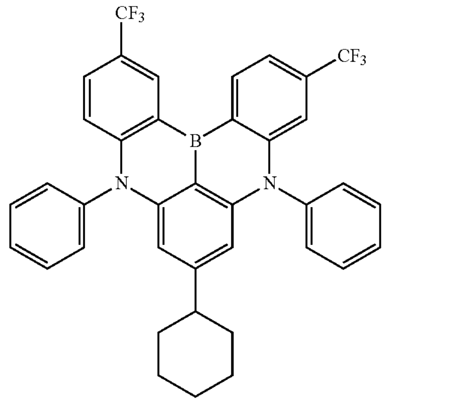
1-134
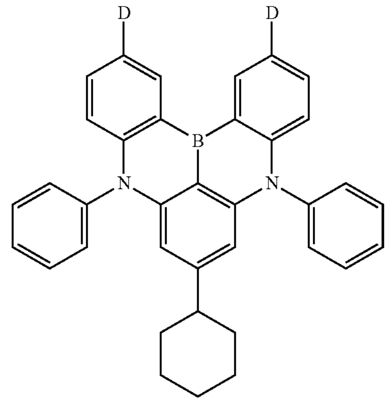
1-135
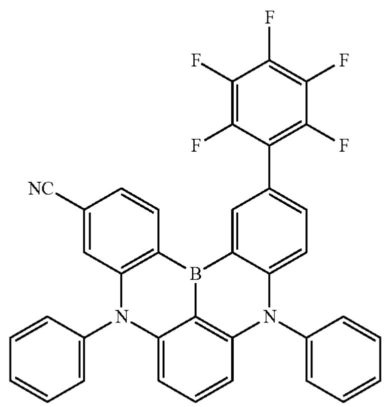
1-136
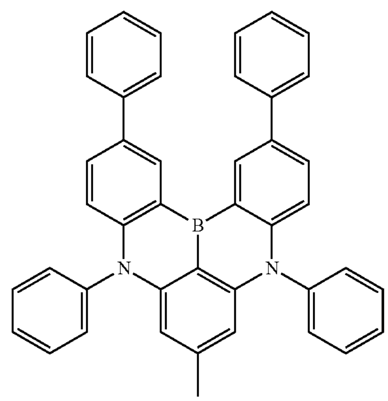
1-137
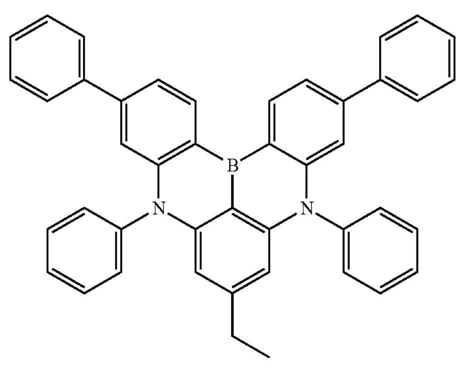
1-138
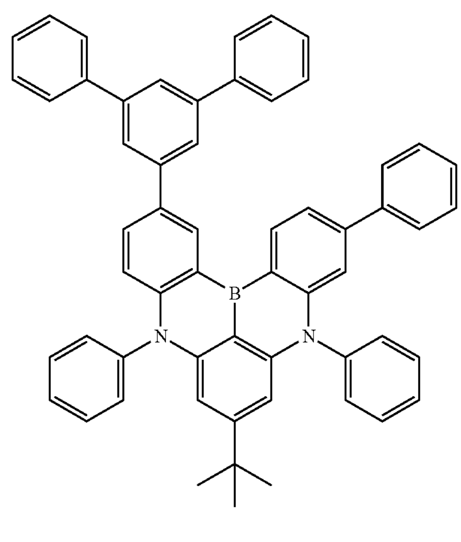
1-139

-continued
1-140
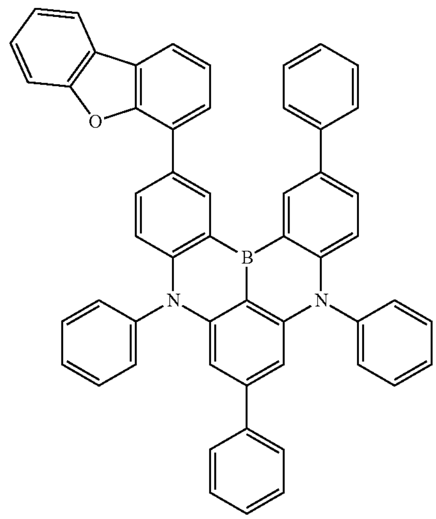
1-141
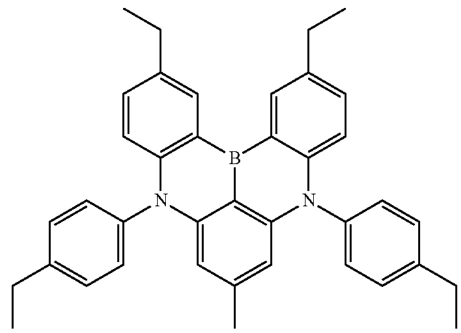
1-142
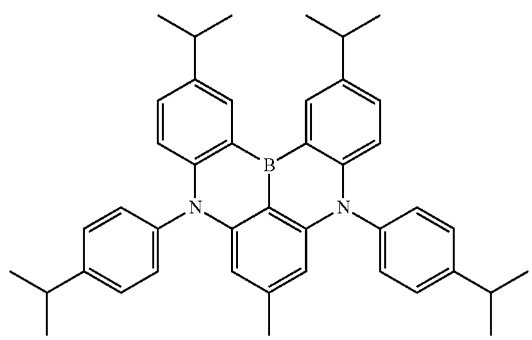
1-143
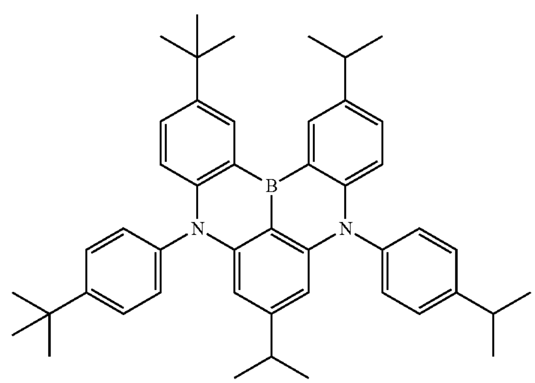
1-144
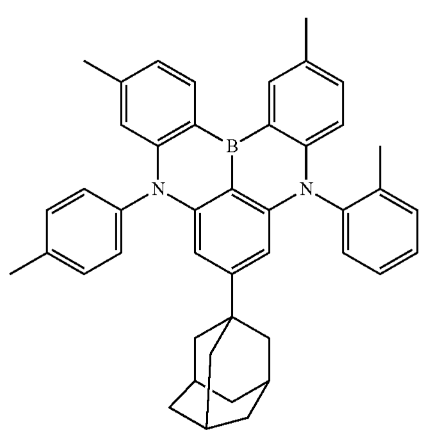
1-145
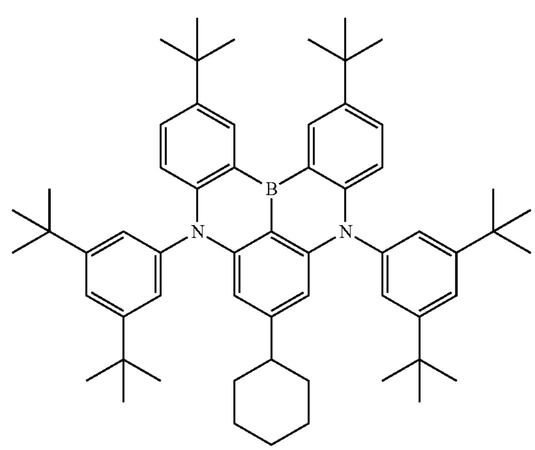

-continued
1-146
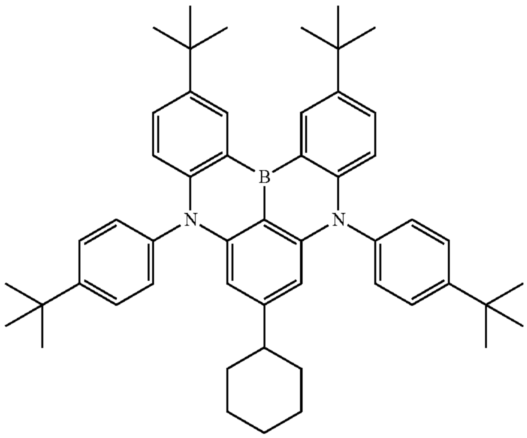
1-147
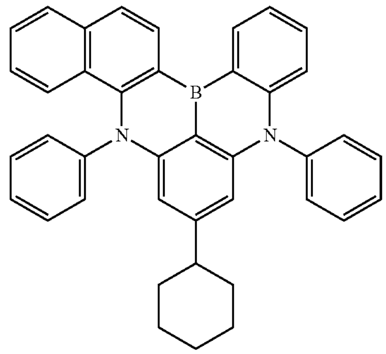
1-148
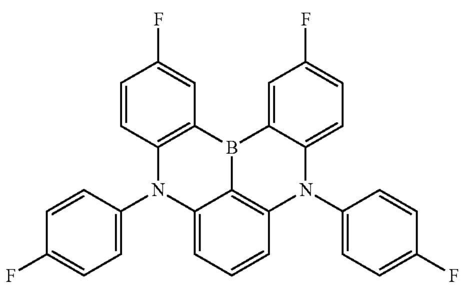
1-149
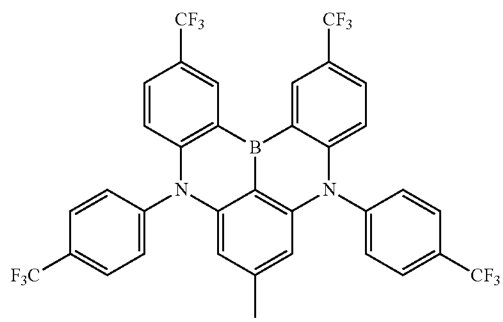
1-150
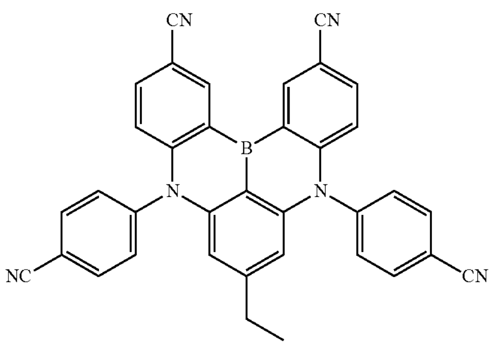
1-151
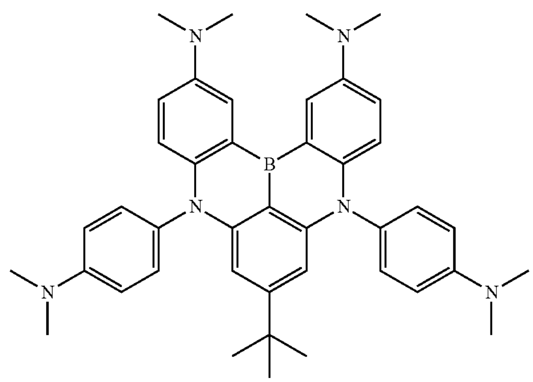
1-152
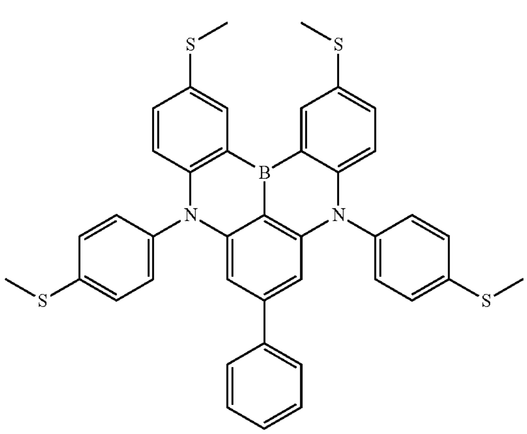
1-153
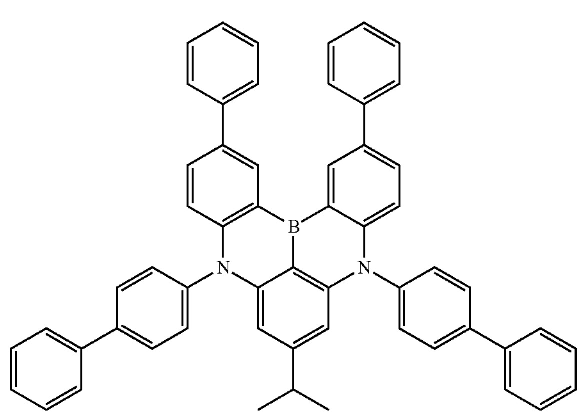

-continued
1-154
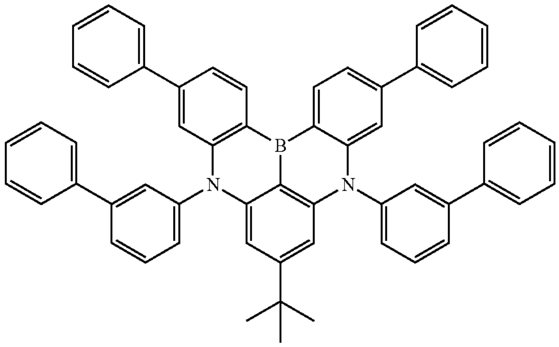
1-155
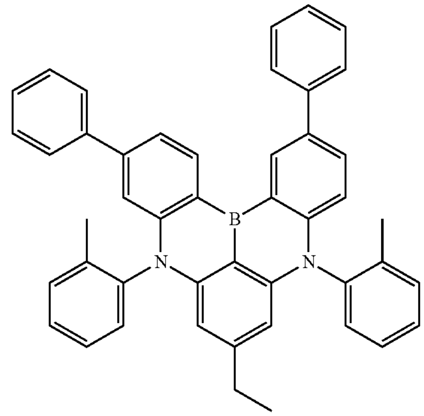
1-156
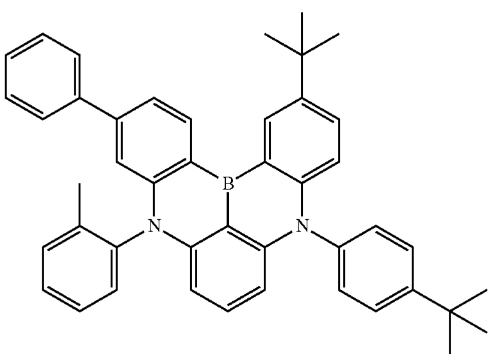
1-157
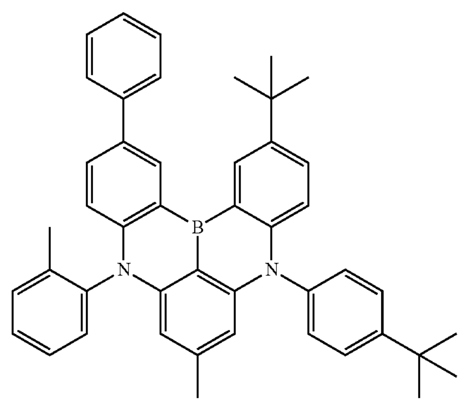
1-158
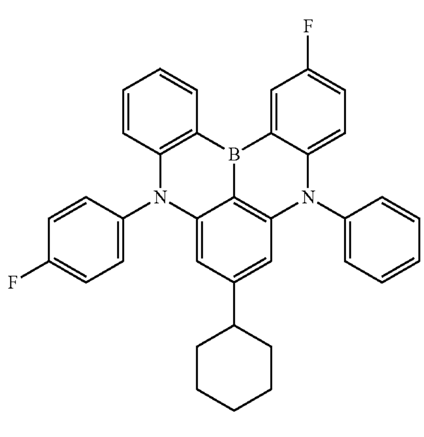
1-159
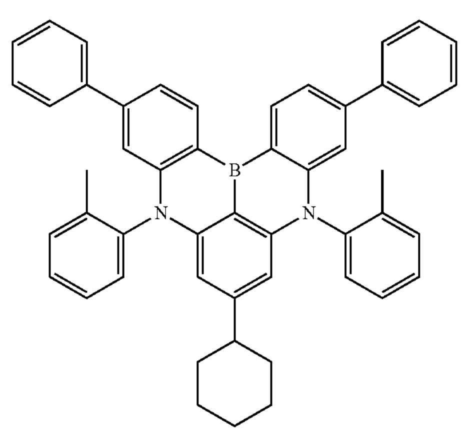

-continued
1-160
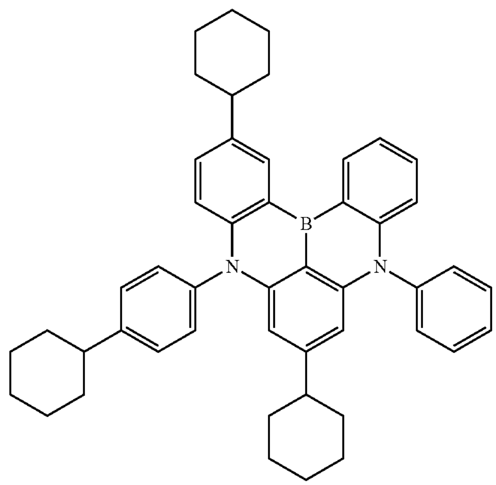
1-161
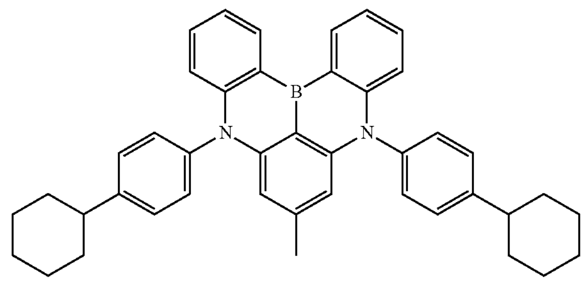
1-162
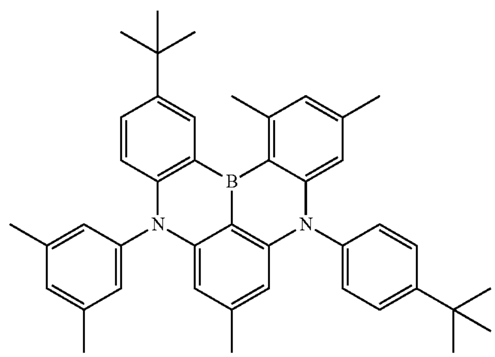
1-163
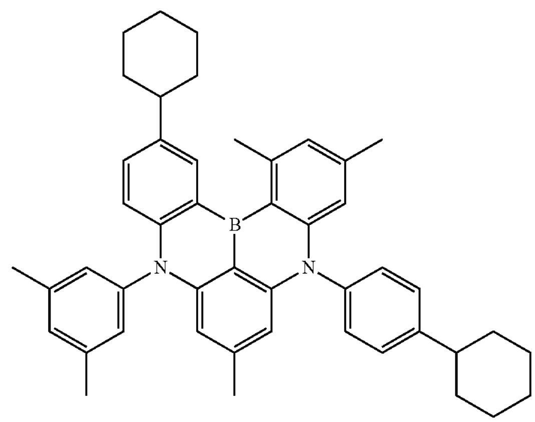
1-164
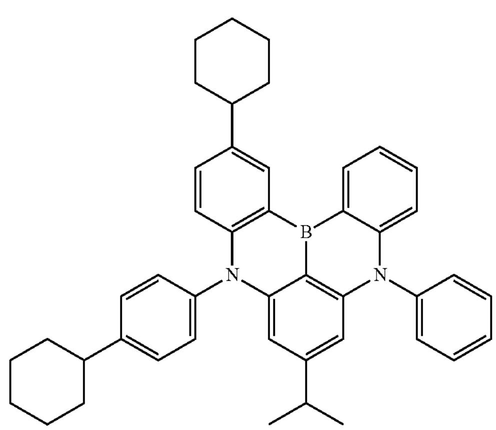
1-165
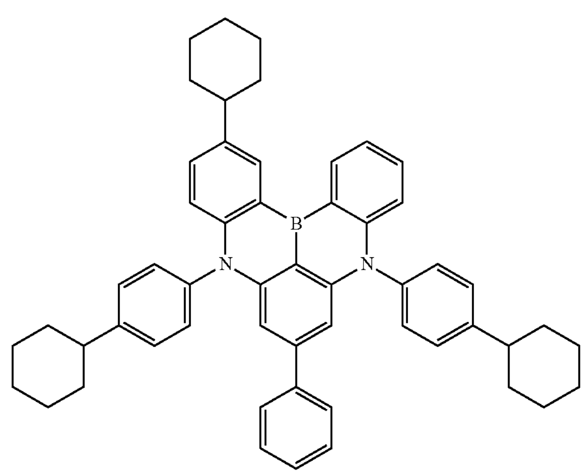

-continued
1-166
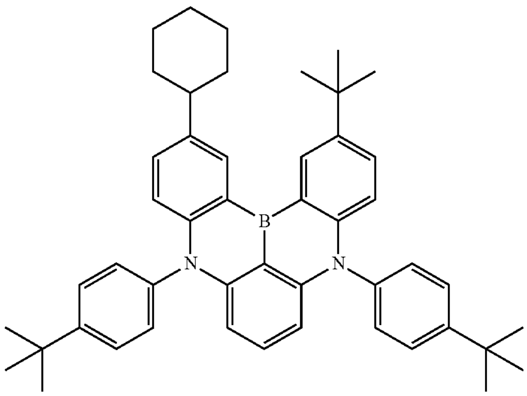
1-167
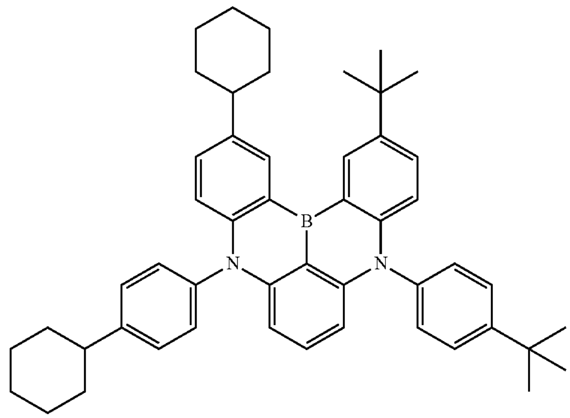
1-168
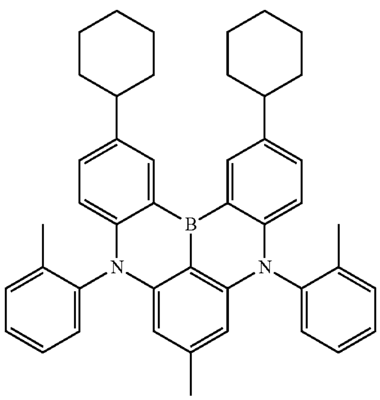
1-169
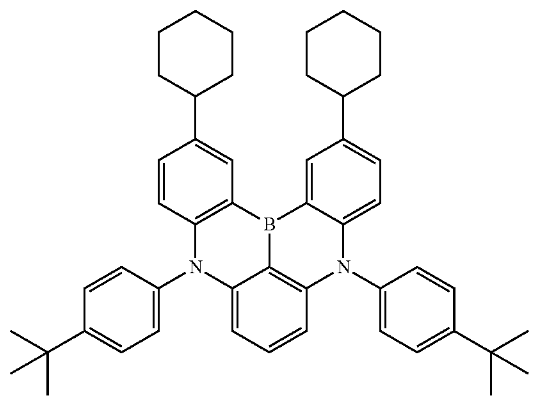
1-170
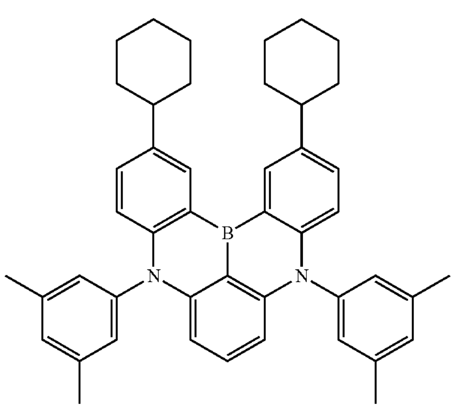
1-171
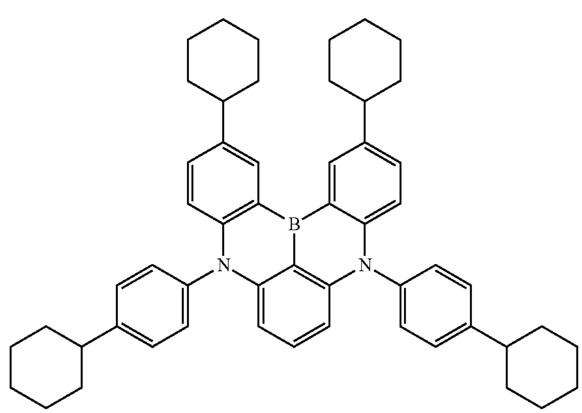

-continued
1-172
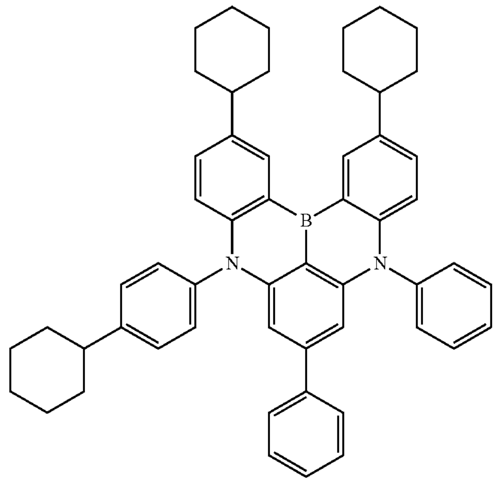
1-173
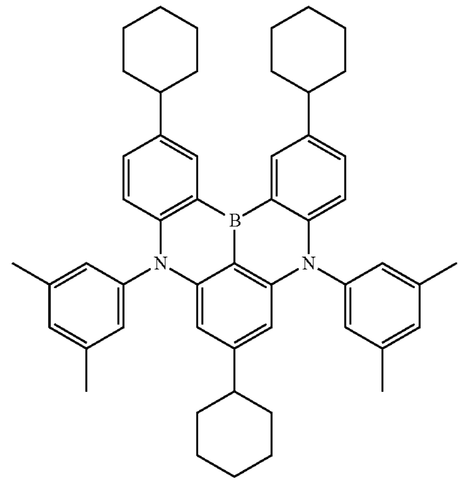
1-174
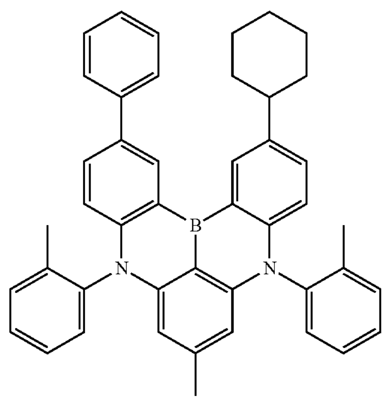
1-175
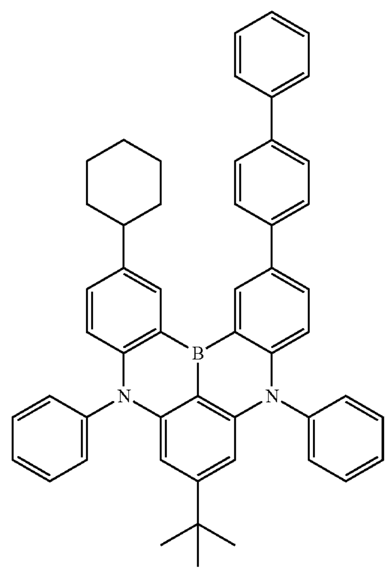
1-176
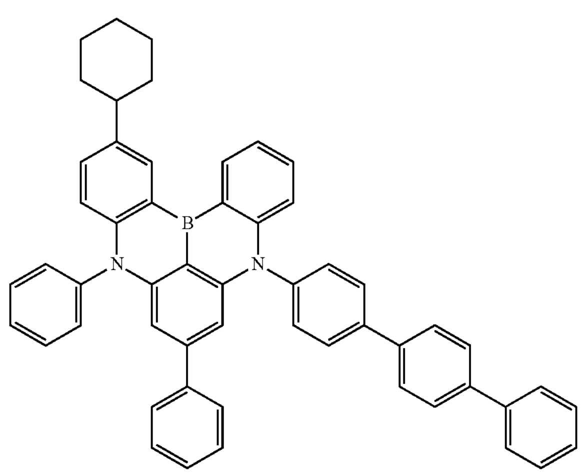
1--177
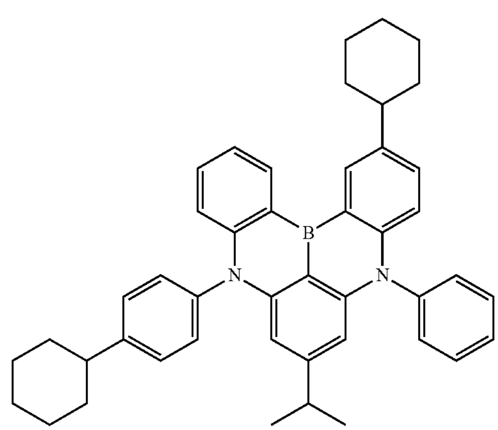

-continued
1-178
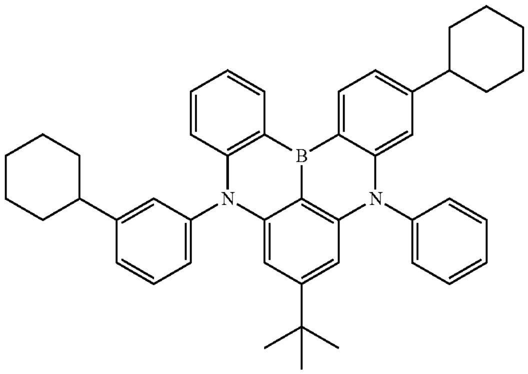
1-179
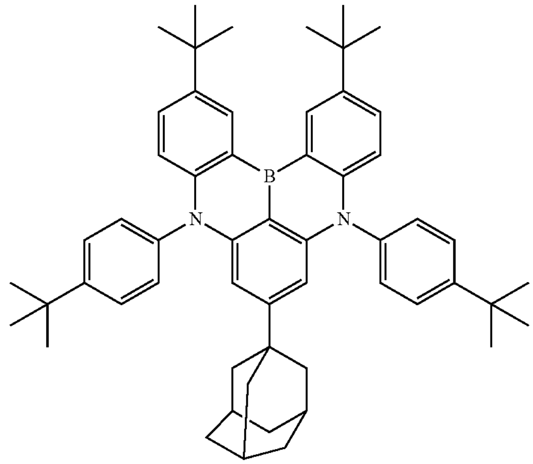
1-180
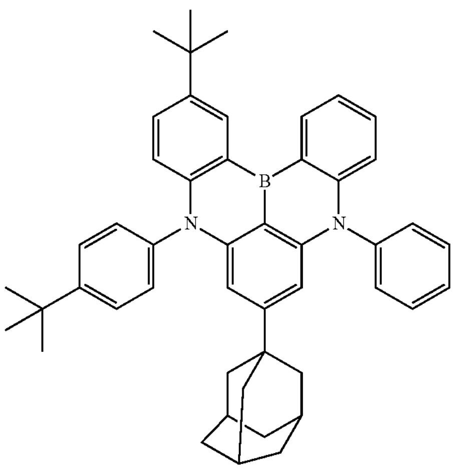
1-181
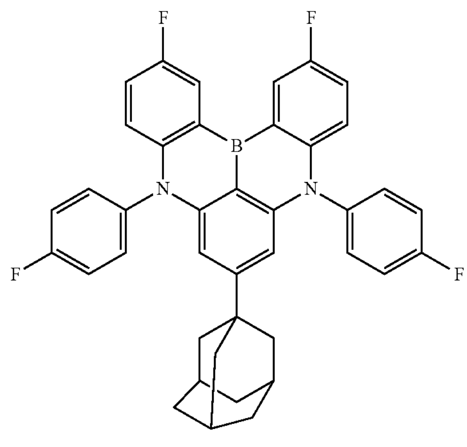
1-182
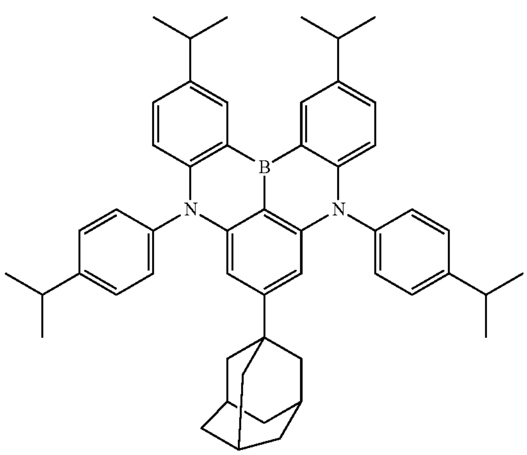
1-183
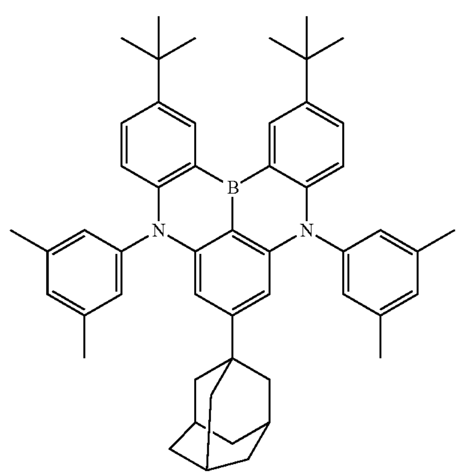

-continued
1-184
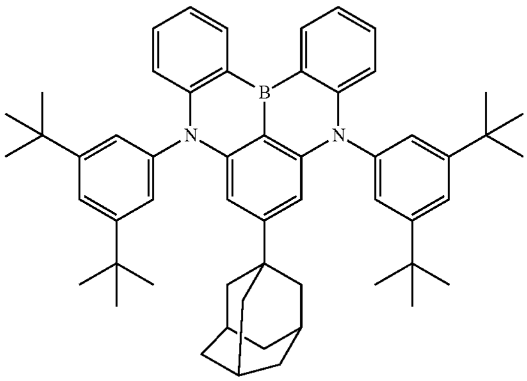
1-185
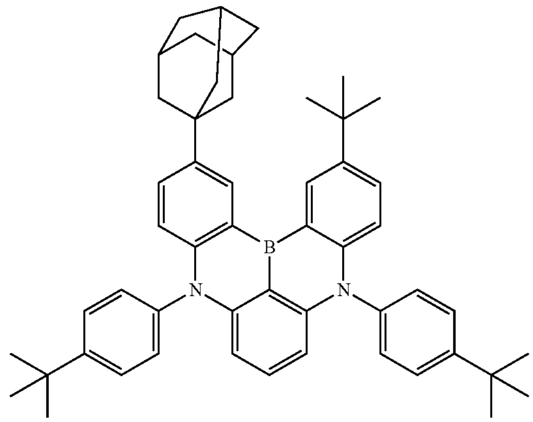
1-186
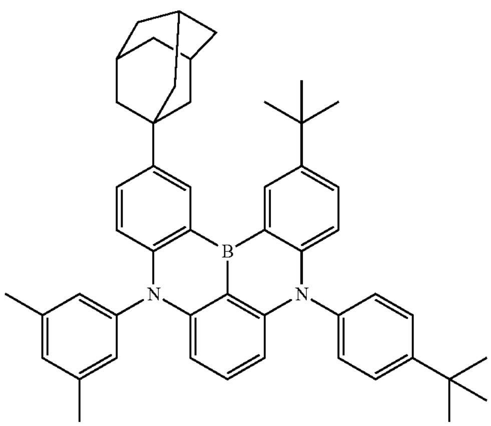
1-187
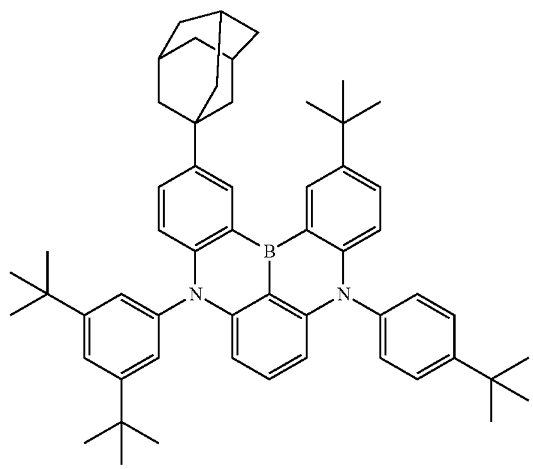
1-188
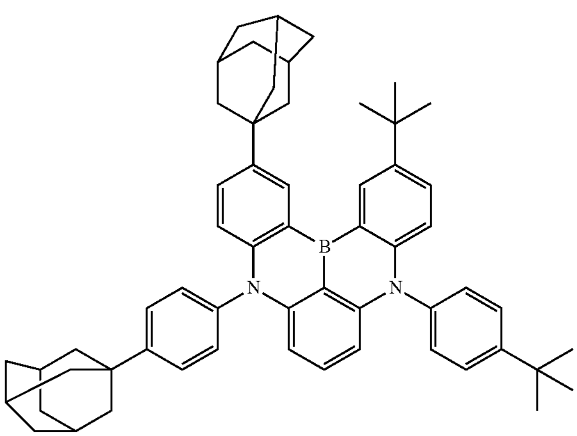
1-189
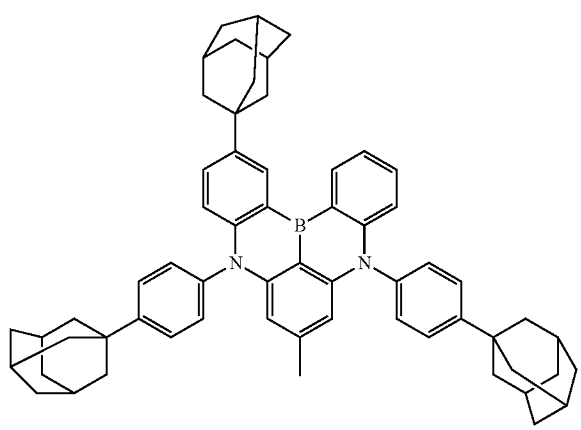

-continued
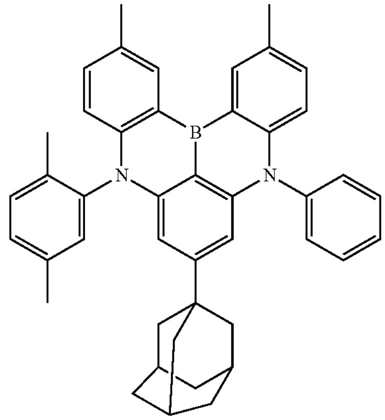
1-190
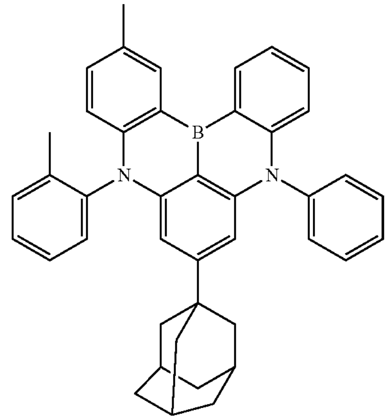
1-191
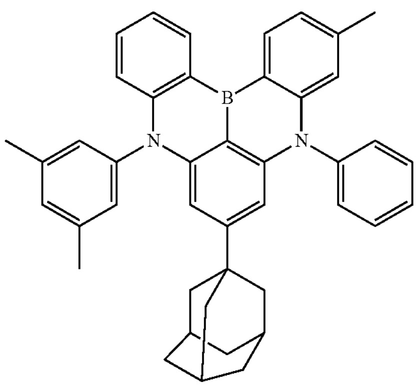
1-192
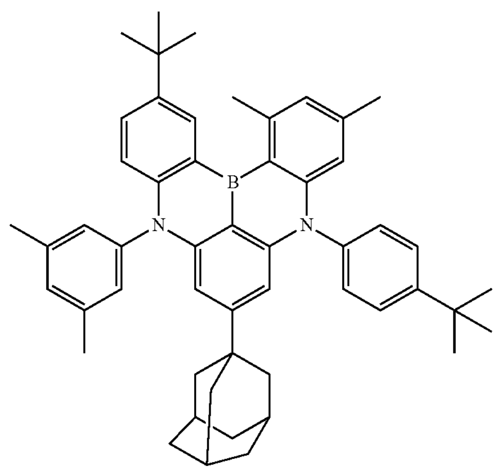
1-193
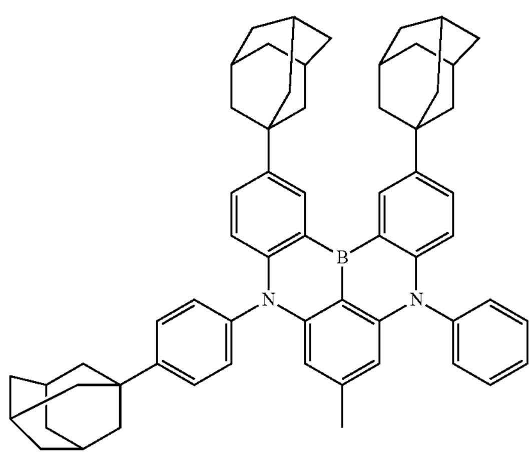
1-194
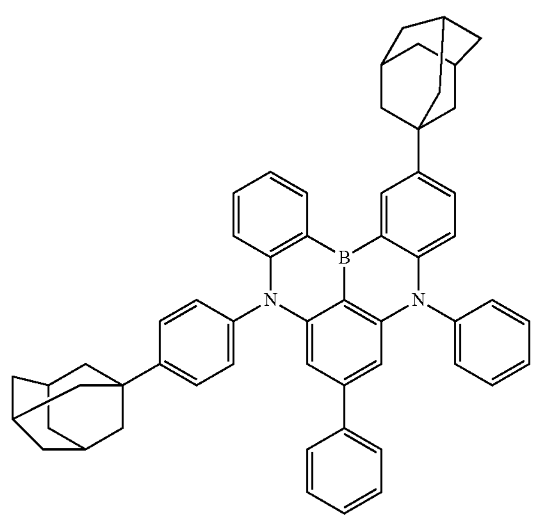
1-195

-continued
1-196
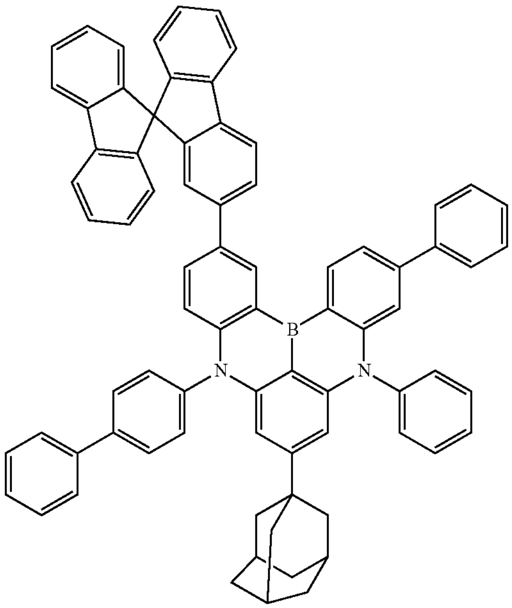
1-197
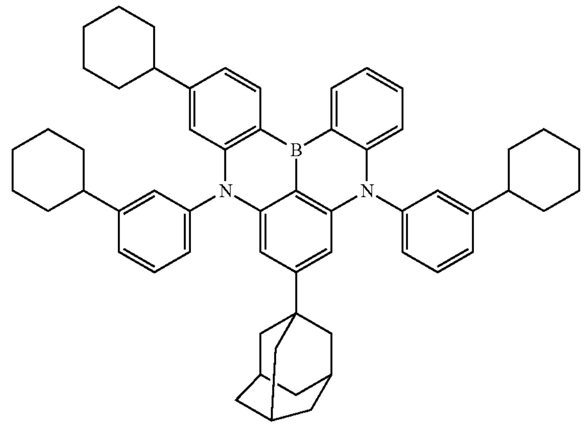
1-198
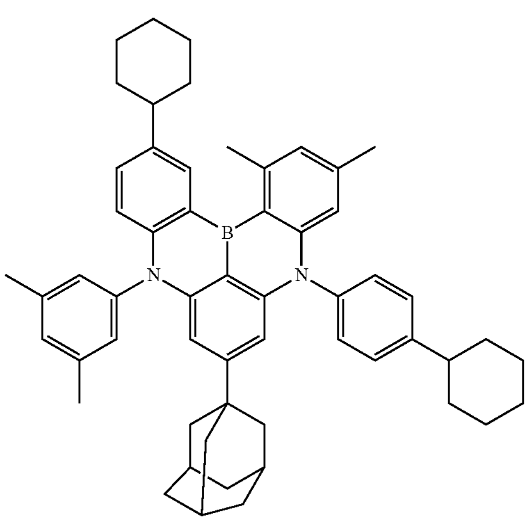
1-199
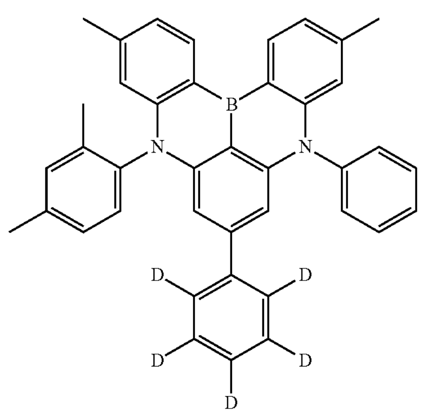

-continued
1-200
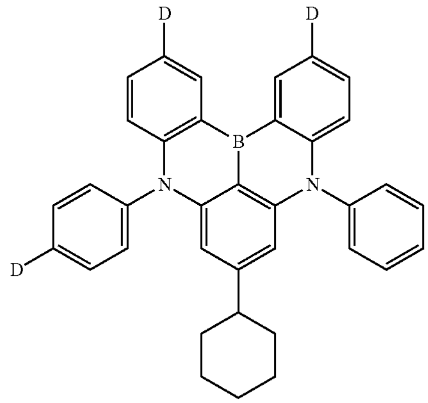
1-201
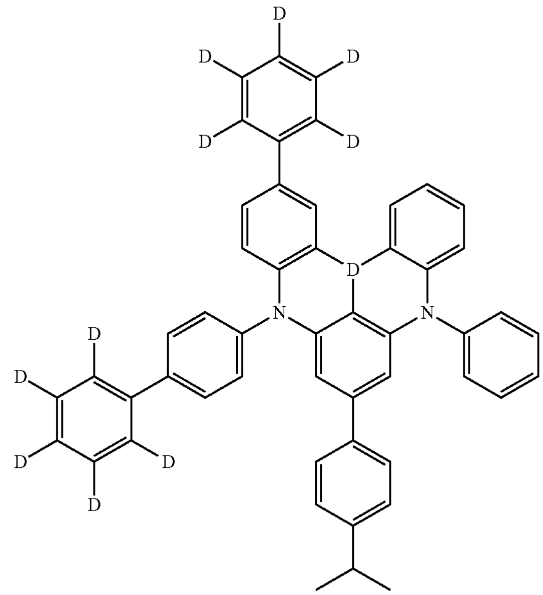
1-202
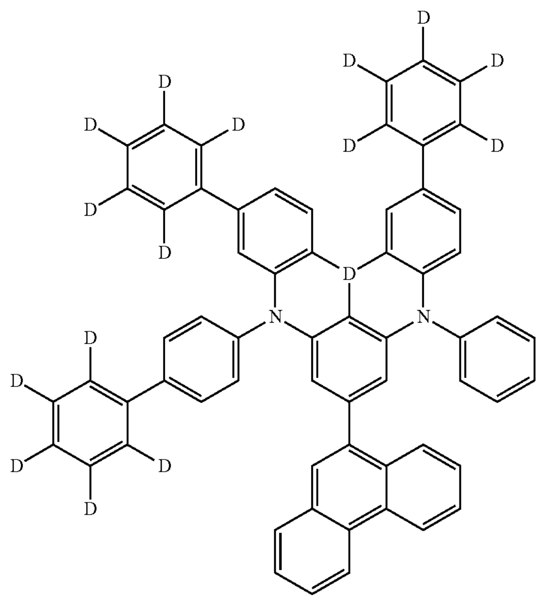
1-203
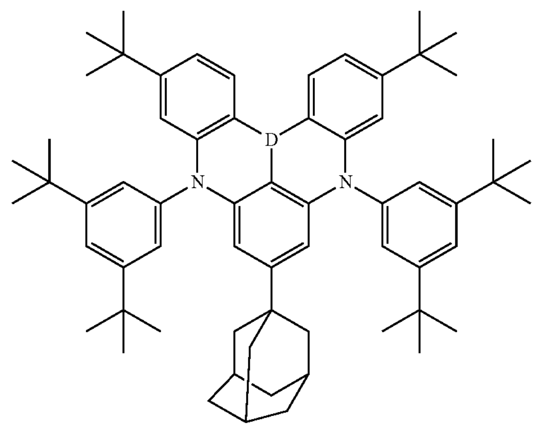
1-204
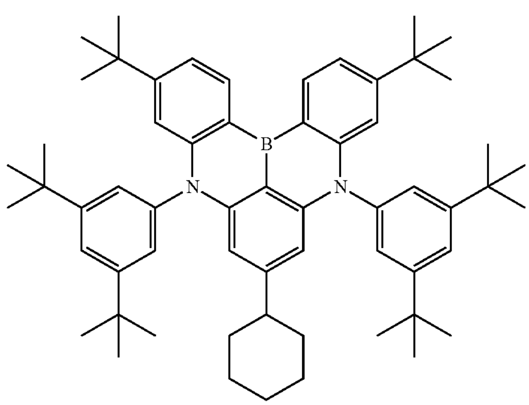
1-205
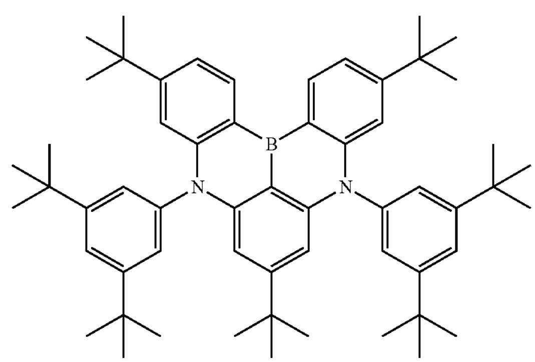

-continued
1-206
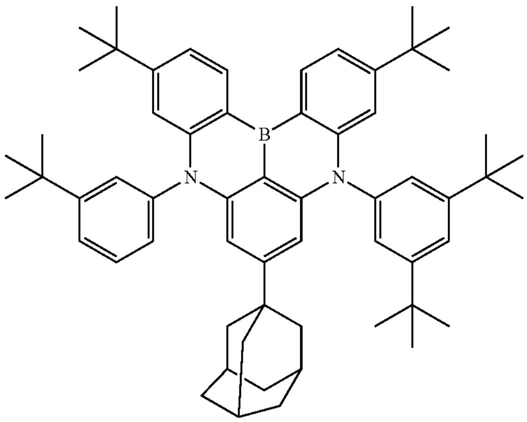
1-207
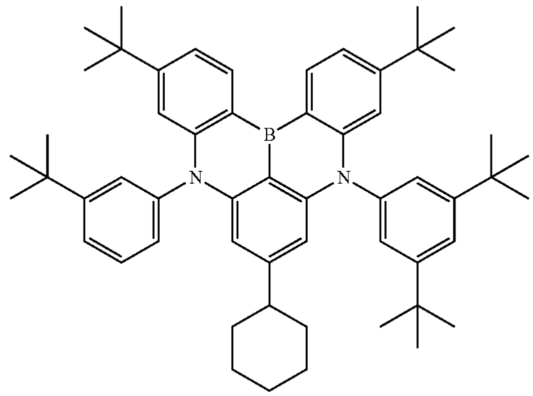
1-208
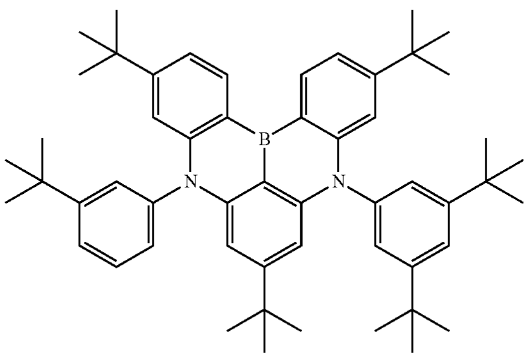
1-209
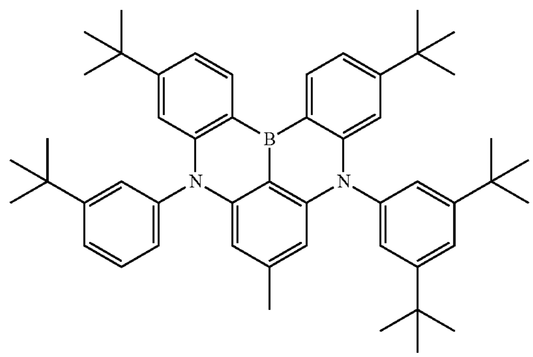
1-210
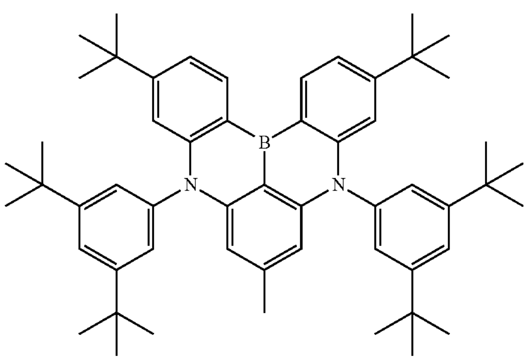
1-211
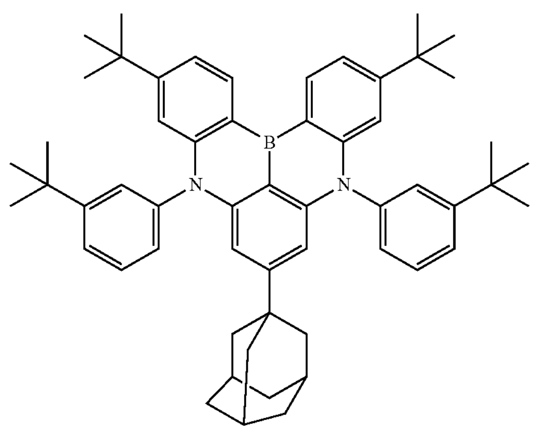
1-212
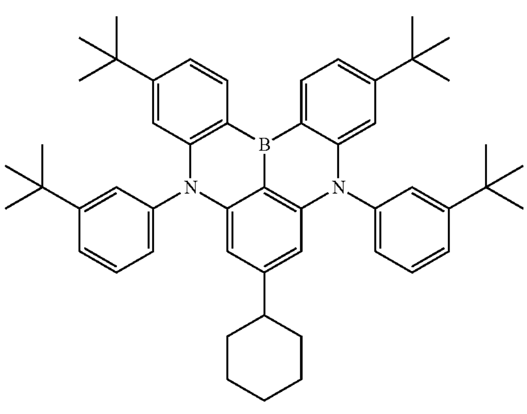
1-213
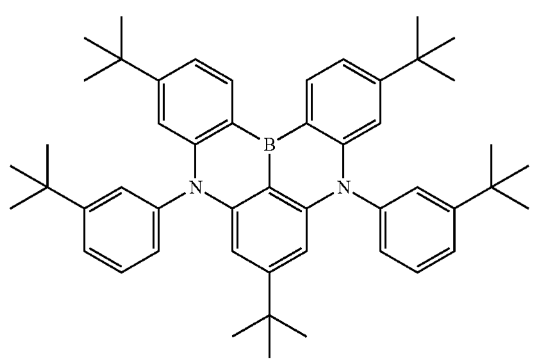

-continued
1-214
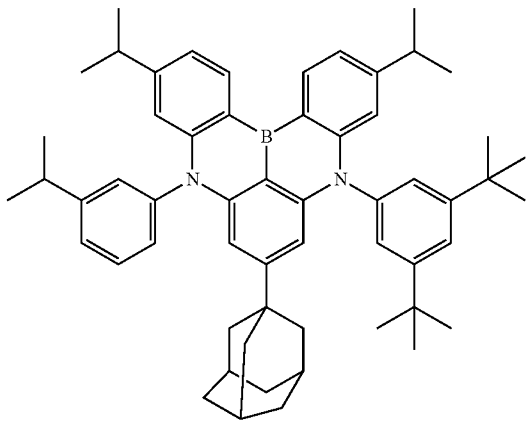
1-215
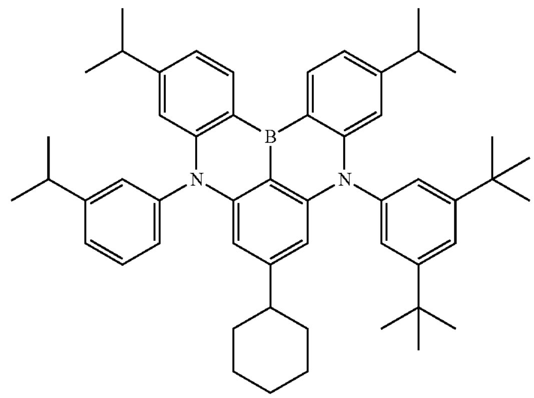
1-216
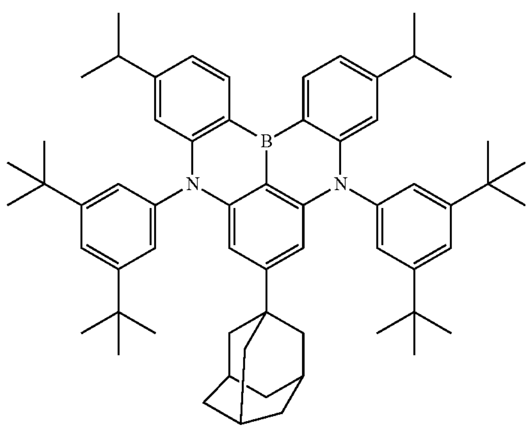
1-217
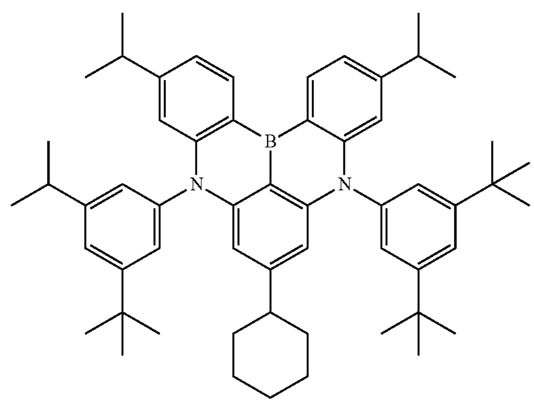
1-218
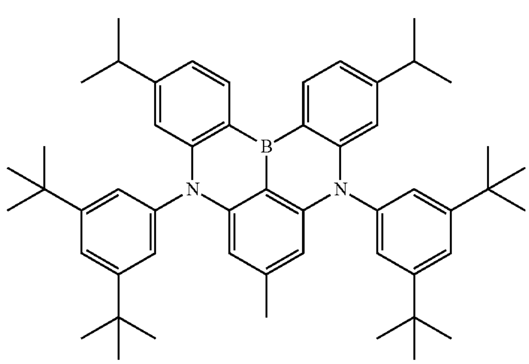
1-219
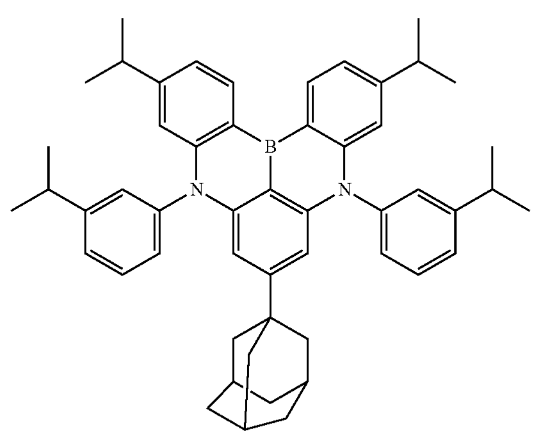

-continued
1-220
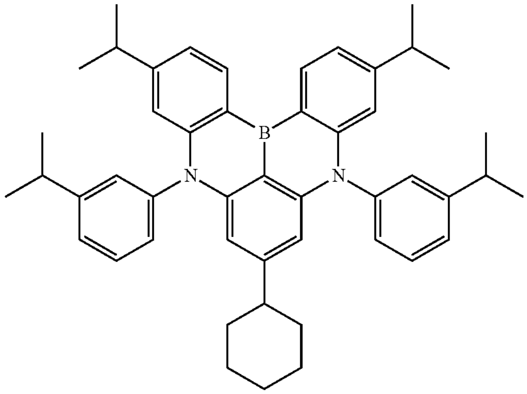
1-221
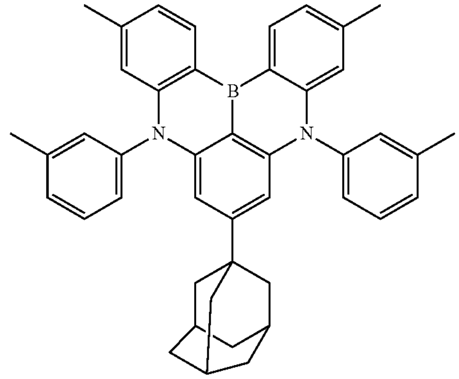
1-222
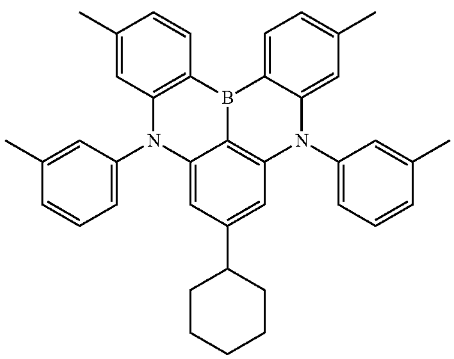
1-223
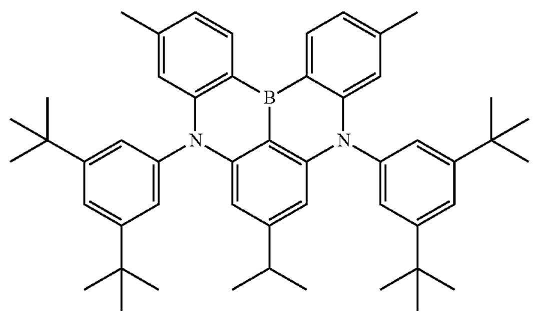
1-224
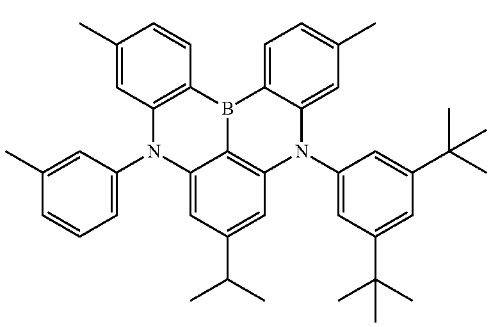
1-225
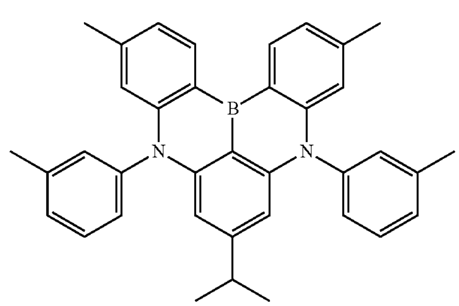

According to one preferred embodiment of the present disclosure, the compound represented by Formula 2 may be selected from the group consisting of the compounds:
2-1
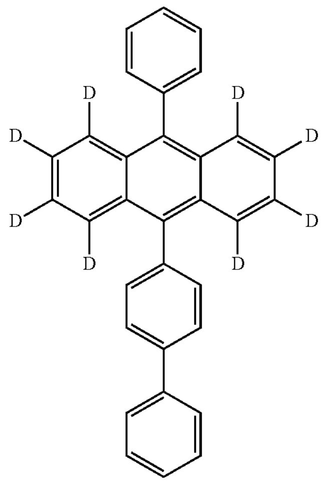
2-2
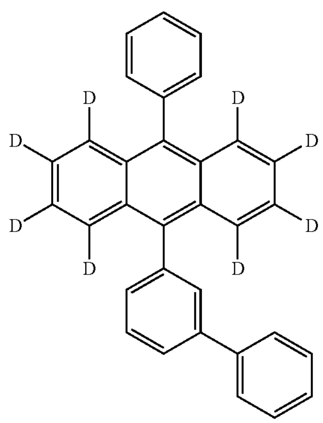
2-3
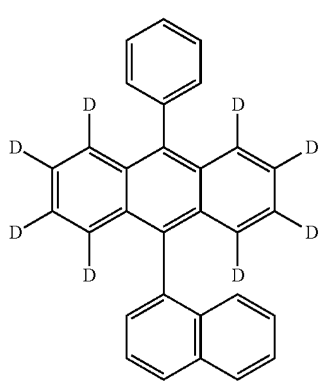
-continued
2-4
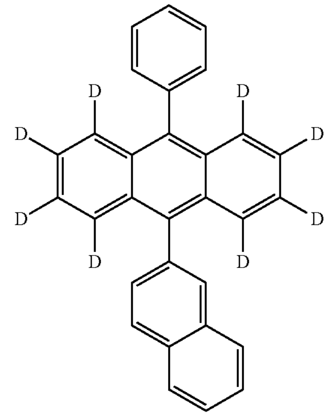
2-5
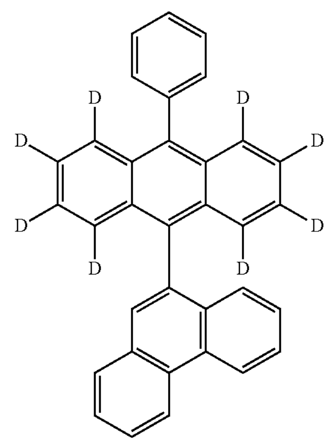
2-6
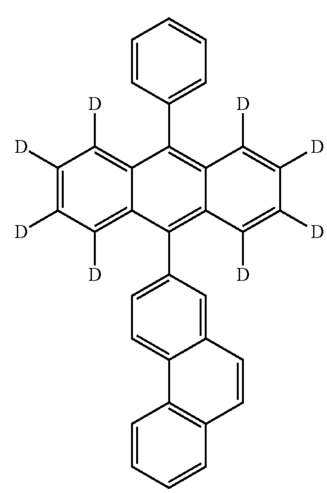

-continued
2-7
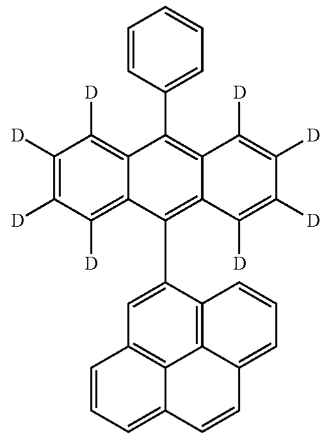
2-8
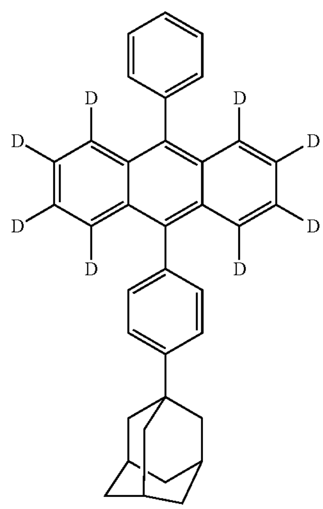
2-9
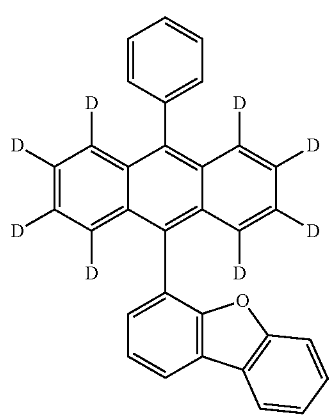
-continued
2-10
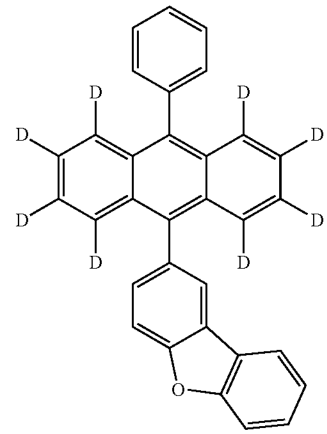
2-11
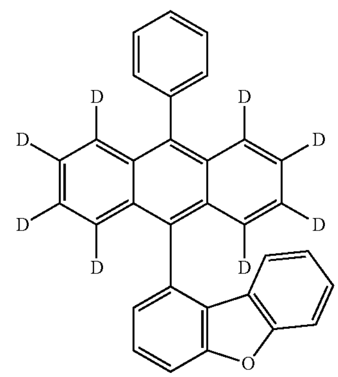
2-12
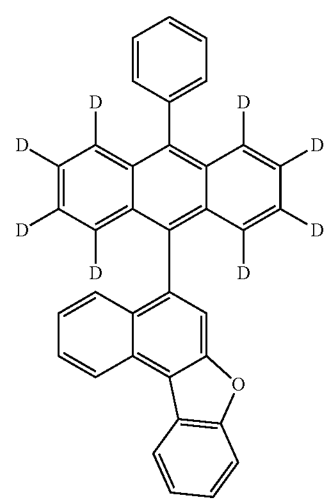

-continued
2-13
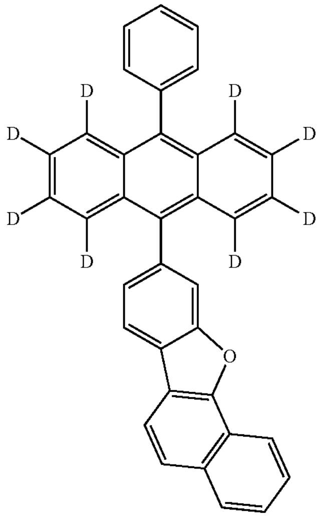
2-14
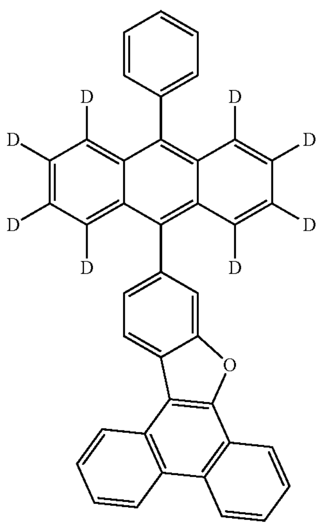
2-15
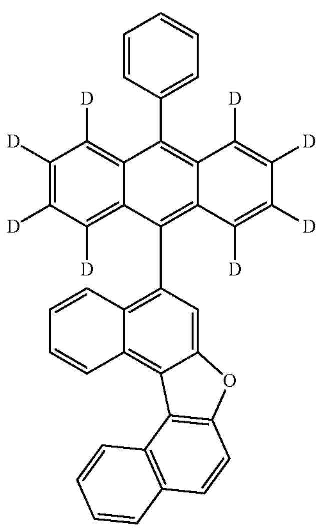
-continued
2-16
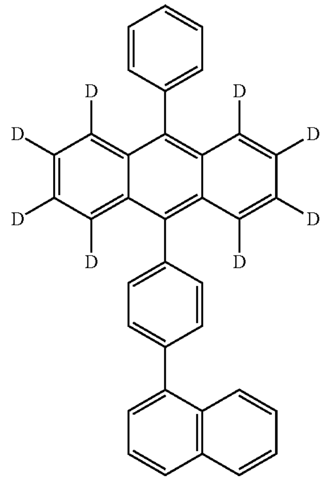
2-17
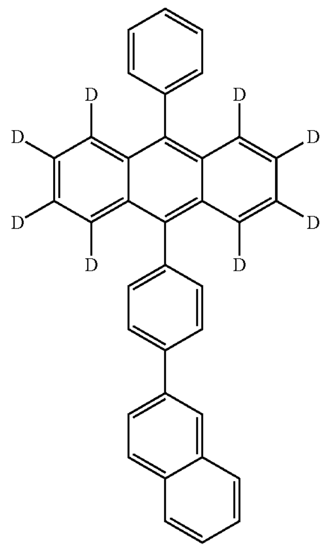
2-18
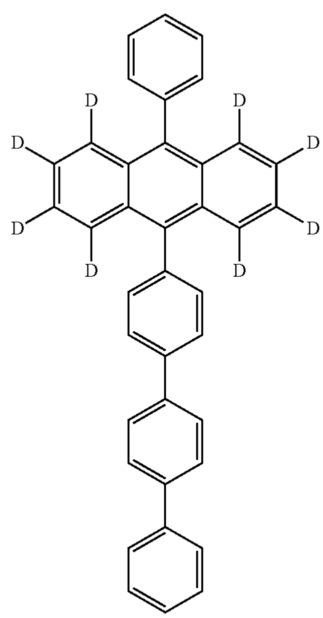

-continued
2-19
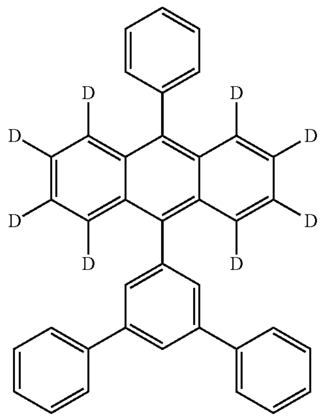
2-20
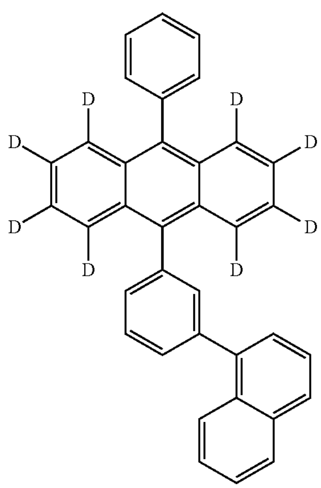
2-21
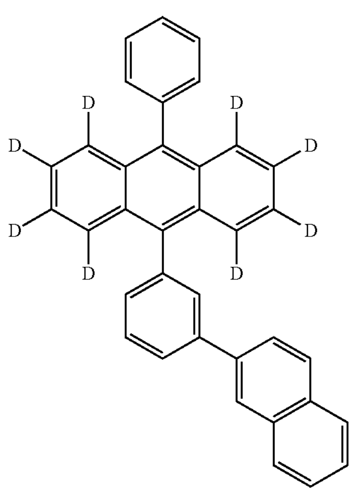
-continued
2-22
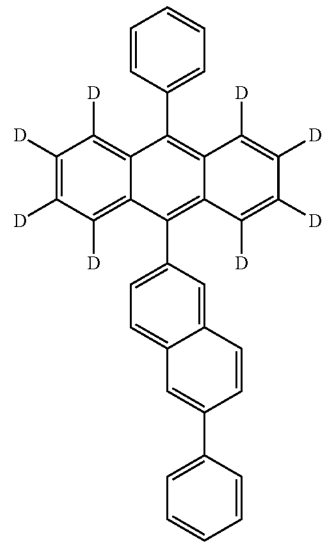
2-23
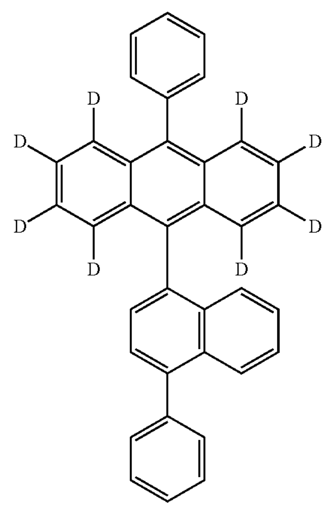
2-24
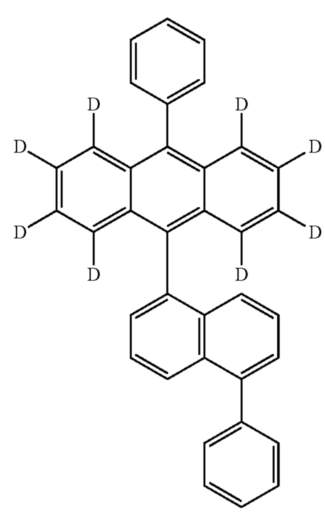

-continued
2-25
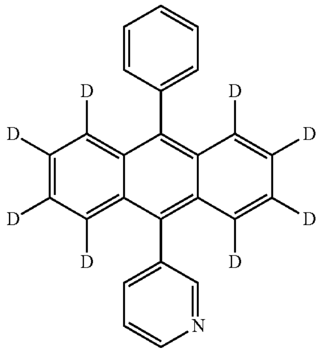
2-26
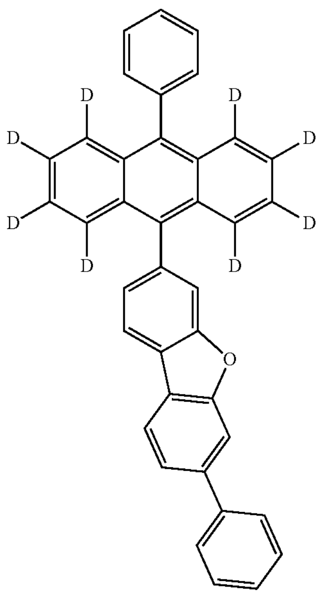
2-27
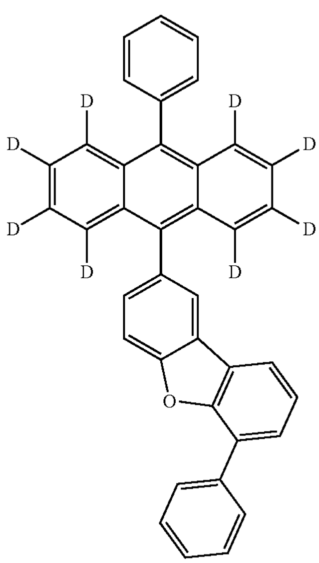
-continued
2-28
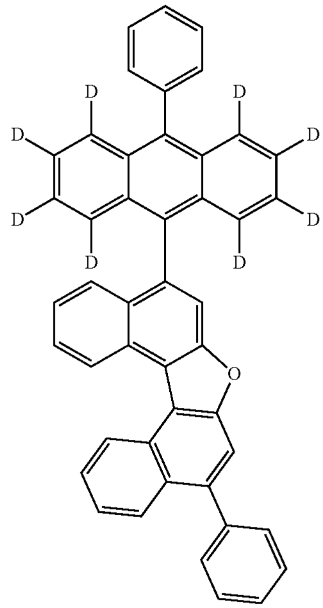
2-29
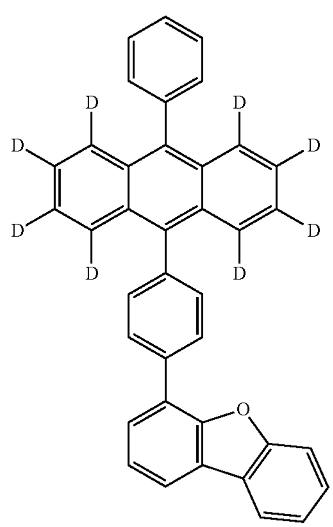

-continued
2-30
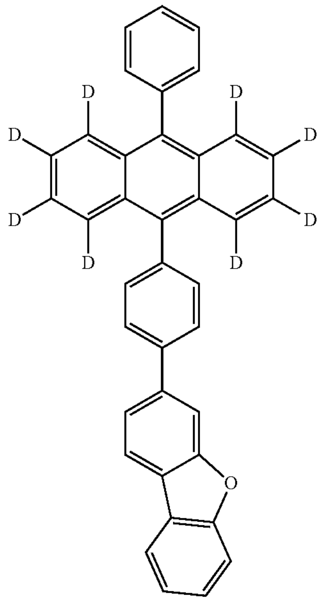
2-31
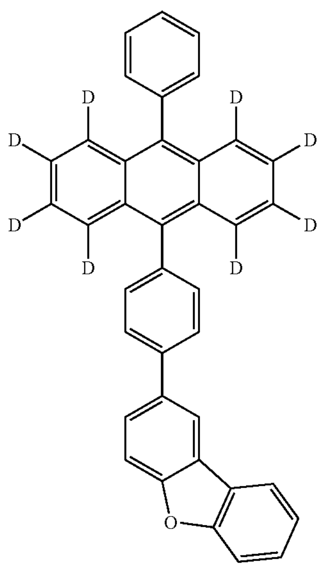
2-32
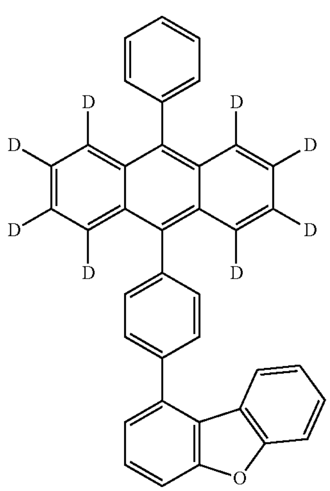
-continued
2-33
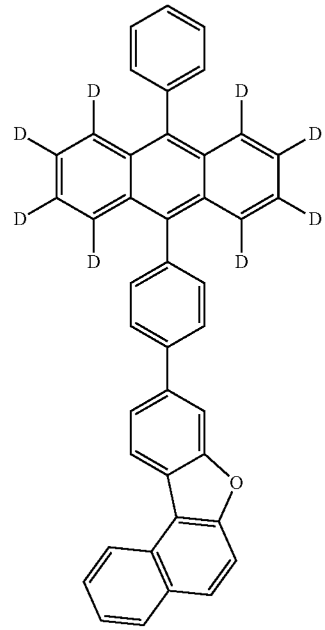
2-34
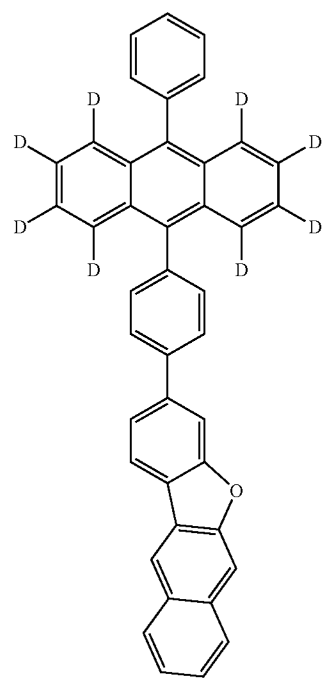

-continued
2-35
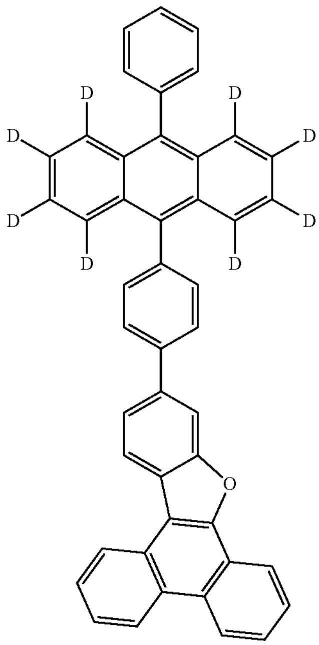
2-36
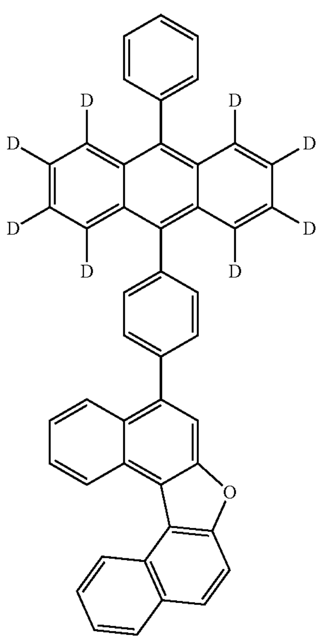
-continued
2-37
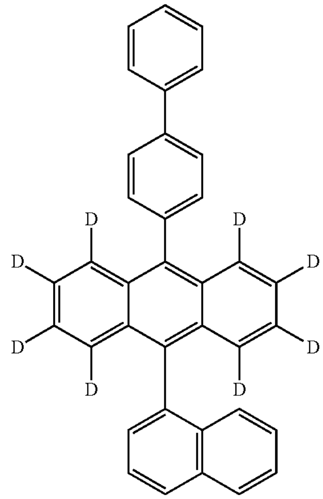
2-38
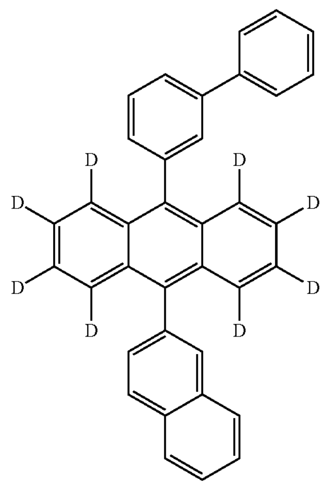
2-39
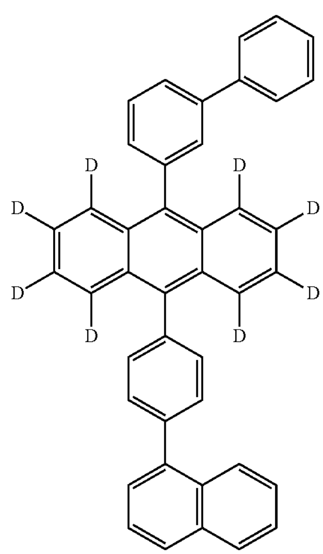

-continued
2-40
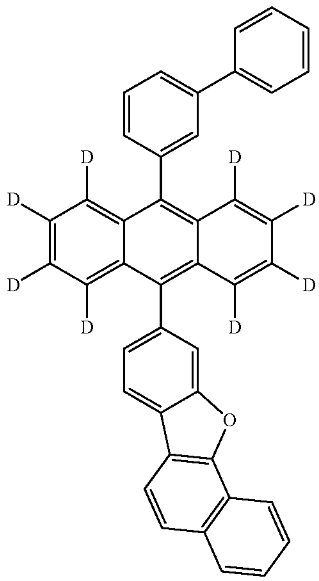
2-41
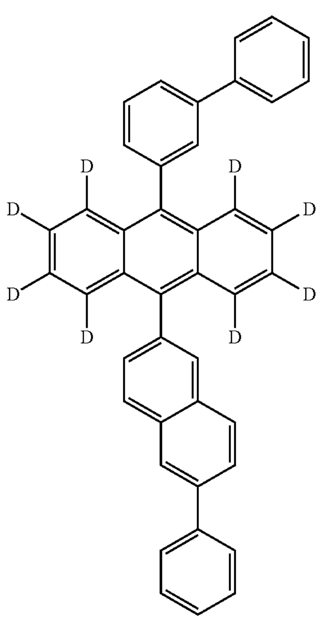
-continued
2-42
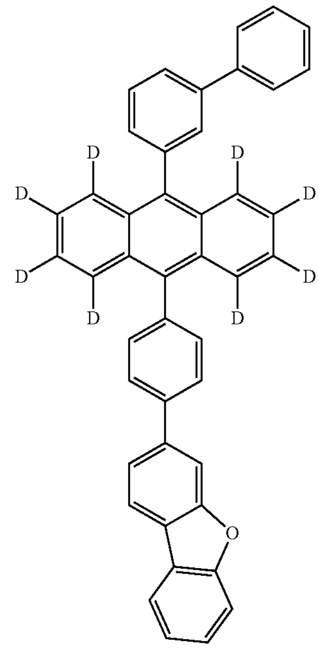
2-43
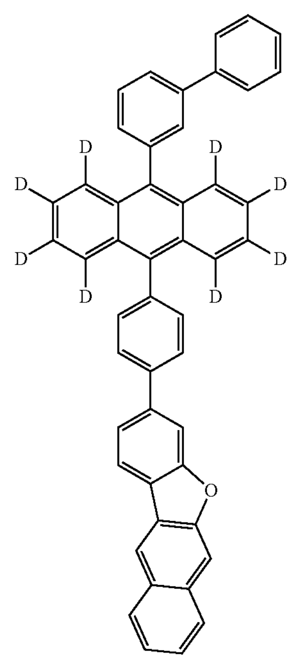

-continued
2-44
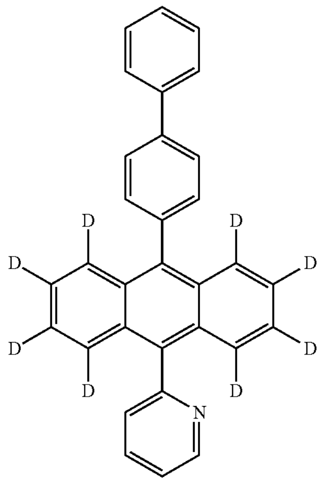
2-45
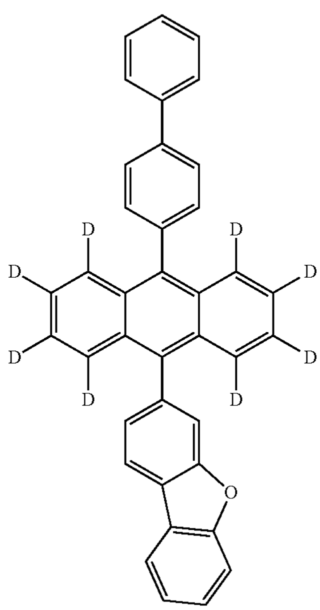
-continued
2-46
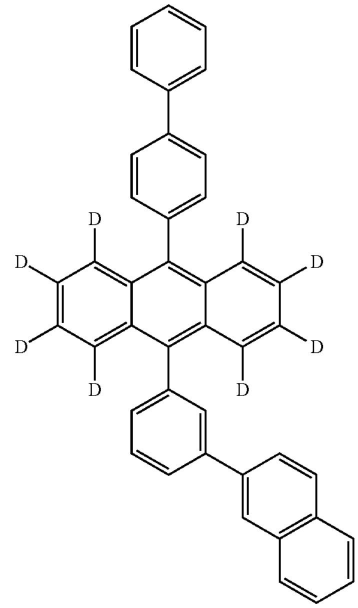
2-47
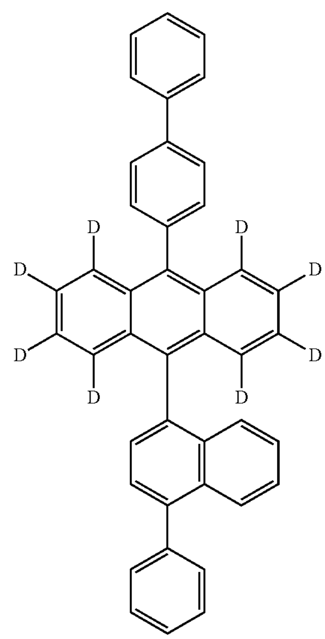

-continued
2-48
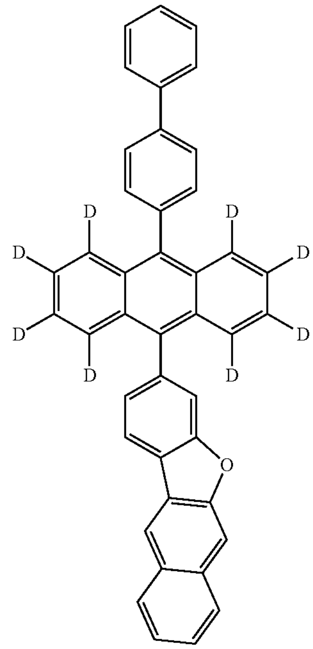
2-49
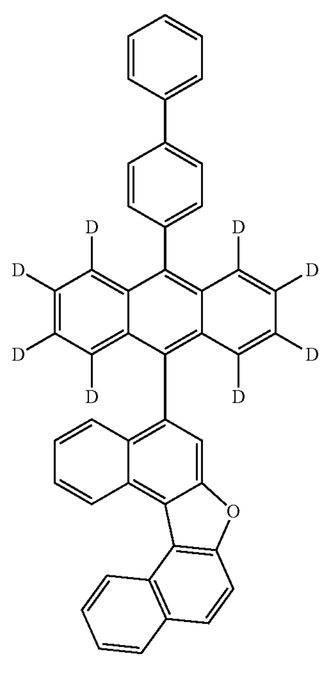
-continued
2-50
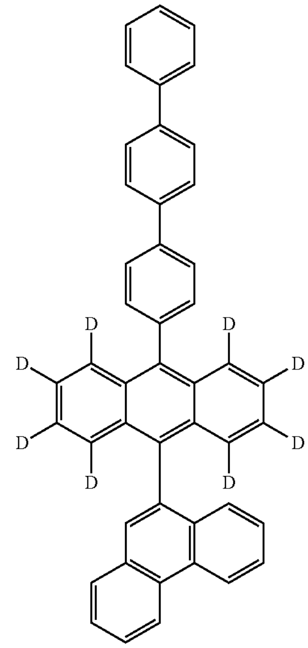
2-51
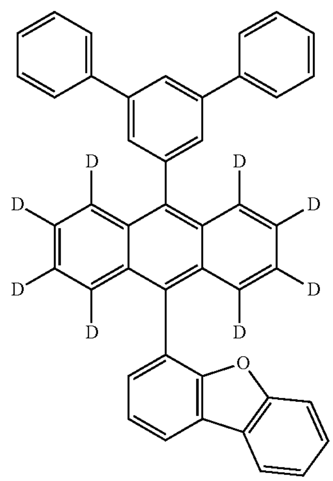
2-52
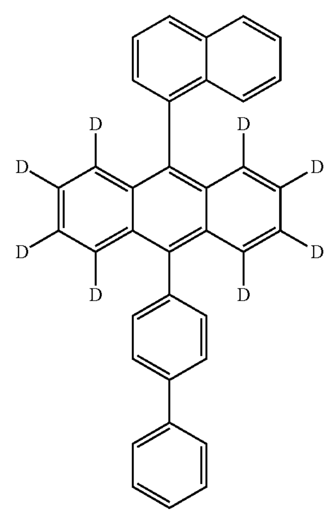

2-53
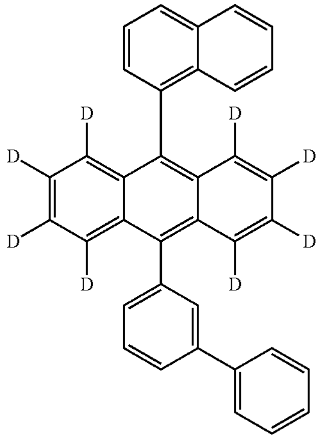
2-54
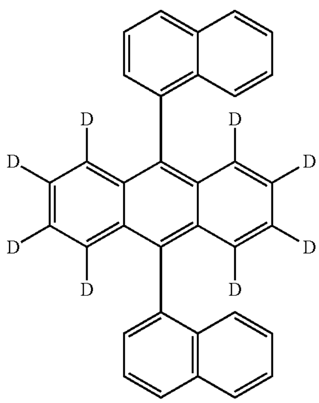
2-55
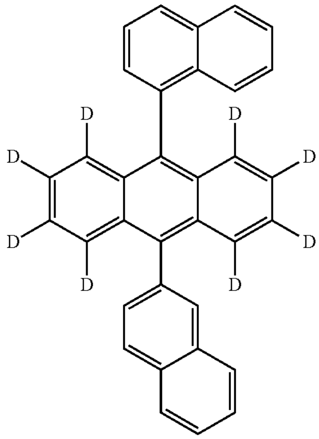
2-56
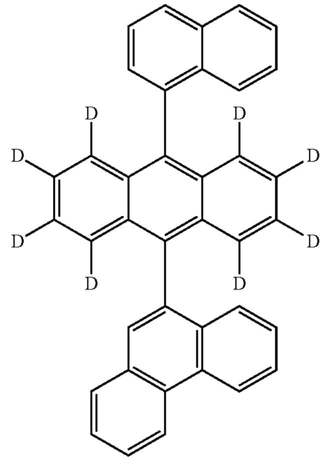
2-57
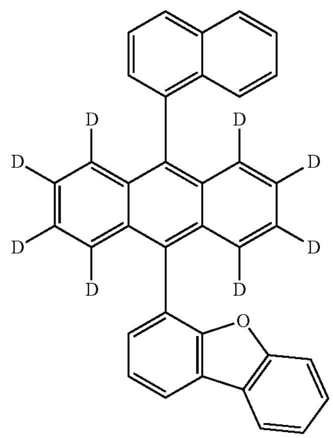
2-58
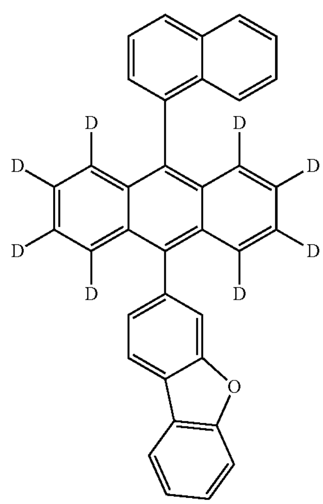

-continued
2-59
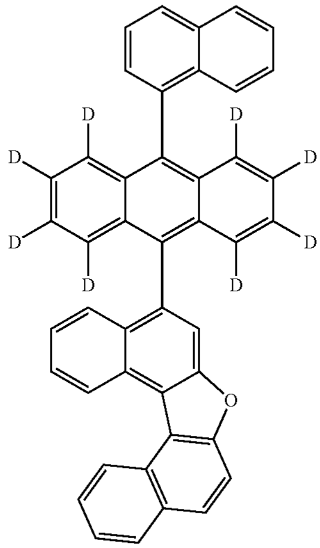
2-60
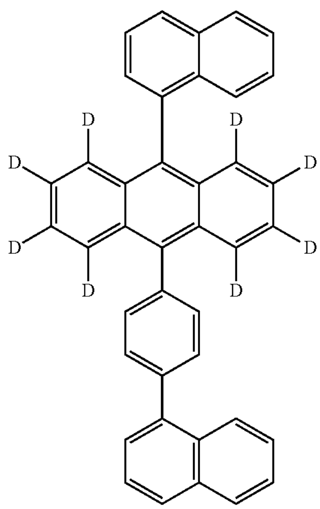
2-61
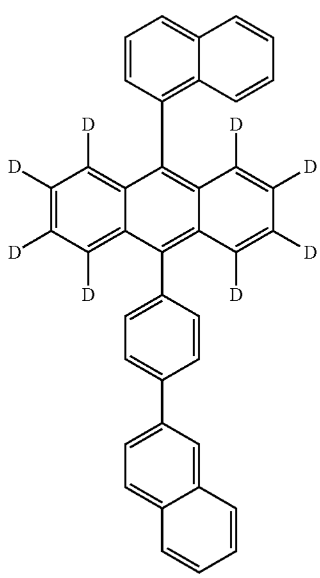
-continued
2-62
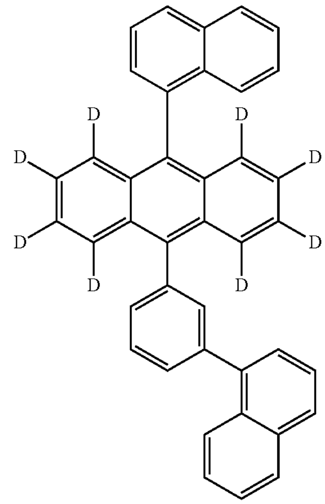
2-63
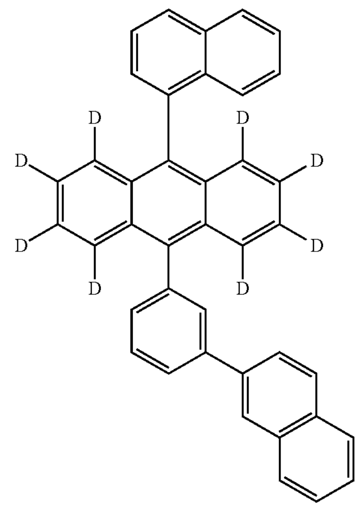
2-64
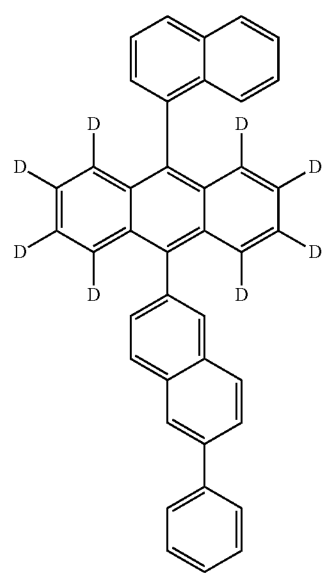

-continued
2-65
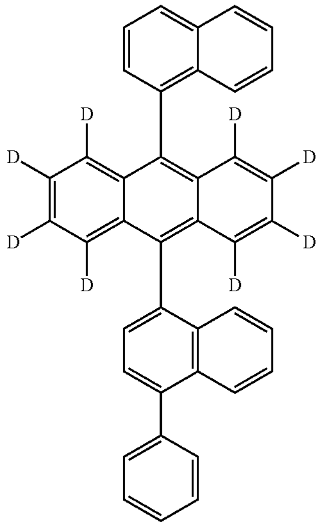
2-66
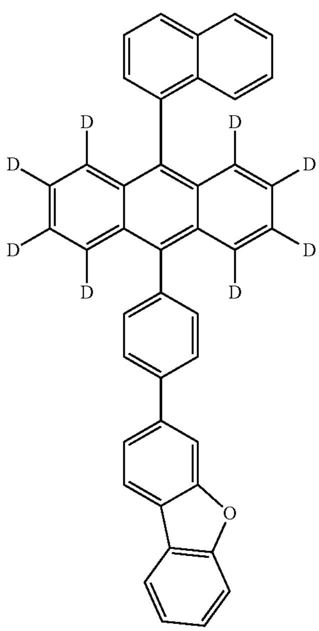
-continued
2-67
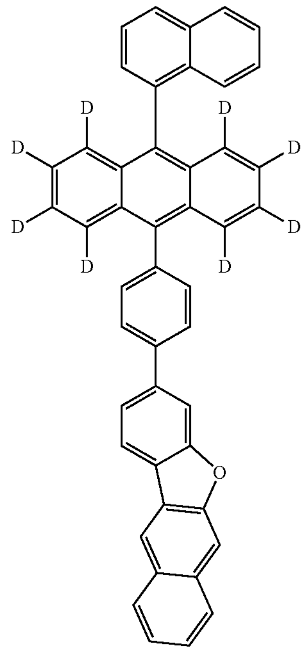
2-68
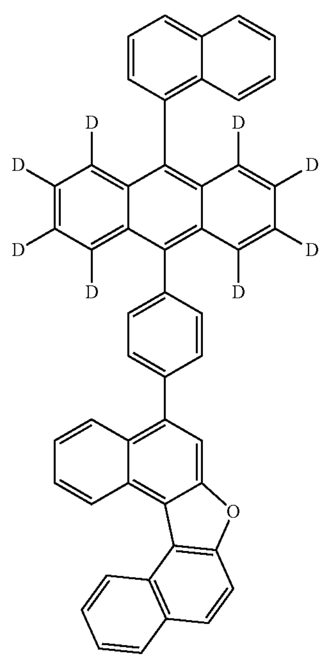

-continued
2-69
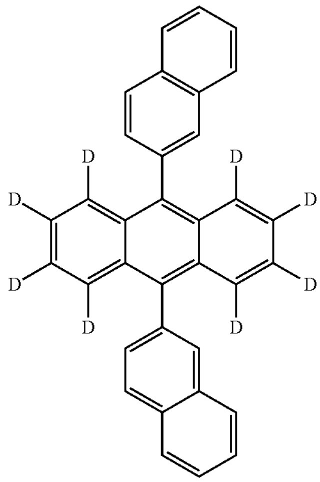
2-70
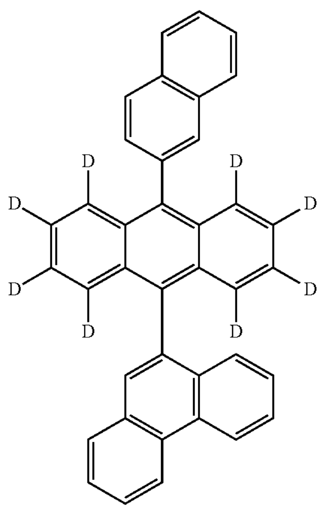
2-71
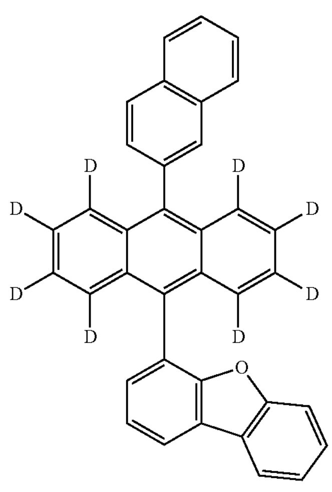
-continued
2-72
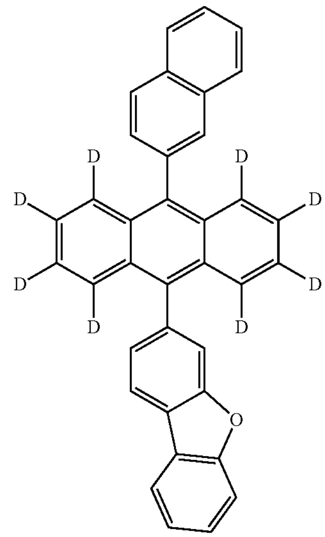
2-73
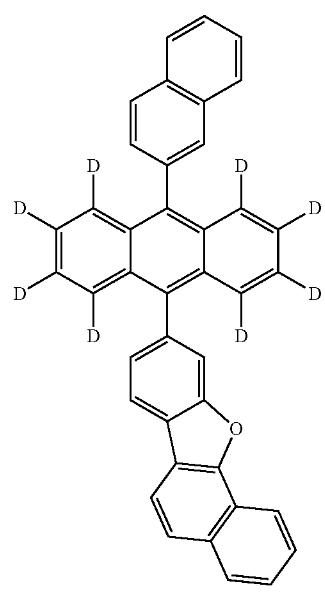

2-74
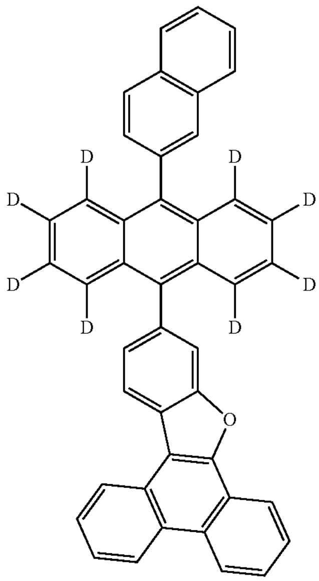
2-75
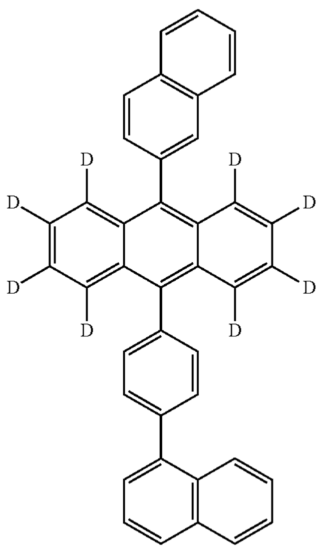
2-76
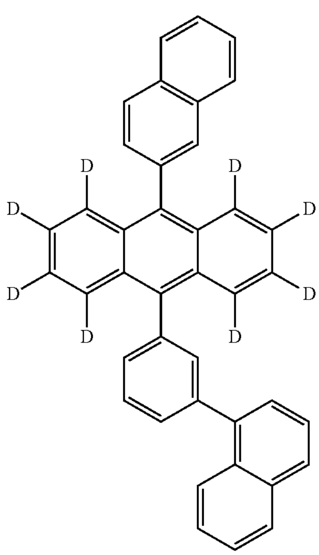
2-77
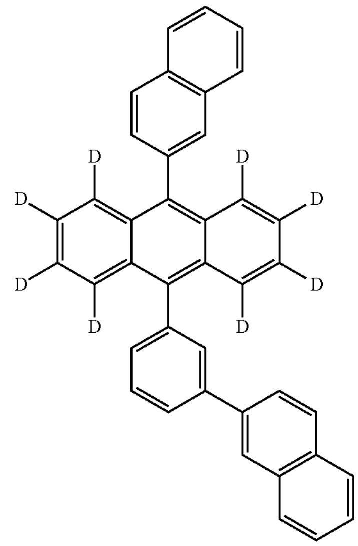
2-78
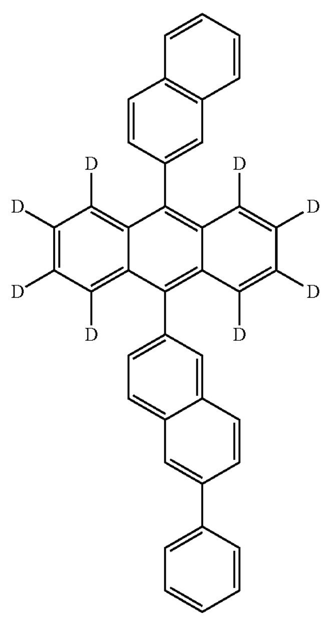

-continued
2-79
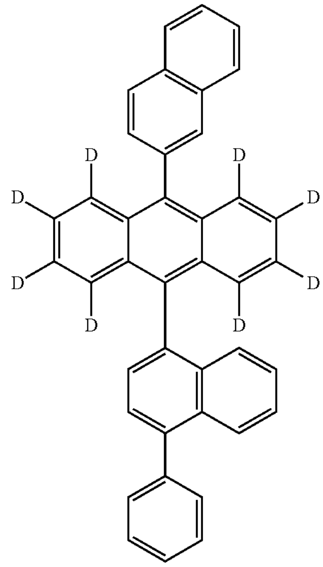
2-80
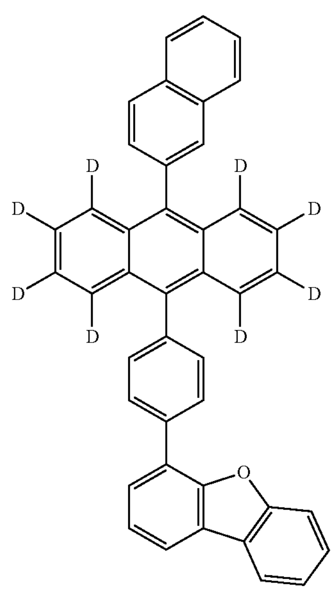
-continued
2-81
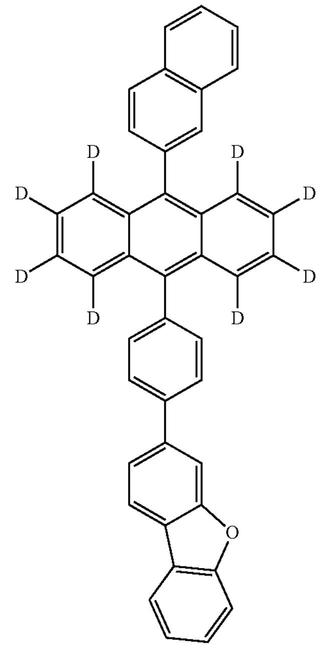
2-82
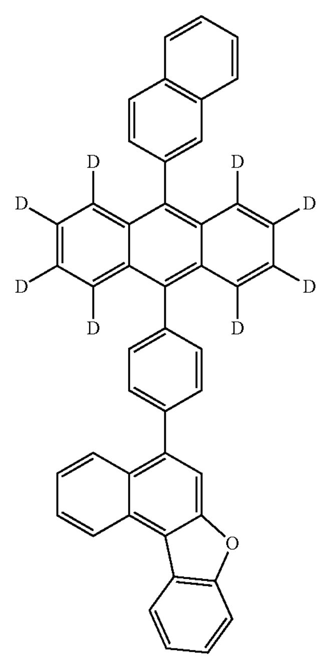

2-83
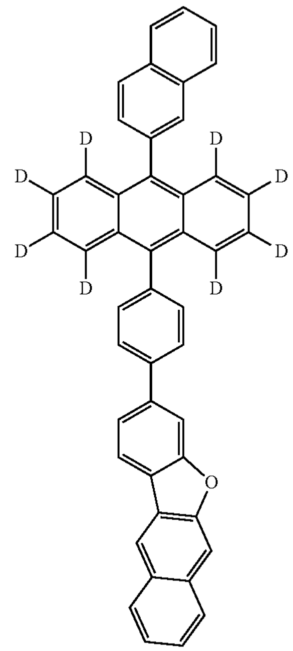
2-84
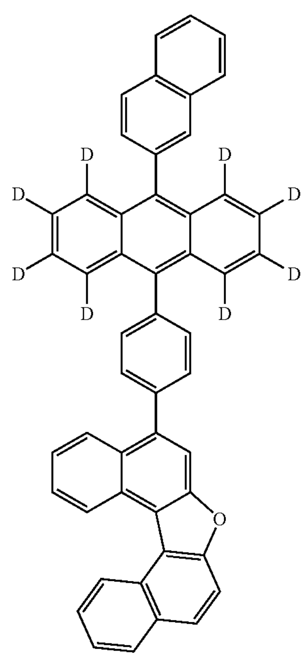
2-85
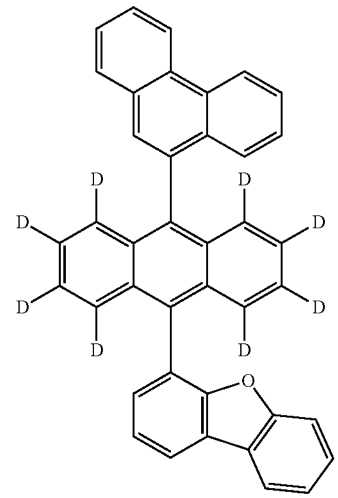
2-86
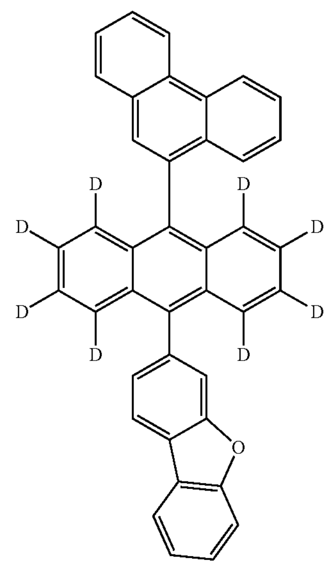
2-87
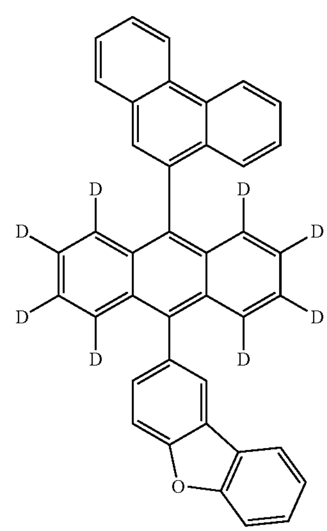

2-88
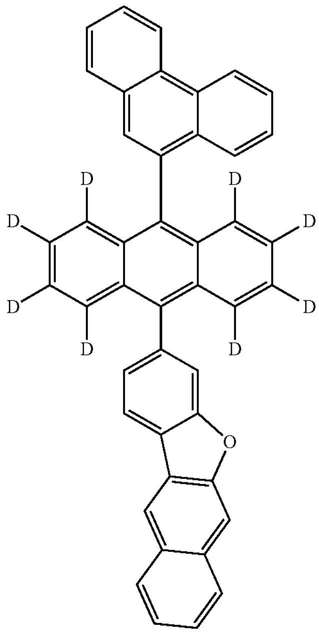
2-89
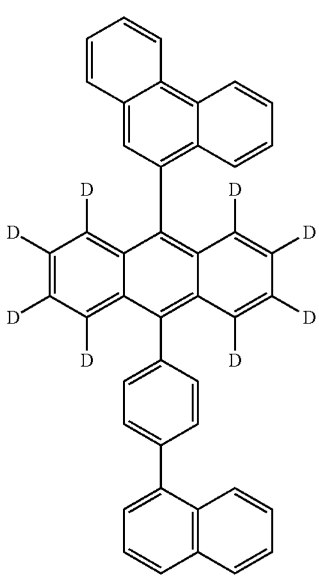
2-90
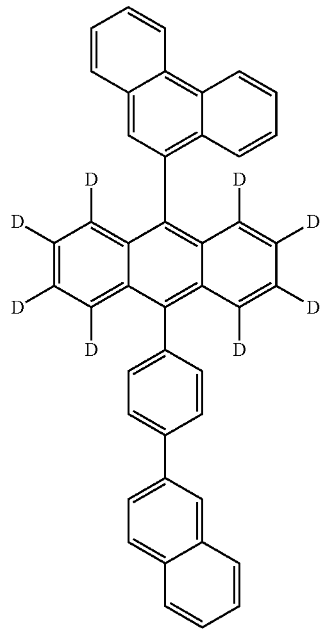
2-91
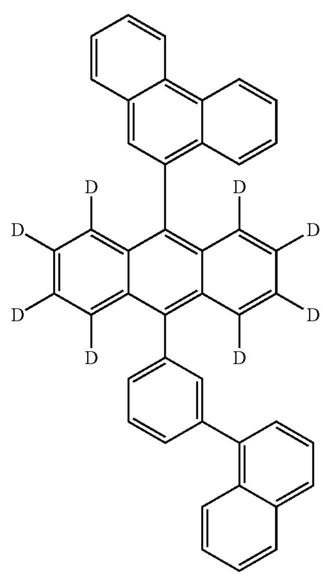

2-92
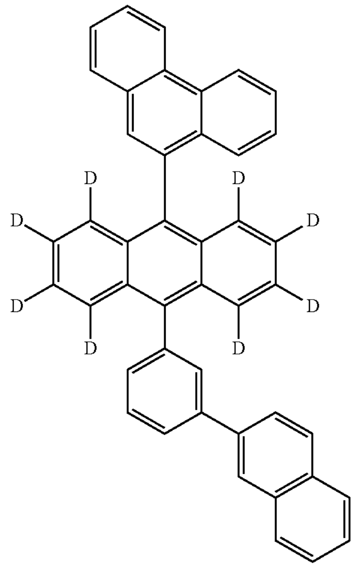
2-93
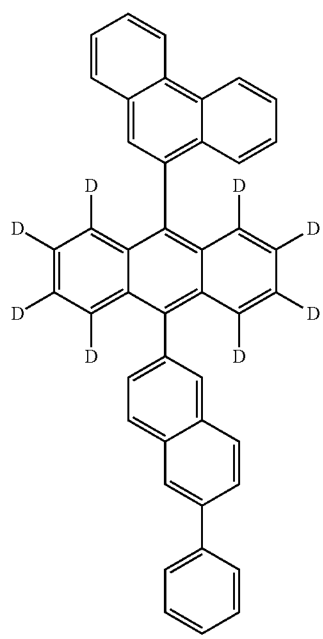
2-94
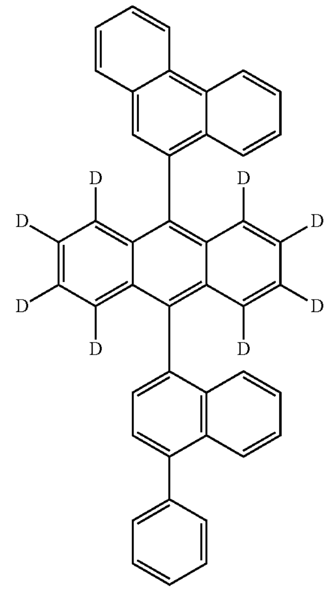
2-95
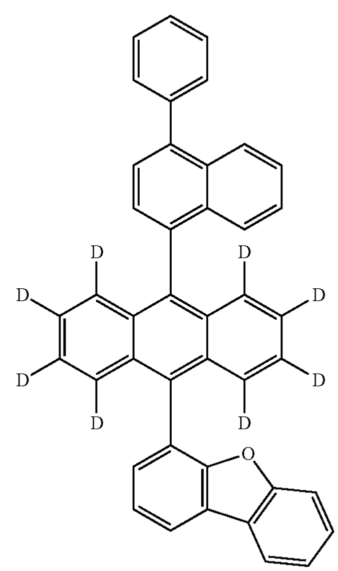

2-96
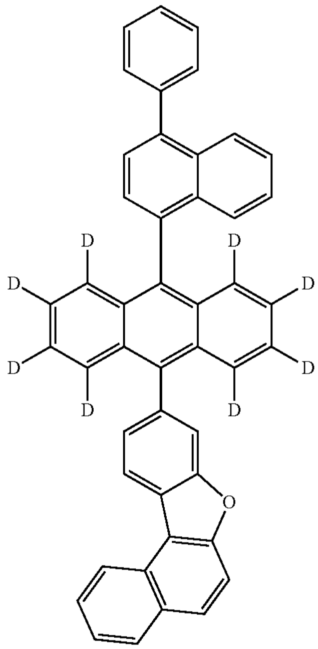
2-97
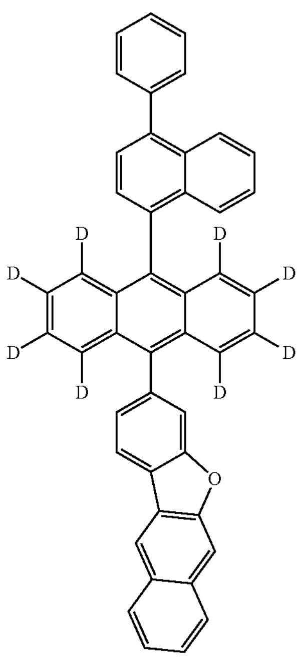
2-98
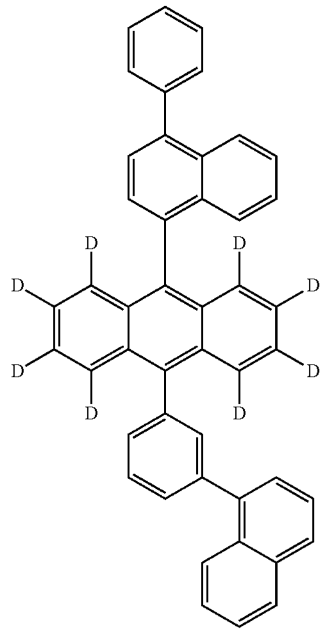
2-99
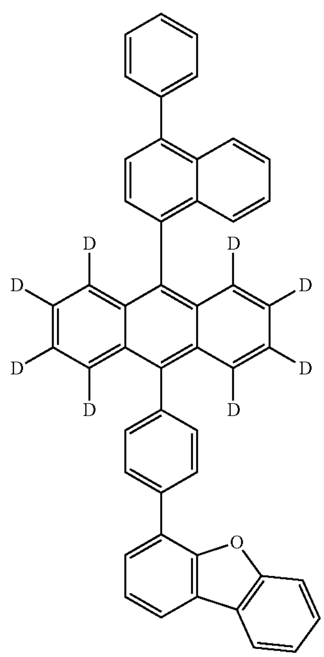

-continued
2-100
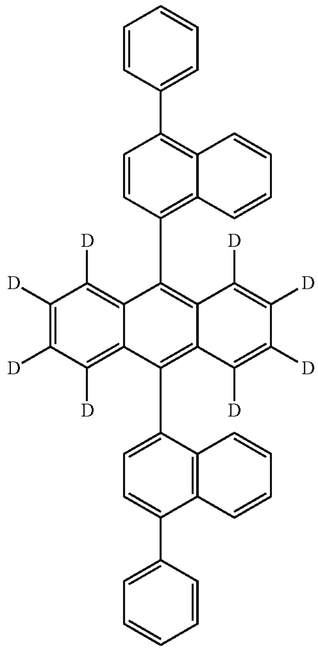
2-101
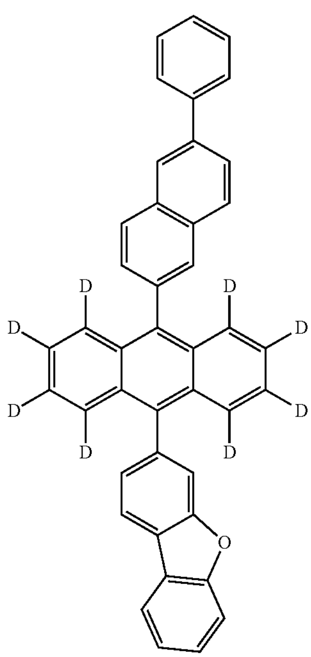
-continued
2-102
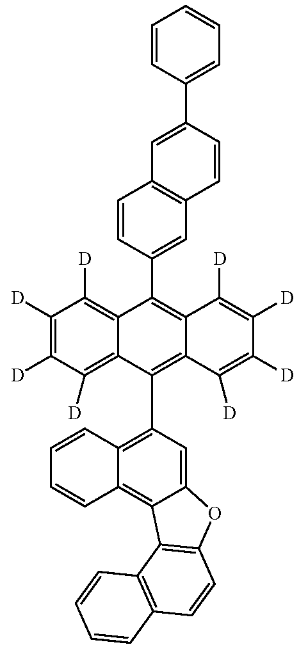
2-103
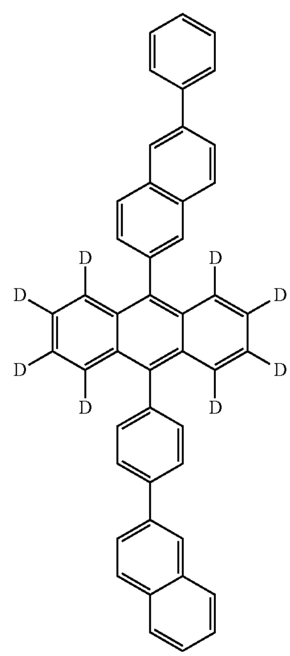

-continued
2-104
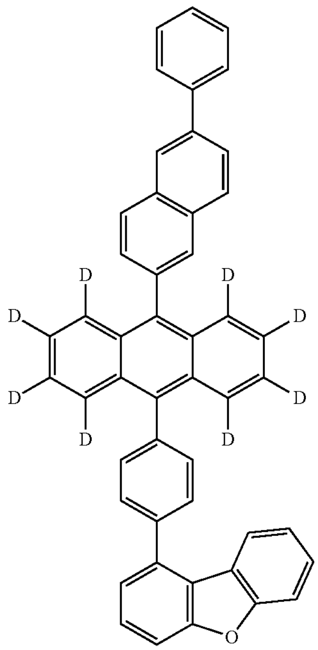
2-105
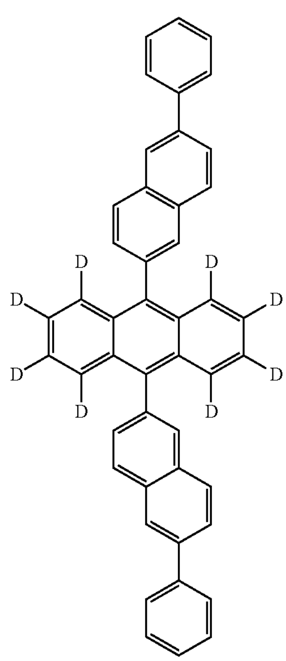
-continued
2-106
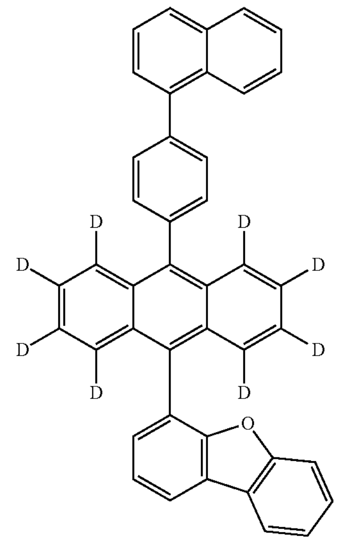
2-107
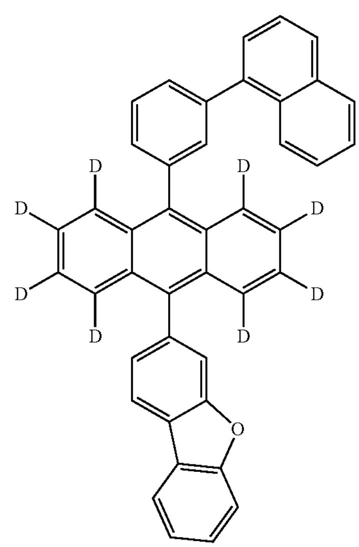

2-108
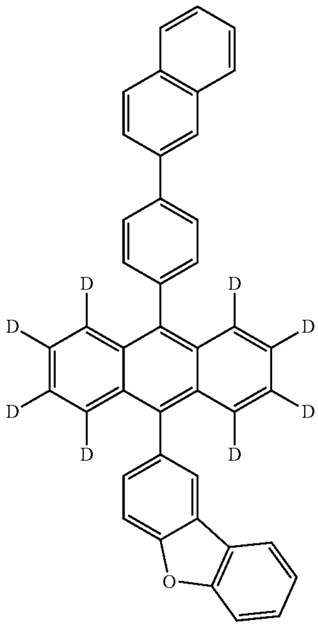
2-109
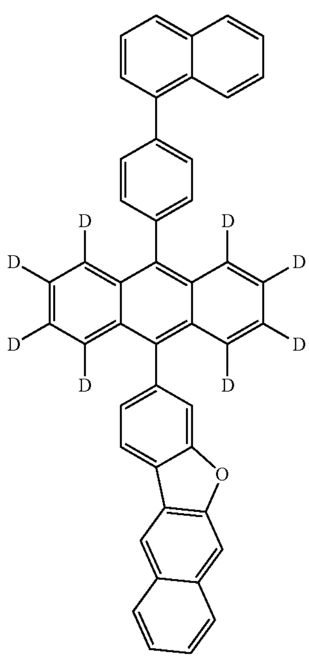
2-110
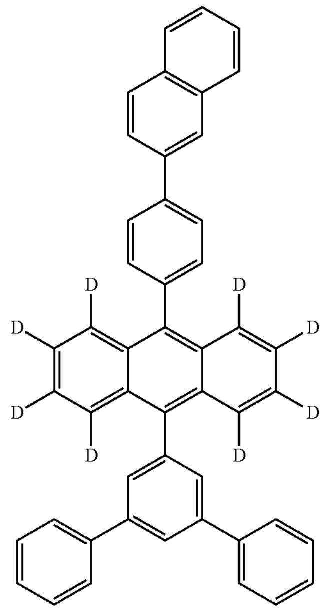
2-111
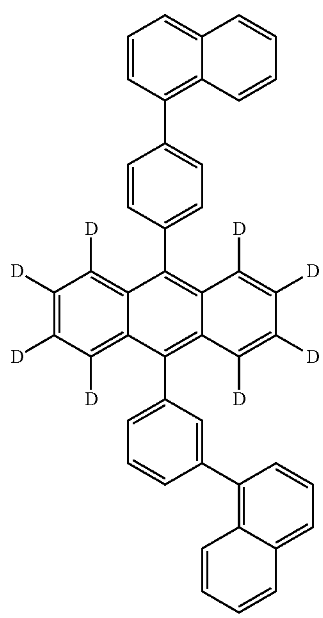

-continued
2-112
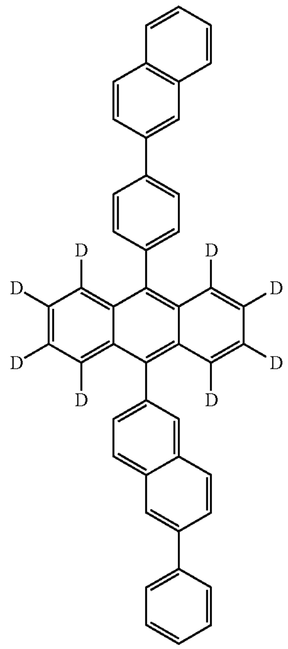
2-113
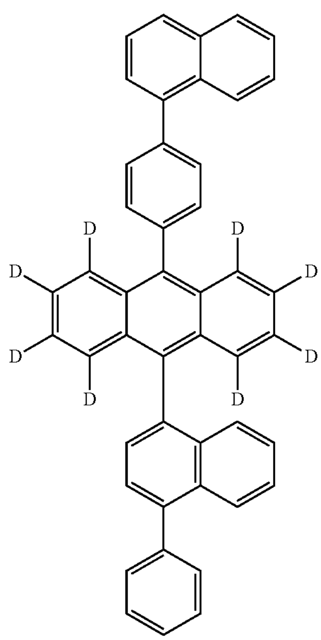
-continued
2-114
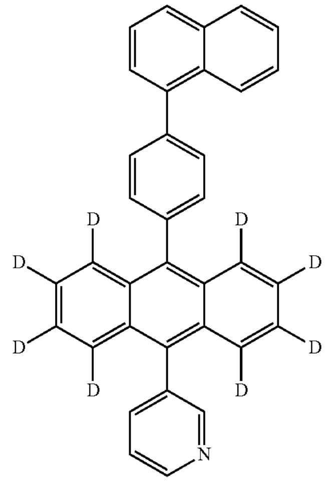
2-115
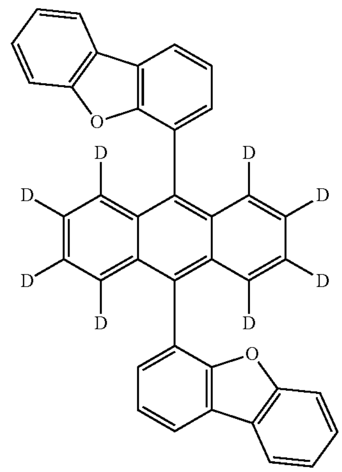
2-116
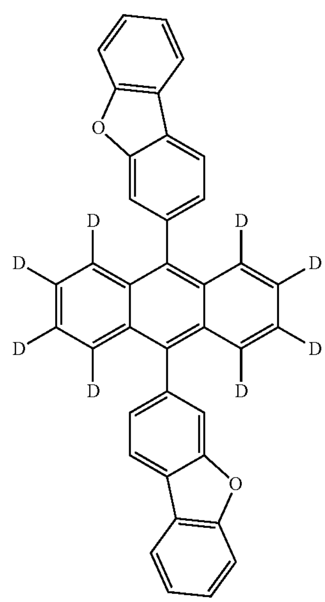

2-117
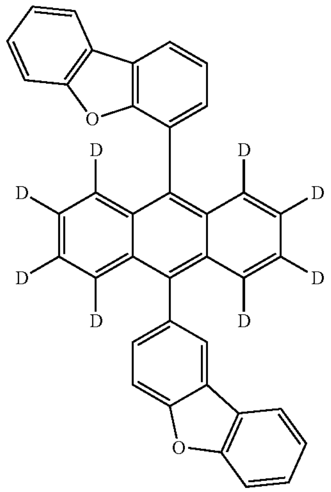
2-118
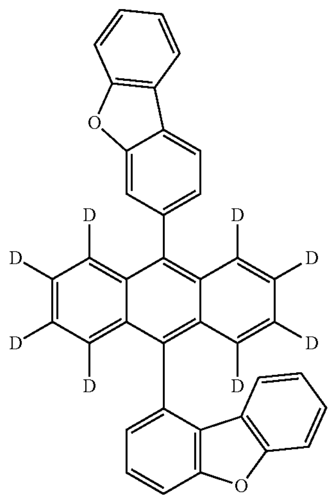
2-119
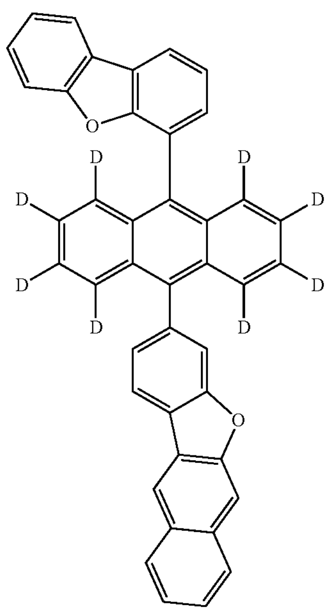
2-120
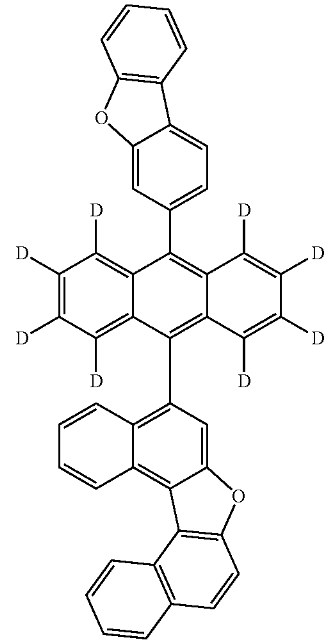
2-121
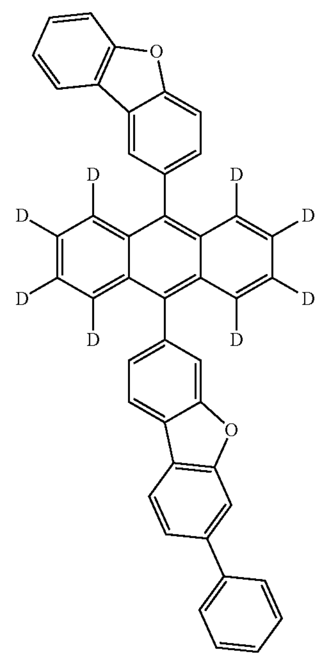

2-122
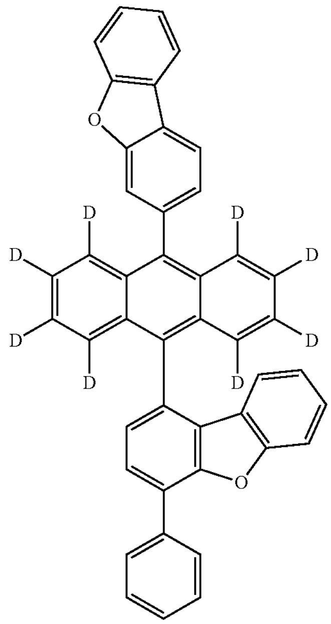
2-123
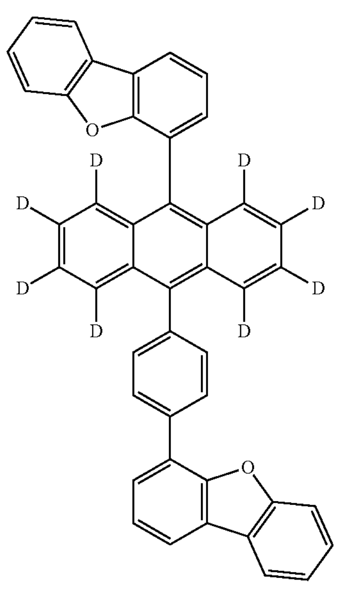
2-124
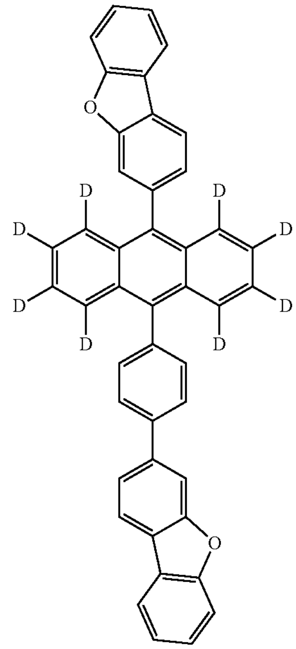
2-125
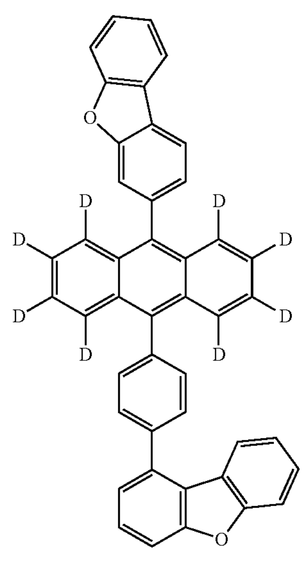

-continued
2-126
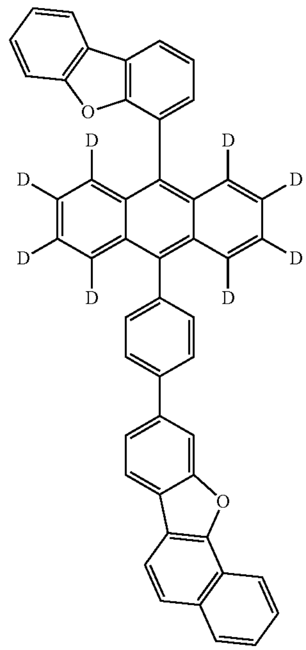
2-127
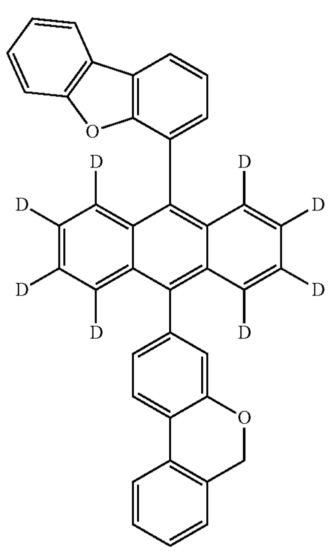
-continued
2-128
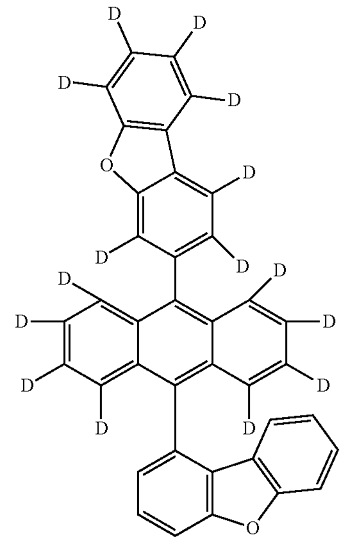
2-129
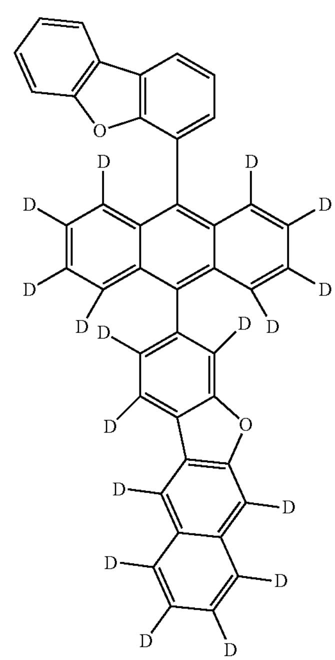

-continued
2-130
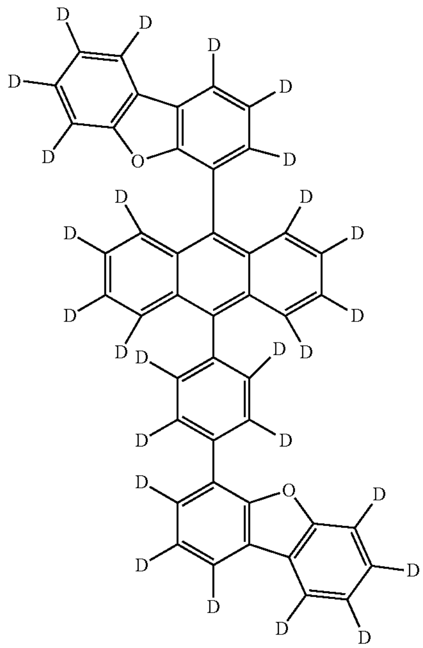
2-131
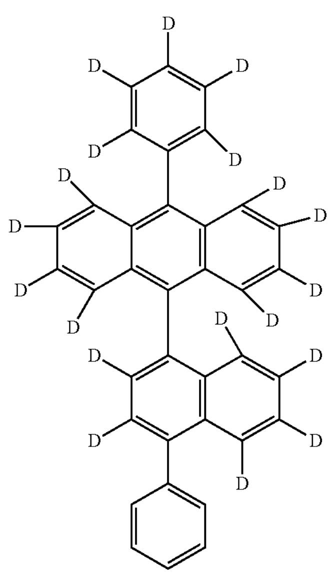
-continued
2-132
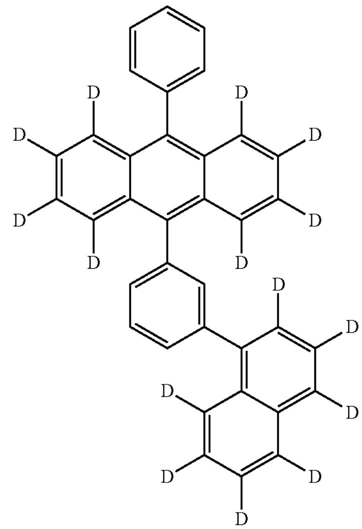
2-133
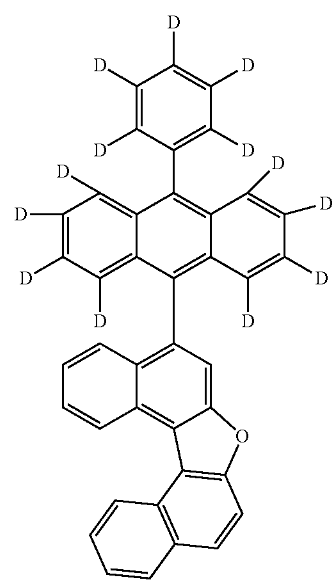

-continued
2-134
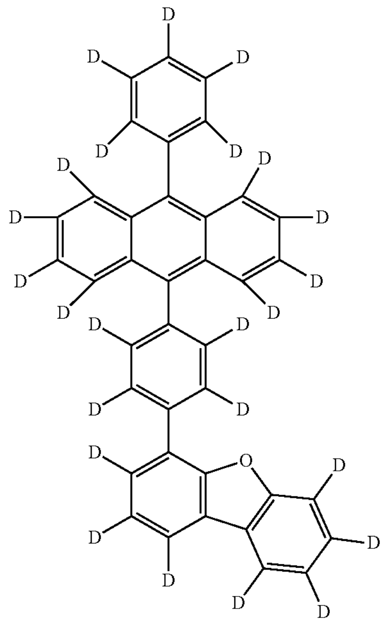
2-135
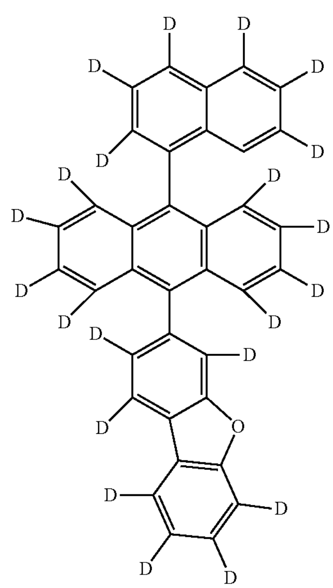
-continued
2-136
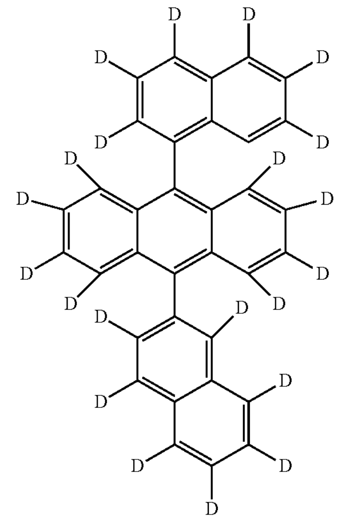
2-137
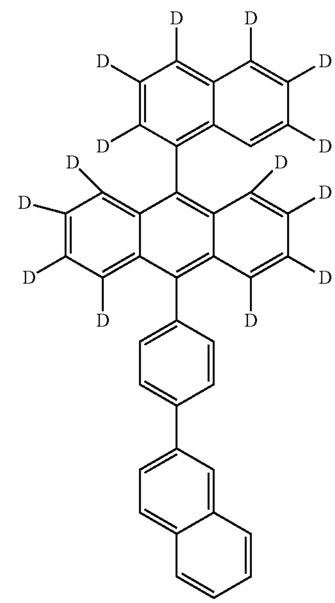
2-138
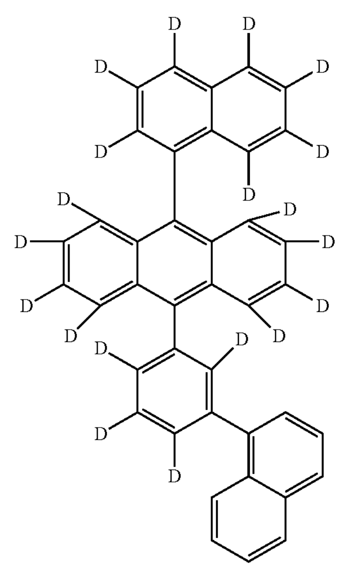

2-139
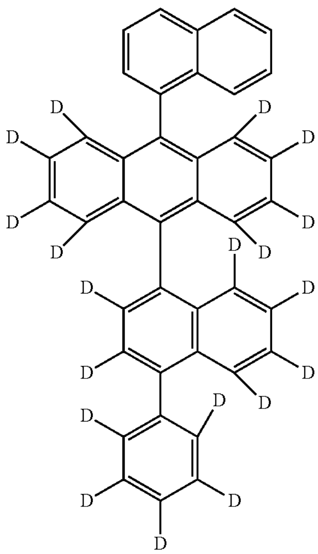
2-140
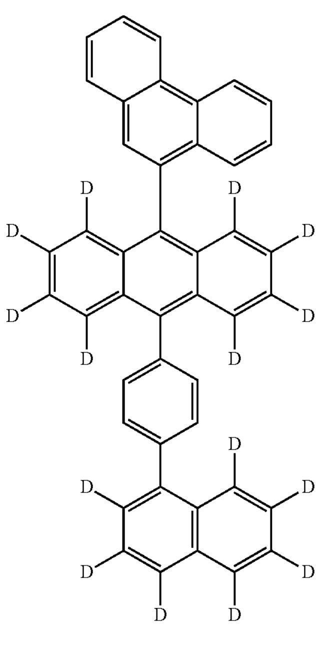
2-141
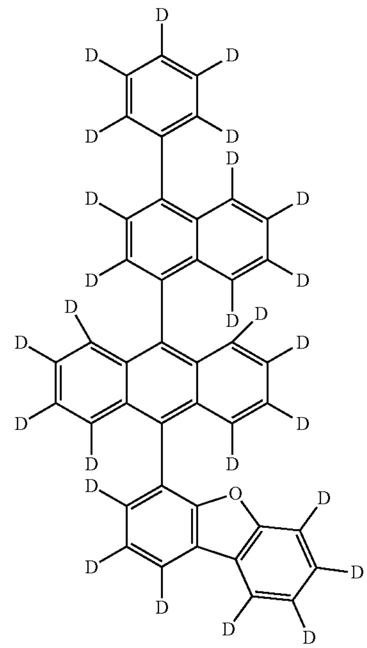
2-142
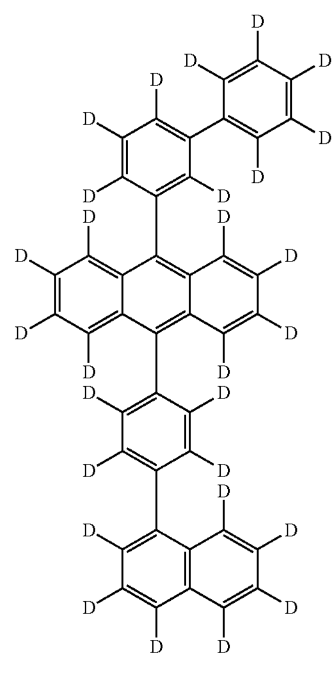

-continued
2-143
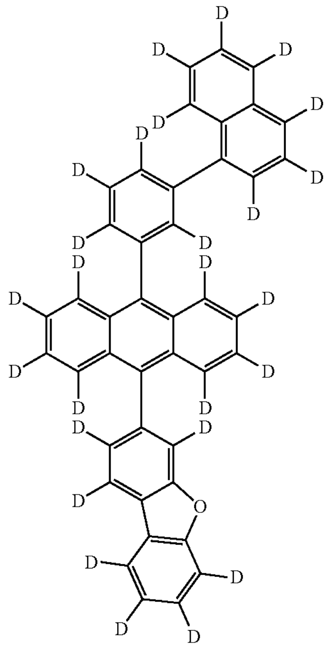
2-144
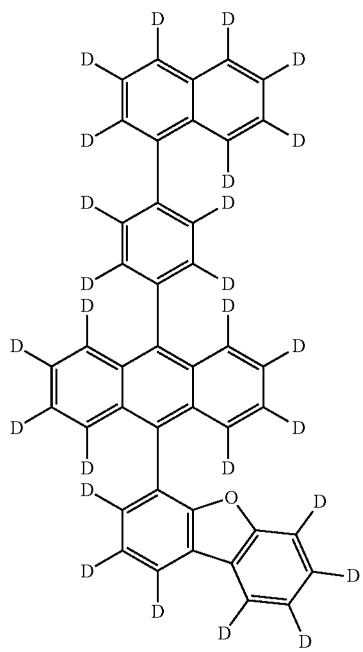
-continued
2-145
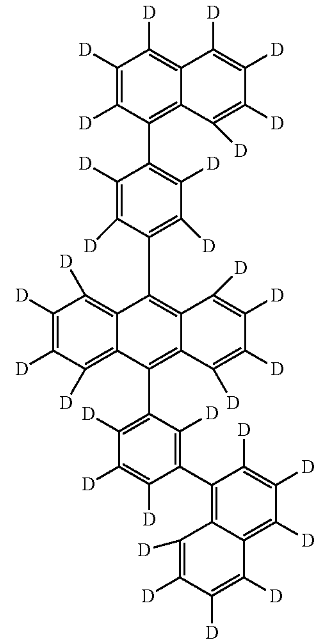
2-146
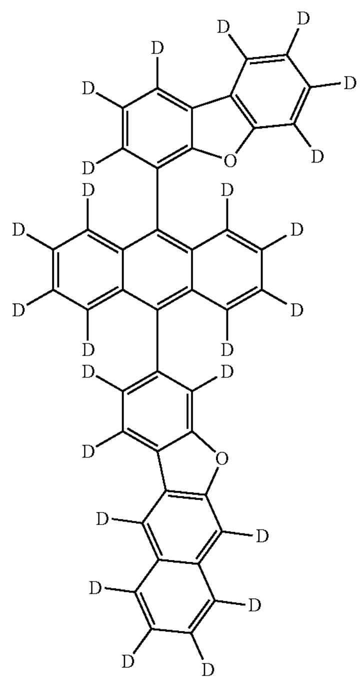

-continued
2-147
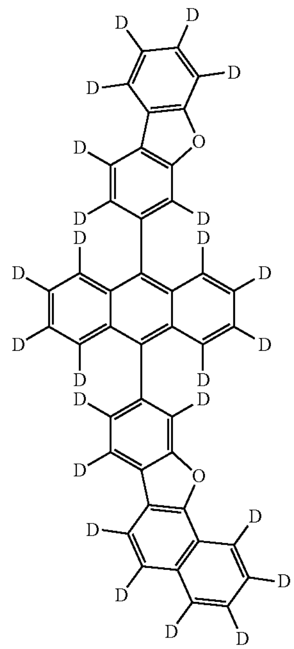
2-148
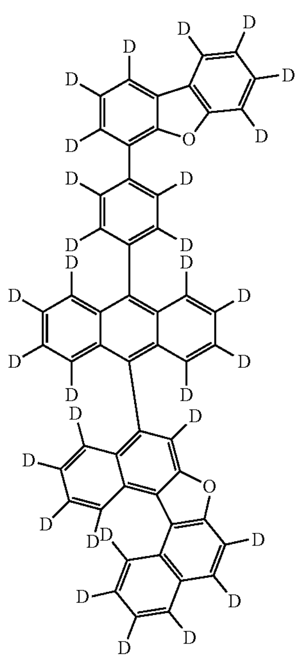
-continued
2-149
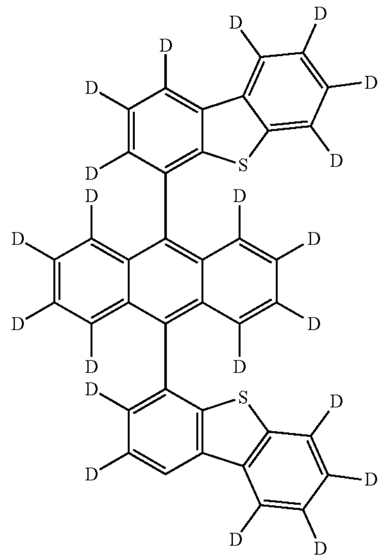
2-150
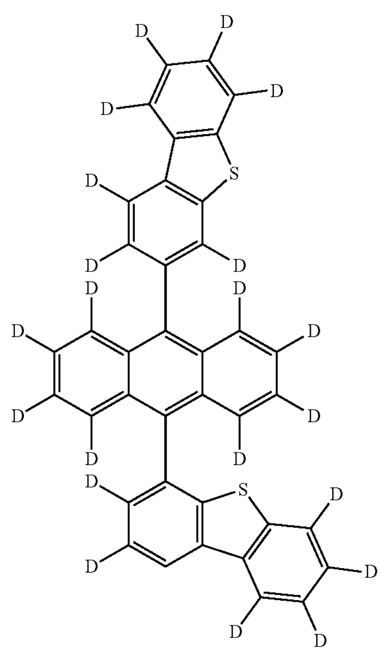

2-151
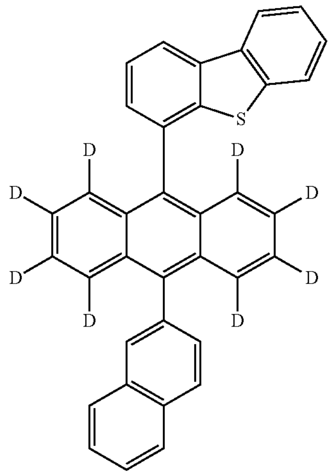
2-152
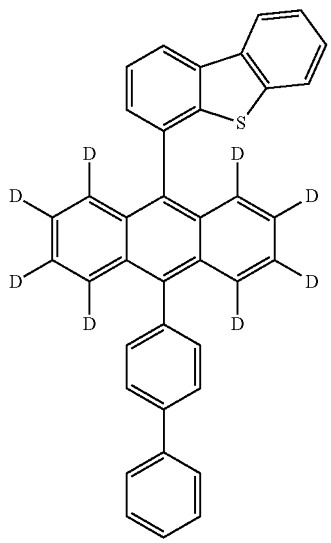
2-153
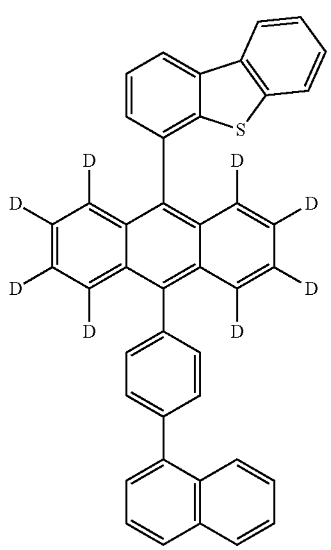
2-154
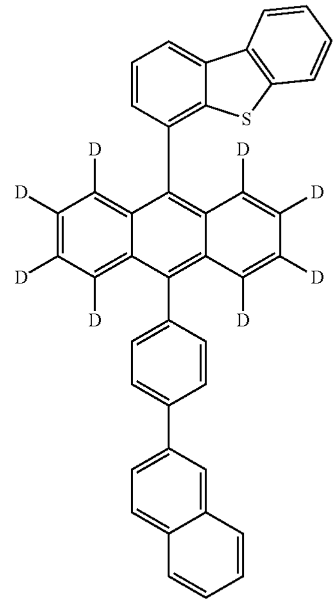
2-155
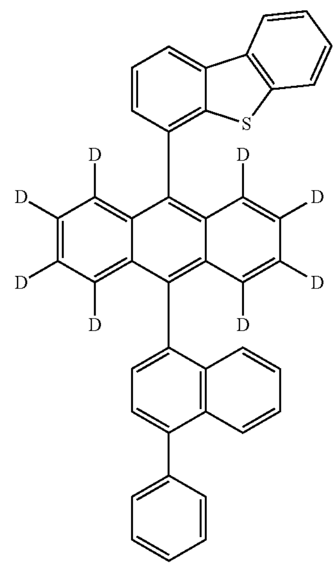
2-156
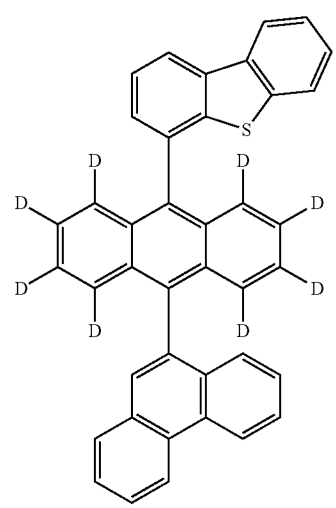

-continued
2-157
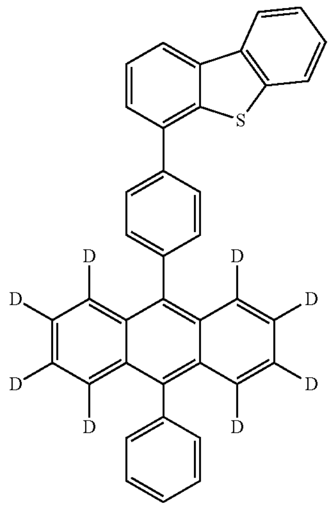
2-158
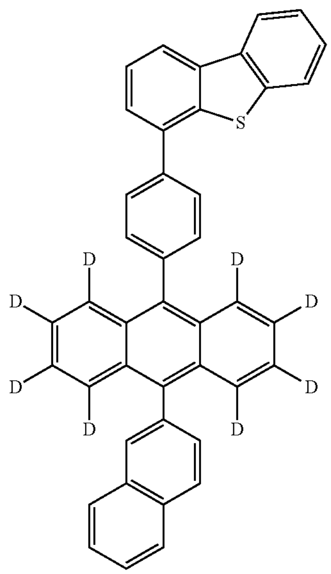
2-159
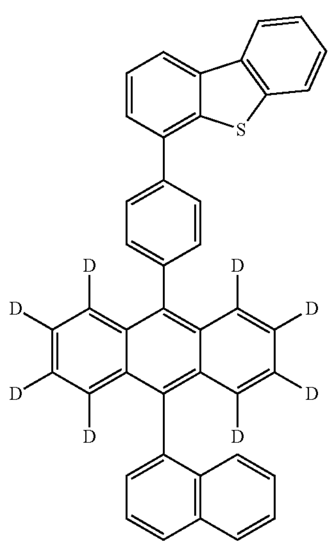
-continued
2-160
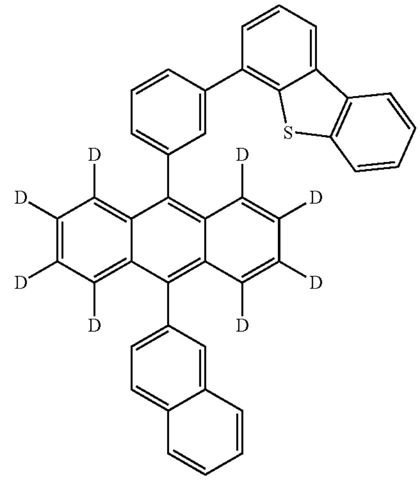
2-161
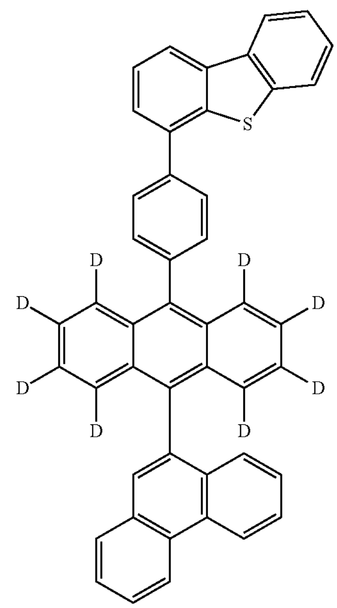
2-162
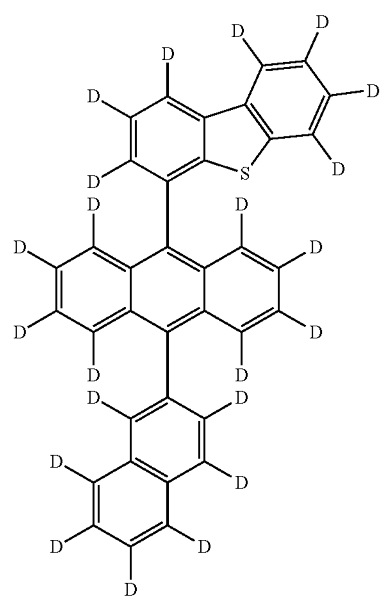

-continued
2-163
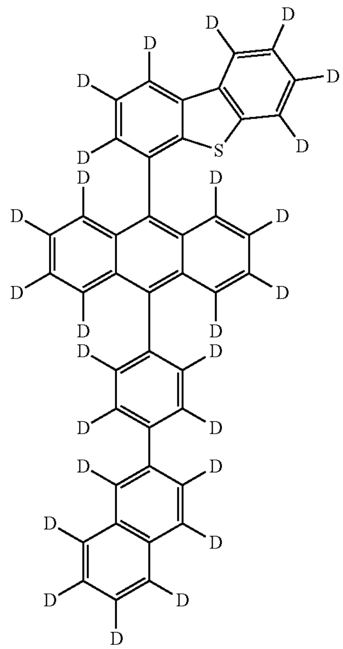
-continued
2-165
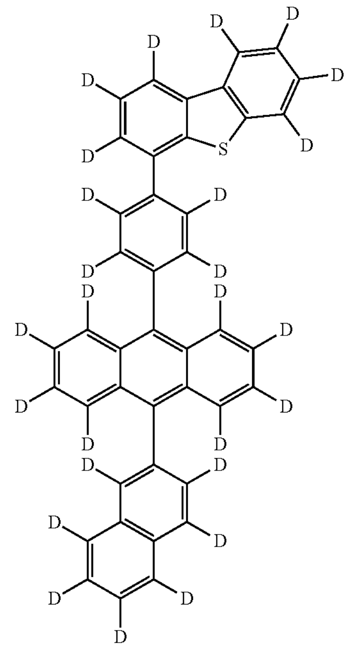
2-164
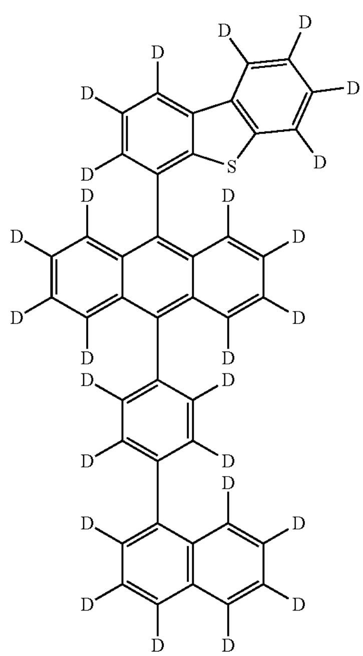
2-166
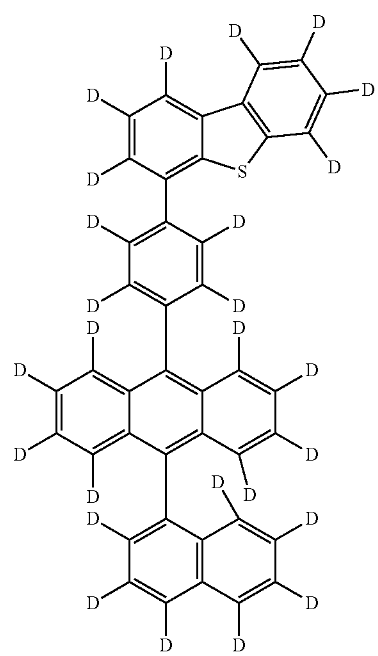

2-167
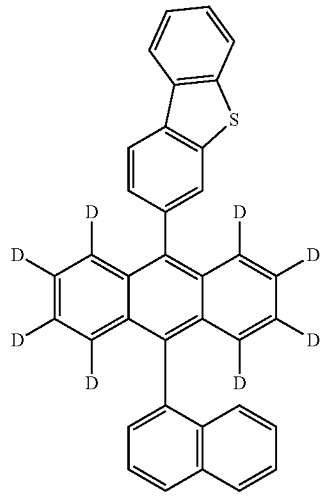
2-168
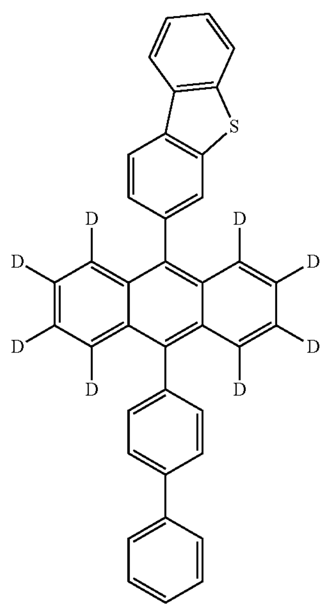
2-169
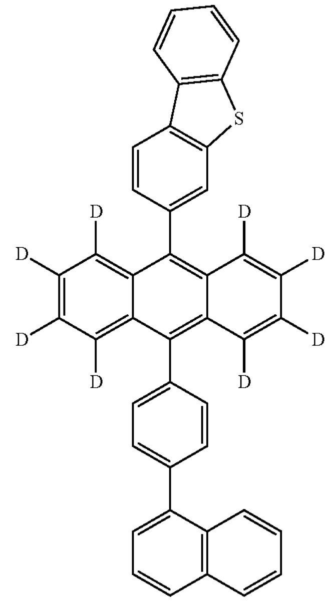
2-170
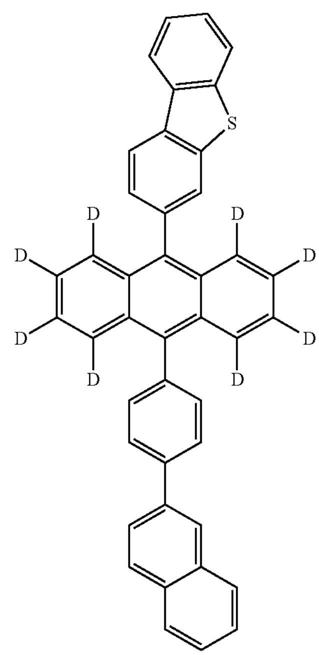

-continued
2-171
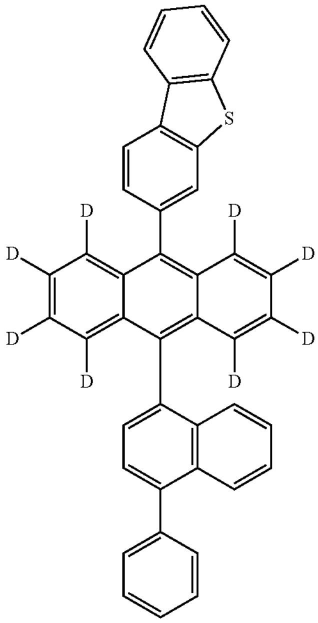
2-172
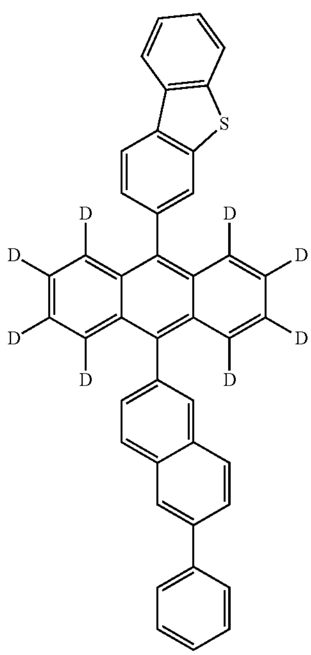
-continued
2-173
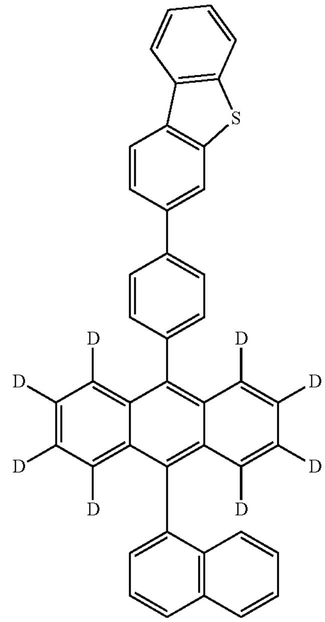
2-174
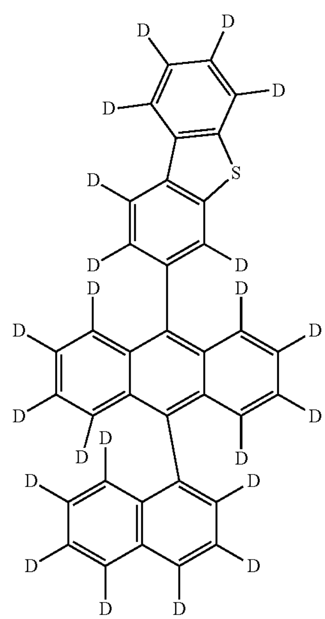

-continued
2-175
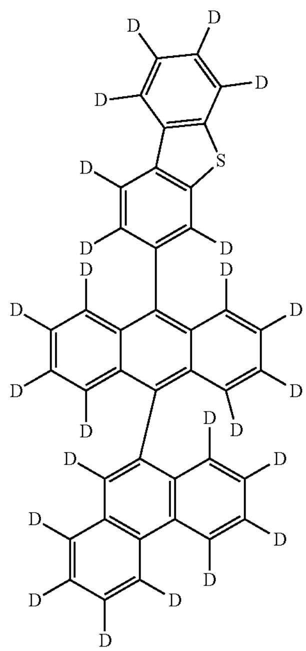
2-176
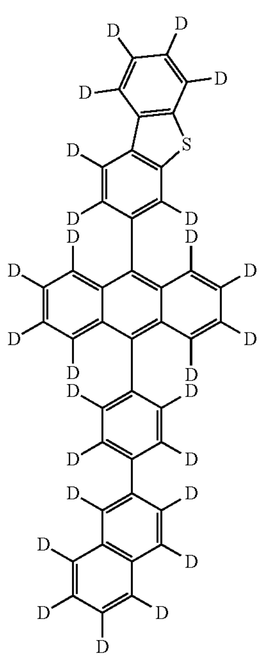
-continued
2-177
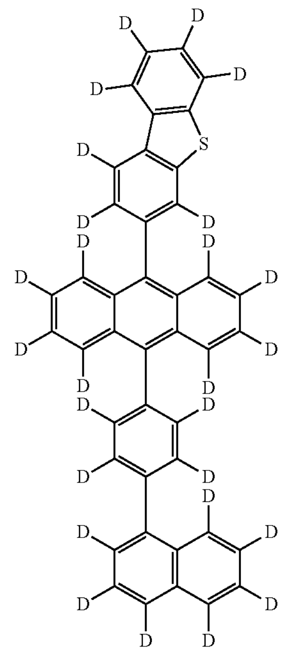
2-178
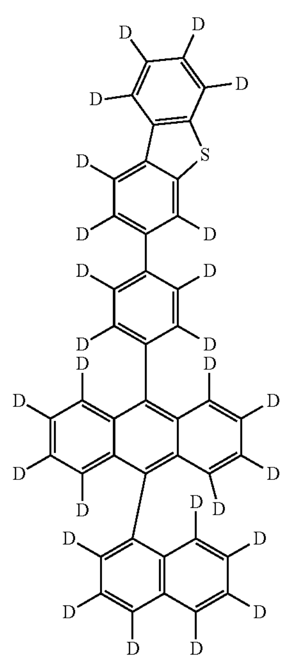

-continued
2-179
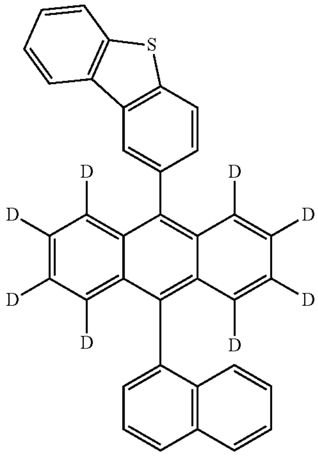
2-180
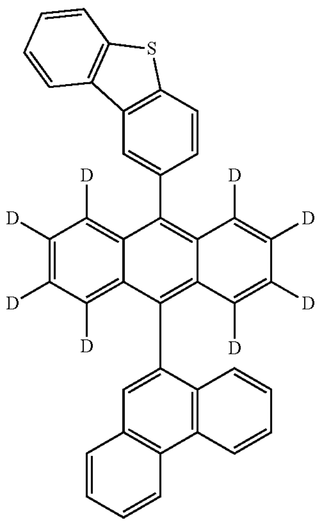
2-181
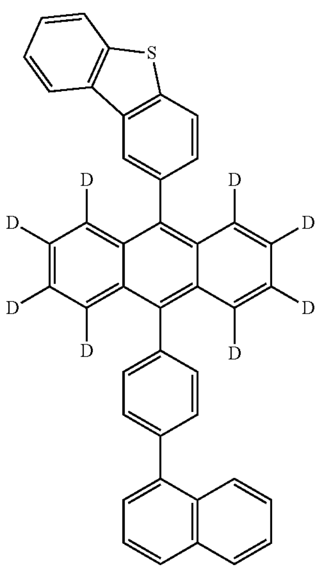
-continued
2-182
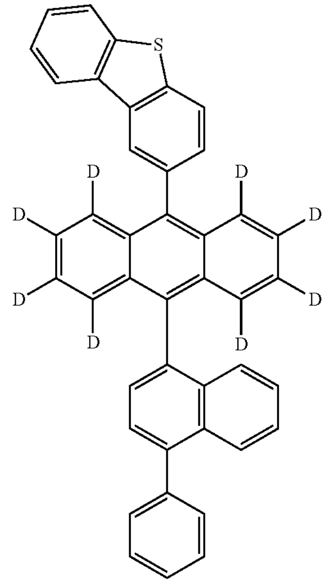
2-183
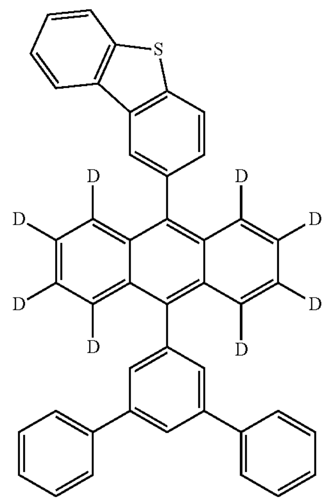
2-184
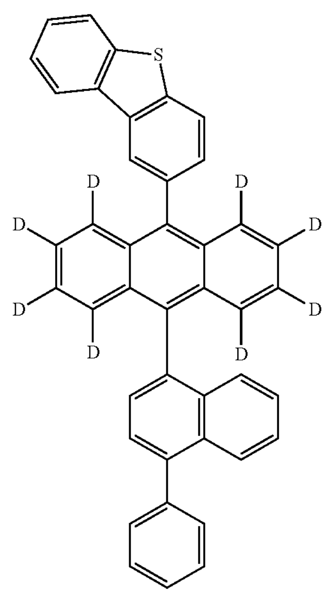

-continued
2-185
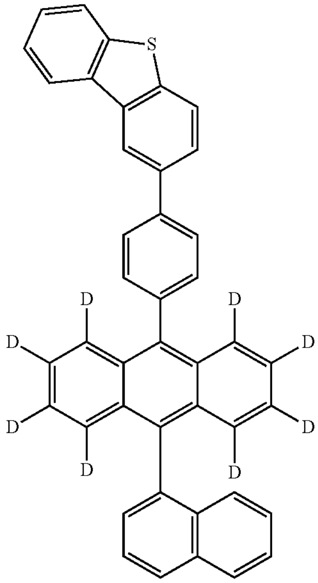
2-186
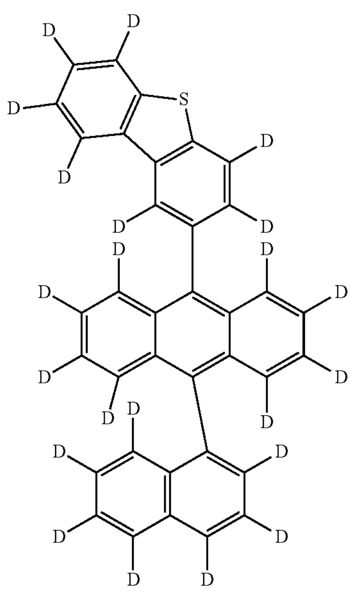
-continued
2-187
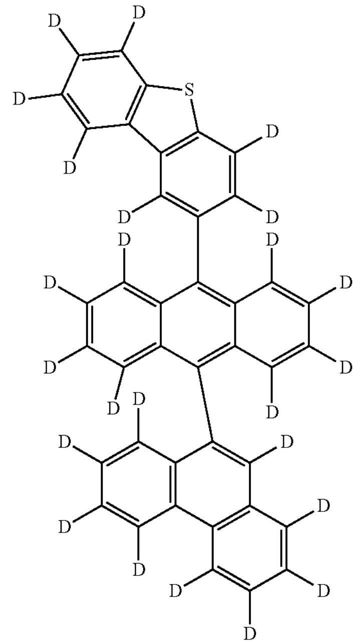
2-188
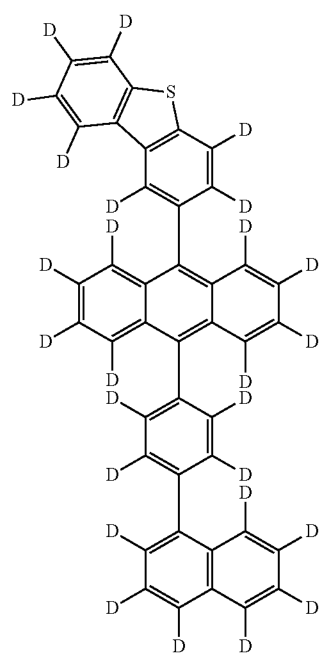

-continued
2-189
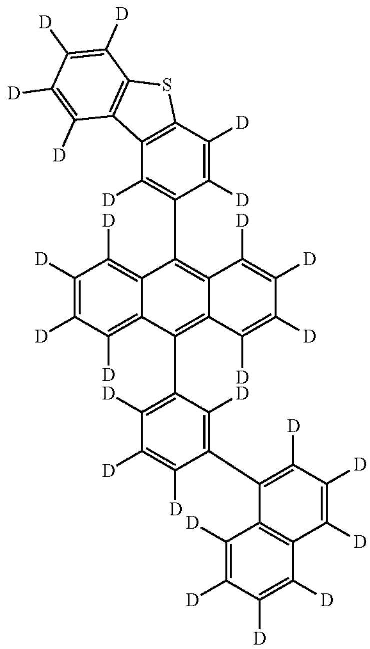
2-190
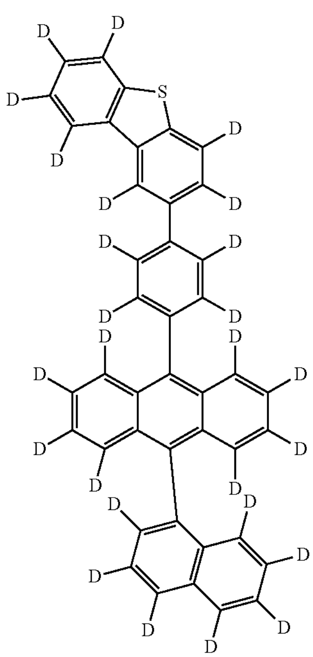
-continued
2-191
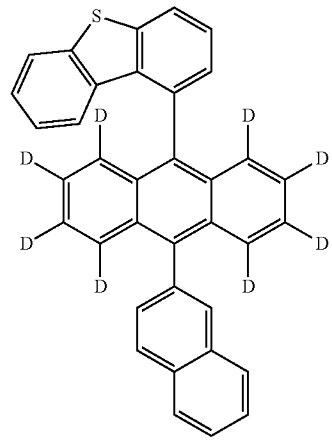
2-192
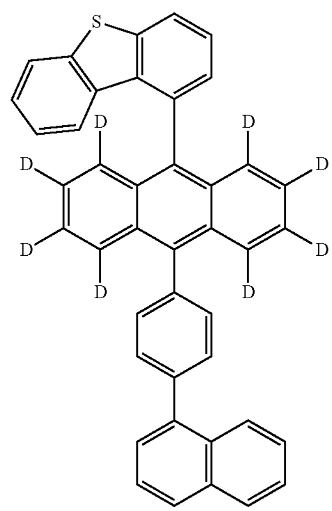
2-193
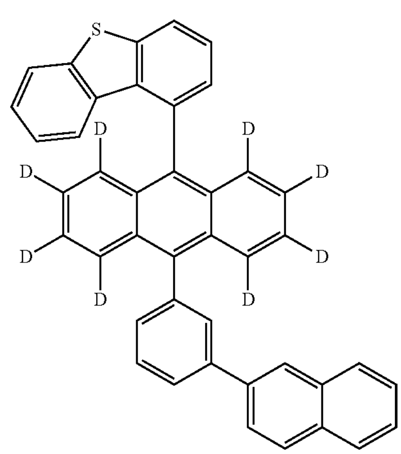

-continued
2-194
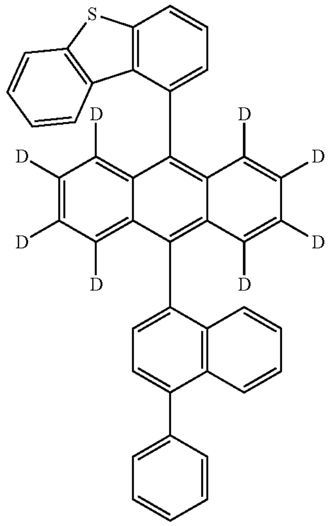
2-195
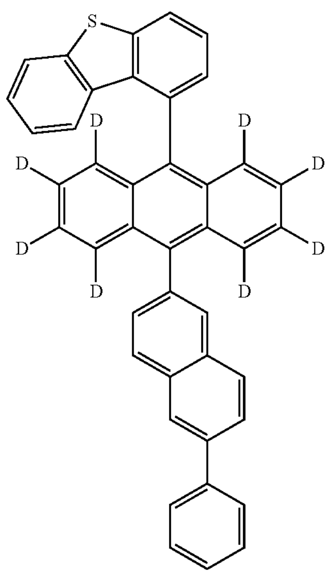
2-196
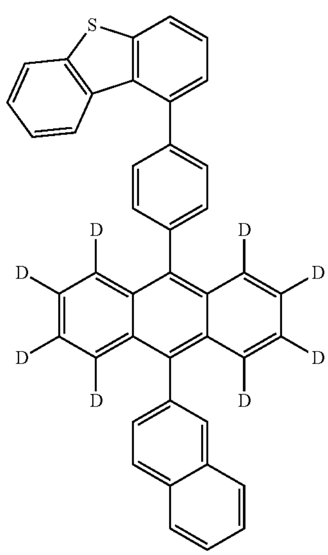
-continued
2-197
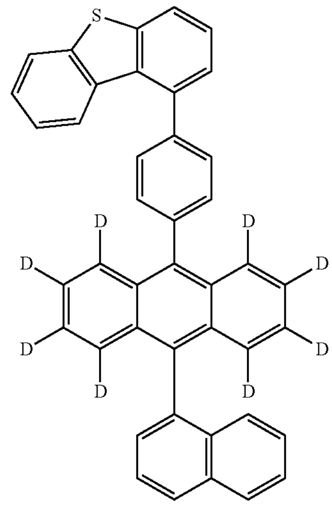
2-198
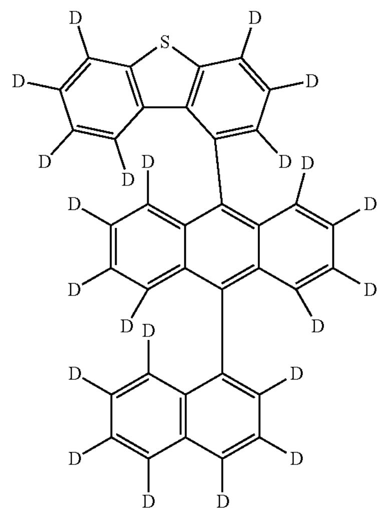
2-199
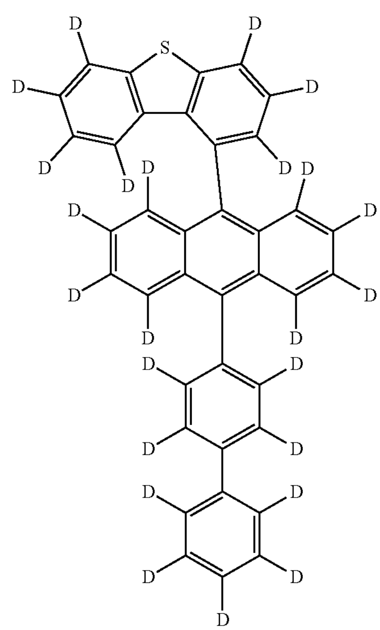

-continued
2-200
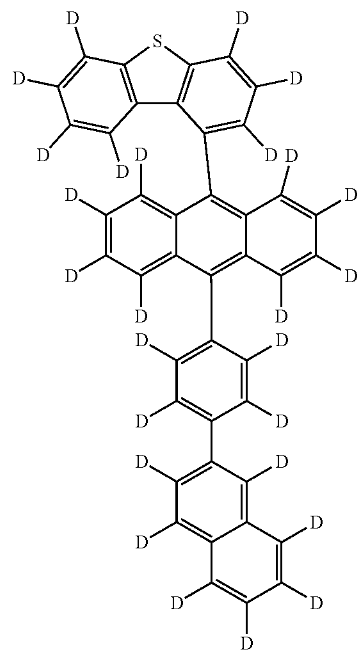
2-201
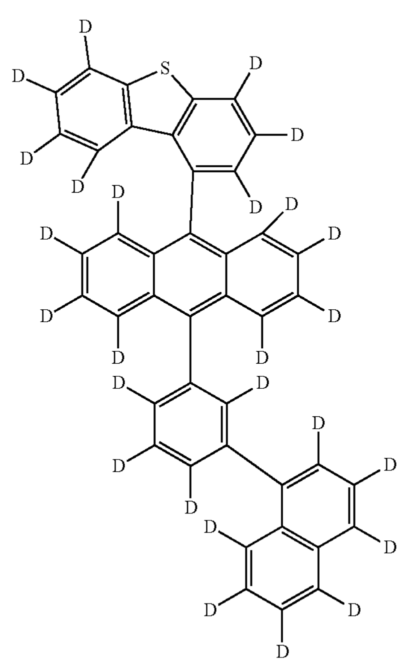
-continued
2-202
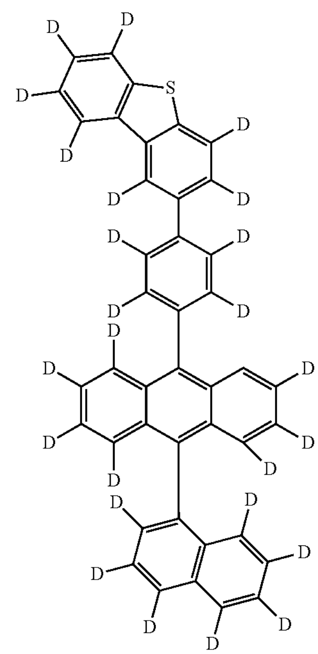
2-203
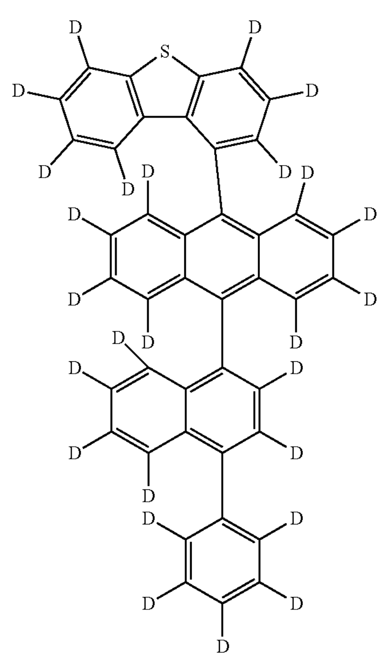

-continued
2-204
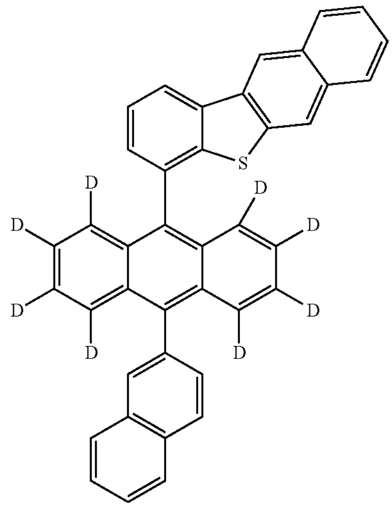
2-205
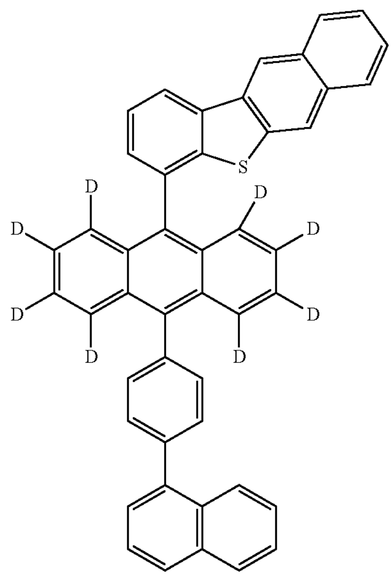
2-206
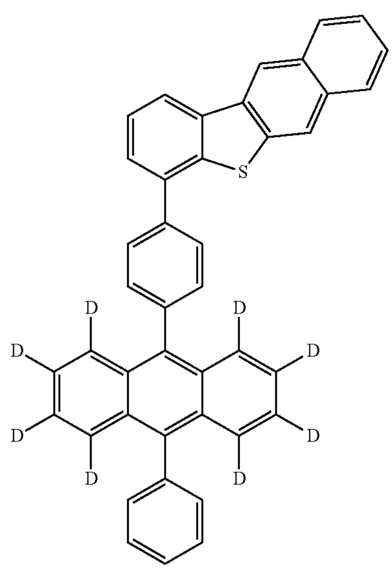
-continued
2-207
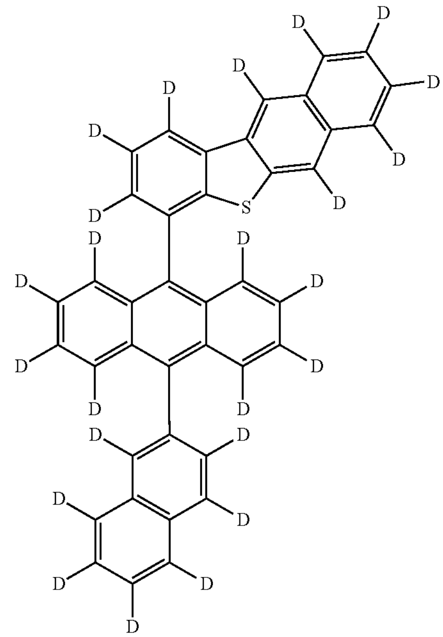
2-208
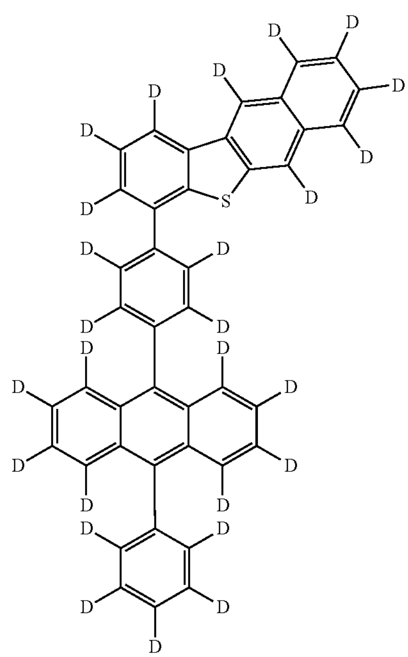

2-209
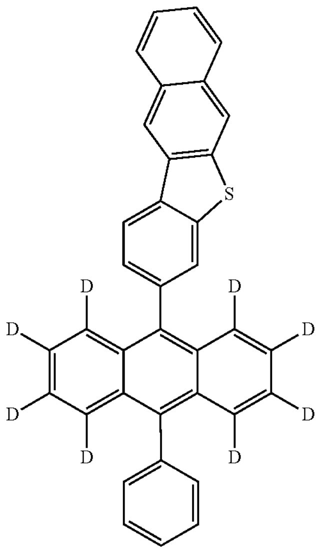
2-210
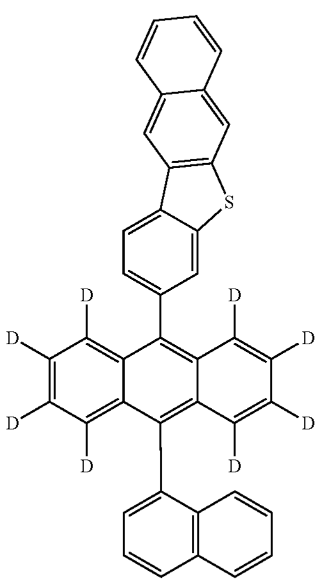
2-211
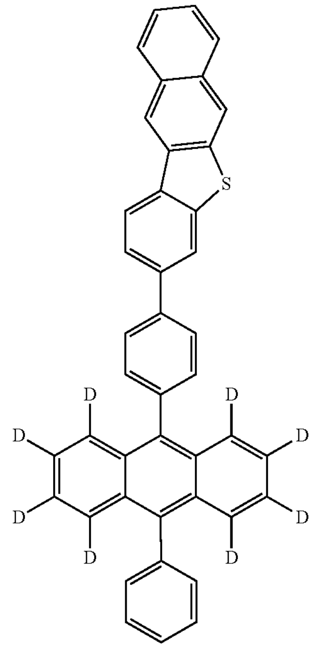
2-212
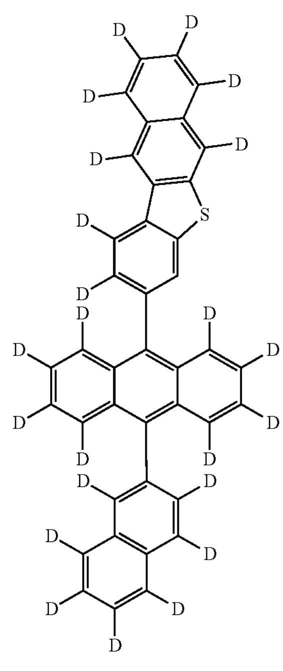

2-213
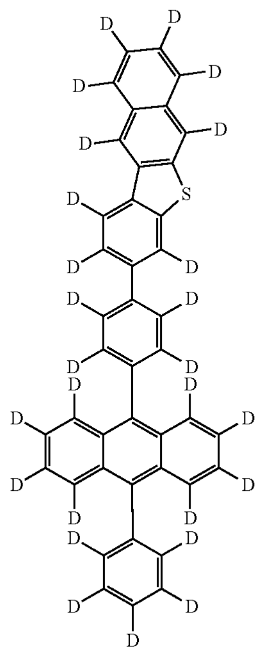
2-214
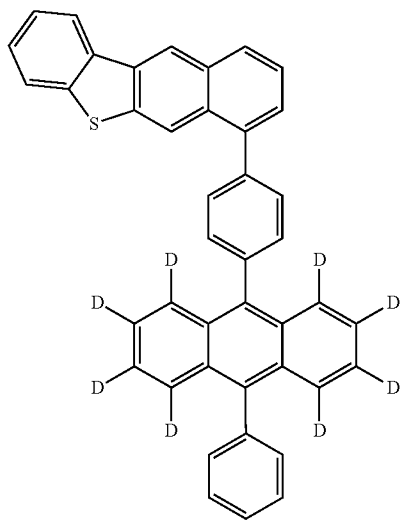
2-215
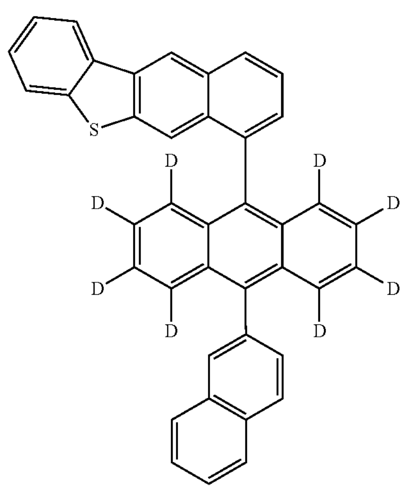
2-216
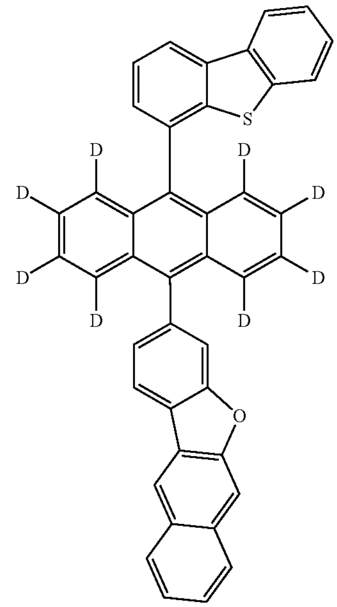
2-217
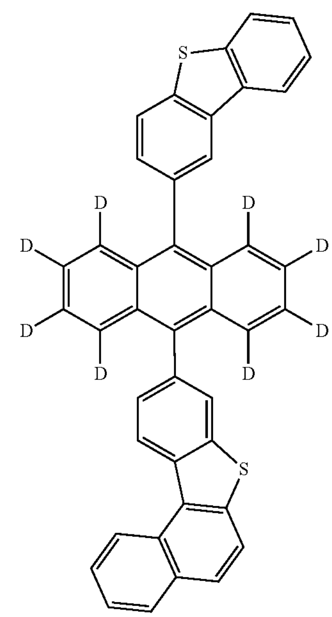

-continued
2-218
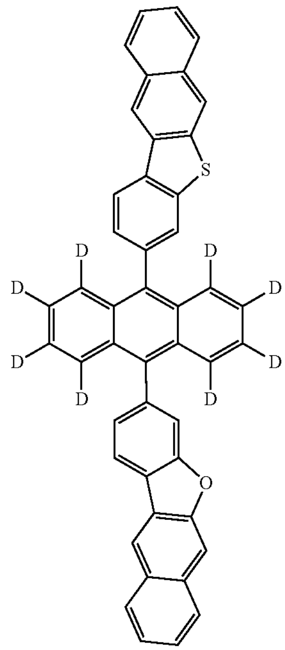
2-219
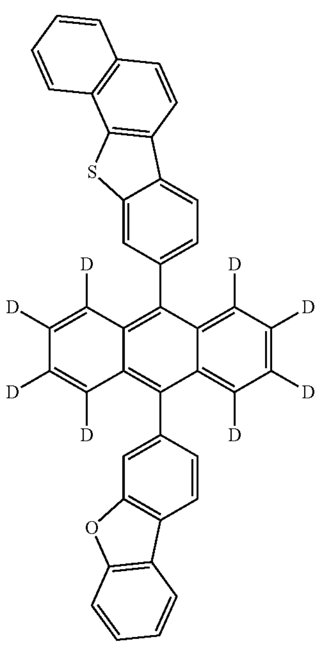
-continued
2-220
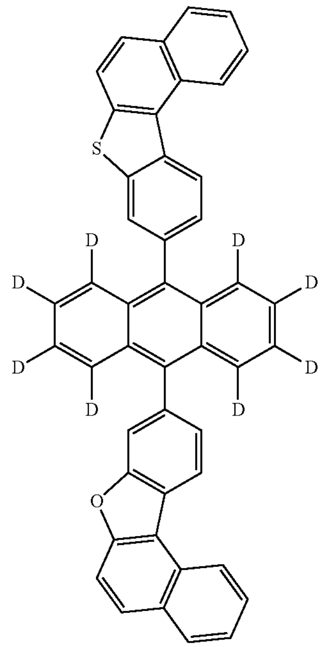
2-221
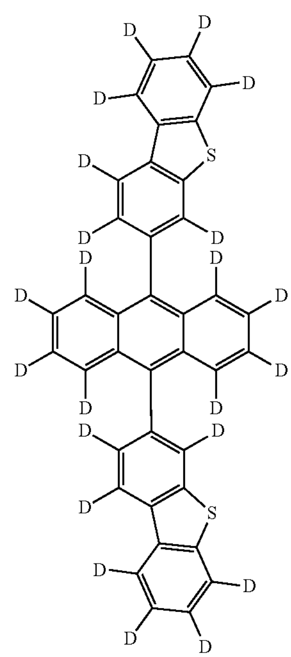

-continued 2-222

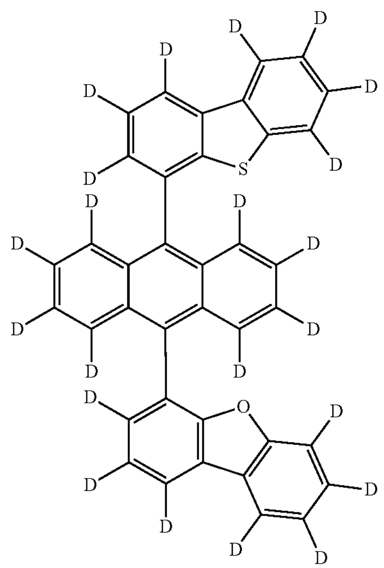

2-223

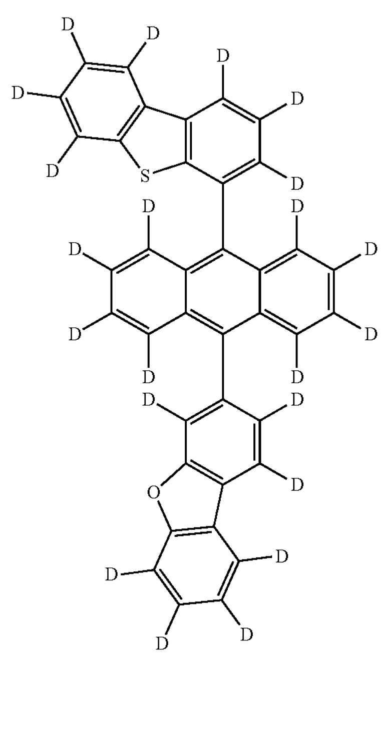

-continued 2-224

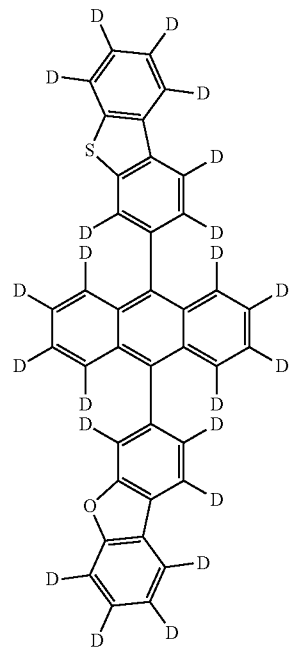

2-225

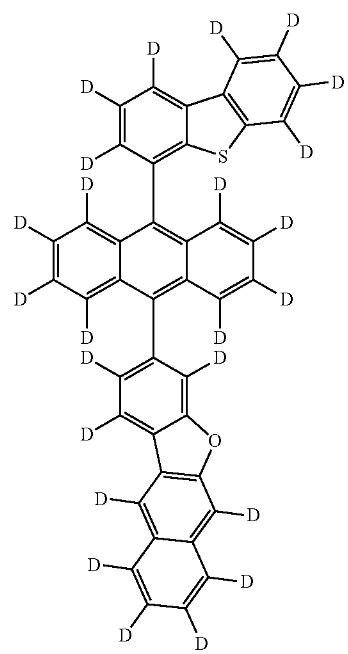

Hereinafter, methods for synthesis of the compounds represented by Formulas 1 and 2 will be described by way of representative examples.

However, the methods for synthesis of the compounds of the present disclosure are not limited to the methods exemplified below, and the compounds of the present disclosure may be produced by the methods exemplified below and methods known in the art.

Synthesis Example 1-1

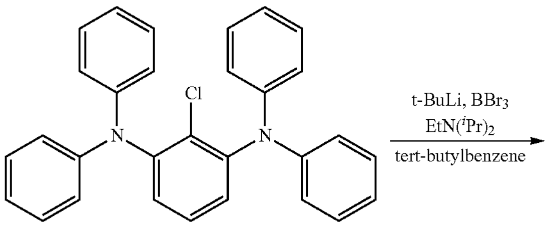

Starting material 1-1

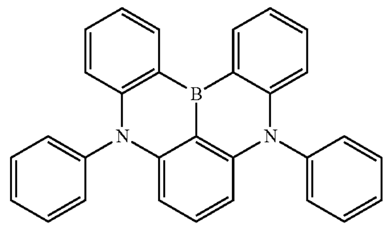

Compound 1-1

8.9 g (20 mmol) of starting material was dissolved in tert-butylbenzene (250 ml), and then the solution was cooled to 0° C. Under a nitrogen atmosphere, 24.7 ml (42 mmol) of 1.7 M tert-butyllithium solution (in pentane) was added thereto, followed by stirring at 60° C. for 2 hours.

Thereafter, the reaction solution was cooled again to 0° C. and 4.0 ml (42 mmol) of $BBr_3$ was added thereto, followed by stirring at room temperature for 0.5 hours. Then, the reaction solution was cooled again to 0° C. and 7.3 ml (42 mmol) of N,N-diisopropylethylamine was added thereto, followed by stirring at 60° C. for 2 hours.

The reaction solution was cooled slowly to room temperature, and the organic layer was extracted with ethyl acetate and water. The solvent was removed from the extracted organic layer, followed by purification by silica gel column chromatography (DCM/hexane). Then, recrystallization from a DCM/acetone mixture solvent afforded 1.7 g of compound 1-1 in a yield of 20.2%.

MS (MALDI-TOF) m/z: 420 [M]+

Synthesis Example 1-2

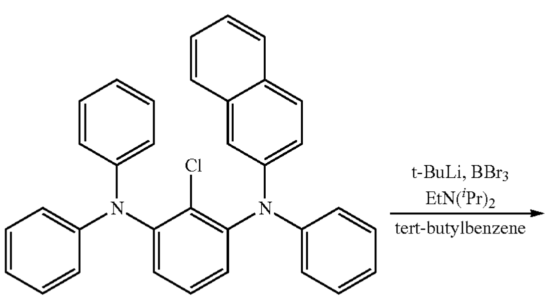

Starting material 1-3

-continued

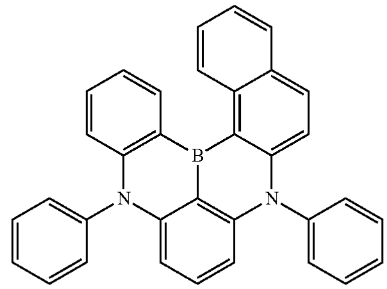

Compound 1-3

2.16 g of compound 1-3 was obtained in a yield of 23.0% by performing an experiment in the same manner as in Synthesis Example 1-1, except that 9.9 g (20 mmol) of starting material 1-3 was used instead of starting material 1-1.

MS (MALDI-TOF) m/z: 470 [M]+

Synthesis Example 1-3

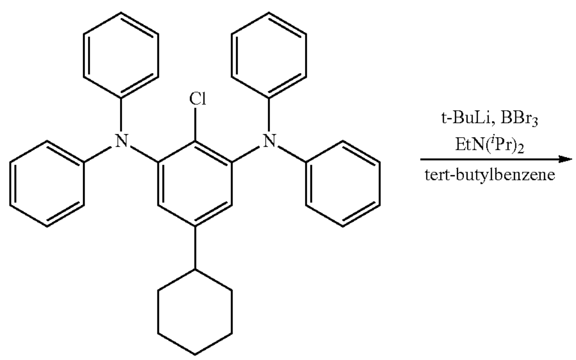

Starting material 1-5

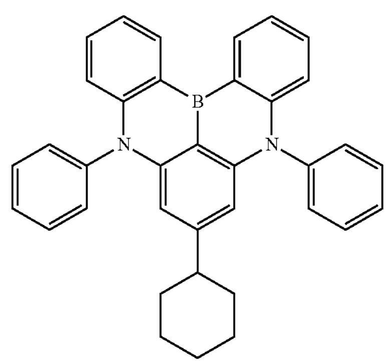

Compound 1-5

2.3 g of compound 1-5 was obtained in a yield of 23.2% by performing an experiment in the same manner as in Synthesis Example 1-1, except that 10.6 g (20 mmol) of starting material 1-5 was used instead of starting material 1-1.

MS (MALDI-TOF) m/z: 502 [M]+

Synthesis Example 1-4

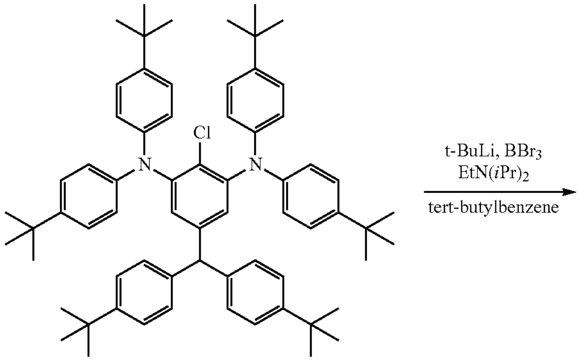

Starting material 1-14

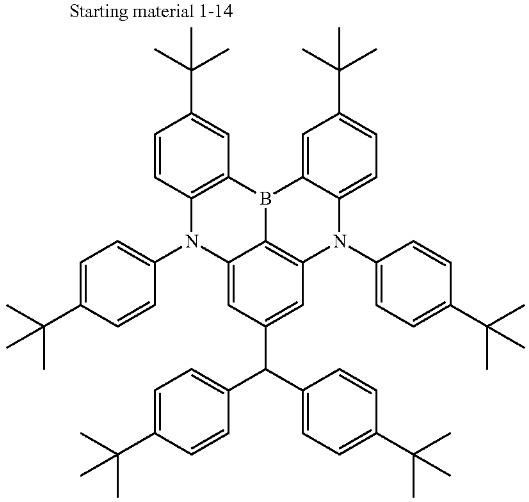

Compound 1-14

2.25 g of compound 1-14 was obtained in a yield of 12.2% by performing an experiment in the same manner as in Synthesis Example 1-1, except that 19.0 g of starting material 1-14 was used instead of starting material 1-1.

MS (MALDI-TOF) m/z: 924 [M]+

Synthesis Example 1-5

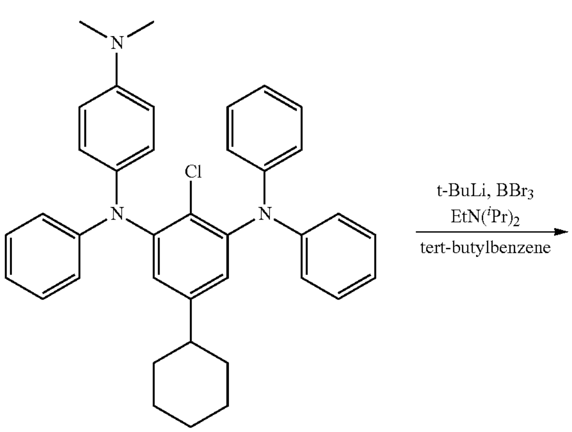

Starting material 1-55

-continued

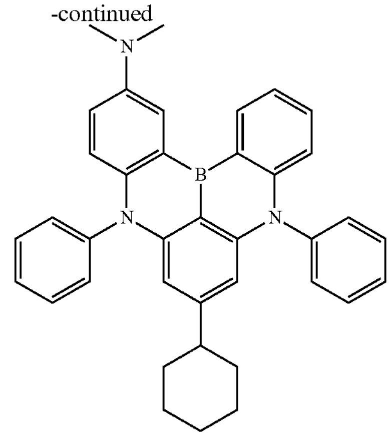

Compound 1-55

1.6 g of compound 1-55 was obtained in a yield of 15.0% by performing an experiment in the same manner as in Synthesis Example 1-1, except that 11.4 g of starting material 1-55 was used instead of starting material 1-1.

MS (MALDI-TOF) m/z: 545 [M]+

Synthesis Example 1-6

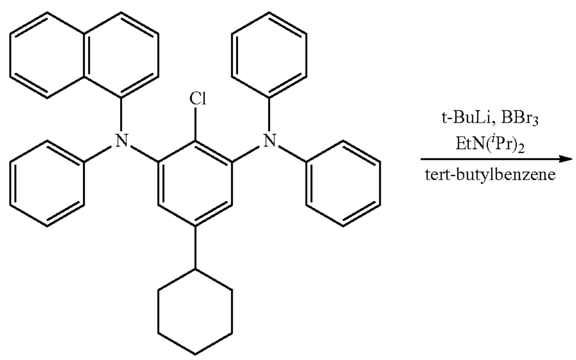

Starting material 1-62

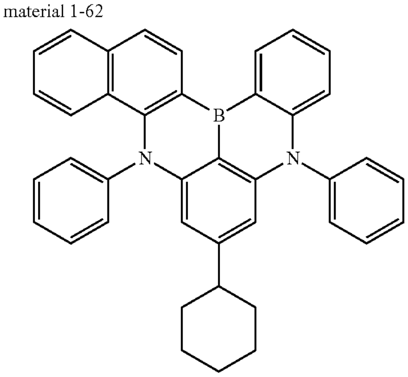

Compound 1-62

0.9 g of compound 1-62 was obtained in a yield of 8.4% by performing an experiment in the same manner as in Synthesis Example 1, except that 11.6 g of starting material 1-62 was used instead of starting material 1-1.

MS (MALDI-TOF) m/z: 552 [M]+

Synthesis Example 1-7

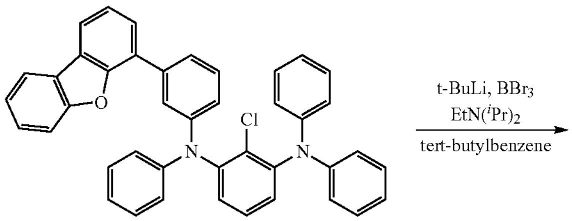

Starting material 1-63

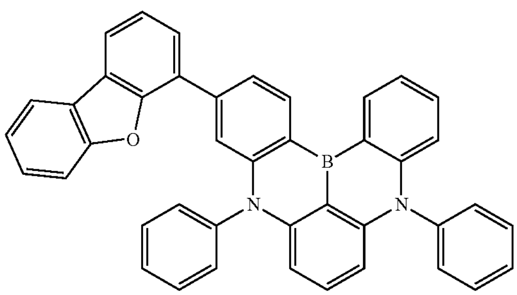

Starting material 1-63

0.82 g of compound 1-63 was obtained in a yield of 7.0% by performing an experiment in the same manner as in Synthesis Example 1-1, except that 12.2 g (20 mmol) of starting material 1-63 was used instead of starting material 1-1.

MS (MALDI-TOF) m/z: 586 [M]+

Synthesis Example 1-8

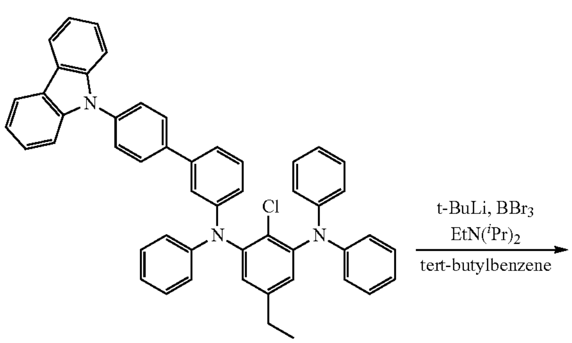

Starting material 1-64

-continued

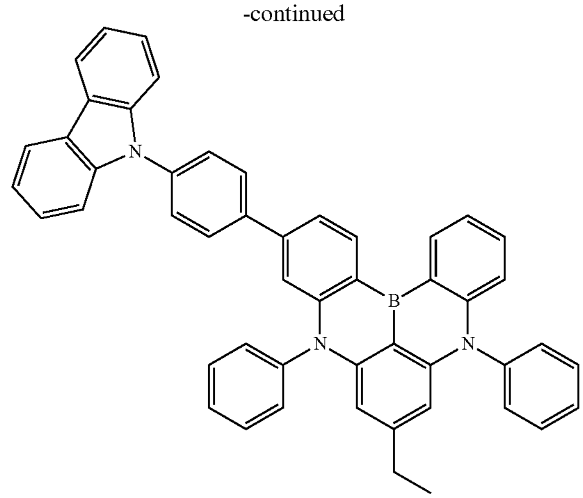

Compound 1-64

1.52 g of compound 1-64 was obtained in a yield of 11.0% by performing an experiment in the same manner as in Synthesis Example 1-1, except that 14.3 g (20 mmol) of starting material 1-64 was used instead of starting material 1-1.

MS (MALDI-TOF) m/z: 689 [M]+

Synthesis Example 1-9

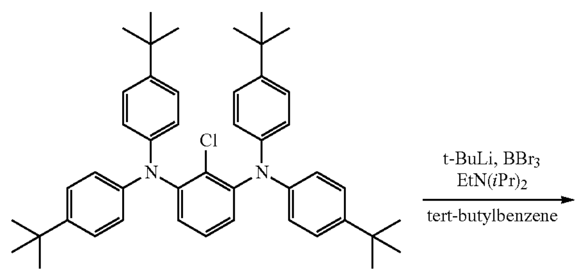

Starting material 1-104

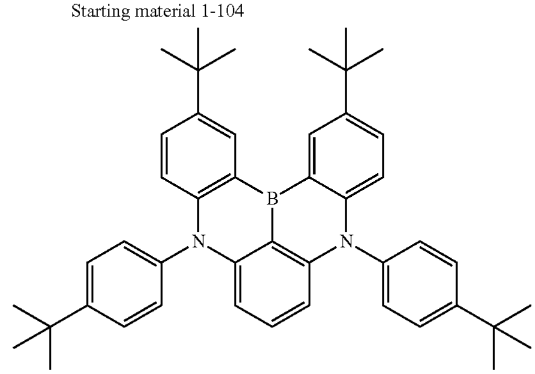

Compound 1-104

2.7 g of compound 1-104 was obtained in a yield of 21.7% by performing an experiment in the same manner as in Synthesis Example 1-1, except that 13.4 g of starting material 1-104 was used instead of starting material 1-1.

MS (MALDI-TOF) m/z: 644 [M]+

Synthesis Example 1-10

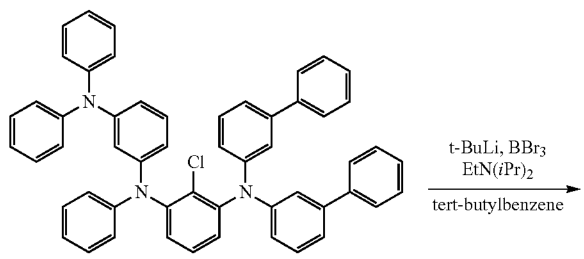

Compound 1-126

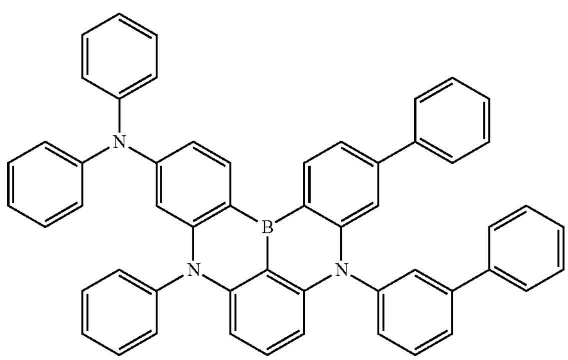

Compound 1-126

2.29 g of compound 1-126 was obtained in a yield of 15.0% by performing an experiment in the same manner as in Synthesis Example 1-1, except that 15.3 g of starting material 1-126 was used instead of starting material 1-1.

MS (MALDI-TOF) m/z: 739 [M]+

Synthesis Example 1-11

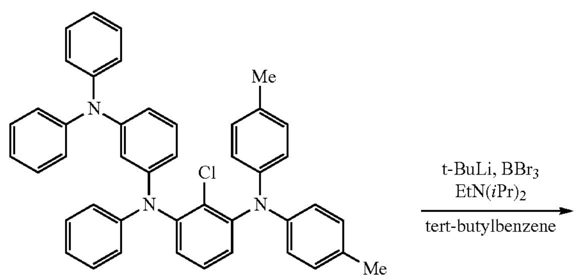

Compound 1-127

-continued

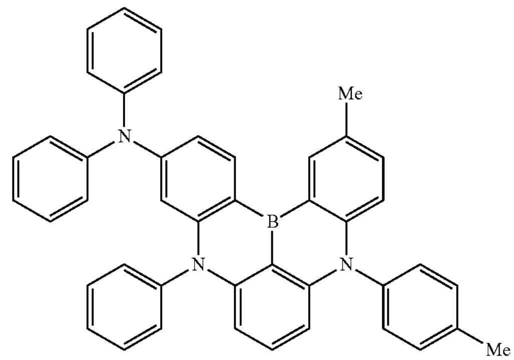

Compound 1-127

2.21 g of compound 1-127 was obtained in a yield of 18.0% by performing an experiment in the same manner as in Synthesis Example 1-1, except that 12.8 g of starting material 1-127 was used instead of starting material 1-1.

MS (MALDI-TOF) m/z: 615 [M]+

Synthesis Example 1-12

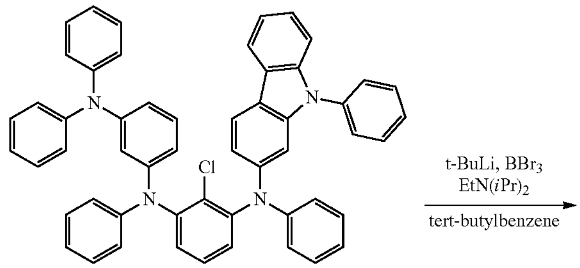

Starting material 1-129

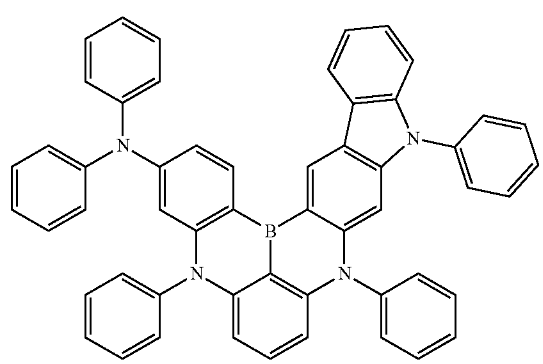

Compound 1-129

1.05 g of compound 1-129 was obtained in a yield of 7.0% by performing an experiment in the same manner as in Synthesis Example 1-1, except that 15.5 g of starting material 1-129 was used instead of starting material 1-1.

MS (MALDI-TOF) m/z: 752 [M]+

Synthesis Example 1-13

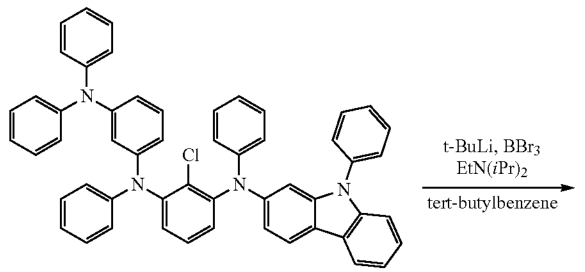

Starting material 1-130

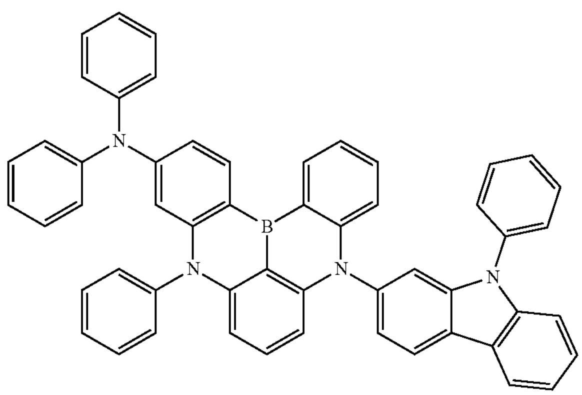

Compound 1-130

0.15 g of compound 1-130 was obtained in a yield of 1.1% by performing an experiment in the same manner as in Synthesis Example 1-1, except that 15.5 g of starting material 1-130 was used instead of starting material 1-1.

MS (MALDI-TOF) m/z: 752 [M]+

Synthesis Example 1-14

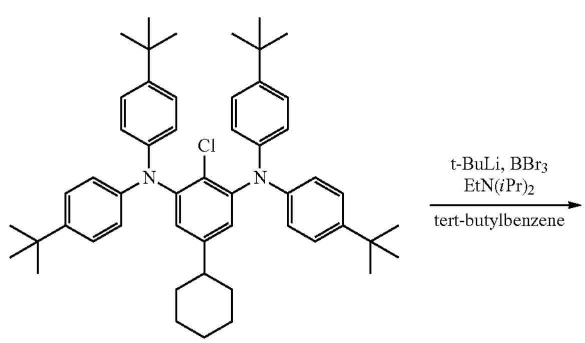

Starting material 1-146

-continued

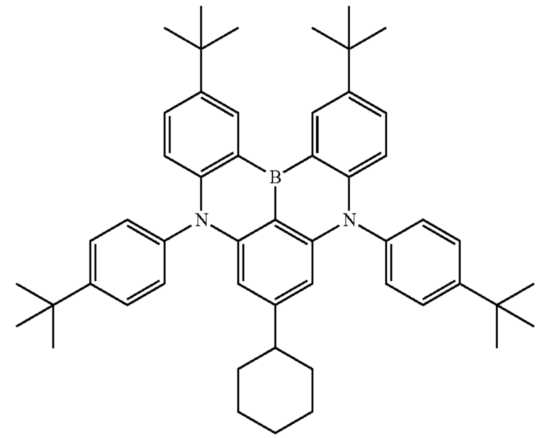

Compound 1-146

3.1 g of compound 1-146 was obtained in a yield of 21.2% by performing an experiment in the same manner as in Synthesis Example 1-1, except that 15.1 g of starting material 1-146 was used instead of starting material 1-1.

MS (MALDI-TOF) m/z: 726 [M]+

Synthesis Example 1-15

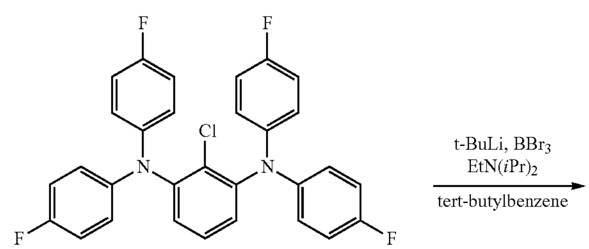

Starting material 1-148

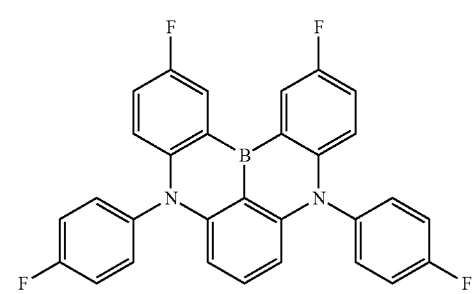

Compound 1-148

1.3 g of compound 1-148 was obtained in a yield of 12.7% by performing an experiment in the same manner as in Synthesis Example 1-1, except that 10.4 g of starting material 1-148 was used instead of starting material 1-1.

MS (MALDI-TOF) m/z: 492 [M]+

Synthesis Example 1-16

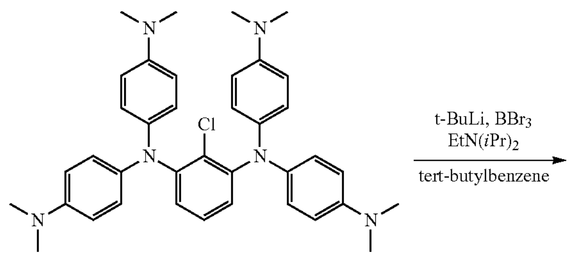

Starting material 1-151

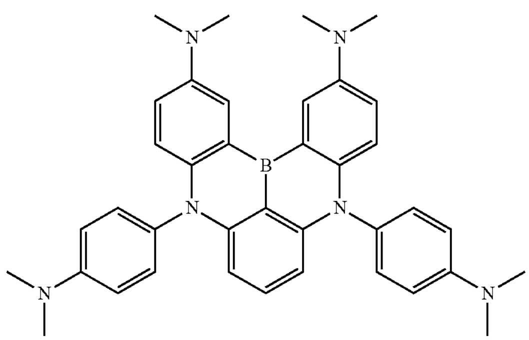

Compound 1-151

1.9 g of compound 1-151 was obtained in a yield of 16.4% by performing an experiment in the same manner as in Synthesis Example 1-1, except that 12.4 g of starting material 1-151 was used instead of starting material 1-1.

MS (MALDI-TOF) m/z: 592 [M]+

Synthesis Example 1-17

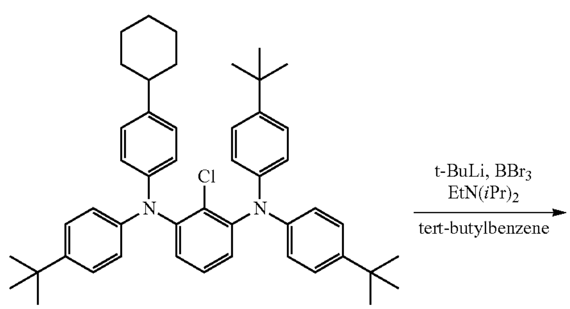

Starting material 1-166

-continued

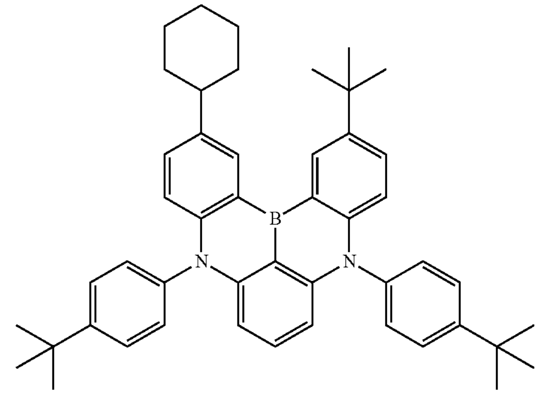

Compound 1-166

2.6 g of compound 1-166 was obtained in a yield of 19.2% by performing an experiment in the same manner as in Synthesis Example 1-1, except that 13.9 g of starting material 1-166 was used instead of starting material 1-1.

MS (MALDI-TOF) m/z: 670 [M]+

Synthesis Example 1-18

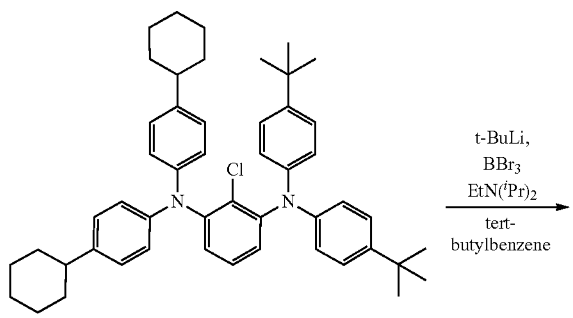

Starting material 1-167

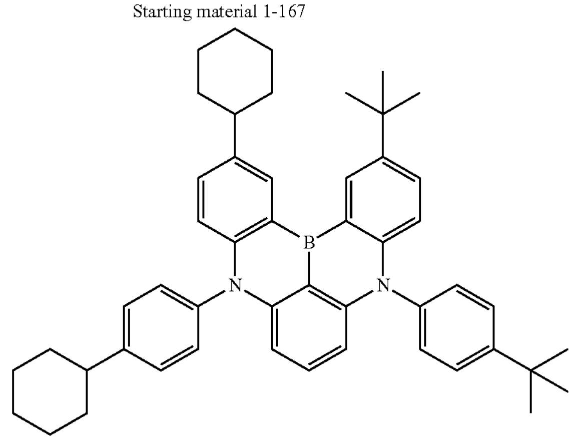

Compound 1-167

2.8 g of compound 1-167 was obtained in a yield of 20.4% by performing an experiment in the same manner as in Synthesis Example 1-1, except that 14.5 g of starting material 1-167 was used instead of starting material 1-1.

MS (MALDI-TOF) m/z: 696 [M]+

Synthesis Example 1-19

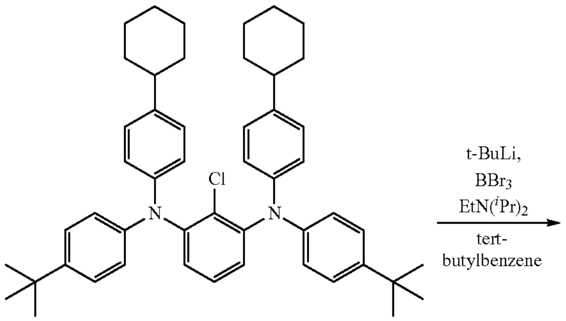

Starting material 1-169

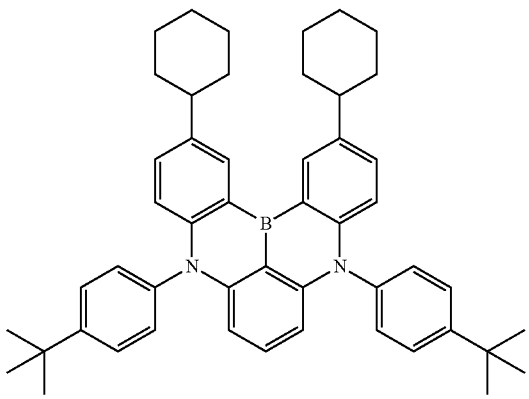

Compound 1-169

2.1 g of compound 1-169 was obtained in a yield of 15.4% by performing an experiment in the same manner as in Synthesis Example 1-1, except that 14.5 g of starting material 1-169 was used instead of starting material 1-1.

MS (MALDI-TOF) m/z: 696 [M]+

Synthesis Example 1-20

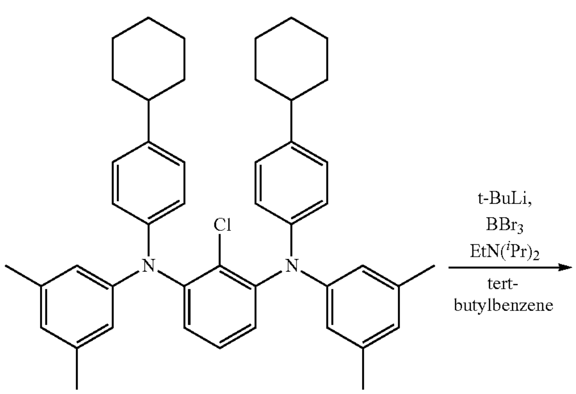

Starting material 1-170

-continued

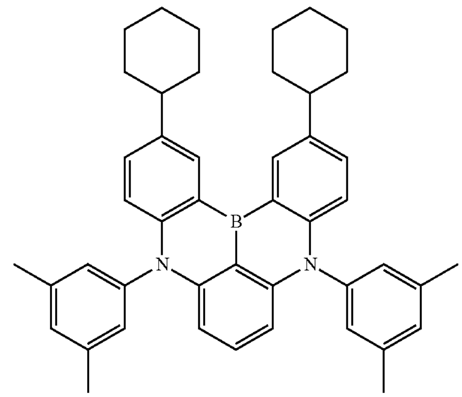

Compound 1-170

2.3 g of compound 1-170 was obtained in a yield of 17.8% by performing an experiment in the same manner as in Synthesis Example 1-1, except that 13.3 g of starting material 1-170 was used instead of starting material 1-1.

MS (MALDI-TOF) m/z: 640 [M]+

Synthesis Example 1-21

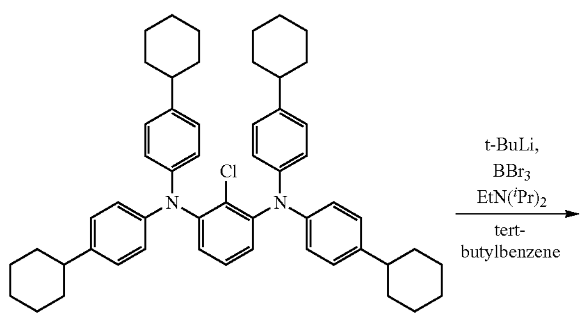

Starting material 1-171

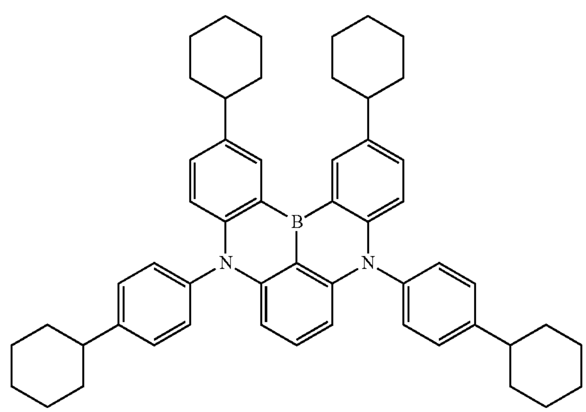

Compound 1-171

3.2 g of compound 1-171 was obtained in a yield of 21.1% by performing an experiment in the same manner as in Synthesis Example 1-1, except that 15.5 g of starting material 1-171 was used instead of starting material 1-1.

MS (MALDI-TOF) m/z: 748 [M]+

Synthesis Example 1-22

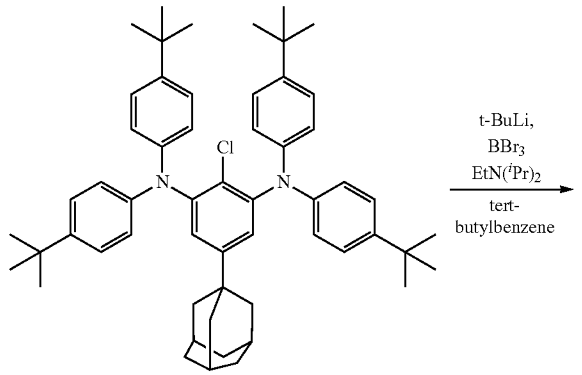

Starting material 1-179

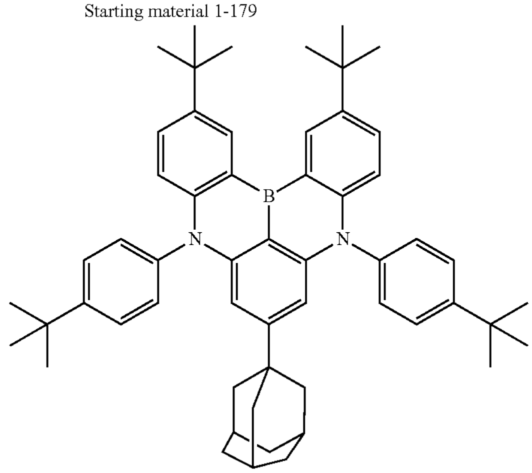

Compound 1-179

3.2 g of compound 1-179 was obtained in a yield of 20.7% by performing an experiment in the same manner as in Synthesis Example 1-1, except that 16.1 g (20 mmol) of starting material 1-179 was used instead of starting material 1-1.

MS (MALDI-TOF) m/z: 778 [M]+

Synthesis Example 1-23

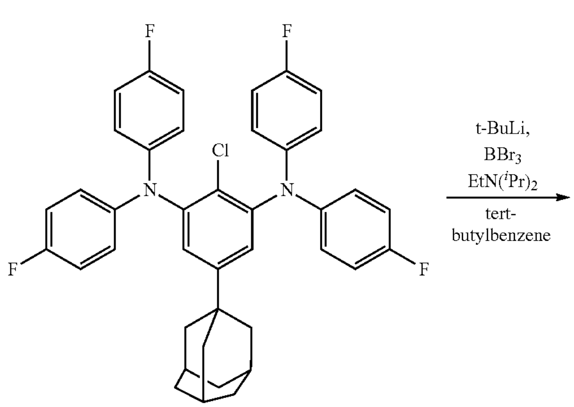

Starting material 1-181

-continued

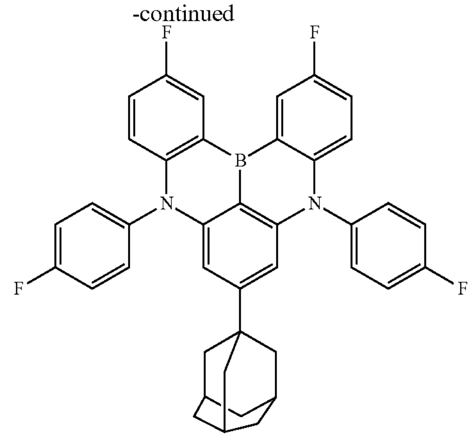

Compound 1-181

1.2 g of compound 1-181 was obtained in a yield of 9.9% by performing an experiment in the same manner as in Synthesis Example 1-1, except that 13.1 g of starting material 1-181 was used instead of starting material 1-1.

MS (MALDI-TOF) m/z: 626 [M]+

Synthesis Example 1-24

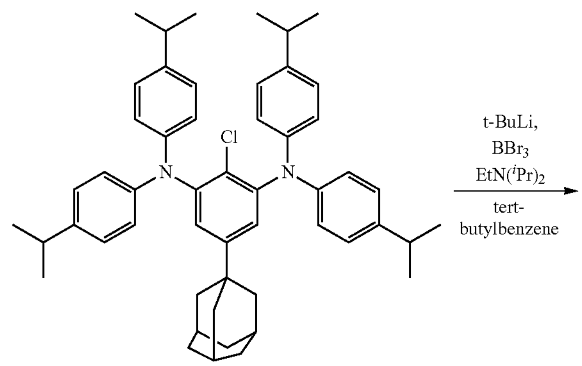

Starting material 1-182

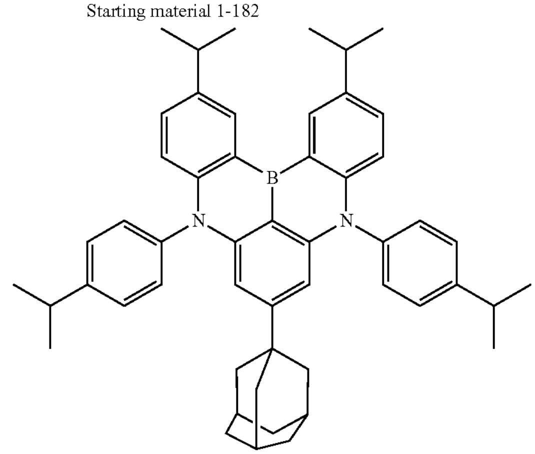

Compound 1-182

2.8 g of compound 1-182 was obtained in a yield of 19.1% by performing an experiment in the same manner as in Synthesis Example 1-1, except that 15.0 g of starting material 1-182 was used instead of starting material 1-1.

MS (MALDI-TOF) m/z: 722 [M]+

Synthesis Example 1-25

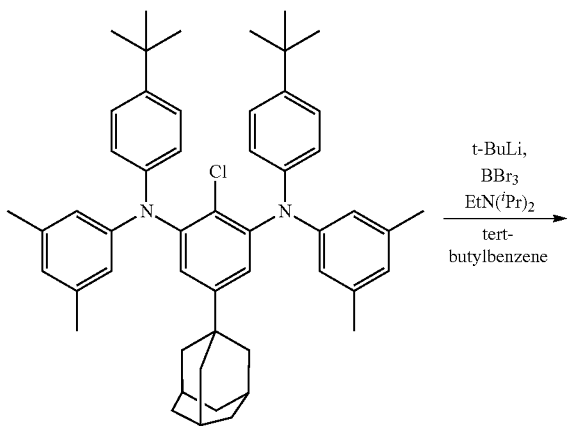

Starting material 1-183

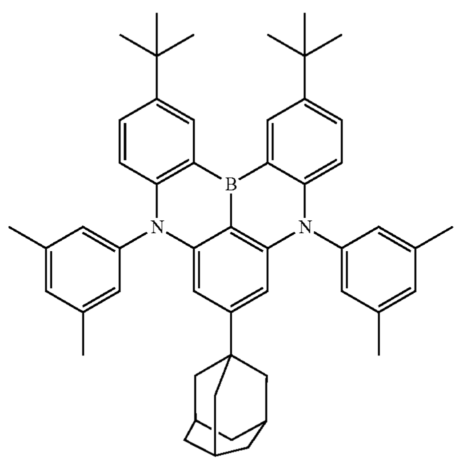

Compound 1-183

2.6 g of compound 1-183 was obtained in a yield of 18.0% by performing an experiment in the same manner as in Synthesis Example 1-1, except that 15.0 g of starting material 1-183 was used instead of starting material 1-1.

MS (MALDI-TOF) m/z: 722 [M]+

Synthesis Example 1-26

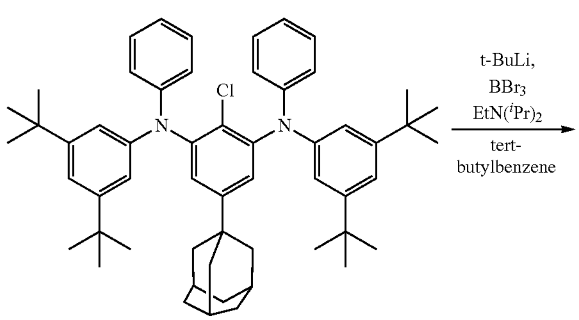

Starting material 1-184

-continued

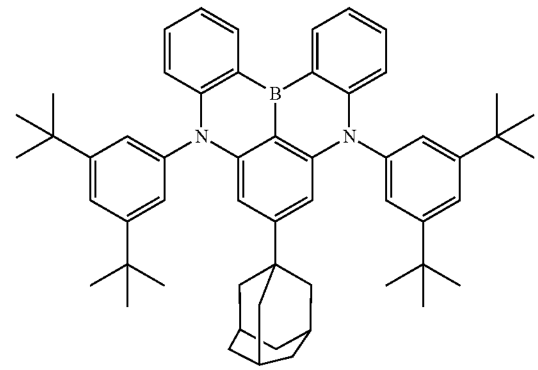

Compound 1-184

2.4 g of compound 1-184 was obtained in a yield of 15.2% by performing an experiment in the same manner as in Synthesis Example 1-1, except that 16.1 g of starting material 1-184 was used instead of starting material 1-1.

MS (MALDI-TOF) m/z: 778 [M]+

Synthesis Example 1-27

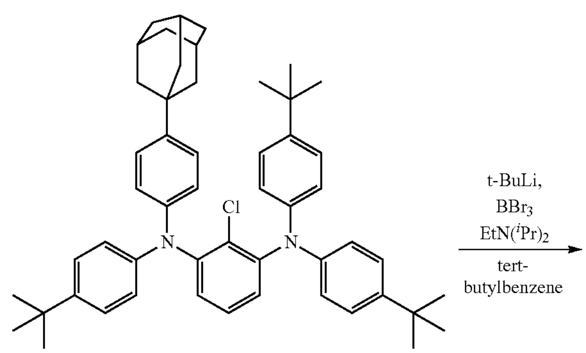

Starting materila 1-185

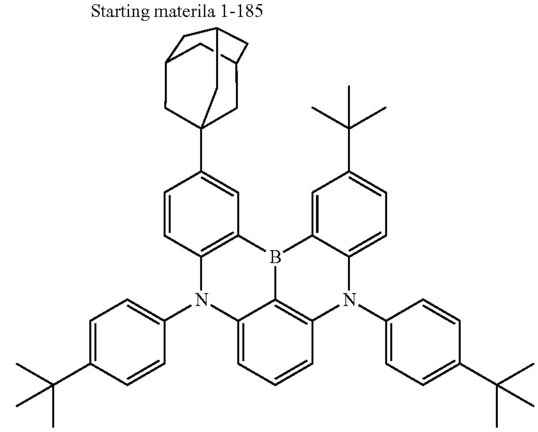

Compound 1-185

2.7 g of compound 1-185 was obtained in a yield of 18.8% by performing an experiment in the same manner as in Synthesis Example 1-1, except that 15.0 g of starting material 1-185 was used instead of starting material 1-1.

MS (MALDI-TOF) m/z: 722 [M]+

Synthesis Example 1-28

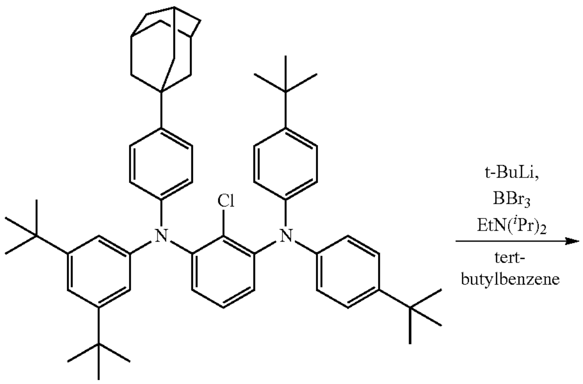

Starting material 1-187

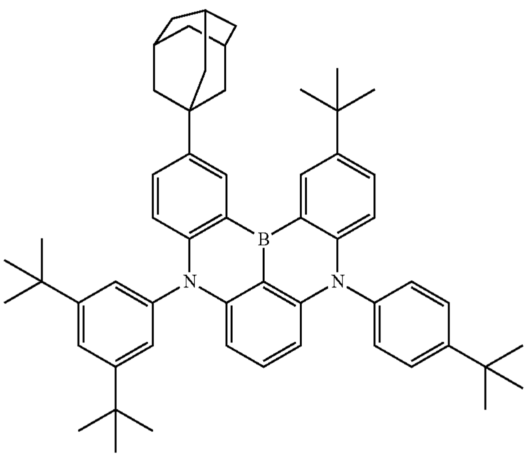

Compound 1-187

2.9 g of compound 1-187 was obtained in a yield of 18.3% by performing an experiment in the same manner as in Synthesis Example 1-1, except that 16.1 g of starting material 1-187 was used instead of starting material 1-1.

MS (MALDI-TOF) m/z: 778 [M]+

Synthesis Example 1-29

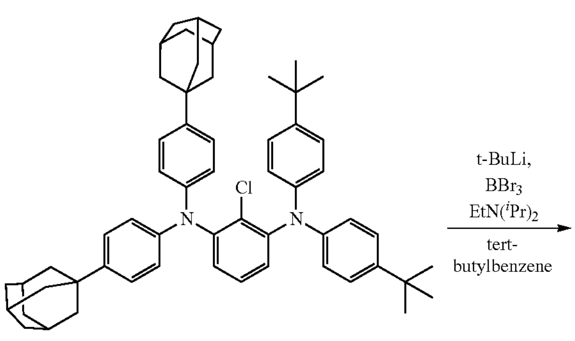

Starting material 1-188

-continued

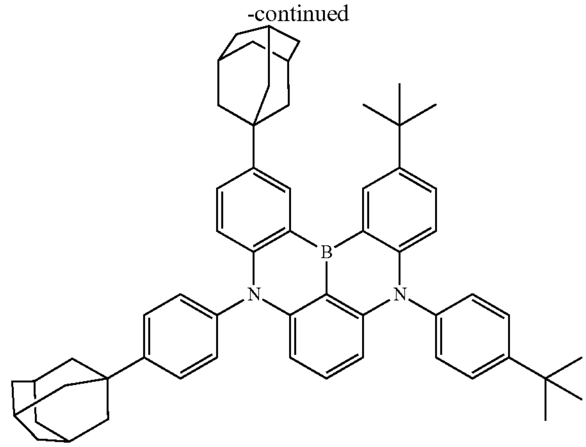

Compound 1-188

2.9 g of compound 1-188 was obtained in a yield of 17.8% by performing an experiment in the same manner as in Synthesis Example 1-1, except that 16.6 g of starting material 1-188 was used instead of starting material 1-1.

MS (MALDI-TOF) m/z: 800 [M]+

Synthesis Example 1-30

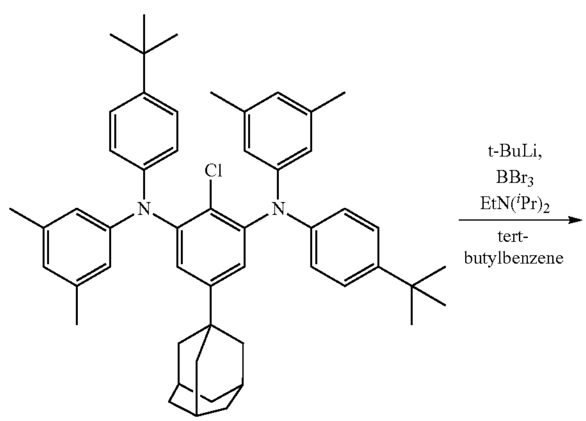

Starting material 1-193

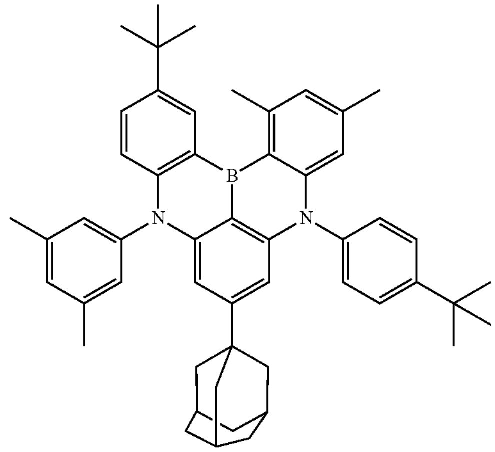

Compound 1-193

3.06 g of compound 1-193 was obtained in a yield of 21.2% by performing an experiment in the same manner as in Synthesis Example 1-1, except that 14.8 g of starting material 1-193 was used instead of starting material 1-1.

MS (MALDI-TOF) m/z: 722 [M]+

Synthesis Example 1-31

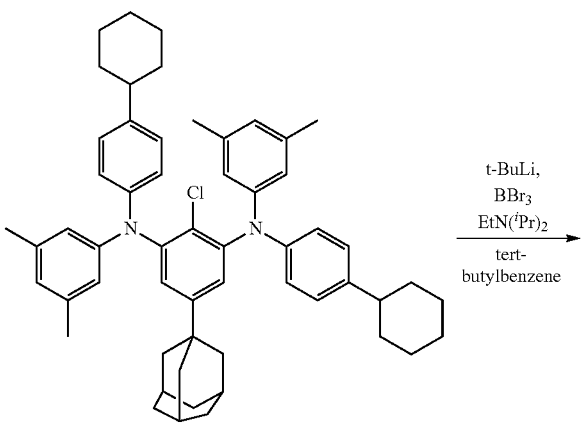

Starting material 1-198

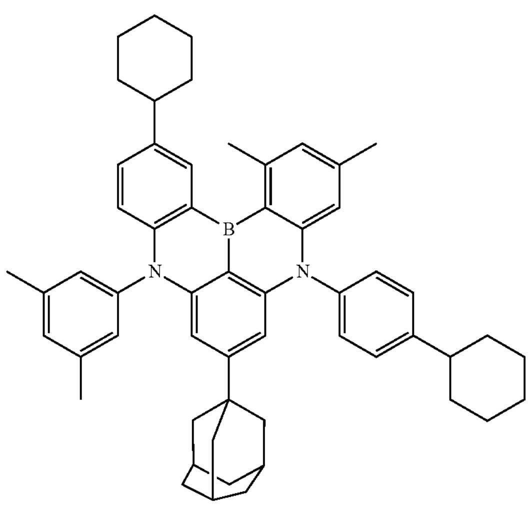

Compound 1-198

3.63 g of compound 1-198 was obtained in a yield of 23.4% by performing an experiment in the same manner as in Synthesis Example 1-1, except that 16.0 g of starting material 1-198 was used instead of starting material 1-1.

MS (MALDI-TOF) m/z: 774 [M]+

Synthesis Example 1-32

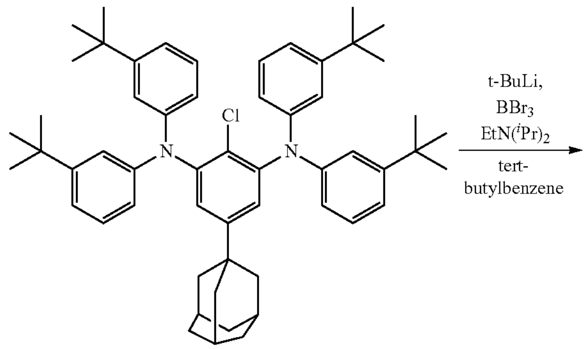

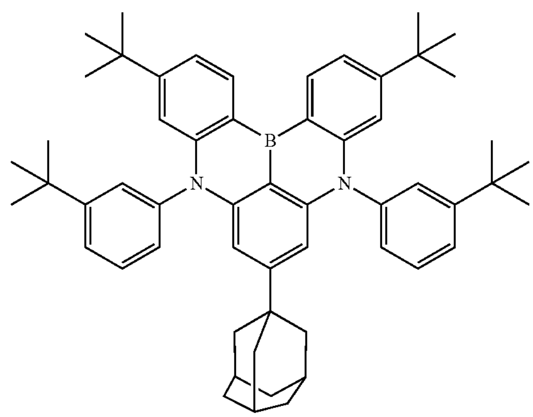

Compound 1-211

3.50 g of compound 1-211 was obtained in a yield of 25.4% by performing an experiment in the same manner as in Synthesis Example 1-1, except that 16.1 g of starting material 1-211 was used instead of starting material 1-1.

MS (MALDI-TOF) m/z: 778 [M]+

Synthesis Example 1-33

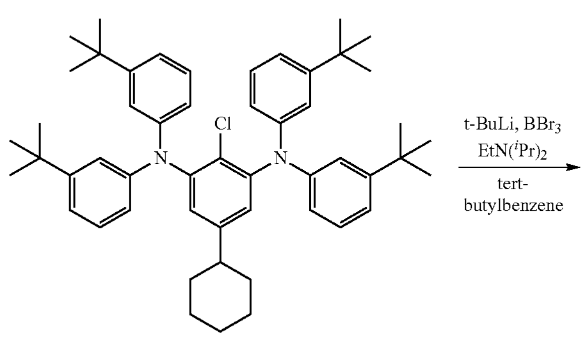

Starting material 1-212

-continued

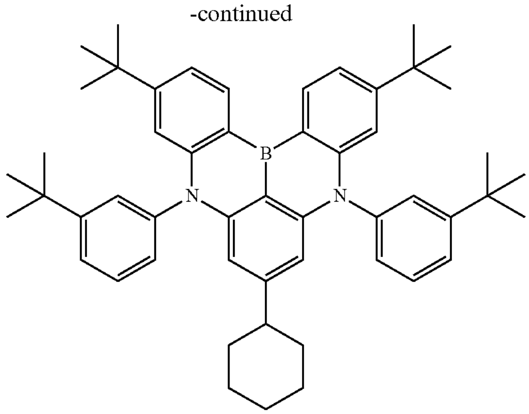

Compound 1-212

2.92 g of compound 1-212 was obtained in a yield of 20.1% by performing an experiment in the same manner as in Synthesis Example 1-1, except that 15.6 g of starting material 1-212 was used instead of starting material 1-1.

MS (MALDI-TOF) m/z: 726 [M]+

Synthesis Example 1-34

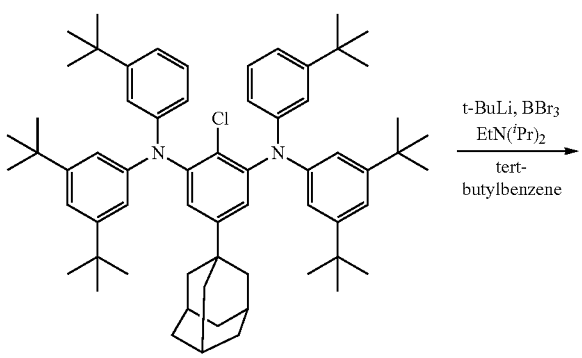

Starting material 1-216

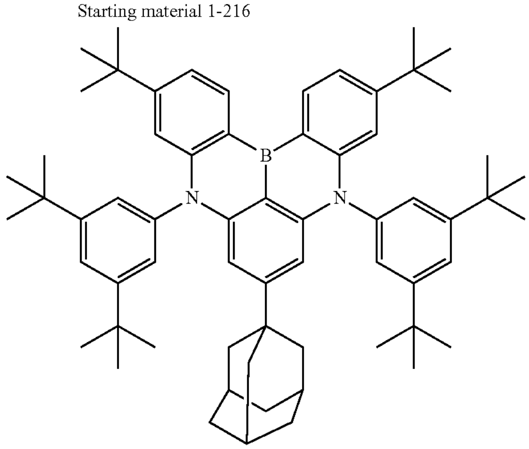

Compound 1-216

2.00 g of compound 1-216 was obtained in a yield of 11.2% by performing an experiment in the same manner as in Synthesis Example 1-1, except that 18.3 g of starting material 1-216 was used instead of starting material 1-1.

MS (MALDI-TOF) m/z: 891 [M]+

Synthesis Example 1-35

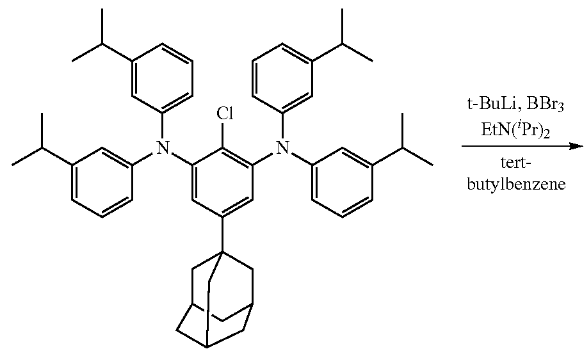

Starting material 1-219

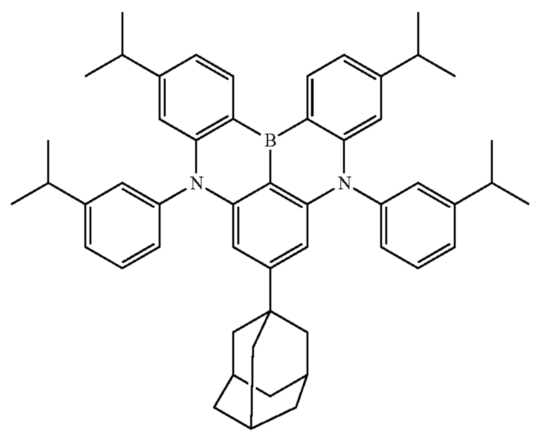

Compound 1-219

1.81 g of compound 1-219 was obtained in a yield of 12.5% by performing an experiment in the same manner as in Synthesis Example 1-1, except that 14.9 g of starting material 1-219 was used instead of starting material 1-1.

MS (MALDI-TOF) m/z: 722 [M]+

Synthesis Example 2-1: Synthesis of Compound 2-12

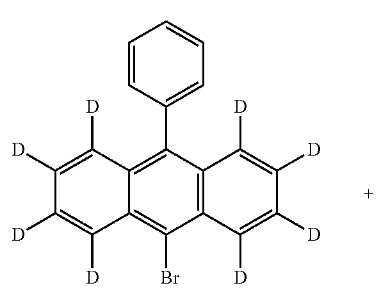

-continued

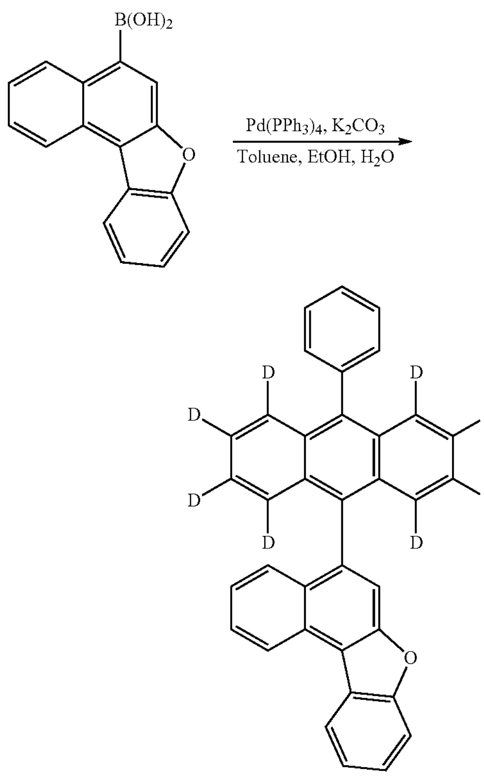

17.1 g (50 mmol) of starting material 2-1-A, 14.4 g (55 mmol) of starting material 2-1-B, 1.7 g (1.5 mmol) of tetrakistriphenylphosphine palladium and 20.7 g (150 mmol) of potassium carbonate were placed in a 2,000-ml flask, and then 500 ml of toluene, 100 ml of ethanol and 100 ml of $H_2O$ were added thereto.

The reaction solution was bubbled with $N_2$ at room temperature for 30 minutes with stirring, and then stirred under reflux at an elevated temperature for 6 hours. After cooling to room temperature, the reaction solution was added to 1,000 ml of methanol and the formed precipitate was filtered. Column chromatography was performed using dichloromethane and n-hexane as a developing solvent to obtain 13.2 g of compound 2-12 in a yield of 55%.

MS (MALDI-TOF) m/z: 478 [M]+

Synthesis Example 2-2: Synthesis of Compound 2-15

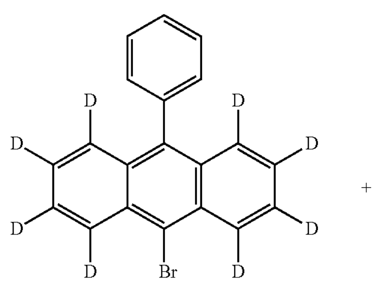

-continued

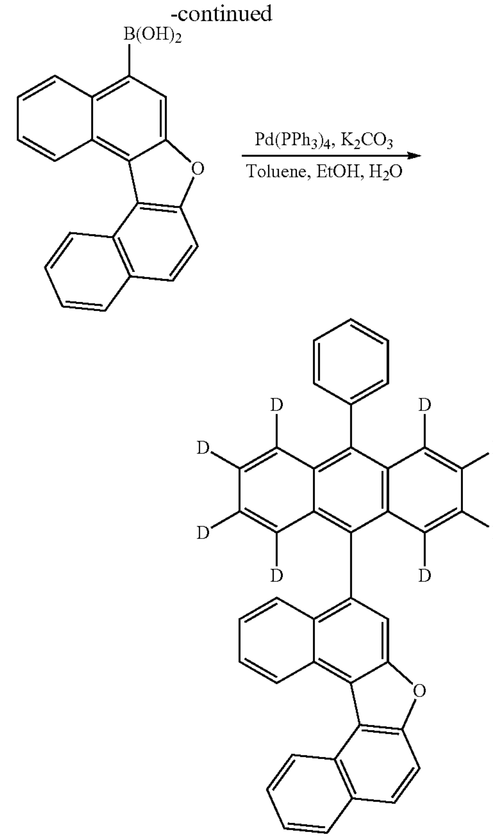

14.3 g of compound 2-15 was obtained in a yield of 54% in the same manner as in Synthesis Example 2-1, except that 17.2 g (55 mmol) of starting material 2-2-B was used instead of starting material 2-1-B.

MS (MALDI-TOF) m/z: 528 [M]+

Synthesis Example 2-3: Synthesis of Compound 2-22

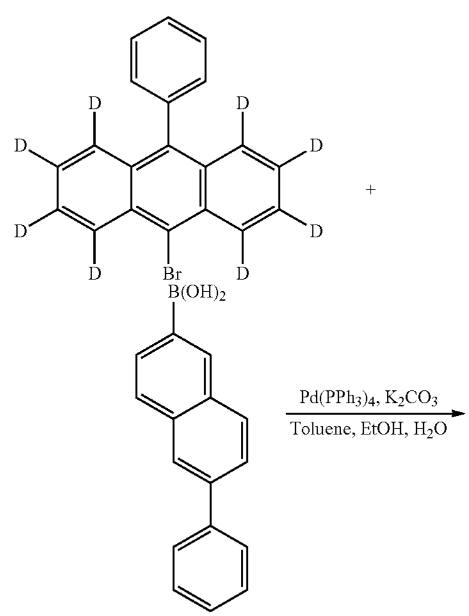

-continued

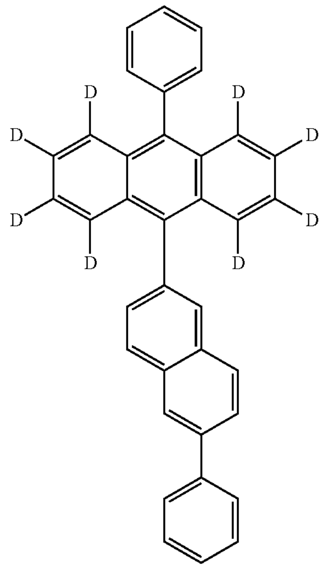

15.8 g of compound 2-22 was obtained in a yield of 68% in the same manner as in Synthesis Example 2-1, except that 13.6 g (55 mmol) of starting material 2-3-B was used instead of starting material 2-1-B.

MS (MALDI-TOF) m/z: 464 [M]+

Synthesis Example 2-4: Synthesis of Compound 2-131

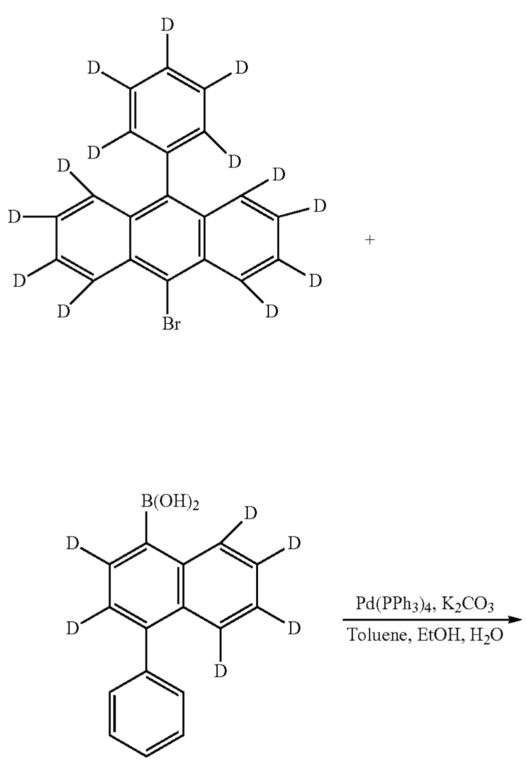

-continued

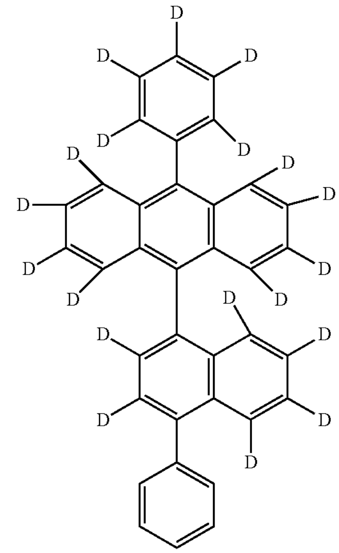

13.8 g of compound 2-131 was obtained in a yield of 58% in the same manner as in Synthesis Example 2-1, except that 17.3 g (50 mmol) of starting material 2-4-A and 14.0 g (55 mmol) of starting material 2-4-B were used instead of starting materials 2-1-A and 2-1-B.

MS (MALDI-TOF) m/z: 475 [M]+

Synthesis Example 2-5: Synthesis of Compound 2-47

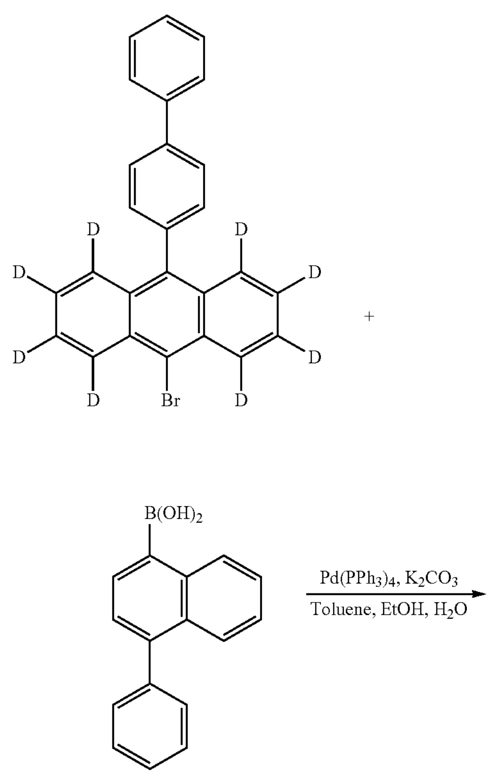

-continued

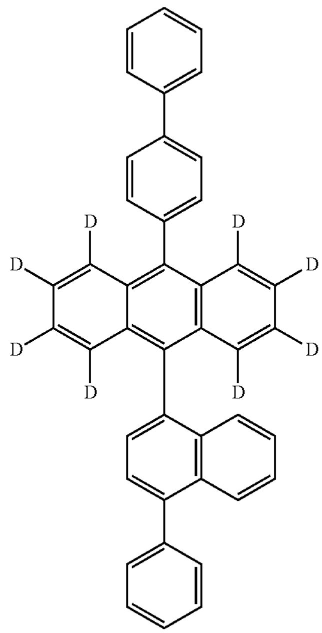

18.1 g of compound 2-47 was obtained in a yield of 67% in the same manner as in Synthesis Example 2-1, except that 20.8 g (50 mmol) of starting material 2-5-A and 13.6 g (55 mmol) of starting material 2-5-B were used instead of starting materials 2-1-A and 2-1-B.

MS (MALDI-TOF) m/z: 540 [M]+

Synthesis Example 2-6: Synthesis of Compound 2-28

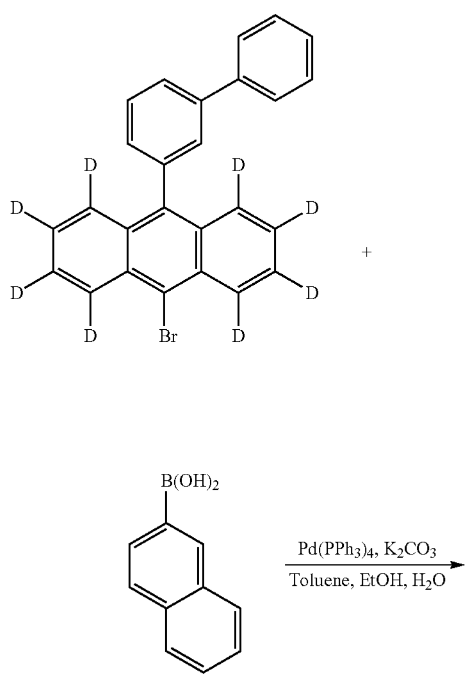

-continued

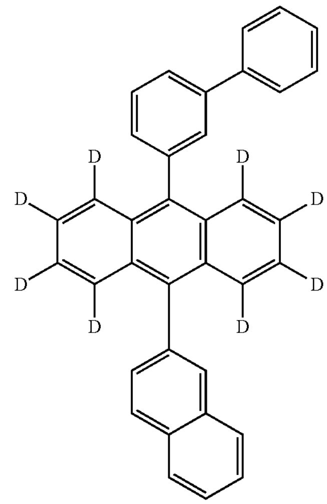

15.8 g of compound 2-28 was obtained in a yield of 68% in the same manner as in Synthesis Example 2-1, except that 20.9 g (50 mmol) of starting material 2-6-A and 9.5 g (55 mmol) of starting material 2-6-B were used instead of starting materials 2-1-A and 2-1-B.

MS (MALDI-TOF) m/z: 464 [M]+

Synthesis Example 2-7: Synthesis of Compound 2-50

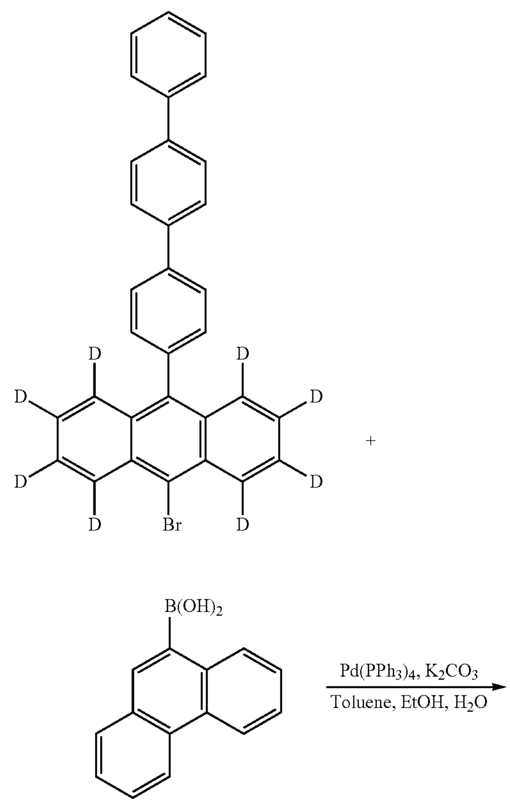

-continued

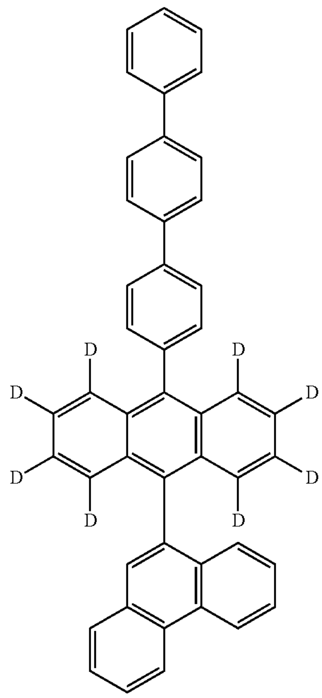

16.8 g of compound 2-50 was obtained in a yield of 57% in the same manner as in Synthesis Example 2-1, except that 24.7 g (50 mmol) of starting material 2-7-A and 12.2 g (55 mmol) of starting material 2-7-B were used instead of starting materials 2-1-A and 2-1-B.

MS (MALDI-TOF) m/z: 590 [M]+

Synthesis Example 2-8: Synthesis of Compound 2-70

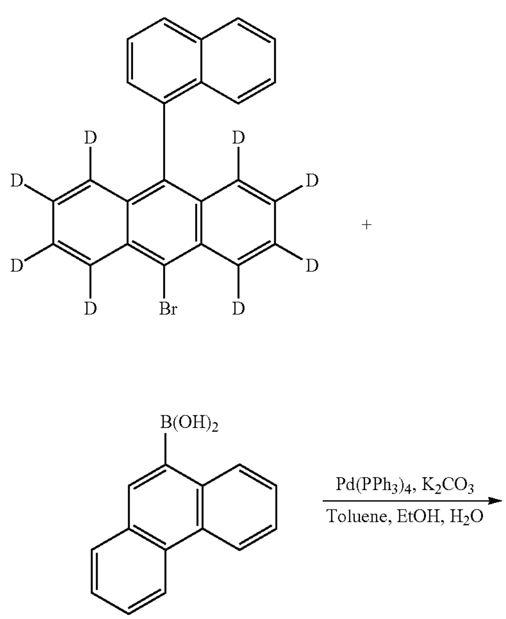

-continued

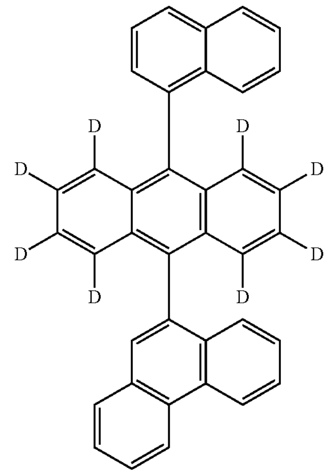

12.5 g of compound 2-70 was obtained in a yield of 51% in the same manner as in Synthesis Example 2-1, except that 19.6 g (50 mmol) of starting material 2-8-A and 12.2 g (55 mmol) of starting material 2-7-B were used instead of starting materials 2-1-A and 2-1-B.

MS (MALDI-TOF) m/z: 488 [M]+

Synthesis Example 2-9: Synthesis of Compound 2-57

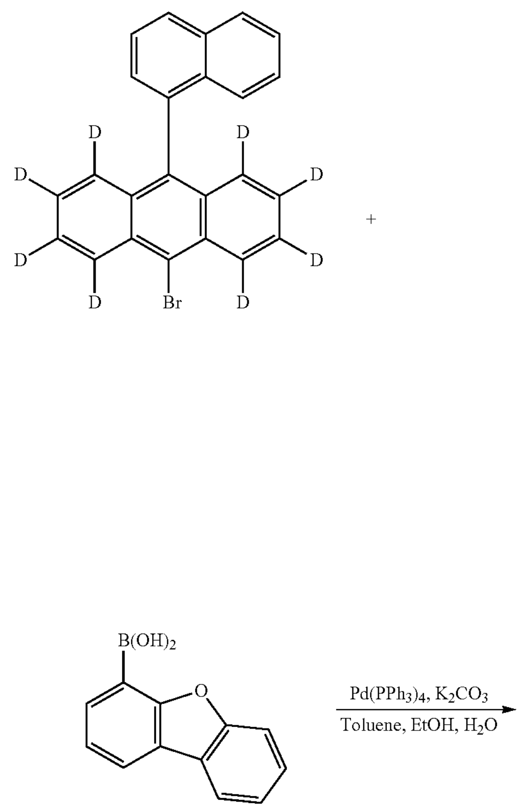

-continued

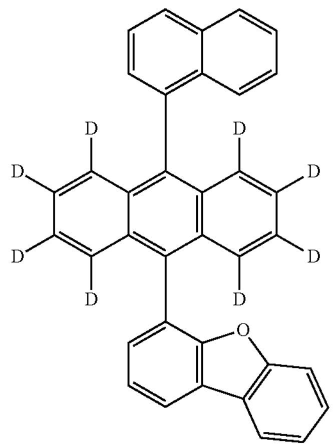

14.4 g of compound 2-57 was obtained in a yield of 60% in the same manner as in Synthesis Example 2-1, except that 19.6 g (50 mmol) of starting material 2-8-A and 11.7 g (55 mmol) of starting material 2-9-B were used instead of starting materials 2-1-A and 2-1-B.

MS (MALDI-TOF) m/z: 478 [M]+

Synthesis Example 2-10: Synthesis of Compound 2-135

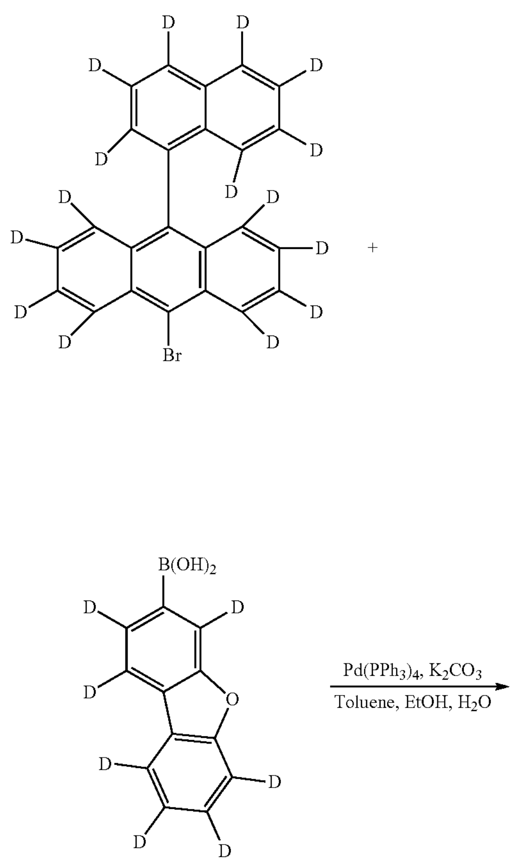

-continued

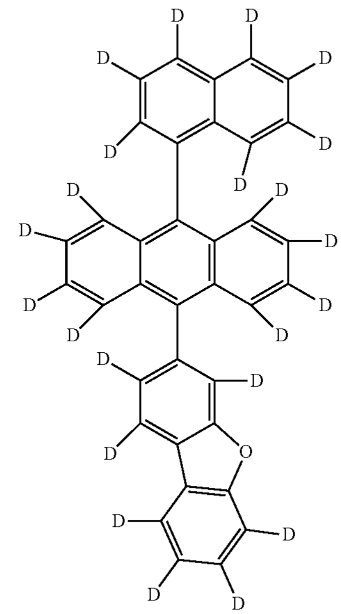

15.8 g of compound 2-135 was obtained in a yield of 64% in the same manner as in Synthesis Example 2-1, except that 19.9 g (50 mmol) of starting material 2-10-A and 12.1 g (55 mmol) of starting material 2-10-B were used instead of starting materials 2-1-A and 2-1-B.

MS (MALDI-TOF) m/z: 492 [M]+

Synthesis Example 2-11: Synthesis of Compound 2-61

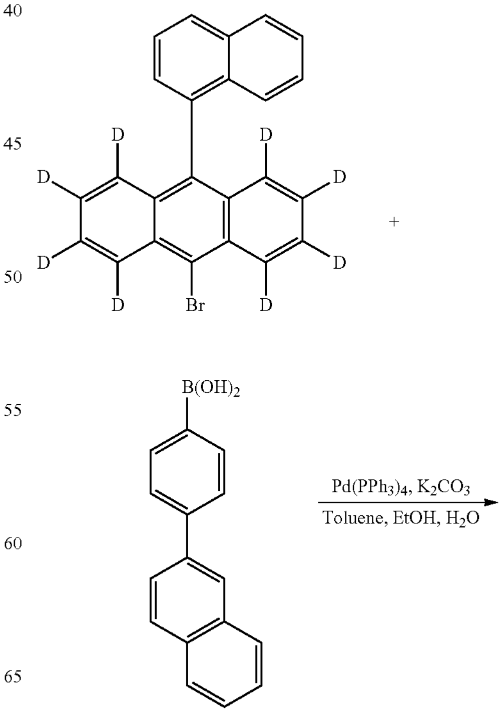

-continued

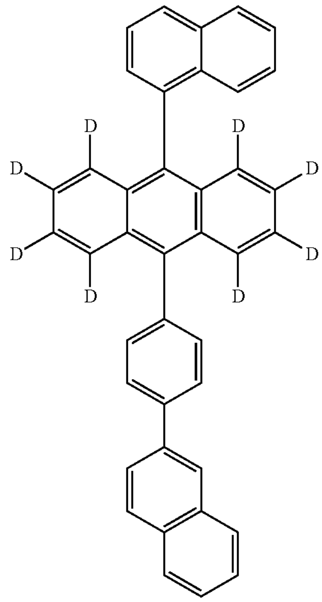

18.5 g of compound 2-61 was obtained in a yield of 72% in the same manner as in Synthesis Example 2-1, except that 19.6 g (50 mmol) of starting material 2-8-A and 13.6 g (55 mmol) of starting material 2-11-B were used instead of starting materials 2-1-A and 2-1-B.

MS (MALDI-TOF) m/z: 514 [M]+

Synthesis Example 2-12: Synthesis of Compound 2-62

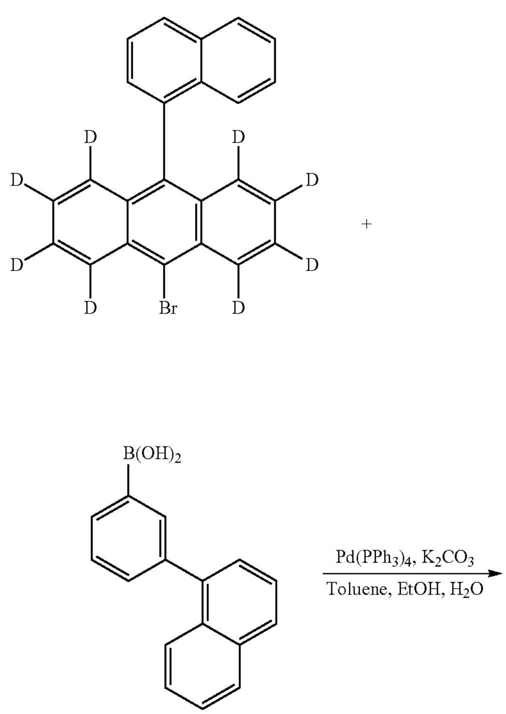

-continued

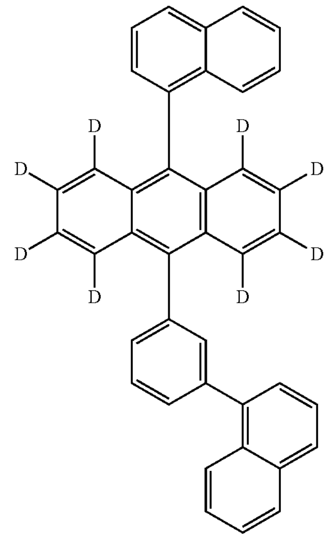

17.0 g of compound 2-62 was obtained in a yield of 66% in the same manner as in Synthesis Example 2-1, except that 19.6 g (50 mmol) of starting material 2-8-A and 13.6 g (55 mmol) of starting material 2-12-B were used instead of starting materials 2-1-A and 2-1-B.

MS (MALDI-TOF) m/z: 514 [M]+

Synthesis Example 2-13: Synthesis of Compound 2-13

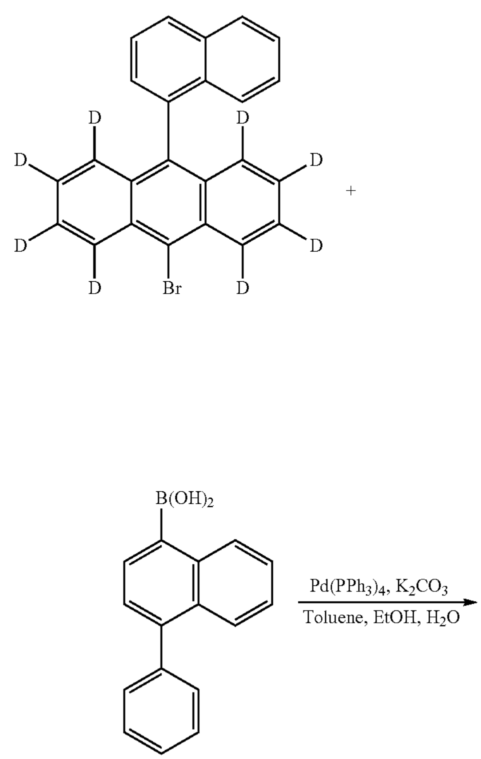

-continued

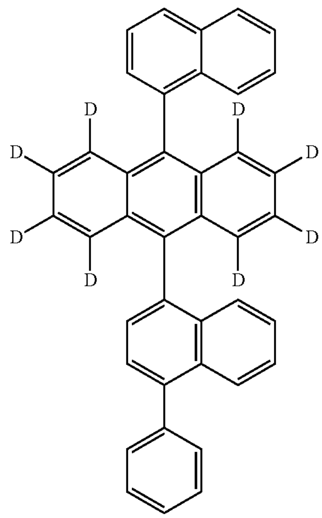

14.9 g of compound 2-13 was obtained in a yield of 58% in the same manner as in Synthesis Example 2-1, except that 19.6 g (50 mmol) of starting material 2-8-A and 13.6 g (55 mmol) of starting material 2-5-B were used instead of starting materials 2-1-A and 2-1-B.

MS (MALDI-TOF) m/z: 514 [M]+

Synthesis Example 2-14: Synthesis of Compound 2-66

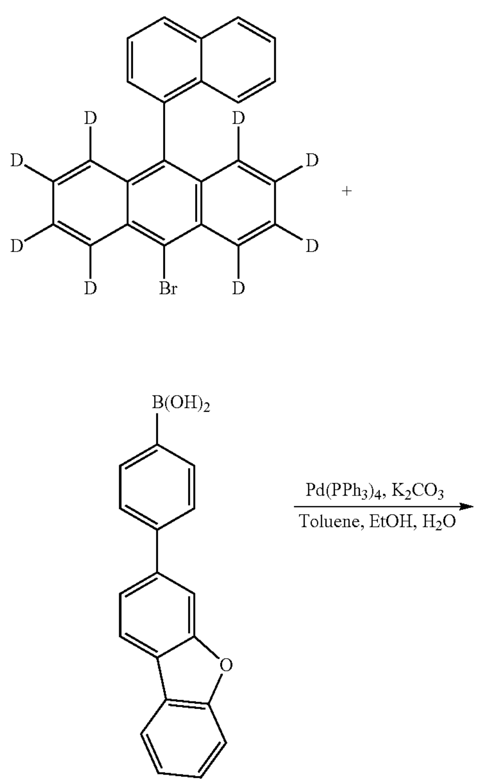

-continued

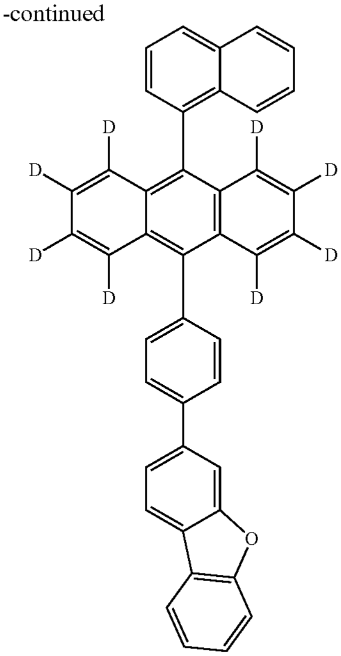

18.3 g of compound 2-66 was obtained in a yield of 66% in the same manner as in Synthesis Example 2-1, except that 19.6 g (50 mmol) of starting material 2-8-A and 15.8 g (55 mmol) of starting material 2-14-B were used instead of starting materials 2-1-A and 2-1-B.

MS (MALDI-TOF) m/z: 554 [M]+

Synthesis Example 2-15: Synthesis of Compound 2-67

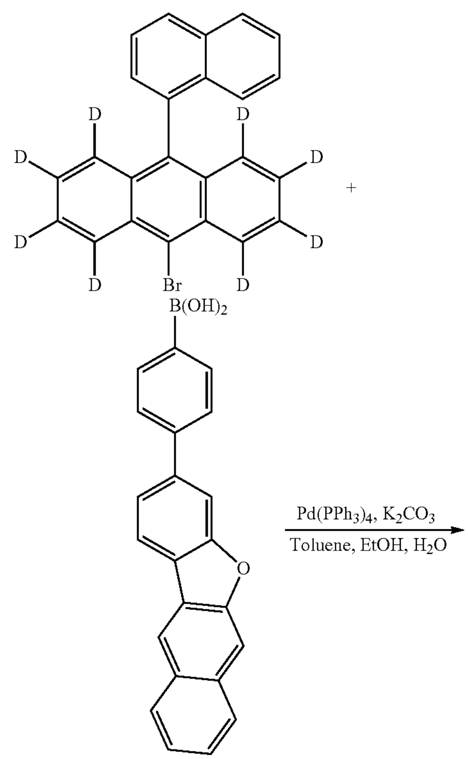

-continued

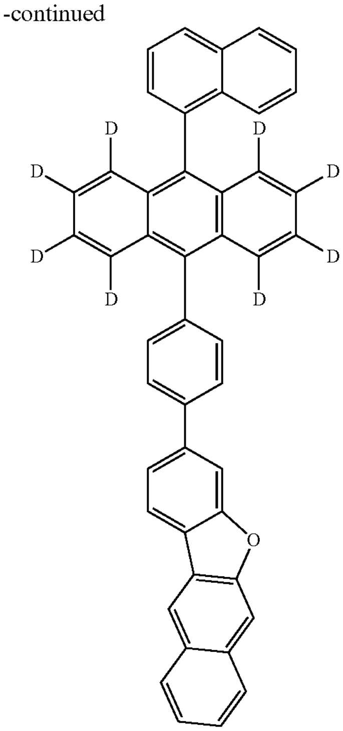

19.4 g of compound 2-67 was obtained in a yield of 64% in the same manner as in Synthesis Example 2-1, except that 19.6 g (50 mmol) of starting material 2-8-A and 18.6 g (55 mmol) of starting material 2-15-B were used instead of starting materials 2-1-A and 2-1-B.

MS (MALDI-TOF) m/z: 604 [M]+

Synthesis Example 2-16: Synthesis of Compound 2-76

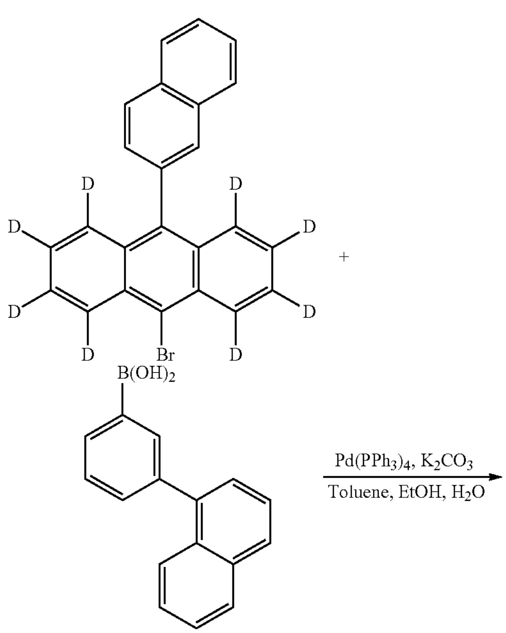

-continued

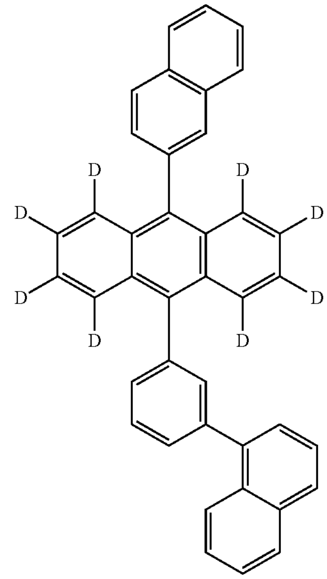

14.4 g of compound 2-76 was obtained in a yield of 56% in the same manner as in Synthesis Example 2-1, except that 19.6 g (50 mmol) of starting material 2-16-A and 13.6 g (55 mmol) of starting material 2-12-B were used instead of starting materials 2-1-A and 2-1-B.

MS (MALDI-TOF) m/z: 514 [M]+

Synthesis Example 2-17: Synthesis of Compound 2-79

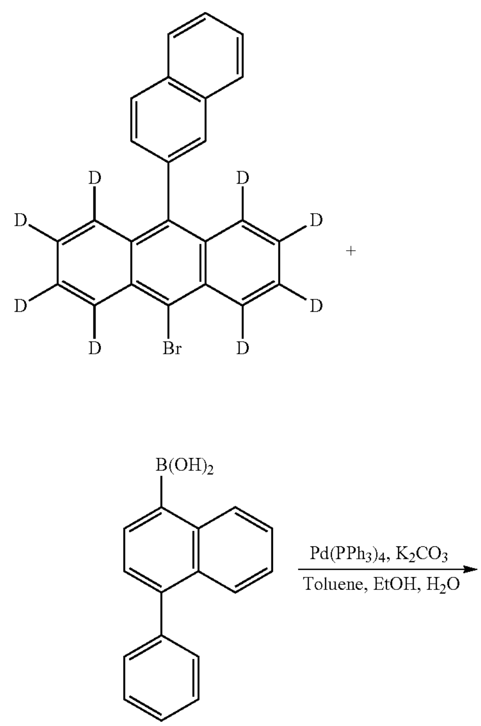

-continued

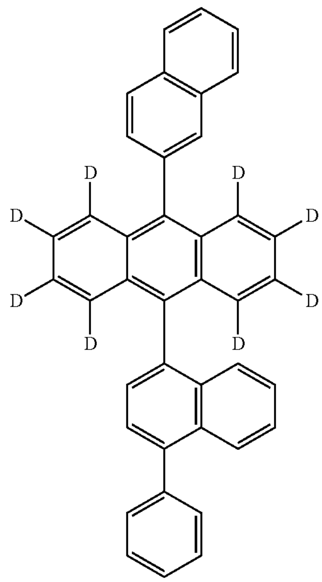

14.9 g of compound 2-79 was obtained in a yield of 58% in the same manner as in Synthesis Example 2-1, except that 19.6 g (50 mmol) of starting material 2-16-A and 13.6 g (55 mmol) of starting material 2-7-B were used instead of starting materials 2-1-A and 2-1-B.

MS (MALDI-TOF) m/z: 514 [M]+

Synthesis Example 2-18: Synthesis of Compound 2-80

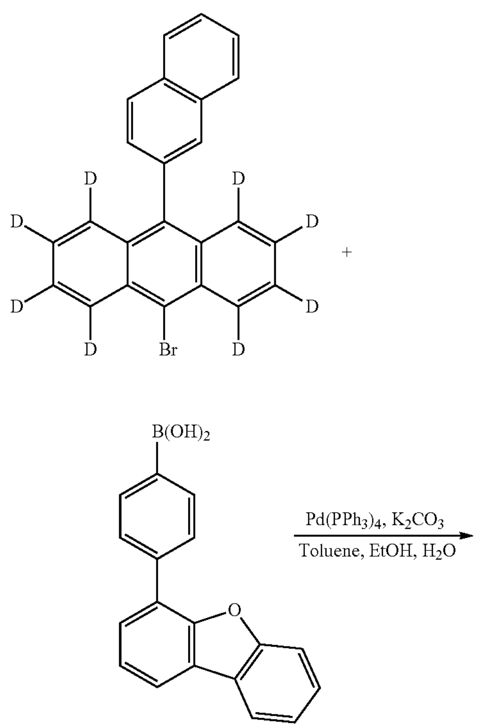

-continued

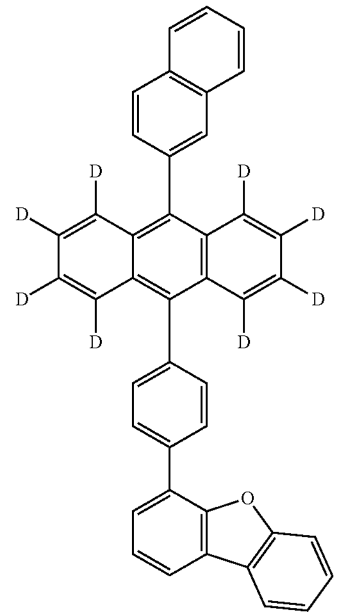

18.3 g of compound 2-80 was obtained in a yield of 66% in the same manner as in Synthesis Example 2-1, except that 19.6 g (50 mmol) of starting material 2-16-A and 15.8 g (55 mmol) of starting material 2-18-B were used instead of starting materials 2-1-A and 2-1-B.

MS (MALDI-TOF) m/z: 554 [M]+

Synthesis Example 2-19: Synthesis of Compound 2-90

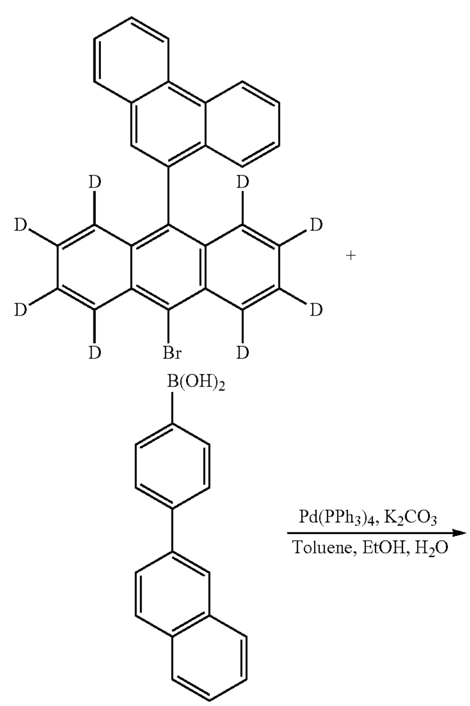

-continued

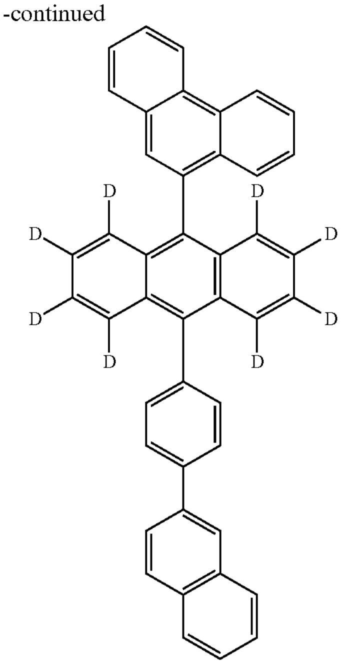

18.9 g of compound 2-90 was obtained in a yield of 67% in the same manner as in Synthesis Example 2-1, except that 22.1 g (50 mmol) of starting material 2-19-A and 13.6 g (55 mmol) of starting material 2-11-B were used instead of starting materials 2-1-A and 2-1-B.

MS (MALDI-TOF) m/z: 564 [M]+

Synthesis Example 2-20: Synthesis of Compound 2-99

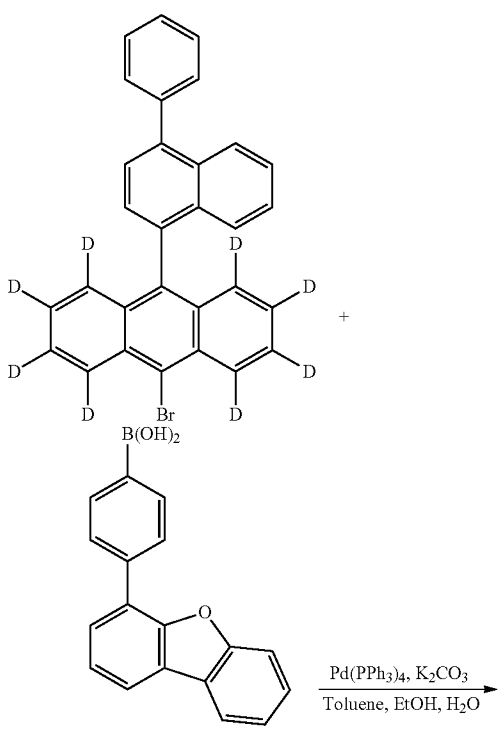

-continued

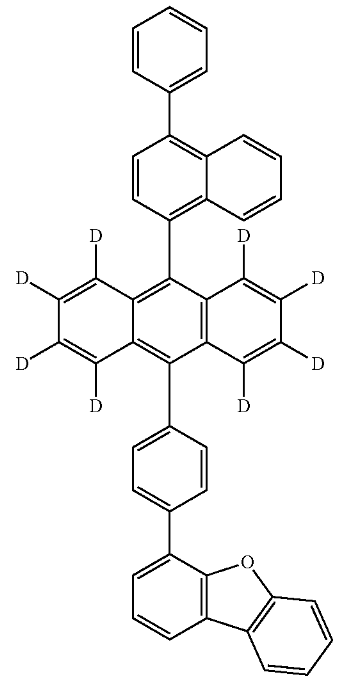

18.3 g of compound 2-99 was obtained in a yield of 58% in the same manner as in Synthesis Example 2-1, except that 23.4 g (50 mmol) of starting material 2-20-A and 15.8 g (55 mmol) of starting material 2-18-B were used instead of starting materials 2-1-A and 2-1-B.

MS (MALDI-TOF) m/z: 630 [M]+

Synthesis Example 2-21: Synthesis of Compound 2-102

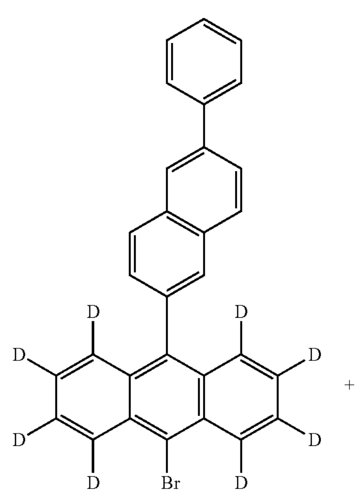

-continued

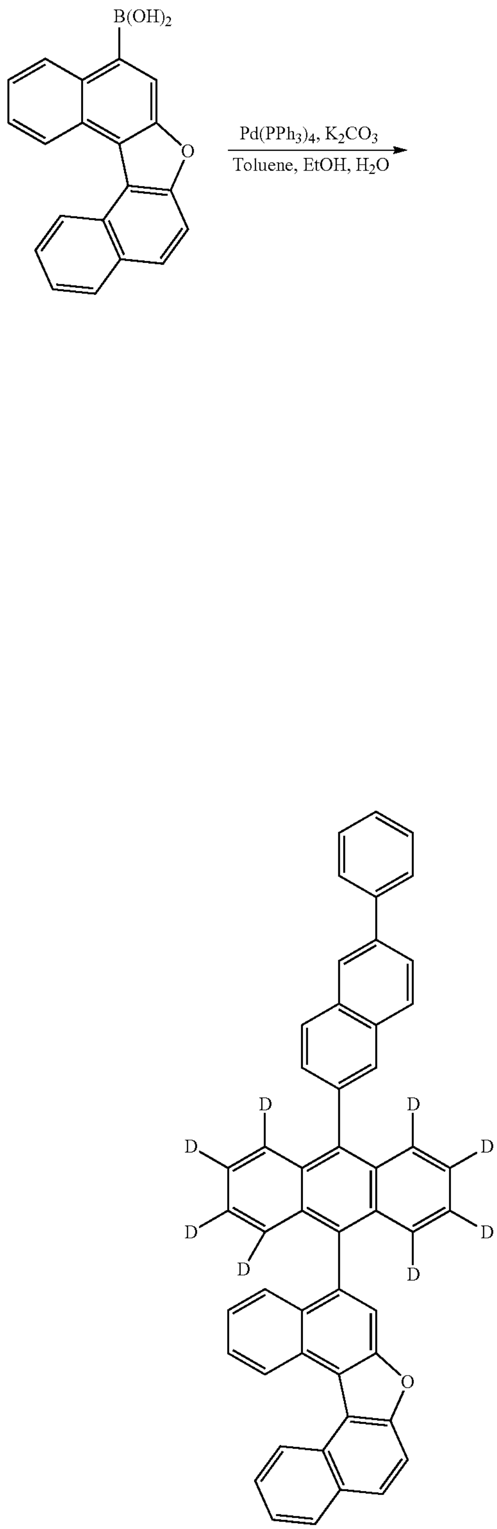

21.0 g of compound 2-102 was obtained in a yield of 63% in the same manner as in Synthesis Example 2-1, except that 23.4 g (50 mmol) of starting material 2-21-A and 11.7 g (55 mmol) of starting material 2-2-B were used instead of starting materials 2-1-A and 2-1-B.

MS (MALDI-TOF) m/z: 654 [M]+

Synthesis Example 2-22: Synthesis of Compound 2-98

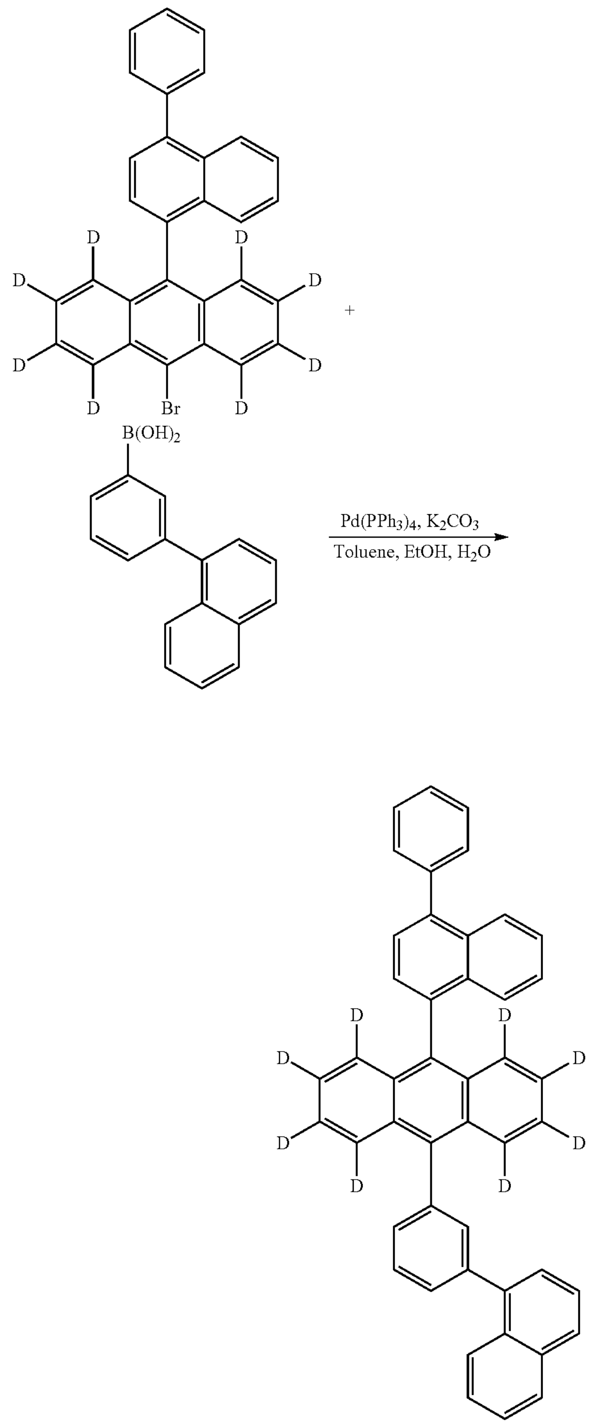

17.4 g of compound 2-98 was obtained in a yield of 59% in the same manner as in Synthesis Example 2-1, except that 23.4 g (50 mmol) of starting material 2-22-A and 13.6 g (55 mmol) of starting material 2-12-B were used instead of starting materials 2-1-A and 2-1-B.

MS (MALDI-TOF) m/z: 590 [M]+

Synthesis Example 2-23: Synthesis of Compound 2-106

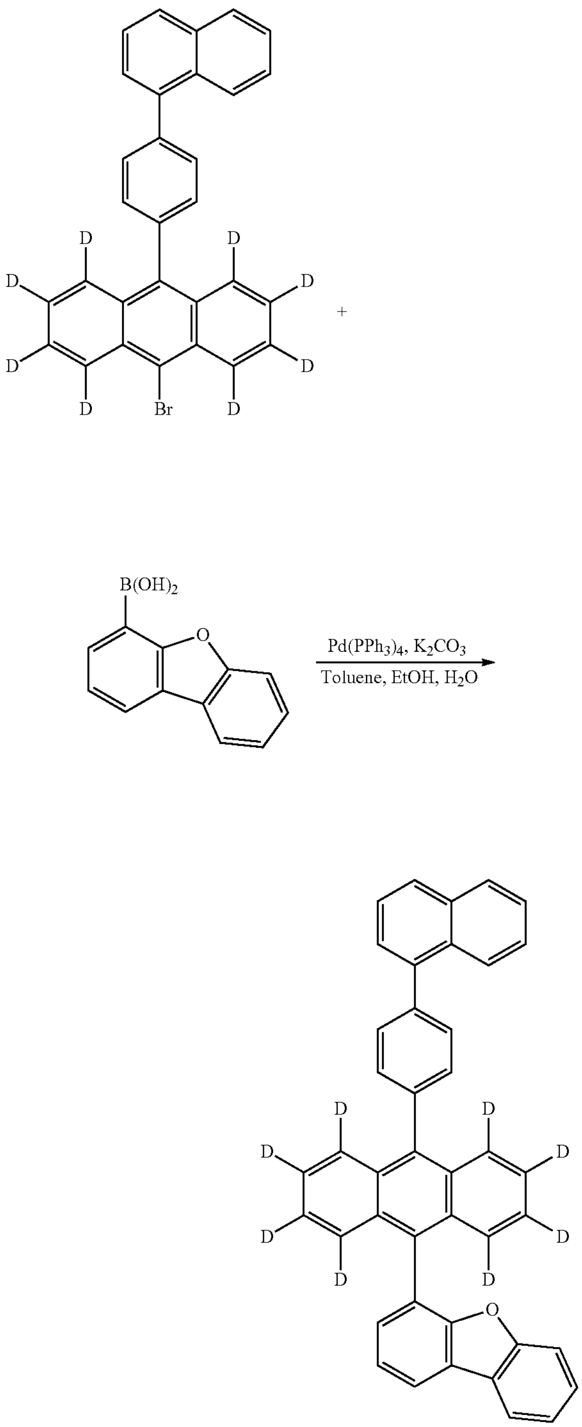

15.8 g of compound 2-106 was obtained in a yield of 57% in the same manner as in Synthesis Example 2-1, except that 23.4 g (50 mmol) of starting material 2-23-A and 11.7 g (55 mmol) of starting material 2-9-B were used instead of starting materials 2-1-A and 2-1-B.

MS (MALDI-TOF) m/z: 554 [M]+

Synthesis Example 2-24: Synthesis of Compound 2-115

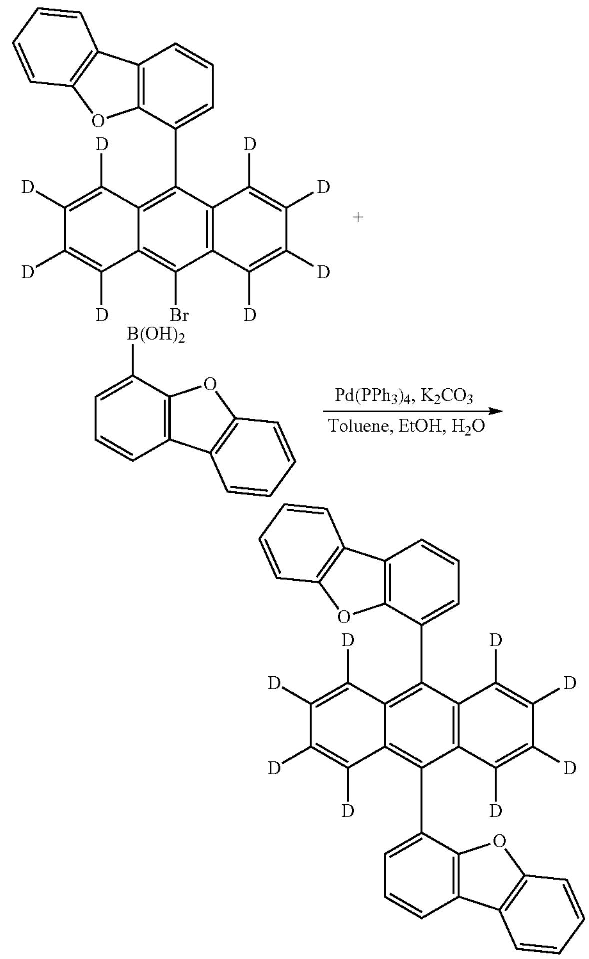

15.0 g of compound 2-115 was obtained in a yield of 58% in the same manner as in Synthesis Example 2-1, except that 21.6 g (50 mmol) of starting material 2-24-A and 11.7 g (55 mmol) of starting material 2-9-B were used instead of starting materials 2-1-A and 2-1-B.

MS (MALDI-TOF) m/z: 518 [M]+

Synthesis Example 2-25: Synthesis of Compound 2-119

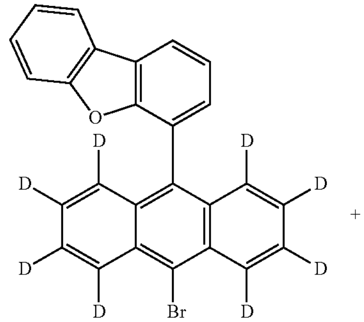

-continued

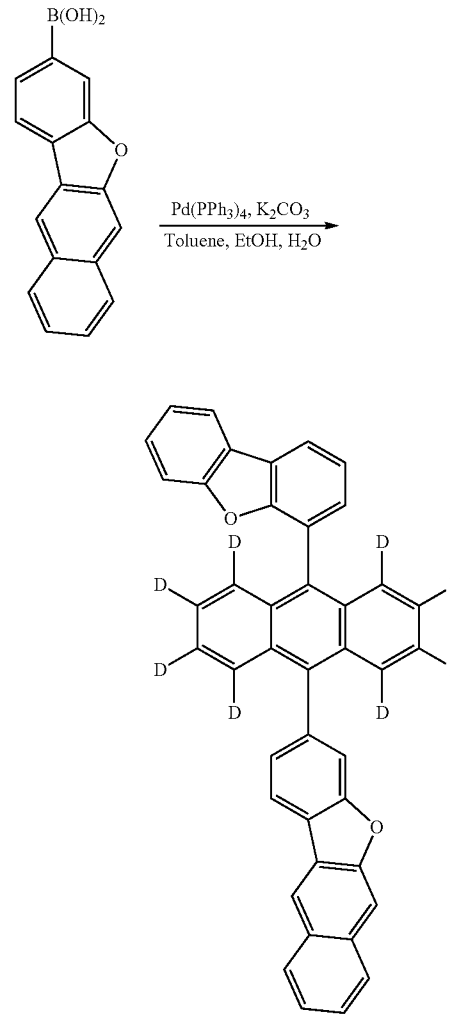

15.4 g of compound 2-119 was obtained in a yield of 54% in the same manner as in Synthesis Example 2-1, except that 21.6 g (50 mmol) of starting material 2-24-A and 14.4 g (55 mmol) of starting material 2-15-B were used instead of starting materials 2-1-A and 2-1-B.

MS (MALDI-TOF) m/z: 568 [M]+

Synthesis Example 2-26: Synthesis of Compound 2-151

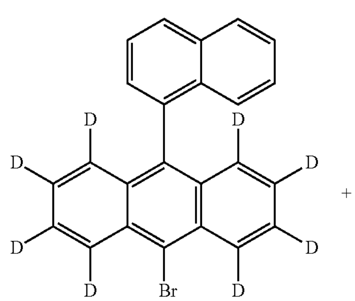

-continued

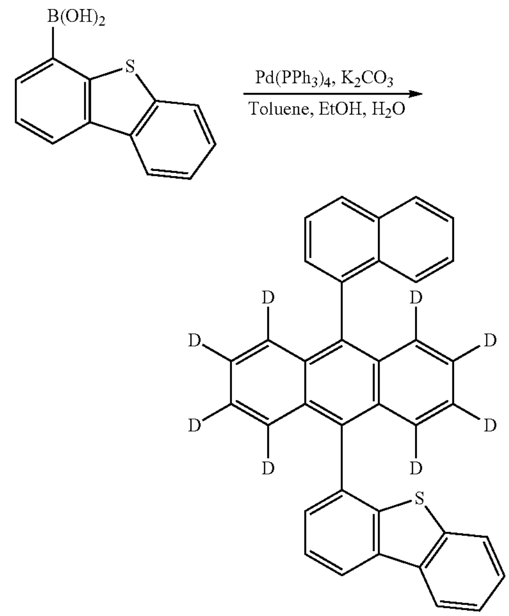

14.8 g of compound 2-151 was obtained in a yield of 60% in the same manner as in Synthesis Example 2-1, except that 19.6 g (50 mmol) of starting material 2-8-A and 12.5 g (55 mmol) of starting material 2-26-B were used instead of starting materials 2-1-A and 2-1-B.

MS (MALDI-TOF) m/z: 494.19 [M]+

Synthesis Example 2-27: Synthesis of Compound 2-158

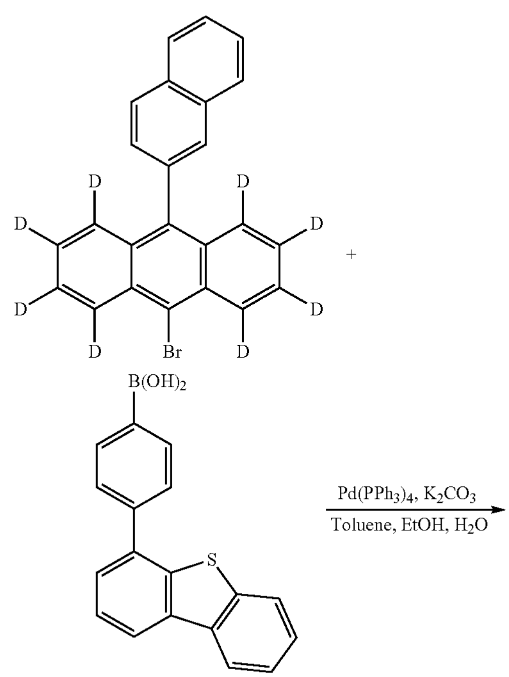

-continued

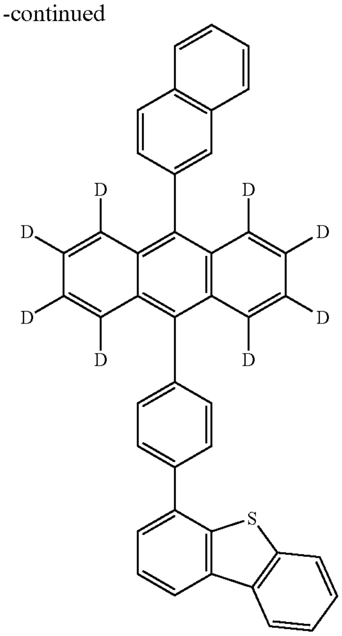

20.7 g of compound 2-158 was obtained in a yield of 66% in the same manner as in Synthesis Example 2-1, except that 19.6 g (50 mmol) of starting material 2-16-A and 16.7 g (55 mmol) of starting material 2-27-B were used instead of starting materials 2-1-A and 2-1-B.

MS (MALDI-TOF) m/z: 570.23 [M]+

Example 1: Fabrication of Organic Electroluminescent Element

A substrate, on which Ag as a light reflection layer and an ITO (10 nm) as an anode of an organic electroluminescent element were sequentially stacked, was patterned into cathode and anode regions and an insulation layer through a photolithography process, and then surface-treated with $O_{-2}$:$N_2$ plasma for the purposes of increasing the work function of the anode (ITO) and cleaning. Thereon, 1,4,5,8,9,11-hexaazatriphenylene-hexacarbonitrile (HAT-CN) as a hole injection layer (HIL) was formed to have a thickness of 100 Å.

Thereafter, N4,N4,N4',N4'-tetra([1,1'-biphenyl]-4-yl)-[1,1'-biphenyl]-4,4'-diamine was vacuum-deposited on the hole injection layer to form a hole transport layer having a thickness of 950 Å. On the hole transport layer (HTL), N-phenyl-N-(4-(spiro[benzo[de]anthracene-7,9'-fluoren]-2'-yl)phenyl)dibenzo[b,d]furan-4-amine as an electron-blocking layer (EBL) was formed to have a thickness of 100 Å, and on the electron-blocking layer (EBL), compound 2-12 as a host of a light-emitting layer was deposited, and at the same time, compound 1-211 as a dopant was doped at a concentration of 2% to form a light-emitting layer (EML) having a thickness of 200 Å.

On the light-emitting layer, 2-(4-(9,10-di(naphthalen-2-yl)anthracen-2-yl)phenyl)-1-phenyl-1H-benzo[d]imidazole and Liq were deposited together at a ratio of 1:1 to form an electron transport layer (ETL) having a thickness of 360 Å. As a cathode, magnesium (Mg) and silver (Ag) at a ratio of 9:1 was deposited to have a thickness of 160 Å. On the cathode, N4,N4'-diphenyl-N4,N4'-bis(4-(9-phenyl-9H-carbazol-3-yl)phenyl)-[1,1'-biphenyl]-4,4'-diamine as a capping layer was deposited to have a thickness of 63 to 65 nm. On the capping layer (CPL), a seal cap was laminated by a UV-curable adhesive to protect an organic electroluminescent element from atmospheric 02 or moisture, thereby fabricating the organic electroluminescent element.

Examples 2 to 27: Fabrication of Organic Electroluminescent Elements

Organic electroluminescent elements were fabricated in the same manner as in Example 1, except that, as the host, the compounds described in Table 1 below were used instead of compound 2-12, and as the dopant, compound 1-211 was used or the compounds described in Table 1 below were used instead of compound 1-211.

Comparative Examples 1 and 2: Fabrication of Organic Electroluminescent Elements Organic electroluminescent elements were fabricated in the same manner as in Example 1, except that, as the host, the following compound 2-A or compound 2-B was used instead of compound 2-12.

[Compound 2-A]

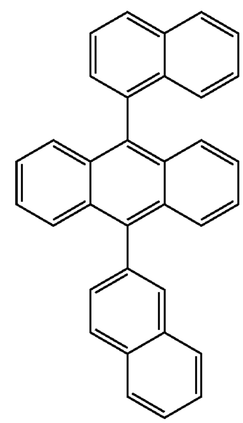

[Compound 2-B]

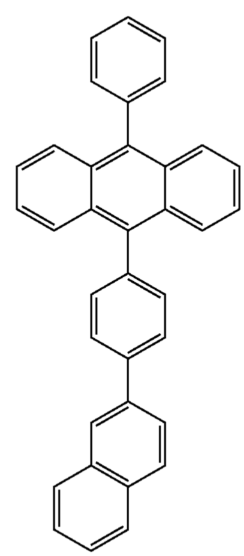

Comparative Examples 3 and 4: Fabrication of Organic Electroluminescent Elements Organic electroluminescent elements were fabricated in the same manner as in Example 1, except that, as the dopant, compound 1-14 or compound 1-212 was used instead of compound 1-211, and as the host, the following compound 2-C, 2-D, 2-F or 2-G was used instead of compound 2-12.

[Compound 2-C]

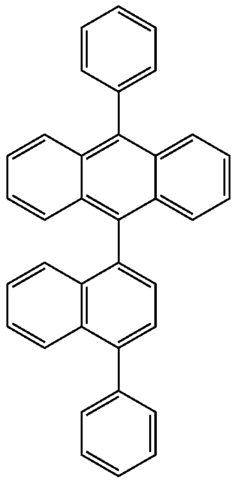

[Compound 2-D]

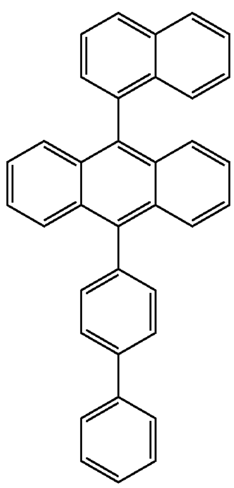

[Compound 2E]

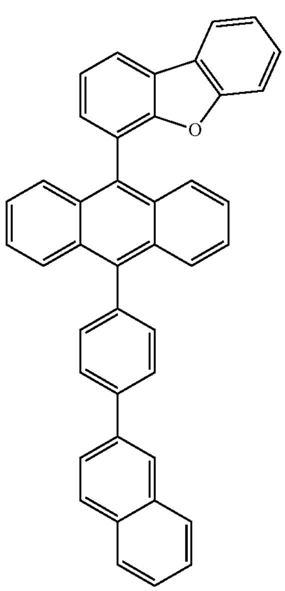

-continued

[Compound 2-F]

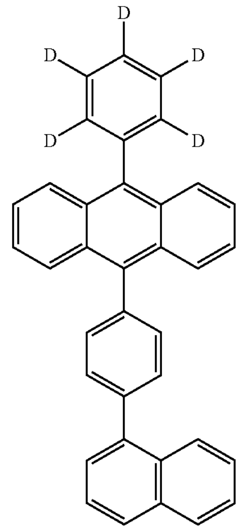

[Compound 2-G]

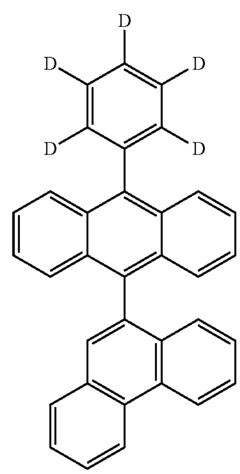

Test Example 1: Analysis of Characteristics of Organic Electroluminescent Elements The efficiency and voltage characteristics of the organic electroluminescent elements fabricated in Examples 1 to 17 and Comparative Example 1 to 5, when driven at a current density of 10 mA/cm$^2$, were compared, and the 5% lifetime reduction characteristics versus initial luminance of the organic electroluminescent elements when driven at a constant current density of 20 mA/cm$^2$ were compared. The results of the comparison are shown in Table 1 below.

TABLE 1

| | Dopant | Host | Voltage (V) | Current efficiency (Cd/A) | External quantum efficiency (EQE) (%) | Color coordinates CIEx | Color coordinates CIEy | Lifetime T95 |
|---|---|---|---|---|---|---|---|---|
| Comparative Example 1 | Compound 1-211 | Compound 2-A | 4.0 | 4.0 | 6.3 | 0.014 | 0.059 | 70 |
| Comparative Example 2 | Compound 1-211 | Compound 2-B | 3.85 | 5.1 | 10.0 | 0.141 | 0.048 | 65 |
| Comparative Example 3 | Compound 1-14 | Compound 2-C | 4.03 | 4.8 | 9.2 | 0.14 | 0.051 | 60 |
| Comparative Example 4 | Compound 1-14 | Compound 2-D | 3.84 | 4.8 | 9.2 | 0.141 | 0.048 | 80 |
| Comparative Example 5 | Compound 1-212 | Compound 2-E | 3.71 | 4.9 | 7.7 | 0.139 | 0.064 | 75 |
| Comparative Example 6 | Compound 1-212 | Compound 2-F | 4.03 | 4.8 | 9.2 | 0.14 | 0.051 | 80 |
| Comparative Example 7 | Compound 1-14 | Compound 2-G | 3.74 | 5.1 | 9.2 | 0.138 | 0.055 | 70 |
| Example 1 | Compound 1-211 | Compound 2-12 | 3.66 | 5.2 | 9.7 | 0.138 | 0.053 | 110 |
| Example 2 | Compound 1-211 | Compound 2-15 | 3.64 | 4.9 | 9.3 | 0.139 | 0.051 | 105 |
| Example 3 | Compound 1-211 | Compound 2-22 | 3.91 | 5.0 | 9.4 | 0.14 | 0.051 | 120 |
| Example 4 | Compound 1-211 | Compound 2-131 | 4.04 | 4.5 | 9.1 | 0.14 | 0.049 | 135 |
| Example 5 | Compound 1-211 | Compound 2-47 | 3.97 | 4.3 | 8.8 | 0.142 | 0.046 | 135 |
| Example 6 | Compound 1-211 | Compound 2-28 | 3.86 | 4.5 | 9.5 | 0.141 | 0.048 | 130 |
| Example 7 | Compound 1-211 | Compound 2-50 | 3.86 | 4.8 | 9.4 | 0.14 | 0.151 | 120 |
| Example 8 | Compound 1-219 | Compound 2-70 | 3.82 | 4.7 | 9.1 | 0.14 | 0.049 | 130 |
| Example 9 | Compound 1-211 | Compound 2-57 | 3.87 | 4.4 | 8.7 | 0.141 | 0.048 | 125 |
| Example 10 | Compound 1-211 | Compound 2-135 | 3.94 | 5.1 | 9.9 | 0.14 | 0.05 | 120 |
| Example 11 | Compound 1-14 | Compound 2-61 | 4.03 | 5.1 | 11.3 | 0.145 | 0.042. | 150 |
| Example 12 | Compound 1-14 | Compound 2-62 | 4.05 | 5.5 | 11.9 | 0.144 | 0.044 | 130 |
| Example 13 | Compound 1-129 | Compound 2-65 | 3.93 | 5.1 | 9.9 | 0.14 | 0.05 | 140 |
| Example 14 | Compound 1-104 | Compound 2-66 | 3.8 | 4.25 | 7.4 | 0.1429 | 0.056 | 135 |
| Example 15 | Compound 1-104 | Compound 2-67 | 3.83 | 5.6 | 10.0 | 0.137 | 0.056 | 125 |
| Example 16 | Compound 1-212 | Compound 2-76 | 3.95 | 4.8 | 9.2 | 0.14 | 0.051 | 120 |
| Example 17 | Compound 1-166 | Compound 2-79 | 3.91 | 5.0 | 9.4 | 0.14 | 0.051 | 135 |
| Example 18 | Compound 1-166 | Compound 2-80 | 3.98 | 5.1 | 9.8 | 0.139 | 0.053 | 130 |
| Example 19 | Compound 1-211 | Compound 2-90 | 3.87 | 4.4 | 8.7 | 0.141 | 0.048 | 140 |
| Example 20 | Compound 1-211 | Compound 2-99 | 4.03 | 4.8 | 9.3 | 0.141 | 0.148 | 130 |
| Example 21 | Compound 1-211 | Compound 2-102 | 3.7 | 4.7 | 8.8 | 0.139 | 0.053 | 120 |
| Example 22 | Compound 1-211 | Compound 2-98 | 3.91 | 5.0 | 9.4 | 0.14 | 0.051 | 130 |
| Example 23 | Compound 1-14 | Compound 2-106 | 3.9 | 4.8 | 9.3 | 0.141 | 0.048 | 135 |
| Example 24 | Compound 1-14 | Compound 2-115 | 3.65 | 5.1 | 9.2 | 0.138 | 0.052 | 120 |
| Example 25 | Compound 1-14 | Compound 2-119 | 3.66 | 5.2 | 9.7 | 0.138 | 0.055 | 130 |
| Example 26 | Compound 1-14 | Compound 2-151 | 3.89 | 4.4 | 8.7 | 0.141 | 0.048 | 125 |
| Example 27 | Compound 1-216 | Compound 2-158 | 3.96 | 5.1 | 9.8 | 0.139 | 0.053 | 130 |

When comparing the elements of the Examples with the elements of the Comparative Examples, it was confirmed that, due to the use of the host materials having the specific structural formulas, the elements of the Examples showed equal or superior ability to prevent deterioration in color characteristics, and also exhibited longer lifetime than the elements of the Comparative Examples.

Although the preferred embodiments of the present disclosure have been described above in detail, the scope of the present disclosure is not limited thereto. Those skilled in the art will appreciate that various modifications and improvements are possible, without departing from the basic concept of the present disclosure as defined in the appended claims, and also fall within the scope of the present disclosure.

INDUSTRIAL APPLICABILITY

The present disclosure relates to an organic electroluminescent element, and more particularly to an organic electroluminescent element including a novel boron-based organic compound and anthracene-based organic compound in one or more organic layers included in the organic electroluminescent element.

The invention claimed is:

1. An organic electroluminescent element comprising:

a first electrode; a second electrode; and at least one organic layer disposed between the first electrode and the second electrode, wherein the organic layer includes a light-emitting layer, wherein the light-emitting layer consists of a dopant of a compound represented by the following Formula 3 and a host of a compound represented by the following Formula 2:

[Formula 3]

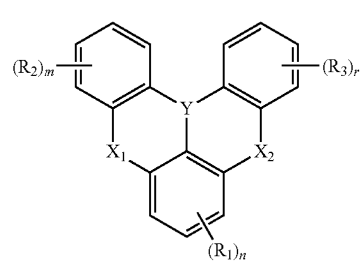

-continued

[Formula 2]

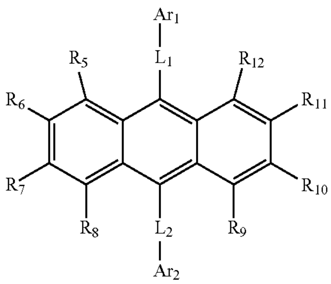

wherein n is an integer ranging from 0 to 3;

m and r are the same or different and are each independently an integer ranging from 0 to 4;

$X_1$ and $X_2$ are the same or different and are $N(R_4)$;

$R_1$ to $R_3$ are same or different and are each independently selected from the group consisting of hydrogen, a halogen group, a substituted or unsubstituted $C_1$-$C_{30}$ alkyl group, a substituted or unsubstituted $C_3$-$C_{20}$ cycloalkyl group, a substituted or unsubstituted $C_6$-$C_{30}$ aryl group, and a substituted or unsubstituted $C_1$-$C_{30}$ alkylamino group;

at least one of $R_1$, $R_2$ and $R_3$ is a substituted or unsubstituted cyclohexyl group or a substituted or unsubstituted adamantyl group;

$R_4$ is a substituted or unsubstituted $C_6$-$C_{30}$ aryl group;

$L_1$ and $L_2$ are the same or different and are each independently selected from the group consisting of a single bond, a substituted or unsubstituted $C_6$-$C_{30}$ arylene group, and a substituted or unsubstituted heteroarylene group having 5 to 30 nuclear atoms;

$Ar_1$ and $Ar_2$ are the same or different and are each independently selected from the group consisting of a substituted or unsubstituted $C_6$-$C_{30}$ aryl group, and a substituted or unsubstituted $C_5$-$C_{30}$ heteroaryl group;

$R_5$ to $R_{12}$ are deuterium;

$R_1$ to $R_4$ may each independently be substituted with one or more substituents selected from the group consisting of hydrogen, a cyano group, a nitro group, a halogen group, a hydroxyl group, a $C_1$-$C_{30}$ alkyl group, a $C_2$-$C_{30}$ alkenyl group, a $C_2$-$C_{24}$ alkynyl group, a $C_2$-$C_{30}$ heteroalkyl group, a $C_6$-$C_{30}$ aralkyl group, a $C_3$-$C_{20}$ cycloalkyl group, a $C_6$-$C_{30}$ aryl group, a $C_5$-$C_{30}$ heteroaryl group, a $C_5$-$C_{30}$ heteroarylalkyl group, a $C_1$-$C_{30}$ alkoxy group, a $C_1$-$C_{30}$ alkylamino group, a $C_6$-$C_{30}$ arylamino group, a $C_6$-$C_{30}$ aralkylamino group, and a $C_5$-$C_{24}$ heteroarylamino group, and when the substituents are plural, they are the same or different, and $L_1$, $L_2$, $Ar_1$ and $Ar_2$ may each independently be substituted with one or more substituents selected from the group consisting of hydrogen, deuterium, a cyano group, a nitro group, a halogen group, a hydroxyl group, a $C_1$-$C_{30}$ alkyl group, a $C_2$-$C_{30}$ alkenyl group, a $C_2$-$C_{24}$ alkynyl group, a $C_2$-$C_{30}$ heteroalkyl group, a $C_6$-$C_{30}$ aralkyl group, a $C_6$-$C_{30}$ aryl group, a $C_5$-$C_{30}$ heteroaryl group, a $C_5$-$C_{30}$ heteroarylalkyl group, a $C_1$-$C_{30}$ alkoxy group, a $C_1$-$C_{30}$ alkylamino group, a $C_6$-$C_{30}$ arylamino group, a $C_6$-$C_{30}$ aralkylamino group, and a $C_5$-$C_{24}$ heteroarylamino group, and when the substituents are plural, they are the same or different.

2. The organic electroluminescent element of claim 1, wherein the compound represented by Formula 1 is selected from the group consisting of the following compounds:

1-5

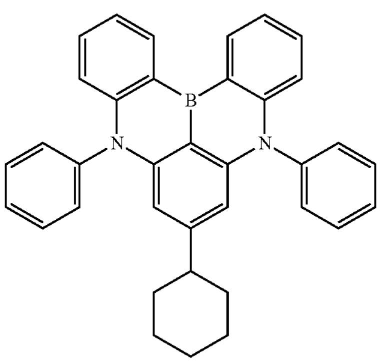

1-13

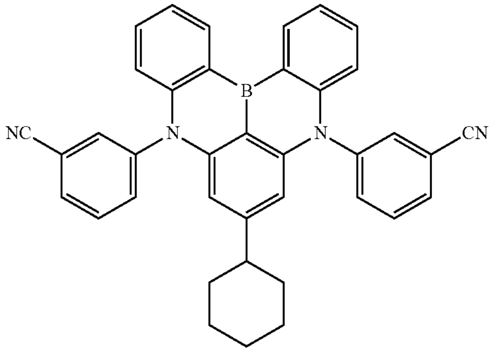

-continued
1-16
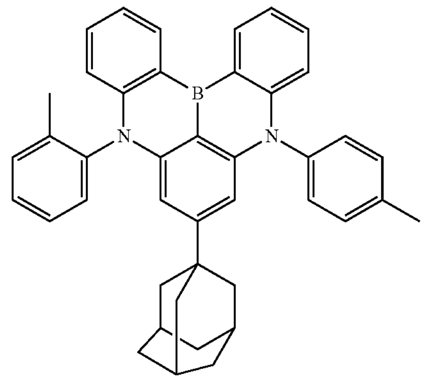
1-21
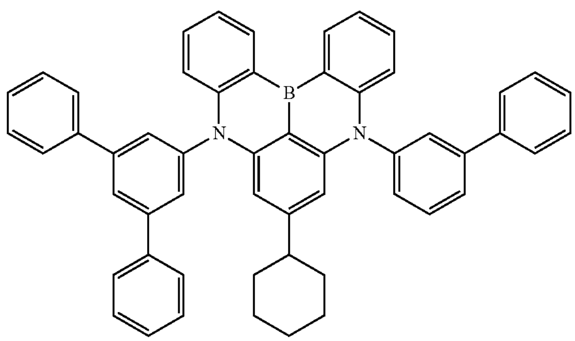
1-44
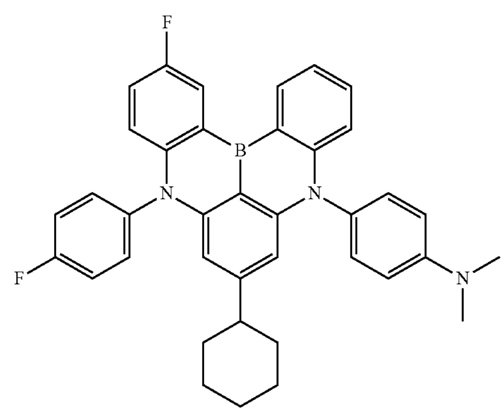
1-47
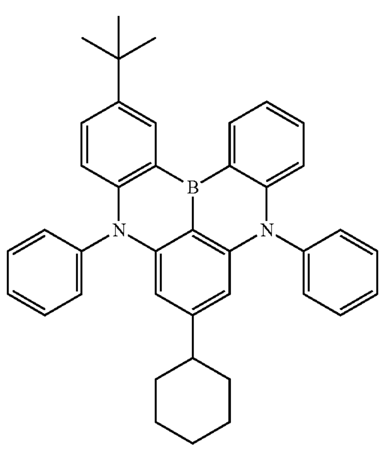
1-48
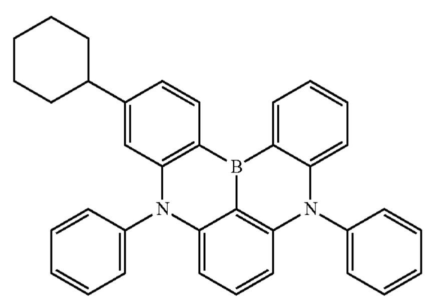

-continued
1-49
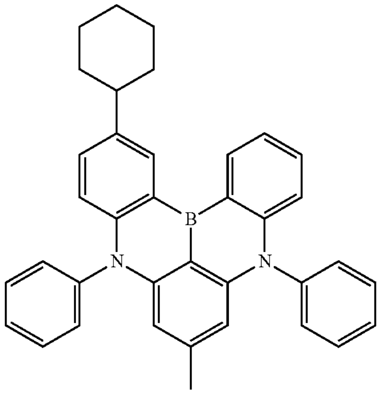
1-50
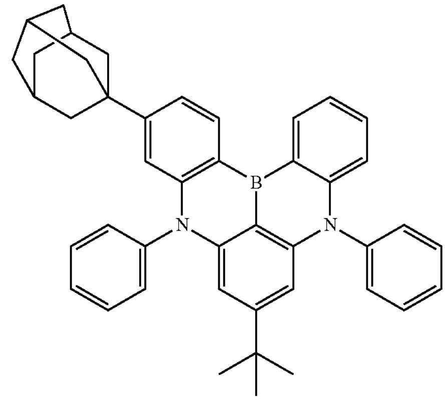
1-51
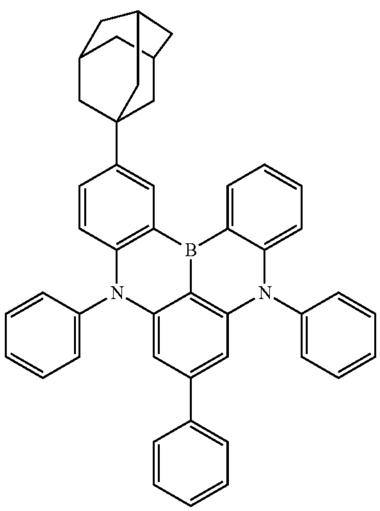
1-52
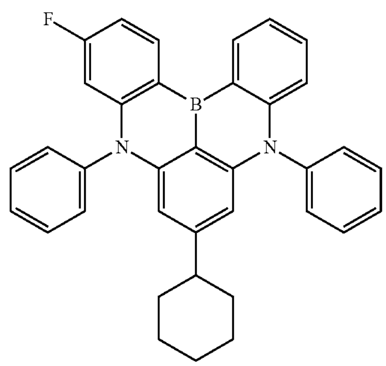
1-55
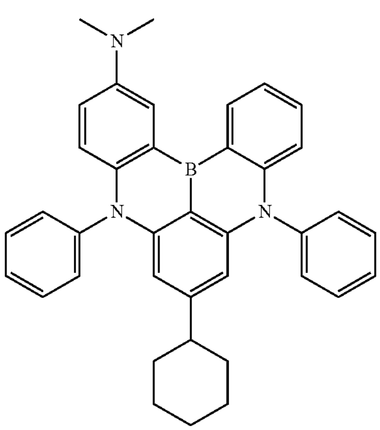

-continued
1-68
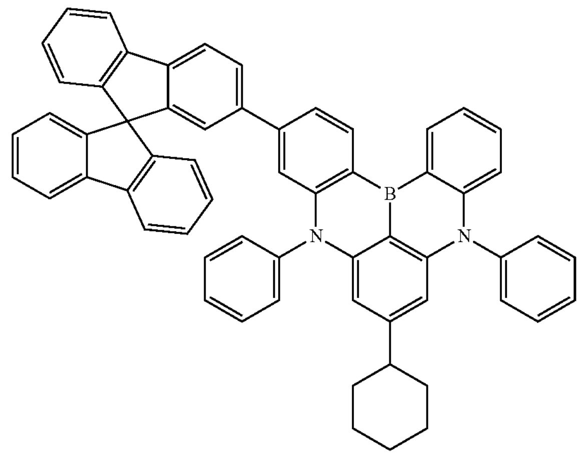
1-70
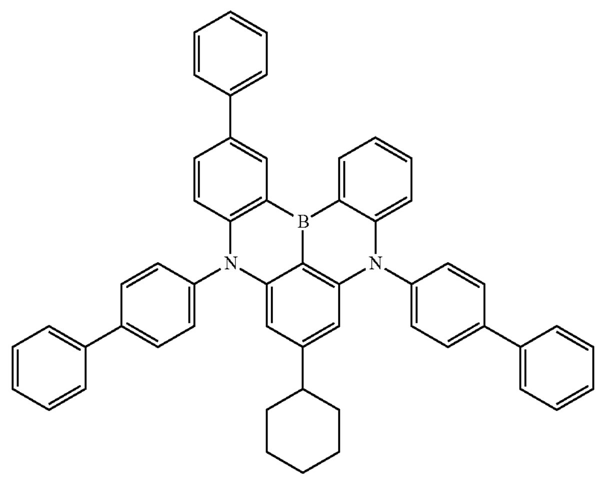
1-78
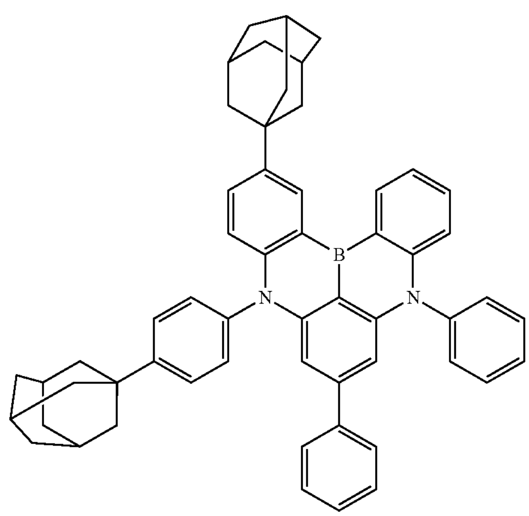
1-79
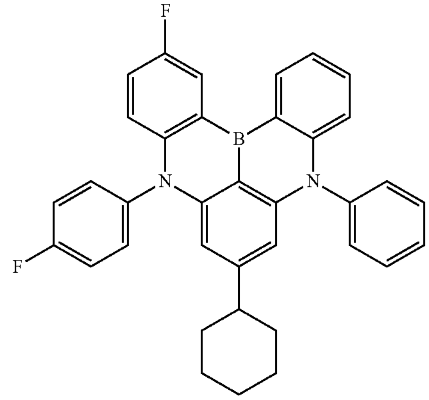

-continued
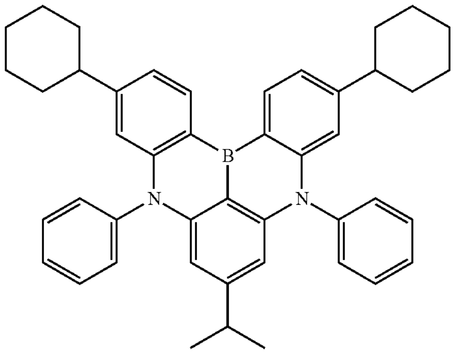
1-132
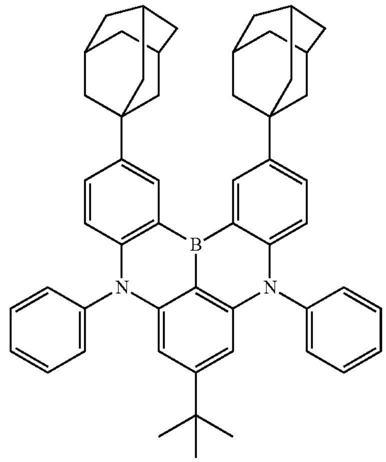
1-133
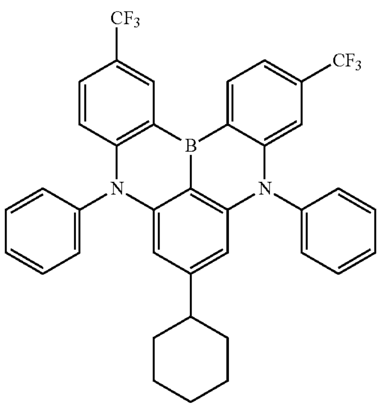
1-134
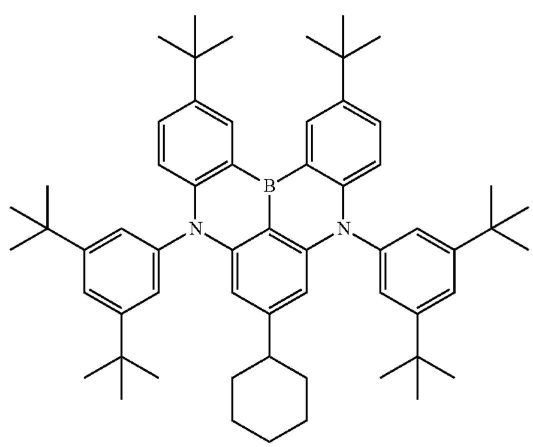
1-145

-continued
1-146
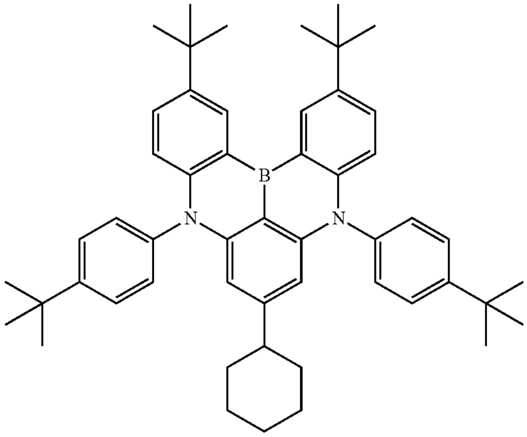
1-158
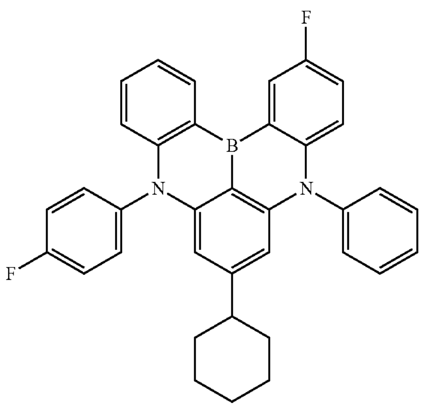
1-159
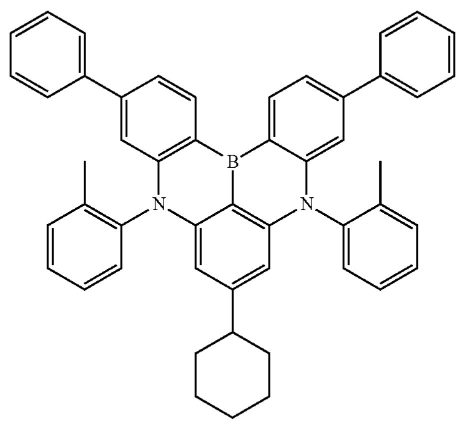
1-160
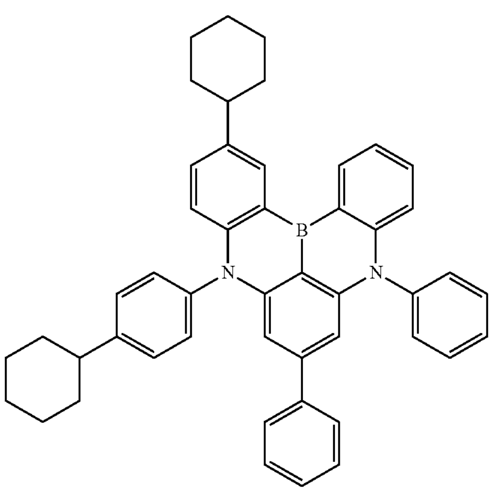

-continued
1-163
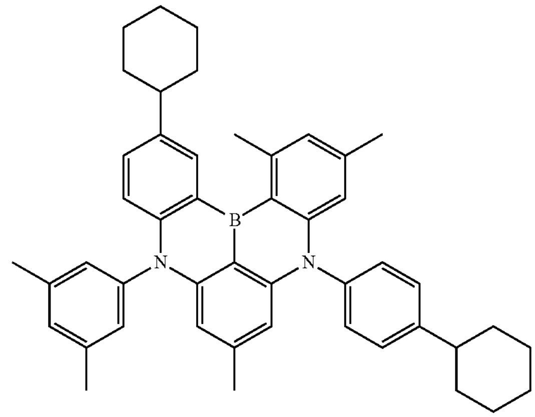
1-164
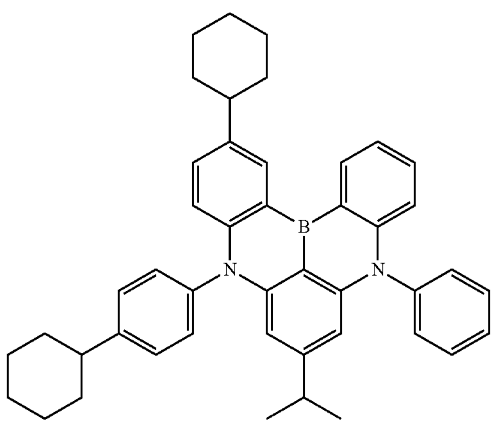
1-165
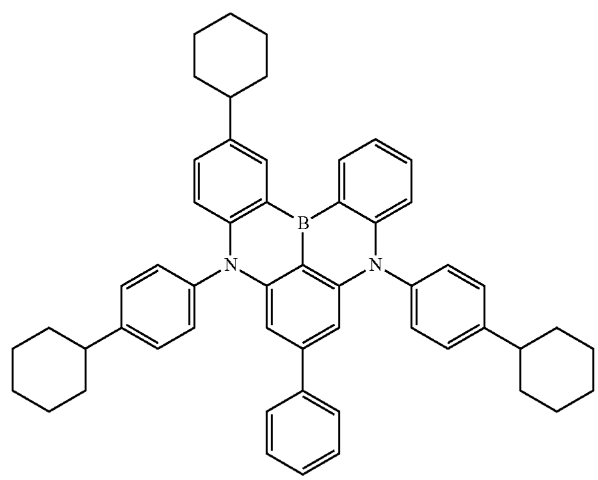
1-166
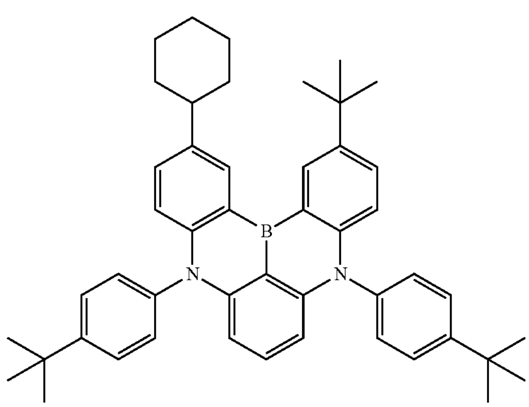
1-167
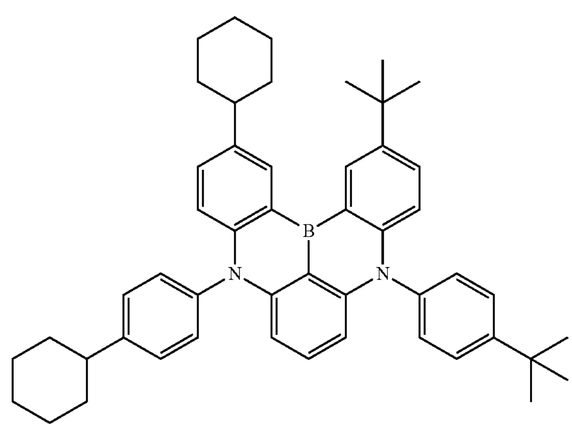

-continued
1-168
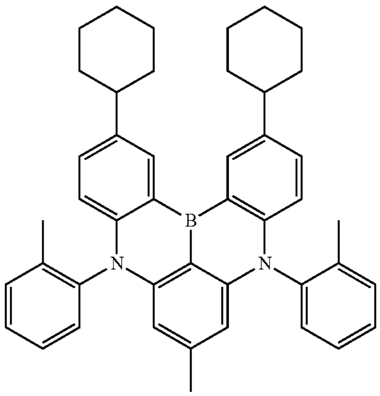
1-169
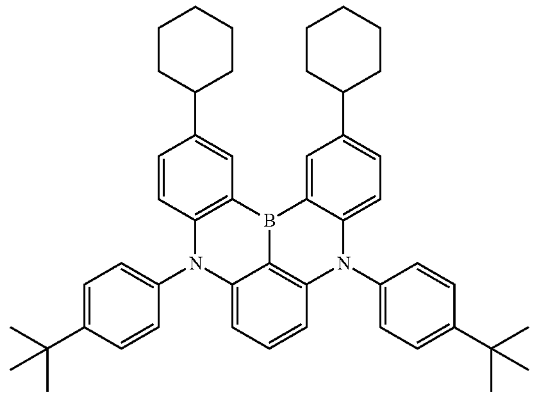
1-170
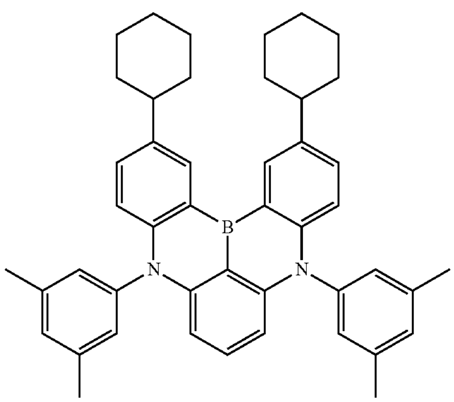
1-171
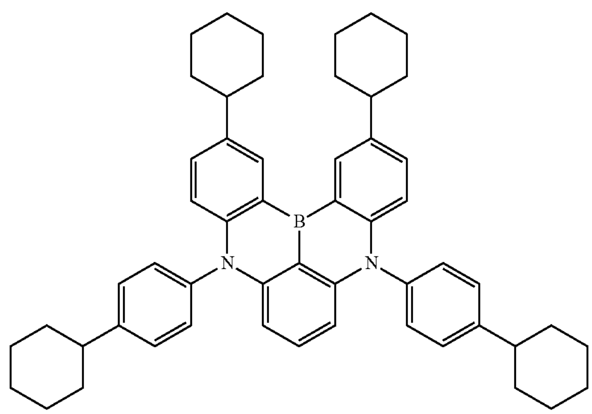
1-172
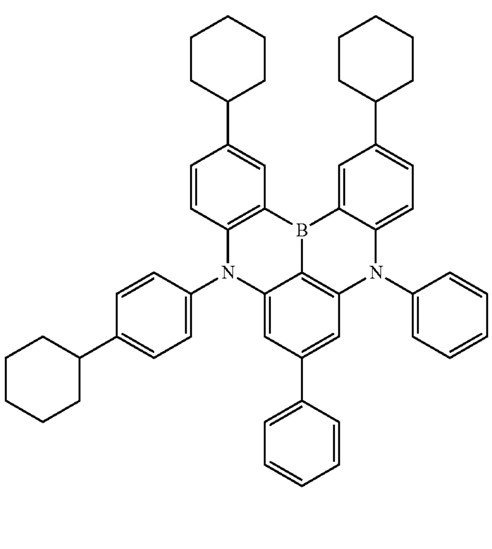
1-173
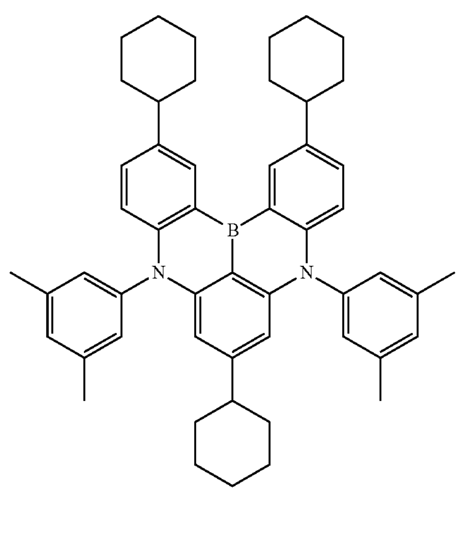

-continued
1-174
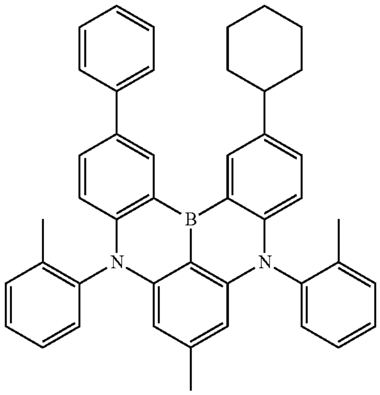
1-175
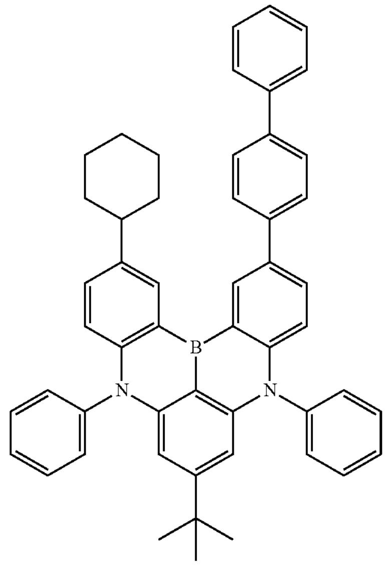
1-176
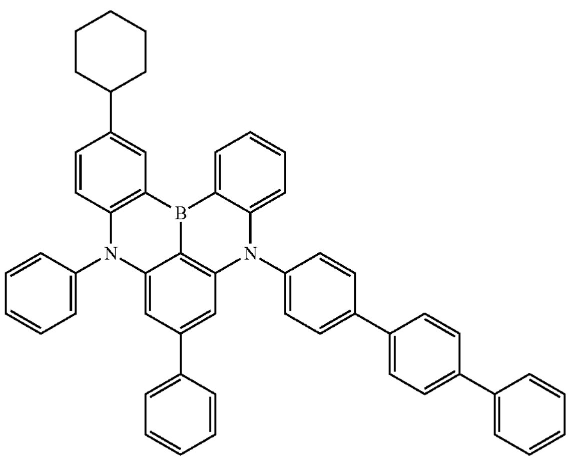
1-177
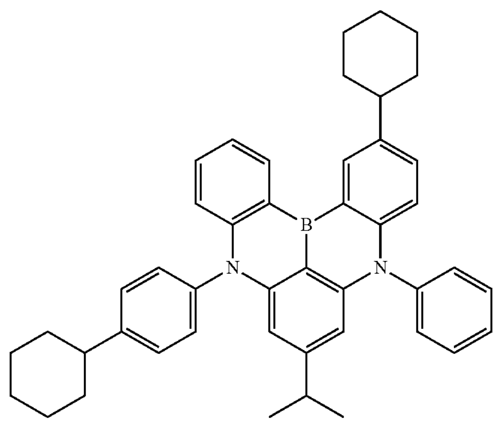
1-178
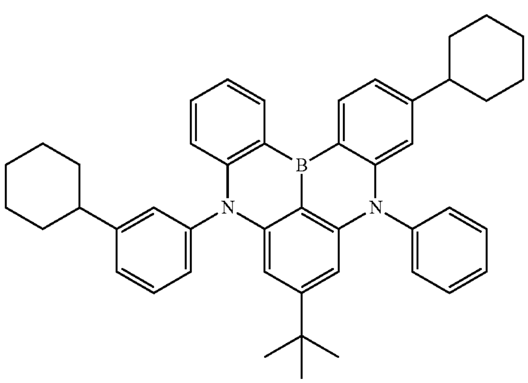
1-179
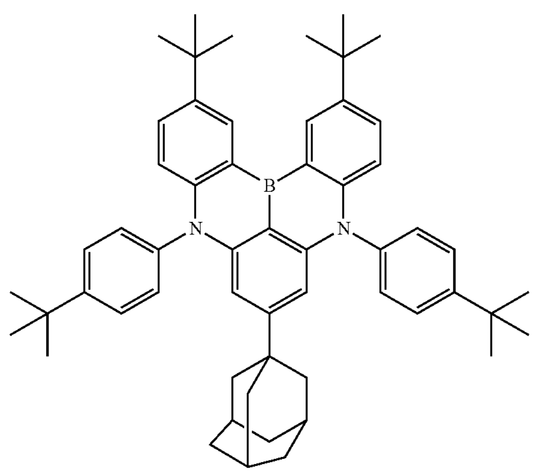

-continued
1-180
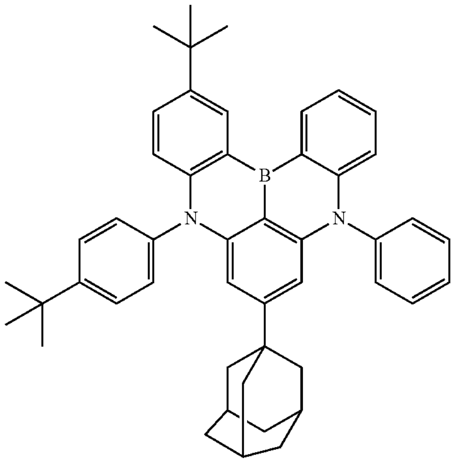
1-181
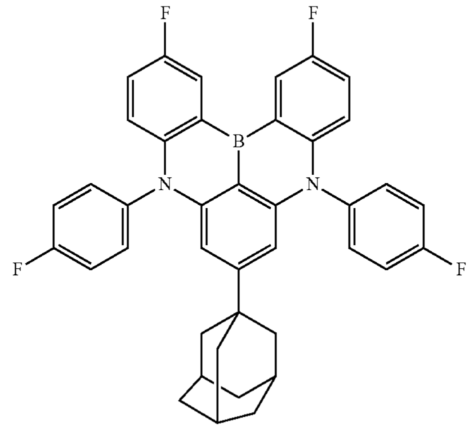
1-182
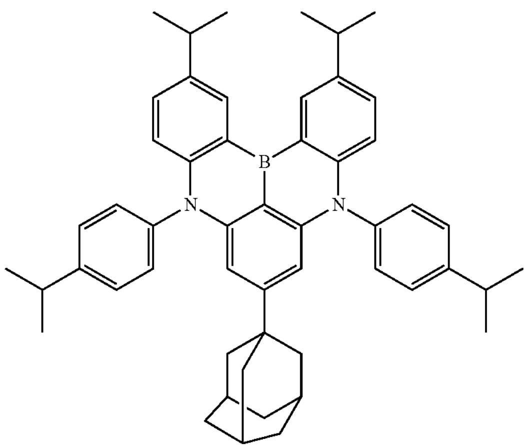
1-183
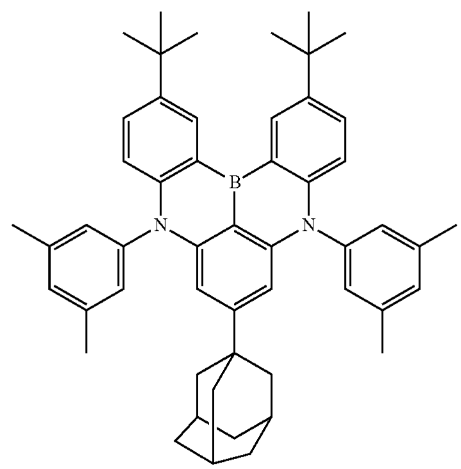
1-184
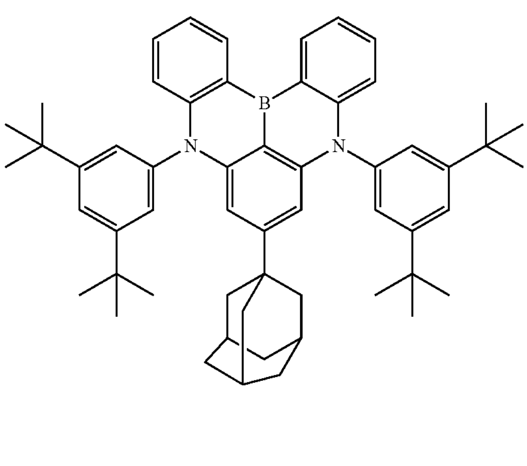
1-185
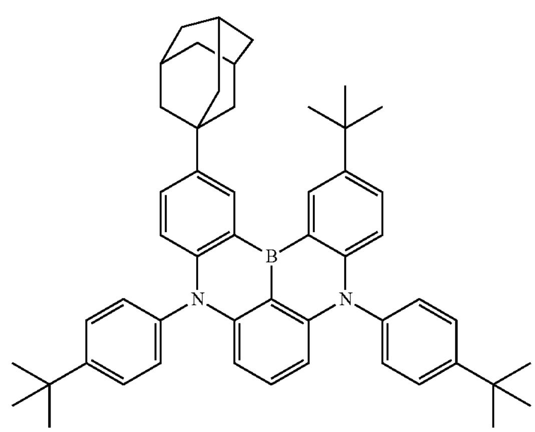

-continued
1-186
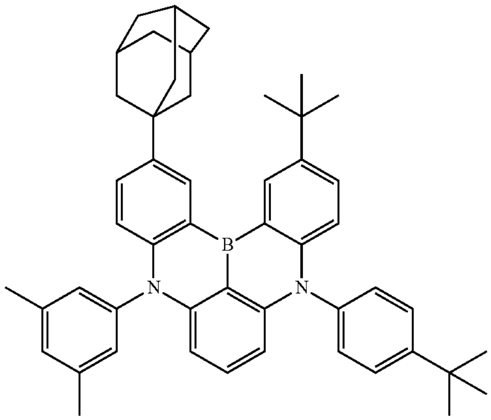
1-187
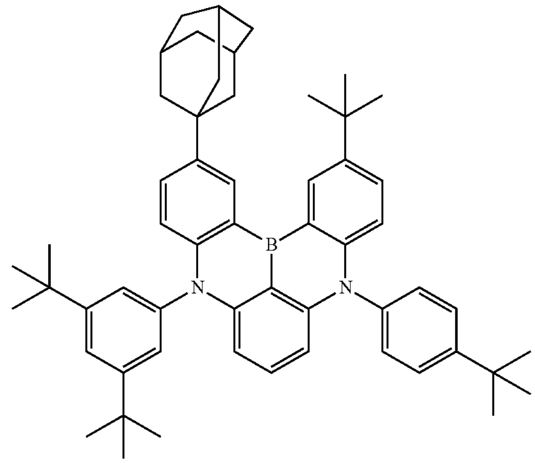
1-188
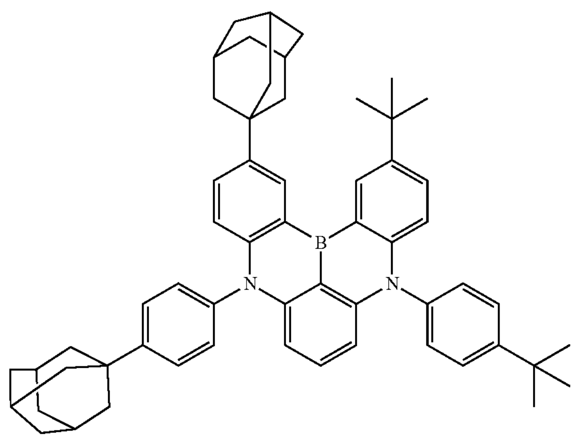
1-189
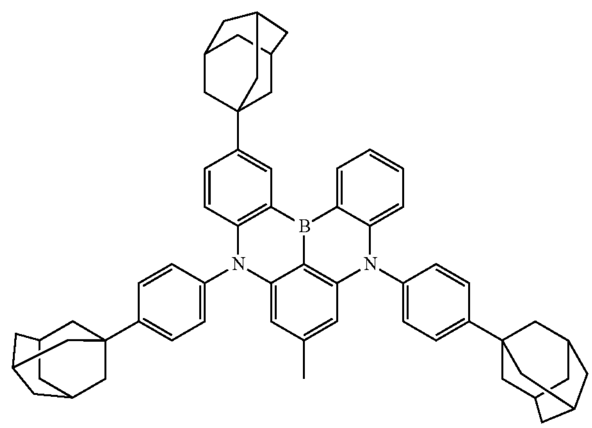
1-190
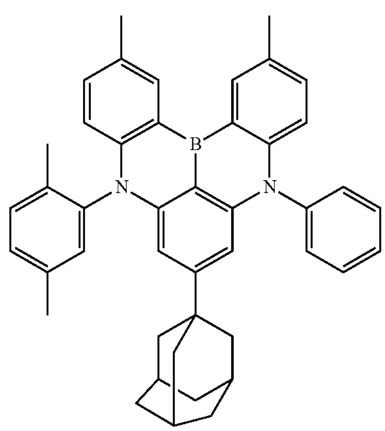
1-191
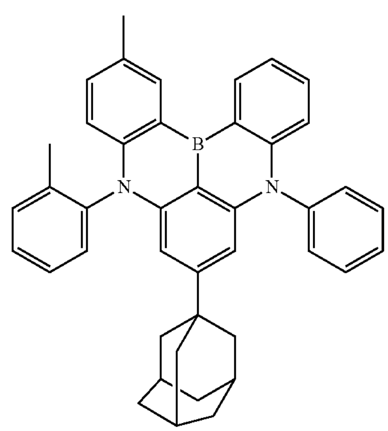

-continued
1-192
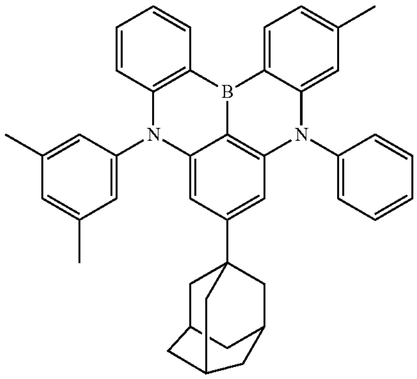
1-193
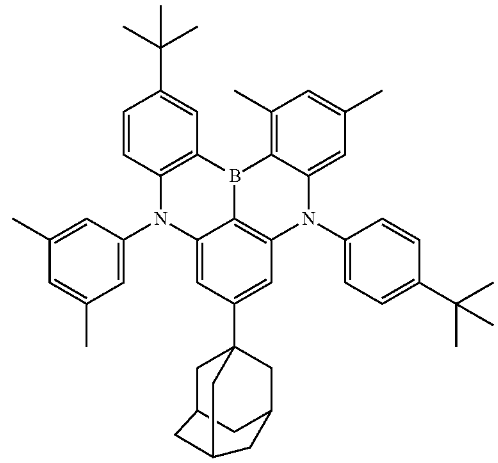
1-194
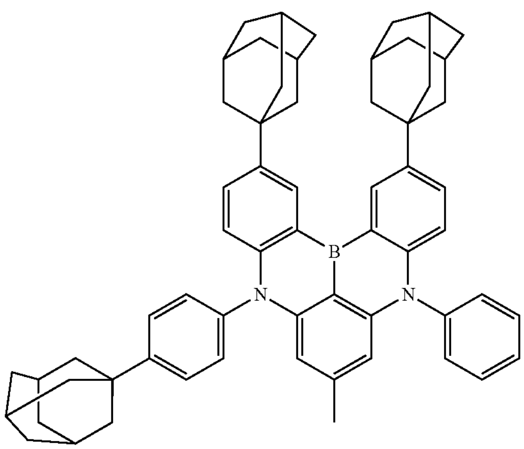
1-195
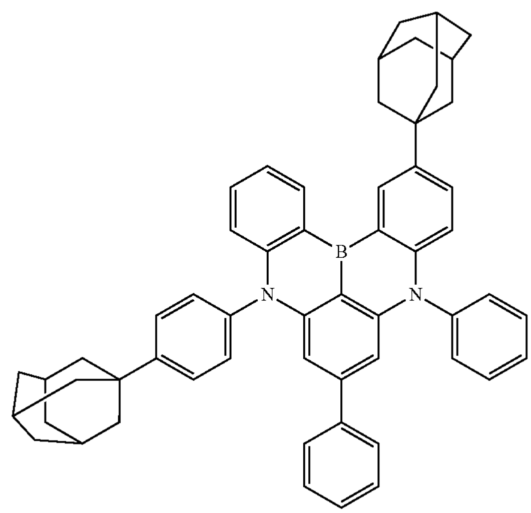
1-196
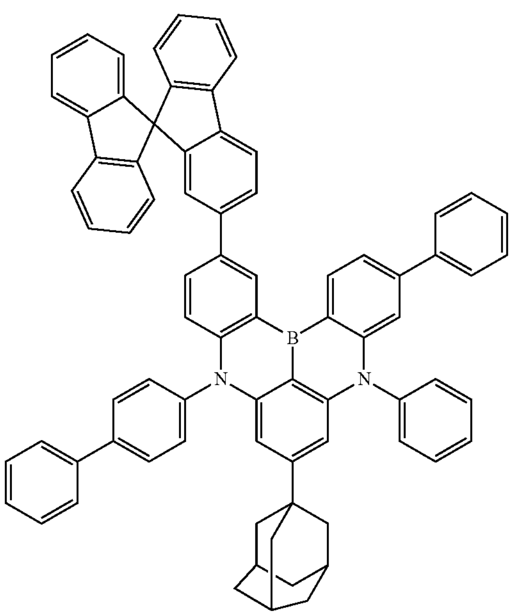
1-197
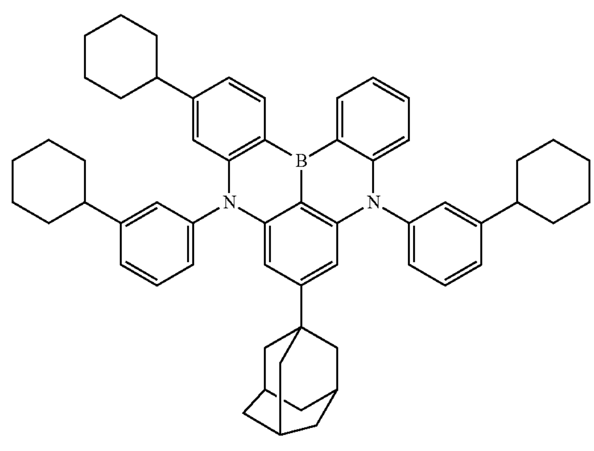

-continued
1-198
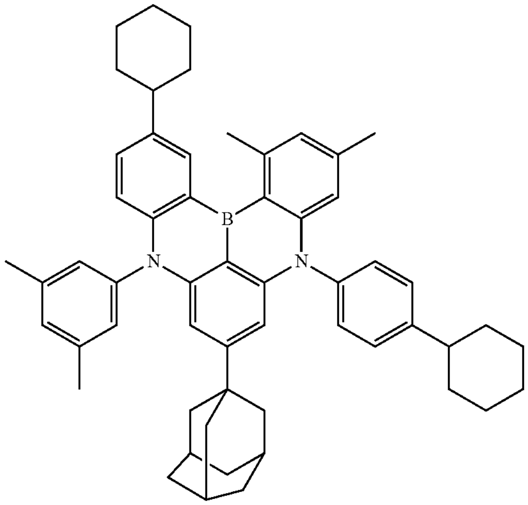
1-203
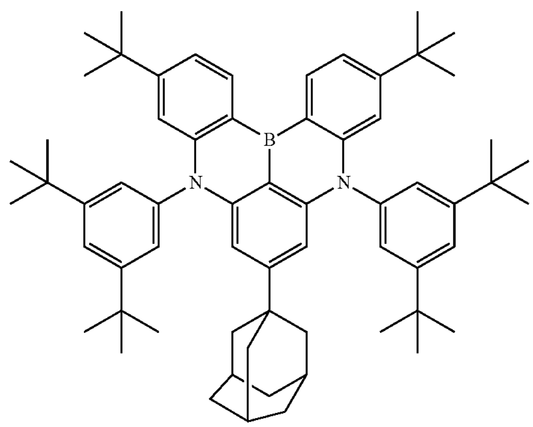
1-204
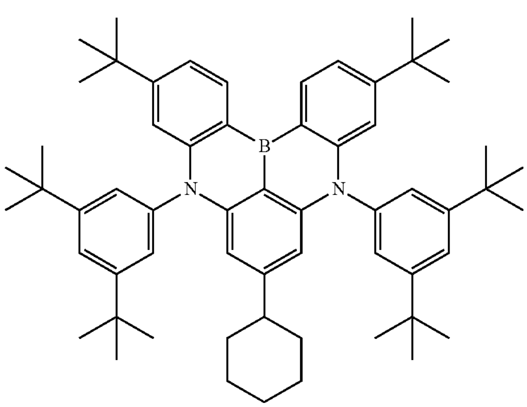

-continued
1-206
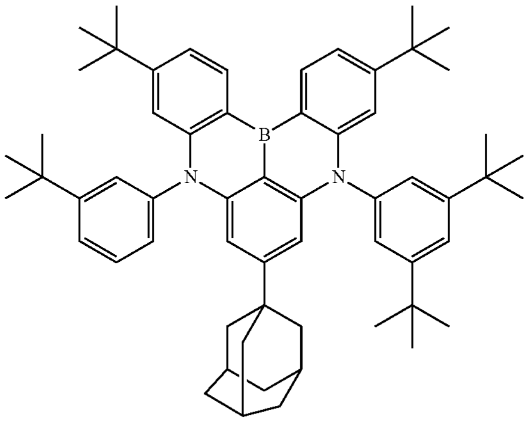
1-207
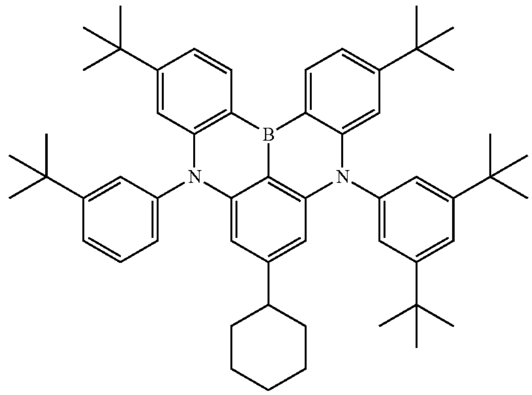
1-211
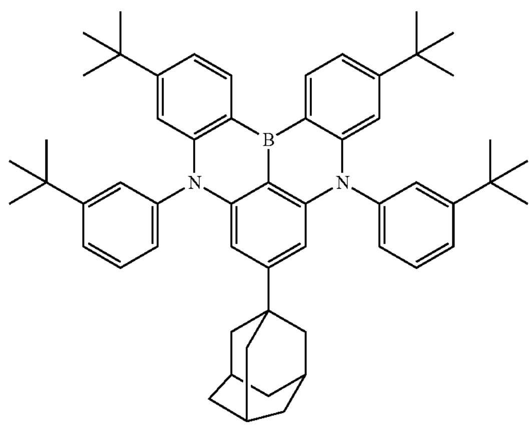
1-212
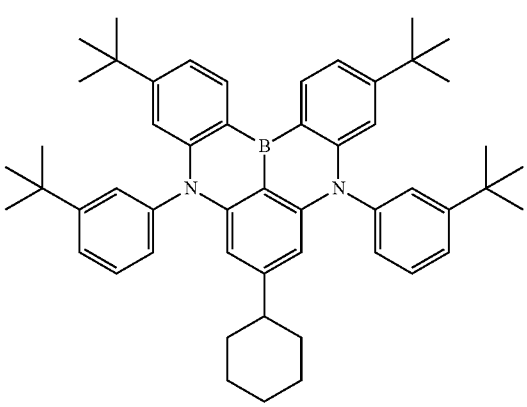

-continued
1-214
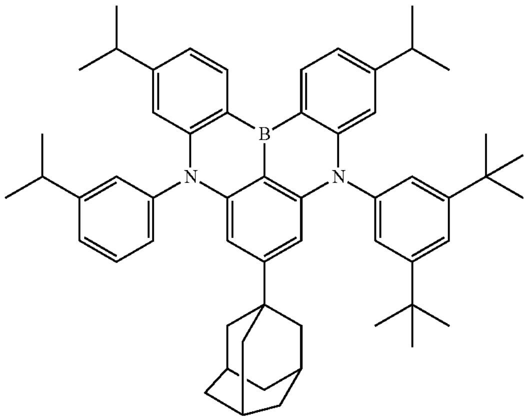
1-215
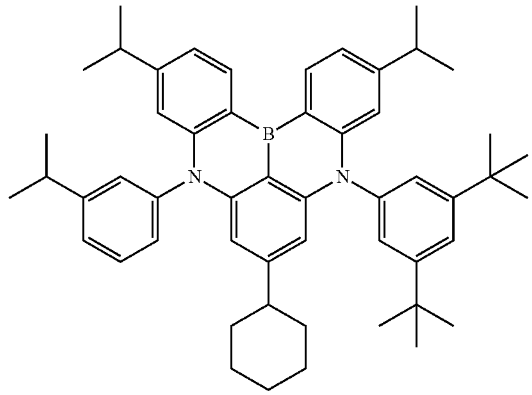
1-216
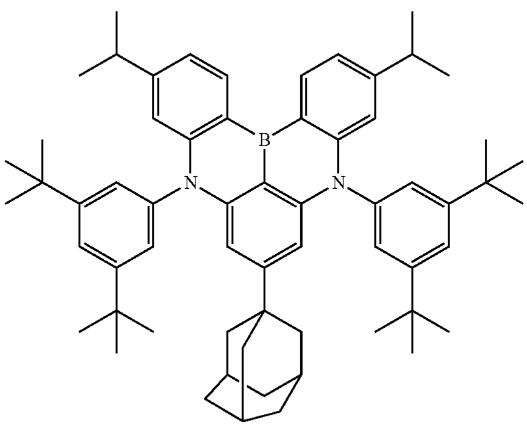
1-217
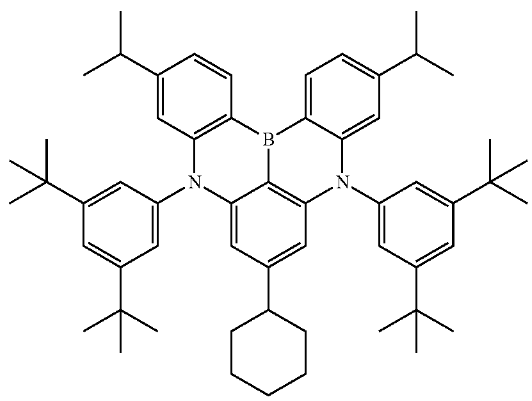
1-219
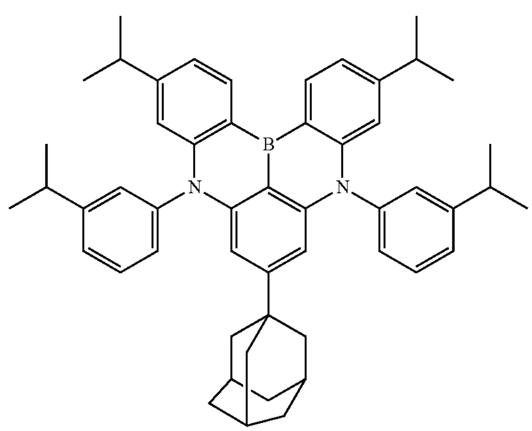

-continued
1-220
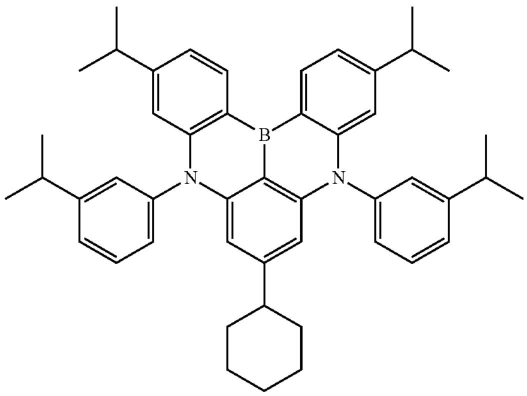
1-221
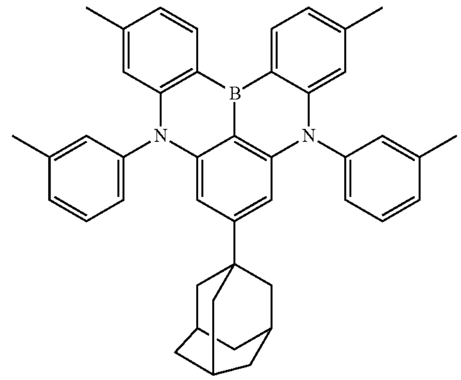
1-222
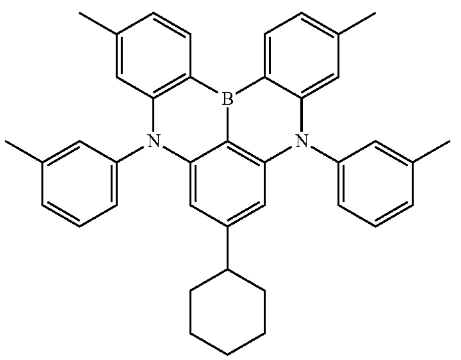
3. The organic electroluminescent element of claim 1, wherein the compound represented by Formula 2 is selected from the group consisting of the following compounds:
2-1
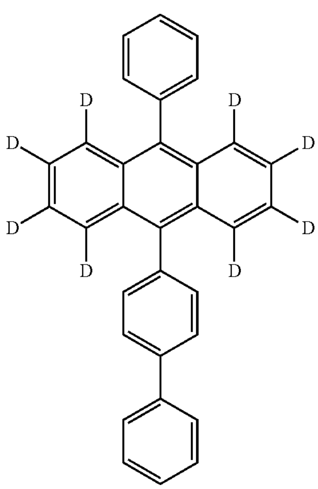
-continued
2-2
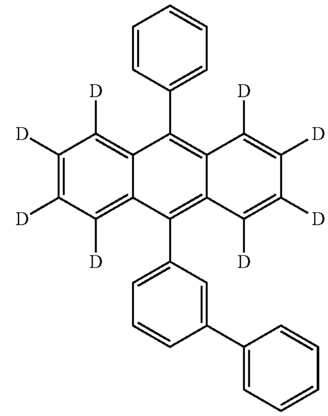
2-3
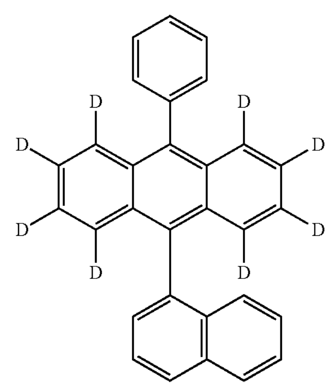

-continued
2-4
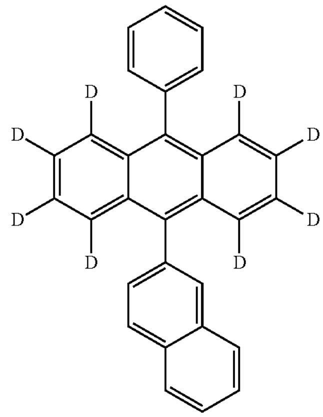
2-5
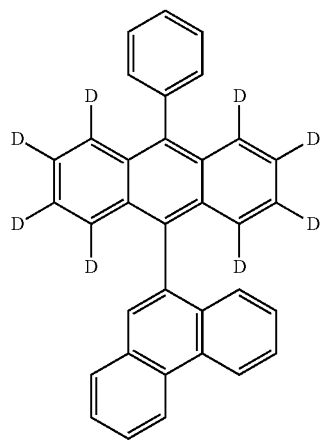
2-6
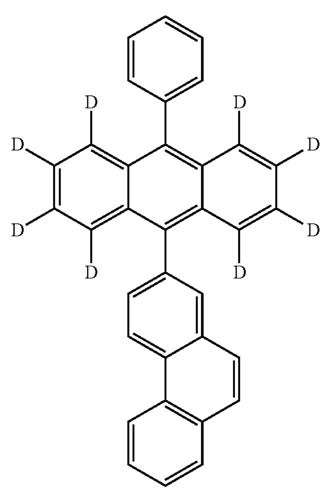
-continued
2-7
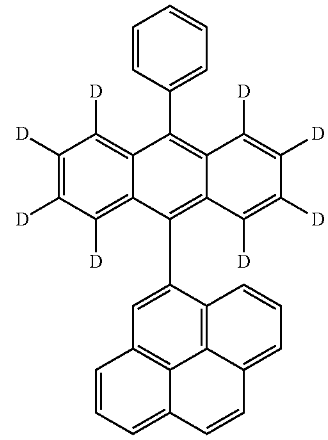
2-8
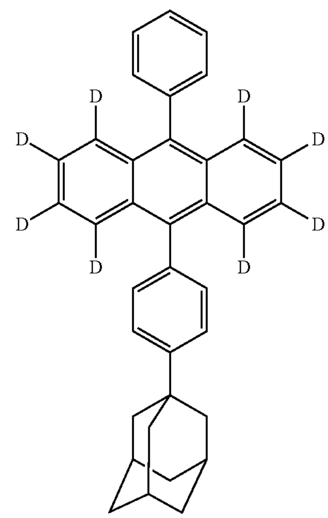
2-9
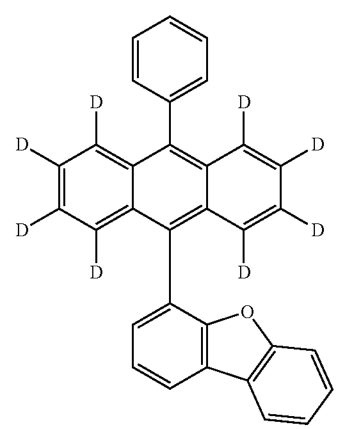

-continued
2-10
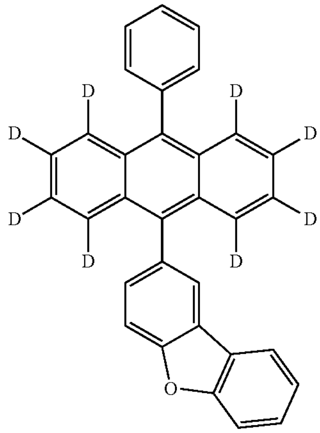
2-11
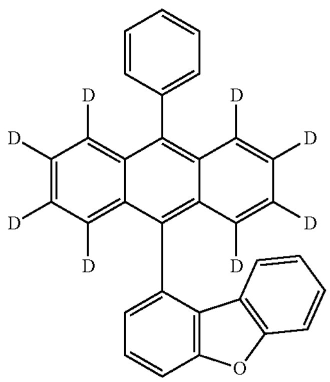
2-12
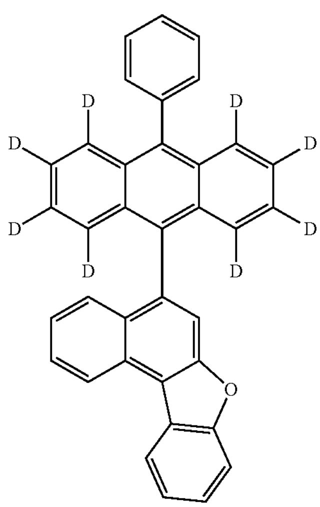
-continued
2-13
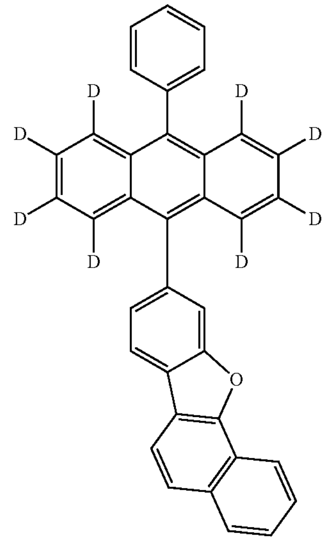
2-14
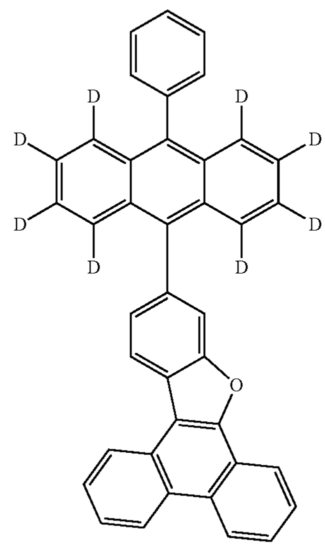
2-15
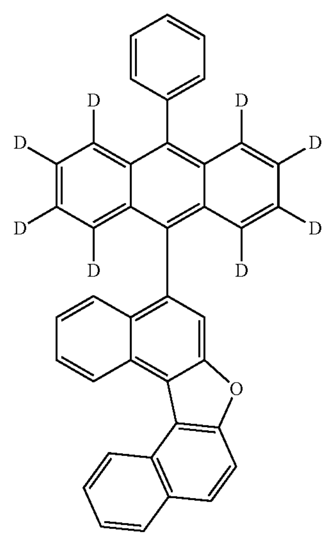

-continued
2-16
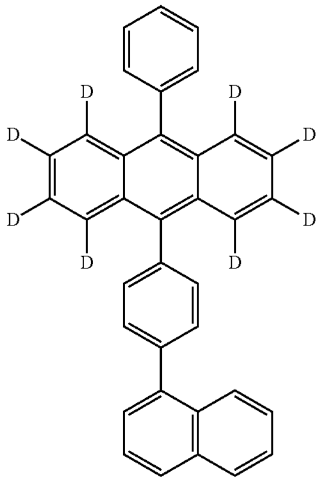
2-17
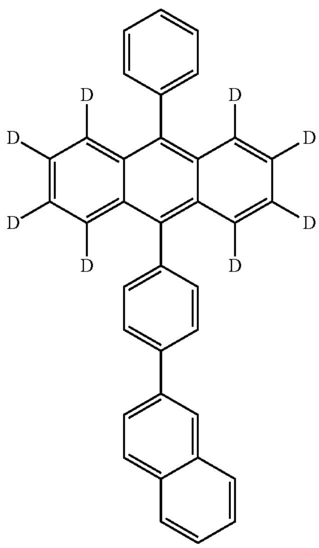
2-18
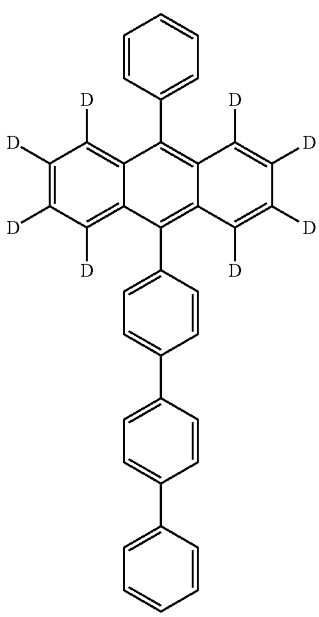
-continued
2-19
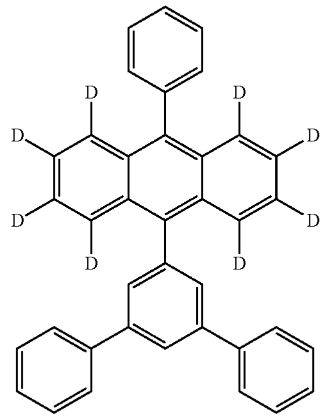
2-20
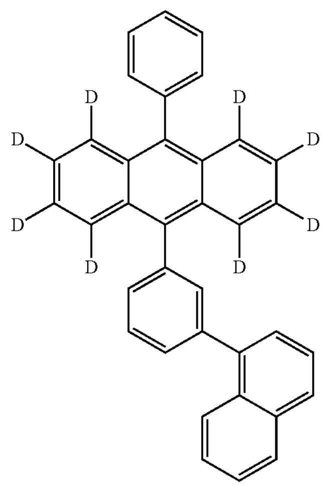
2-21
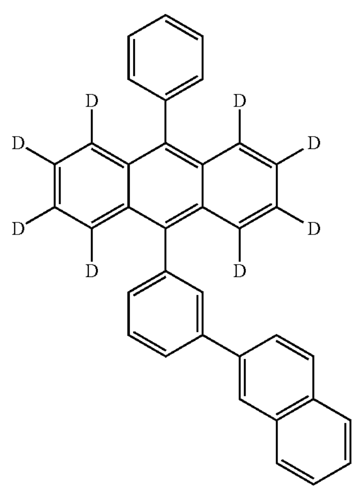

-continued
2-22
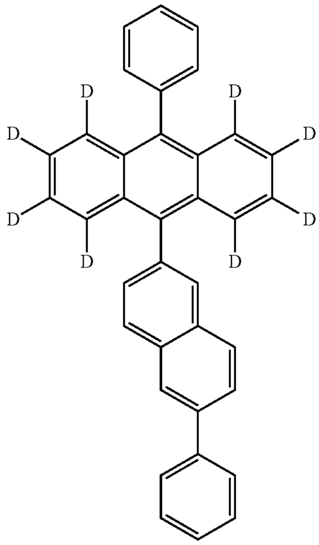
2-23
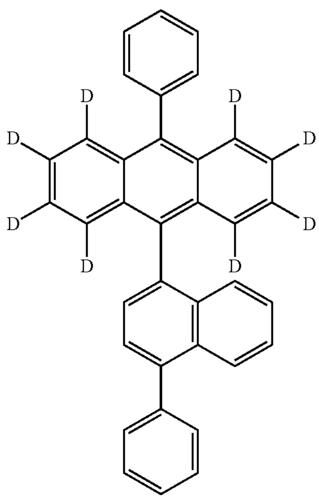
2-24
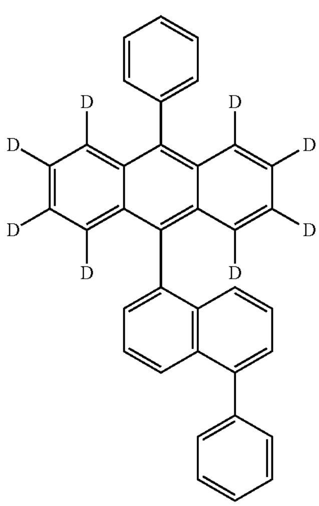
-continued
2-25
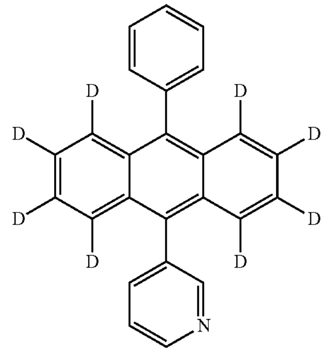
2-26
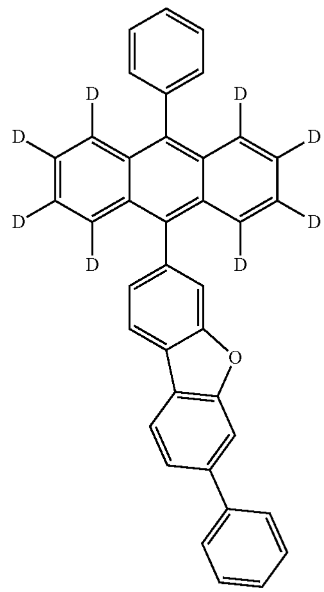
2-27
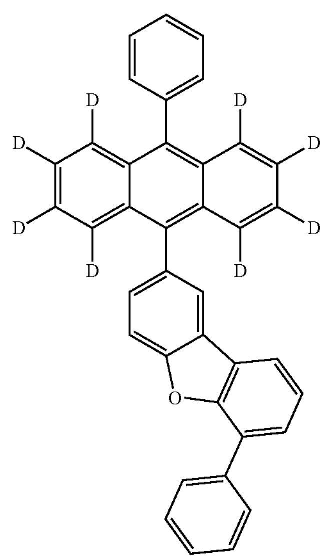

-continued
2-28
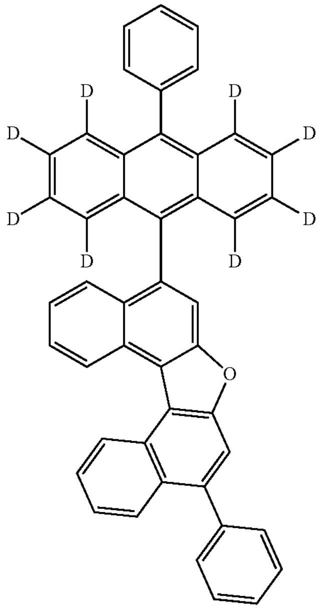
2-29
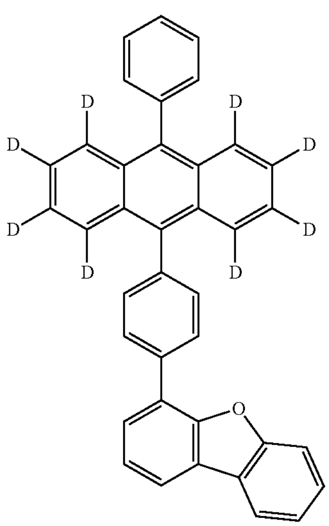
-continued
2-30
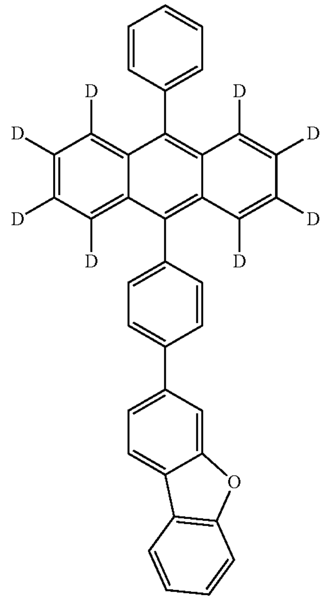
2-31
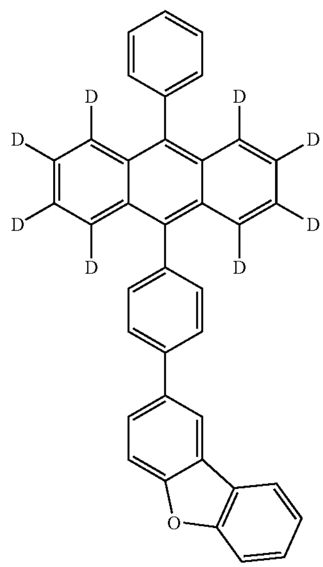
2-32
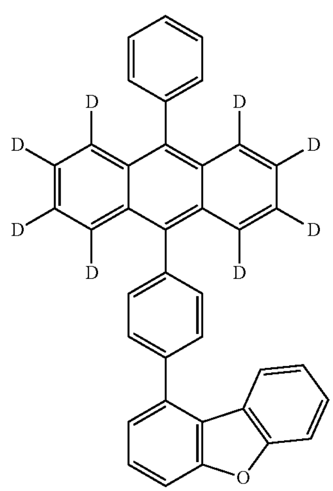

-continued
2-33
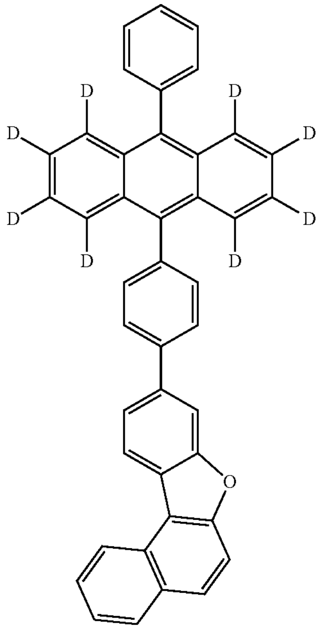
2-34
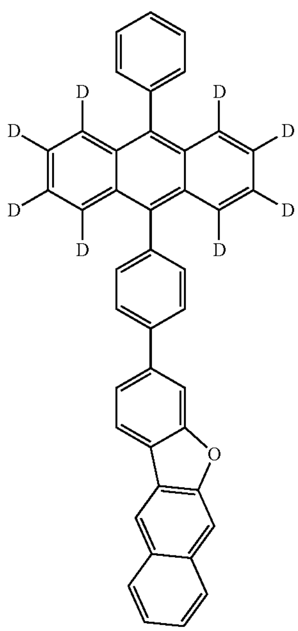
-continued
2-35
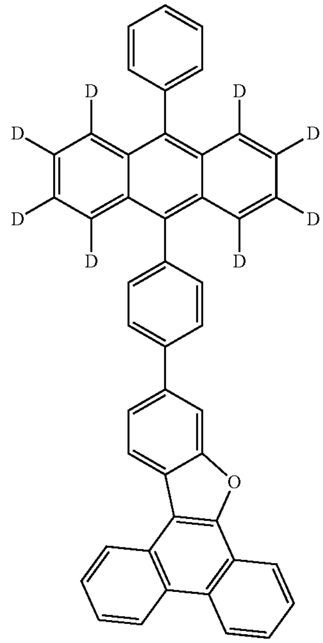
2-36
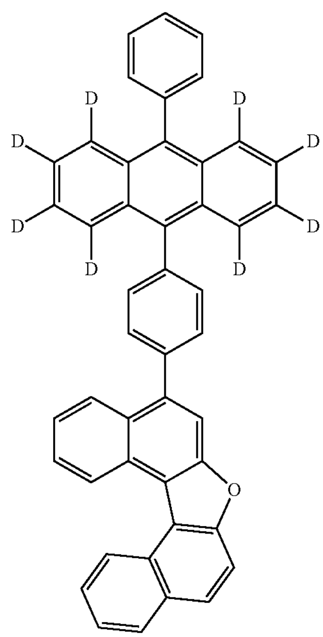

2-37
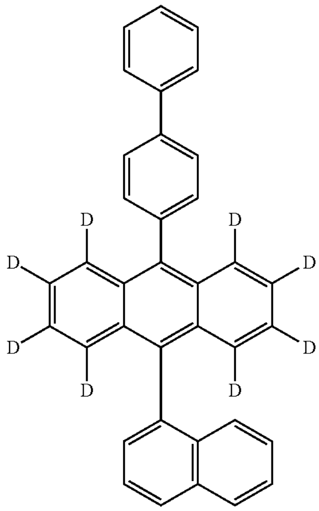
2-38
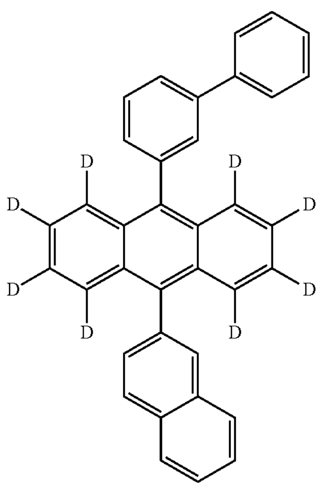
2-39
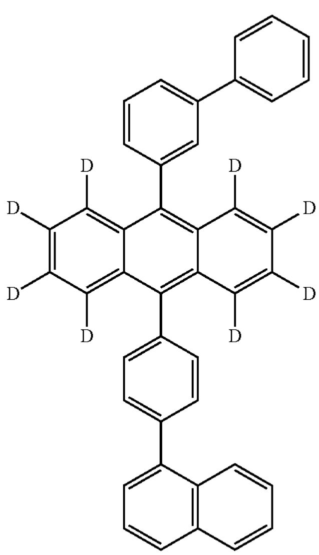
2-40
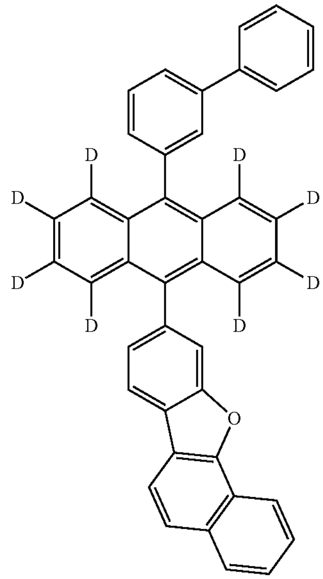
2-41
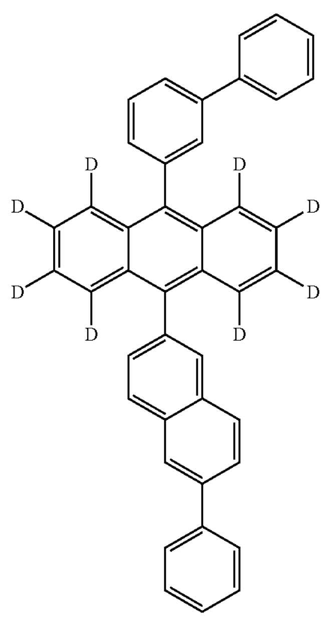

-continued
2-42
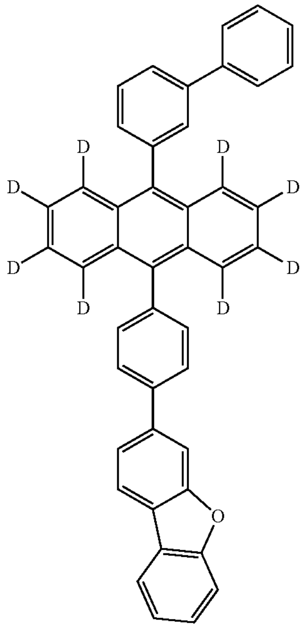
2-43
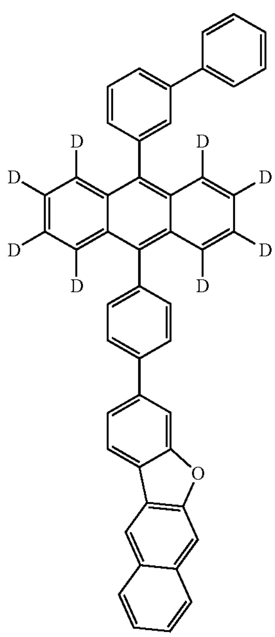
-continued
2-44
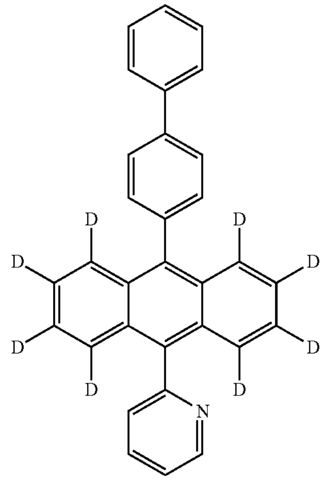
2-45
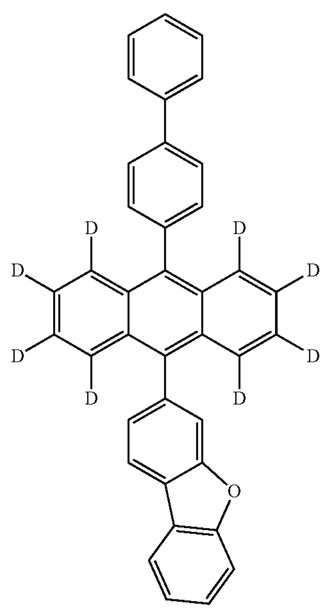

-continued
2-46
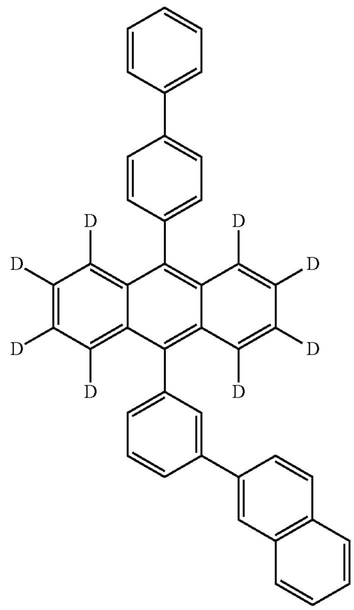
2-48
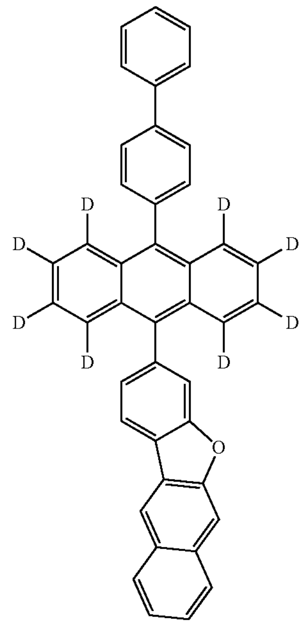
2-47
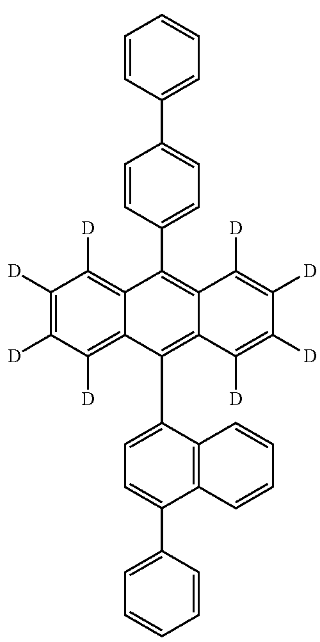
2-49
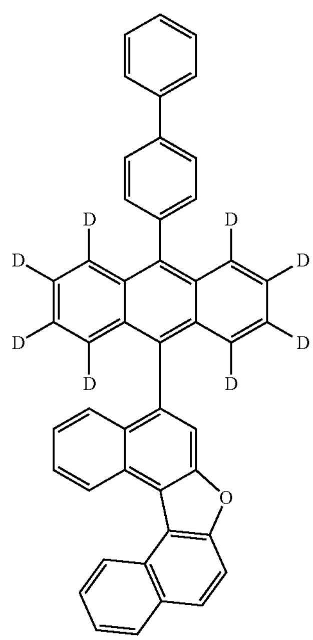

-continued
2-50
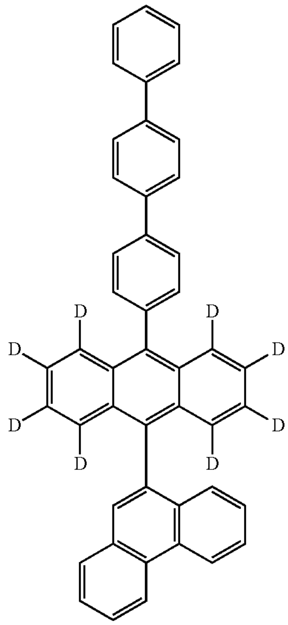
2-51
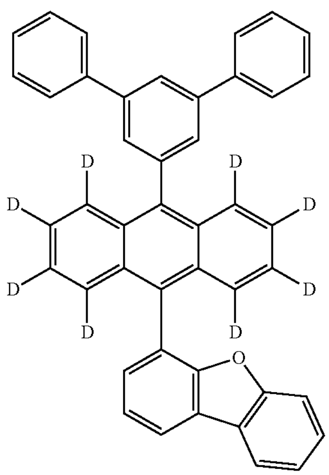
2-52
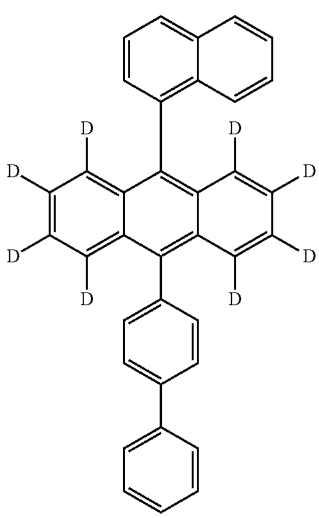
-continued
2-53
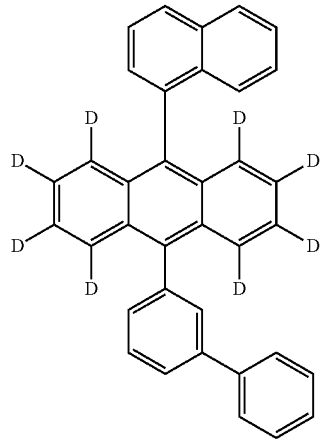
2-54
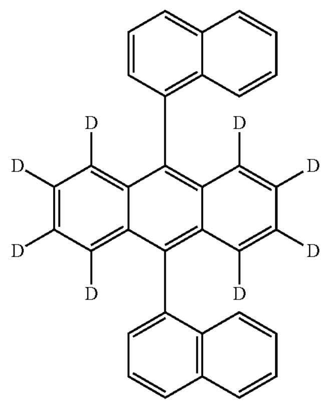
2-55
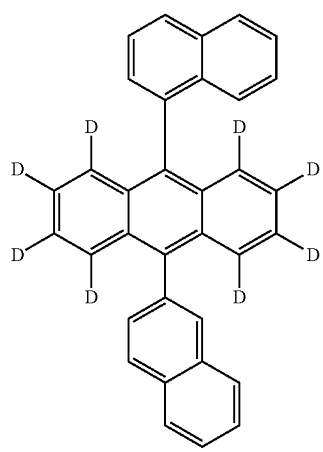

2-56
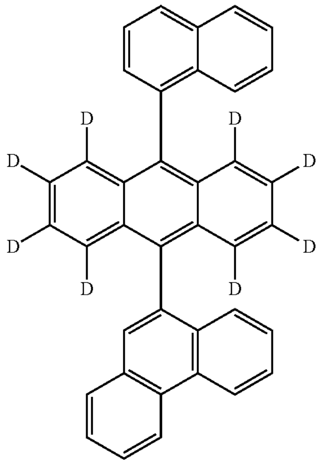
2-57
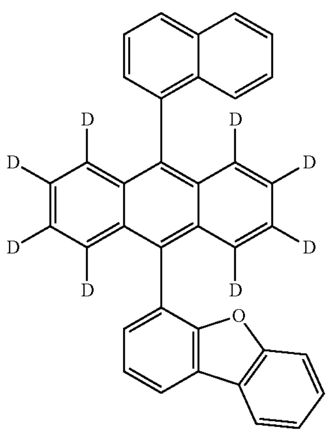
2-58
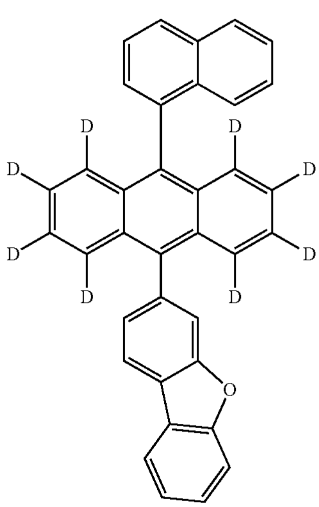
2-59
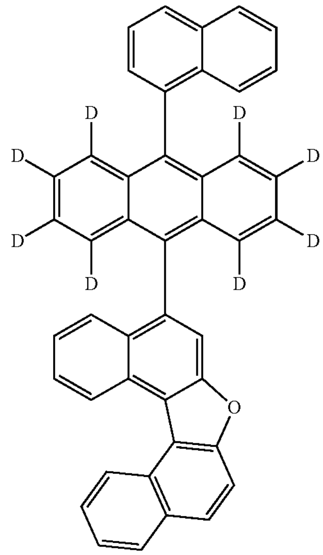
2-60
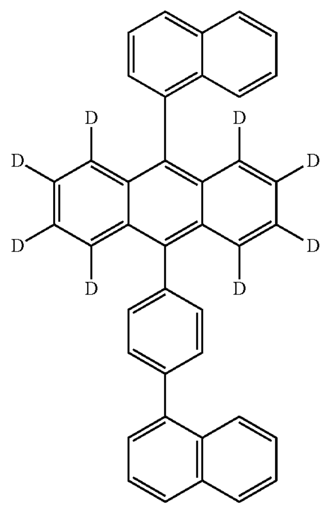
2-61
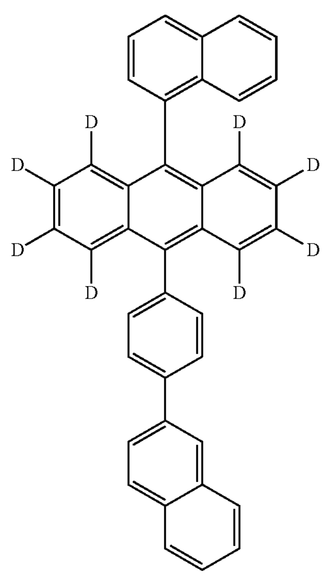

-continued
2-62
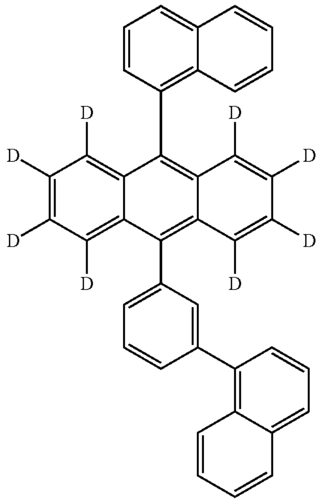
2-63
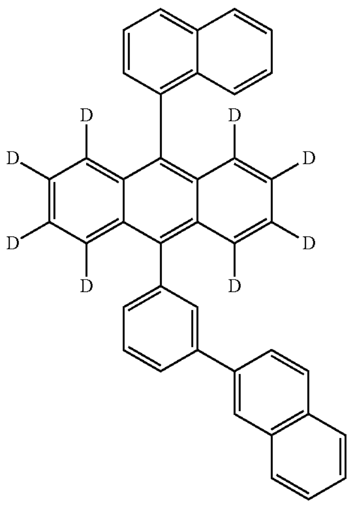
2-64
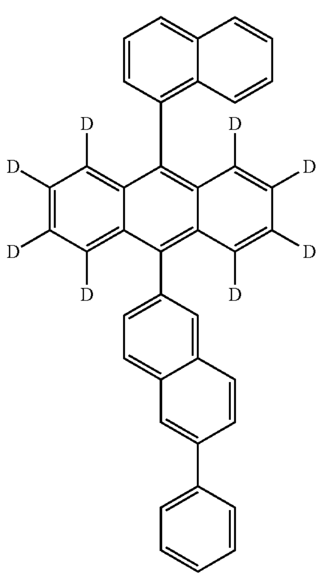
-continued
2-65
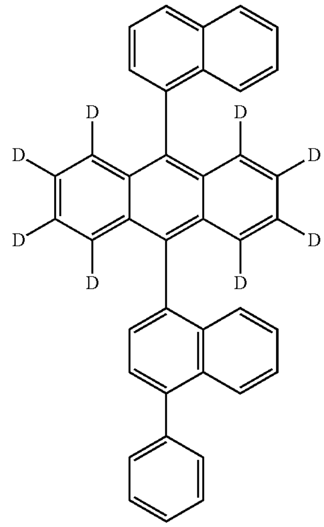
2-66
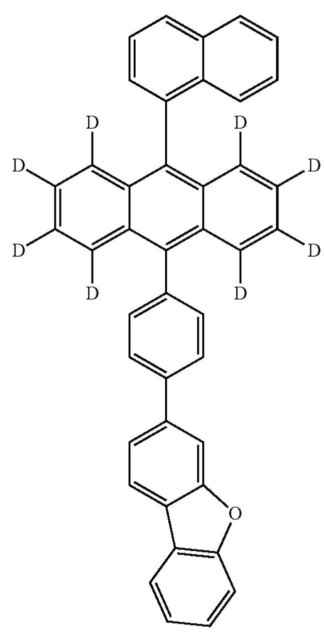

-continued
2-67
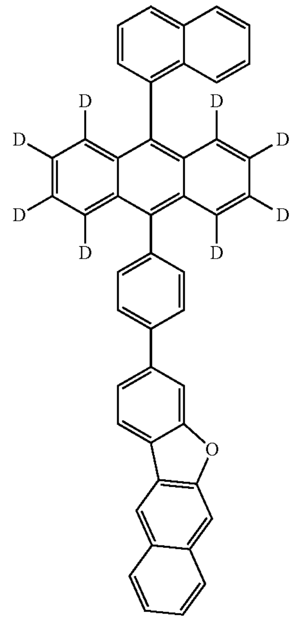
2-68
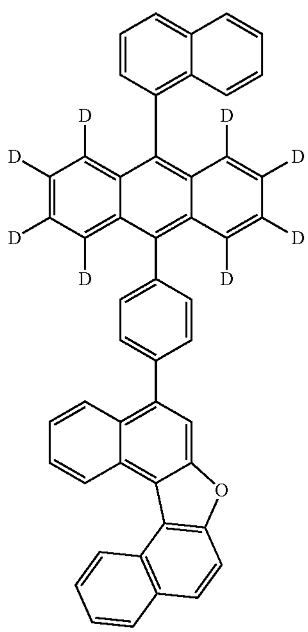
-continued
2-69
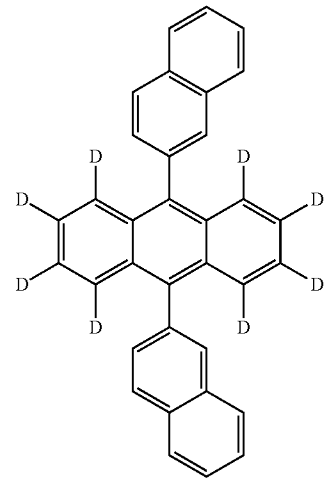
2-70
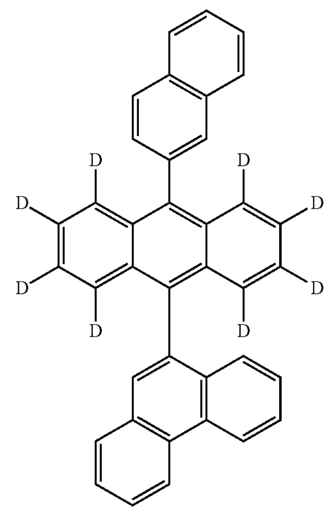
2-71
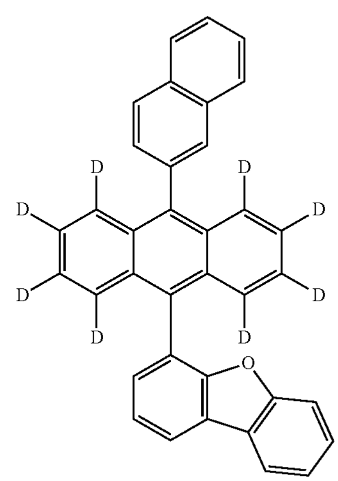

-continued
2-72
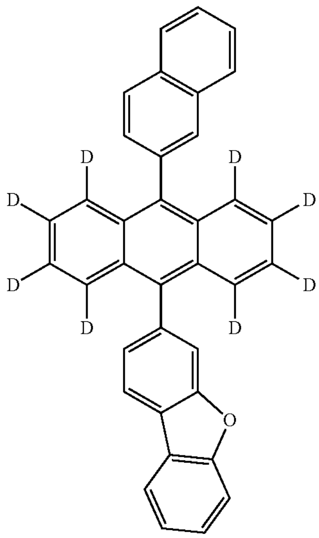
2-73
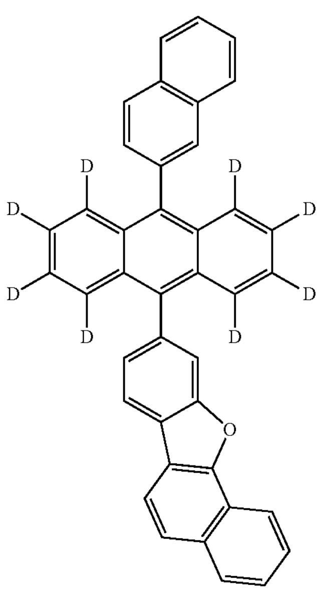
-continued
2-74
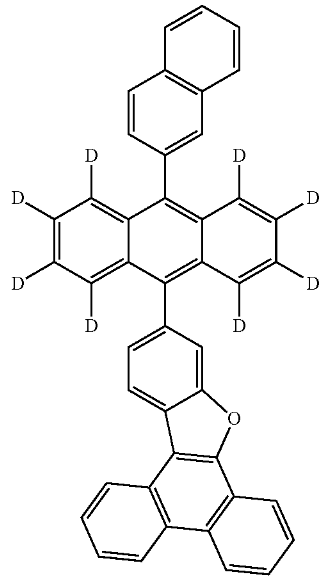
2-75
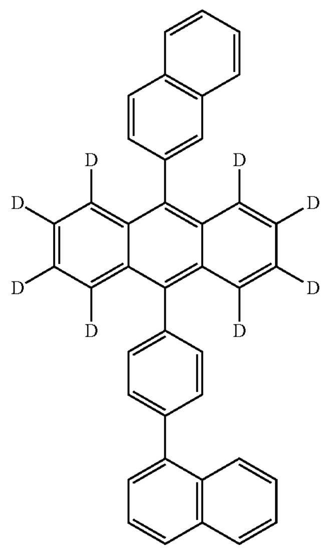
2-76
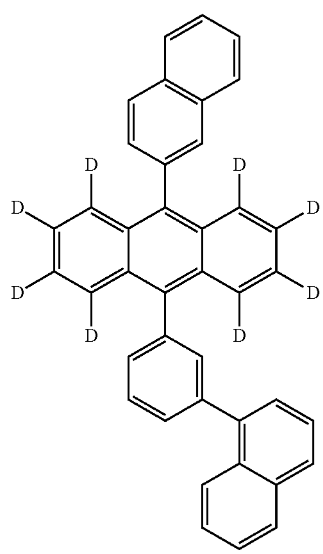

2-77
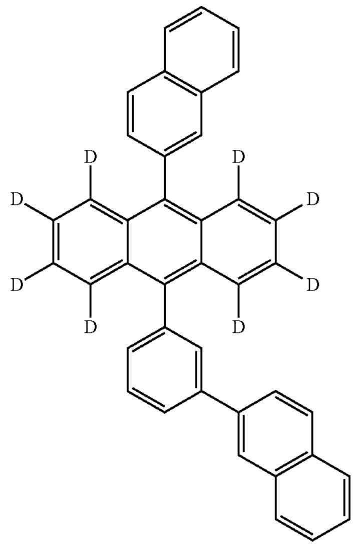
2-78
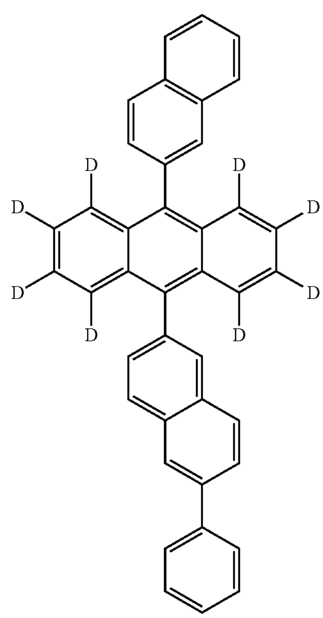
2-79
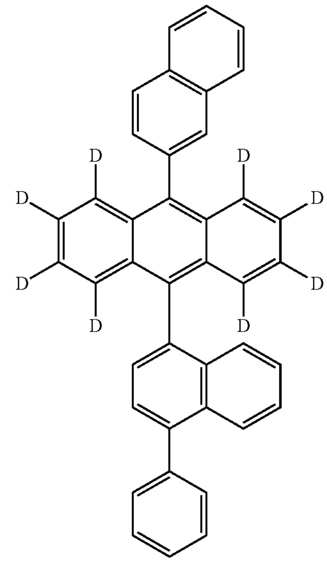
2-80
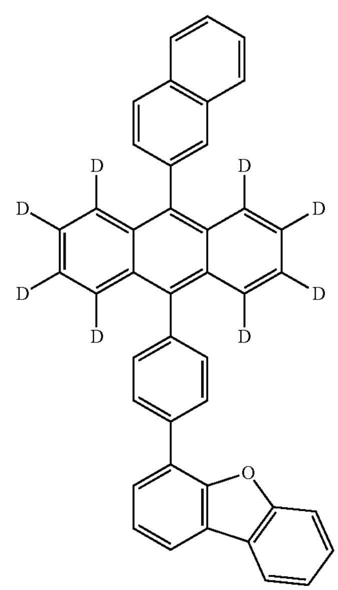

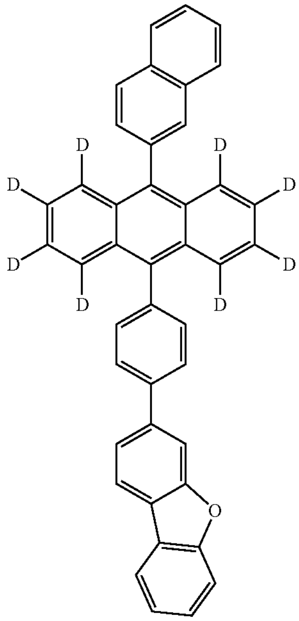
2-81
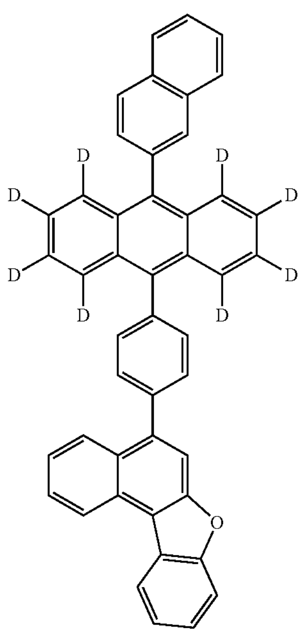
2-82
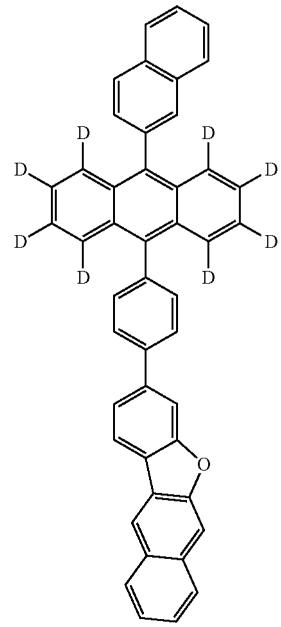
2-83
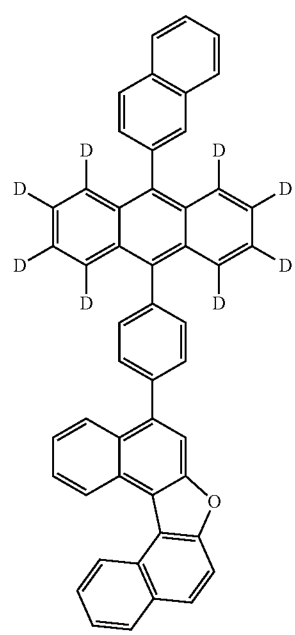
2-84

-continued
2-85
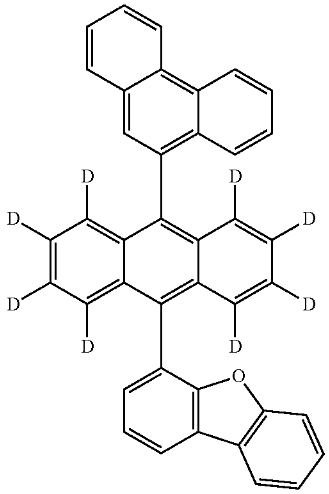
2-86
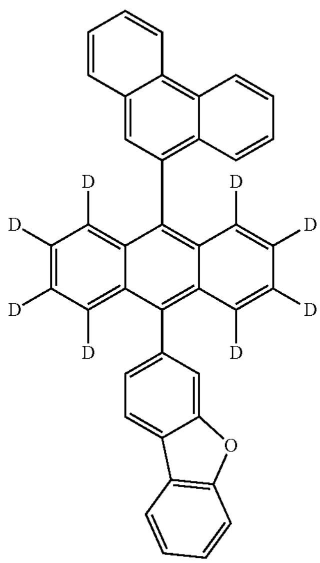
2-87
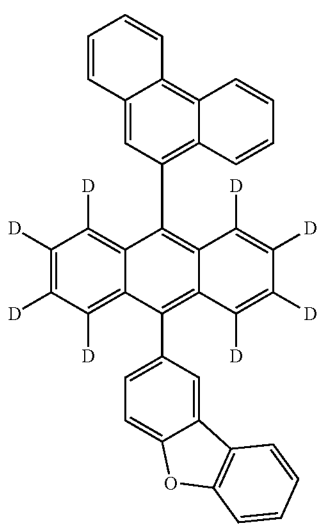
-continued
2-88
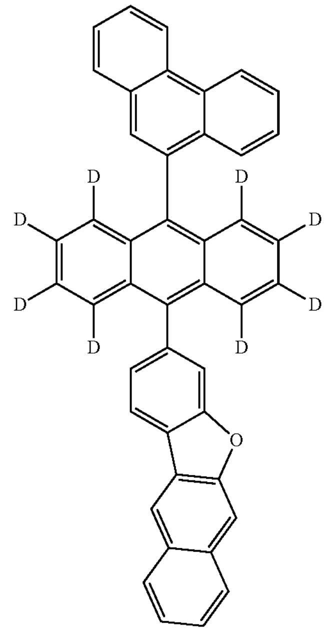
2-89
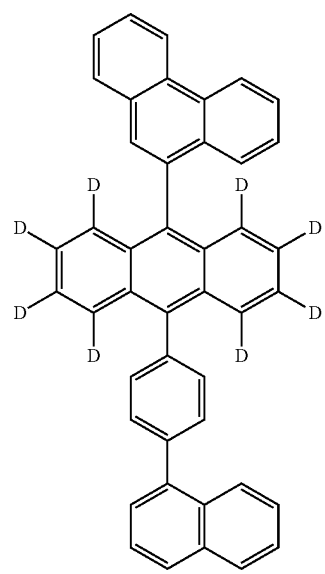

-continued
2-90
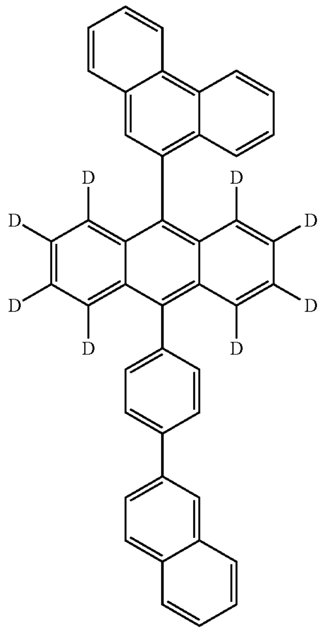
2-91
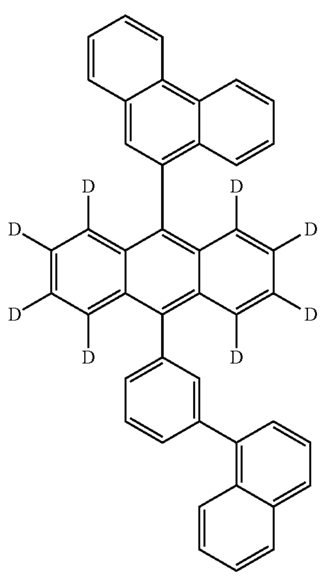
-continued
2-92
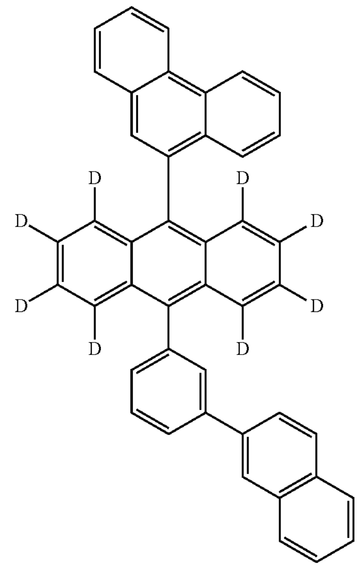
2-93
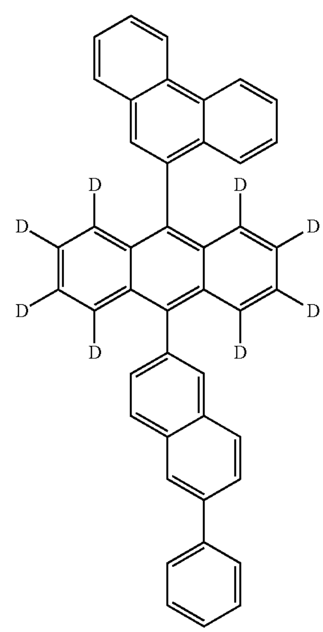

-continued
2-94
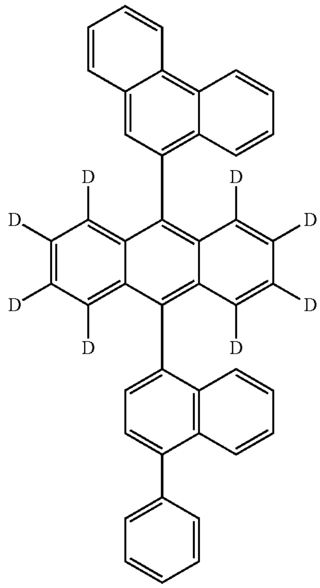
2-95
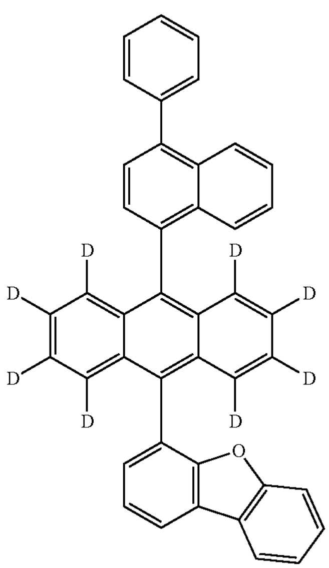
-continued
2-96
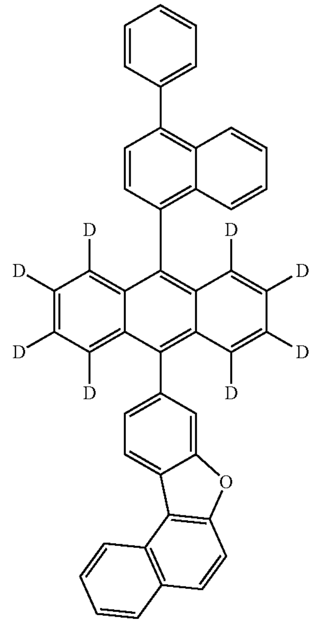
2-97
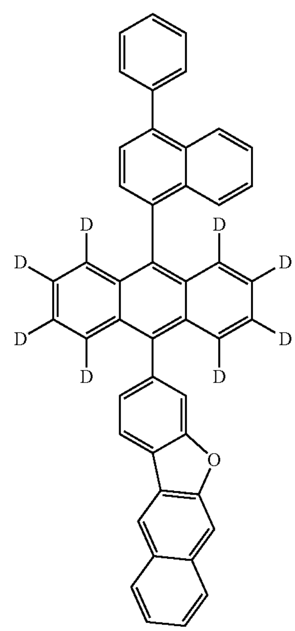

-continued
2-98
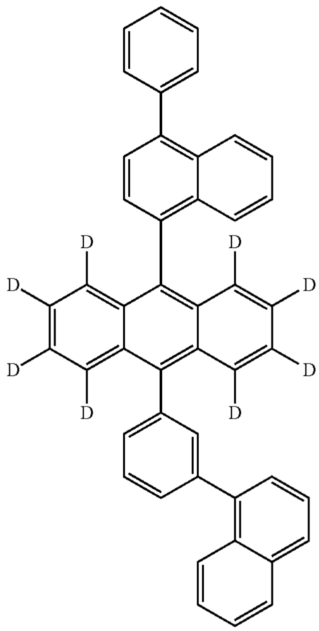
-continued
2-100
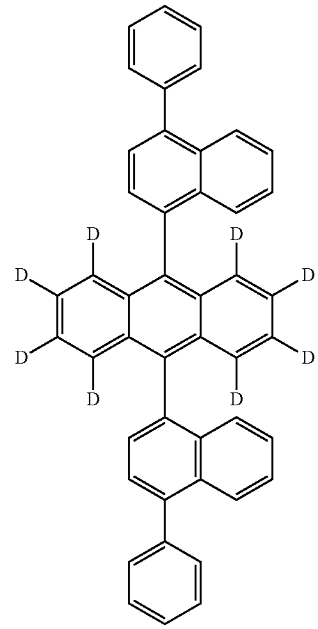
2-99
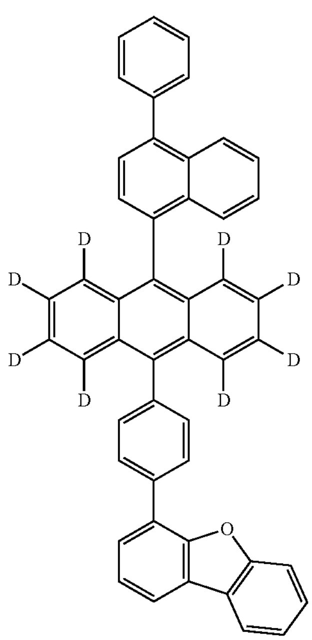
2-101
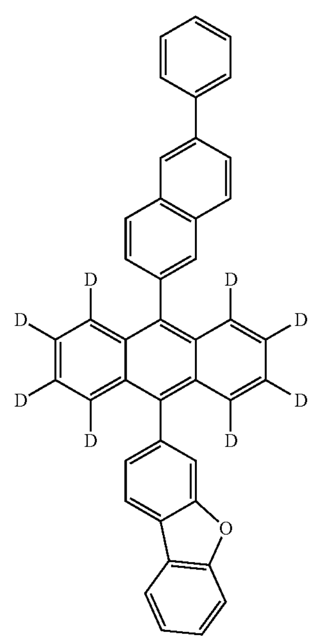

-continued
2-102
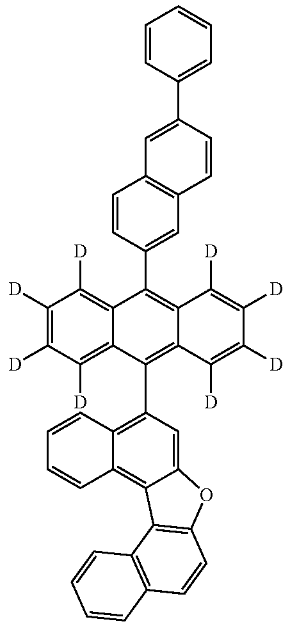
-continued
2-104
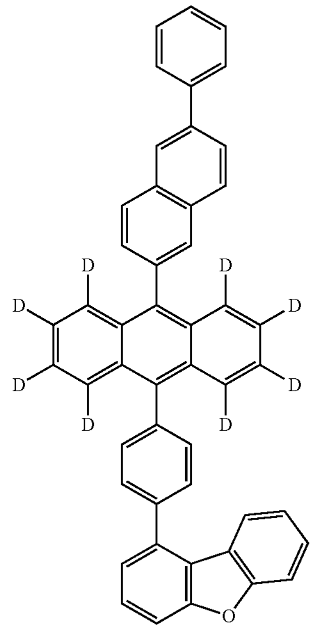
2-103
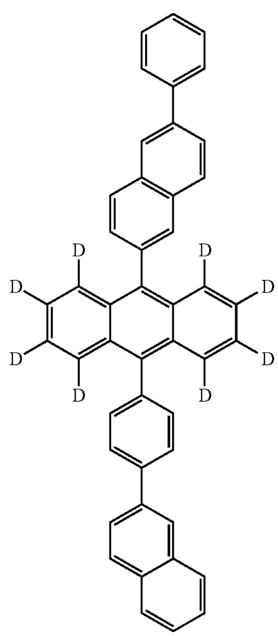
2-105
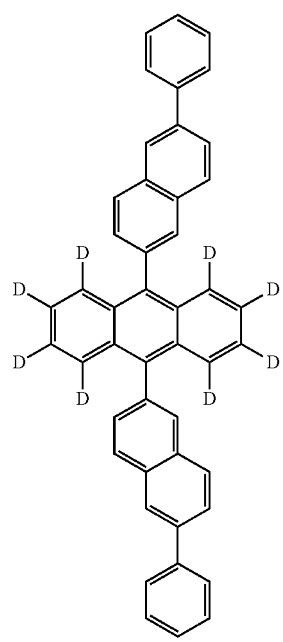

-continued
2-106
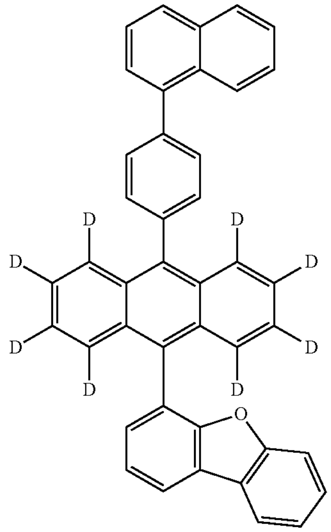
2-107
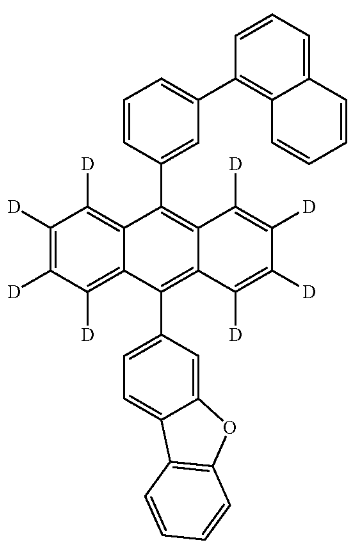
-continued
2-108
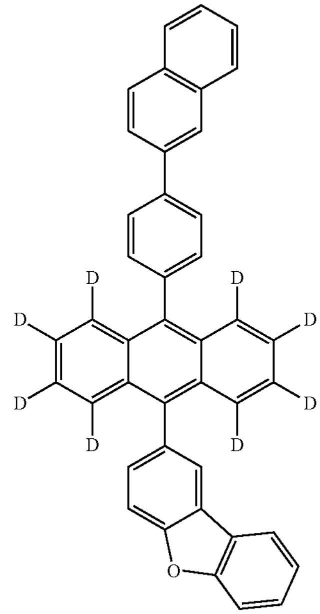
2-109
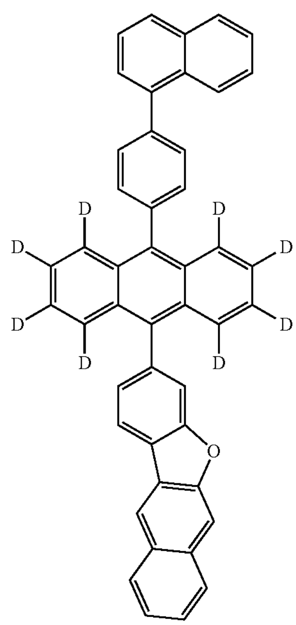

-continued
2-110
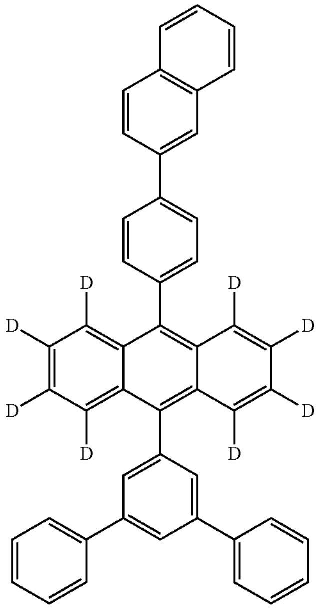
2-111
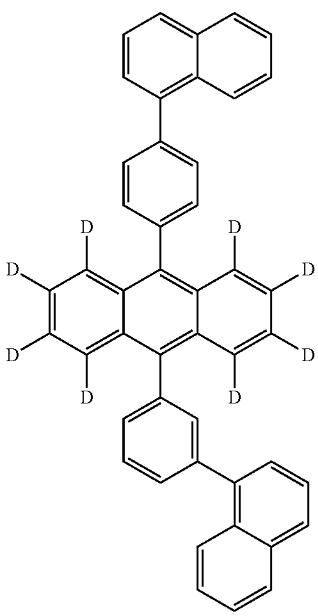
-continued
2-112
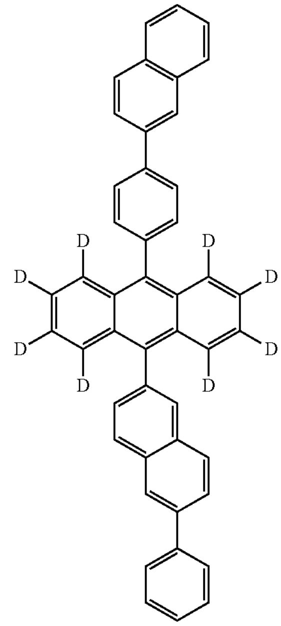
2-113
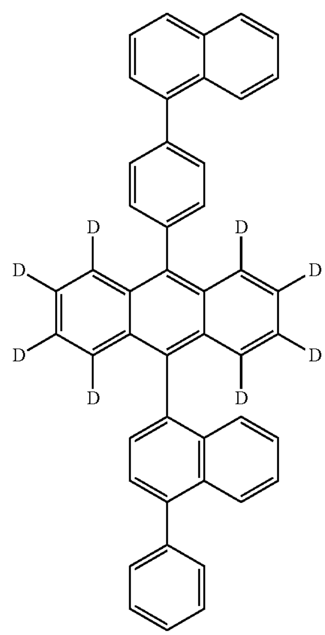

-continued
2-114
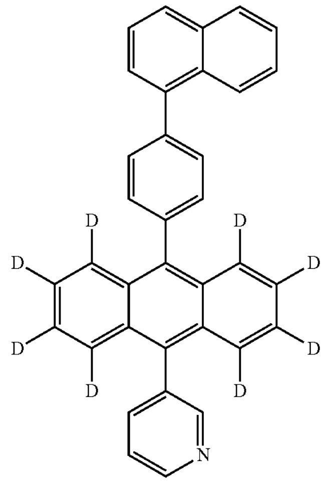
2-115
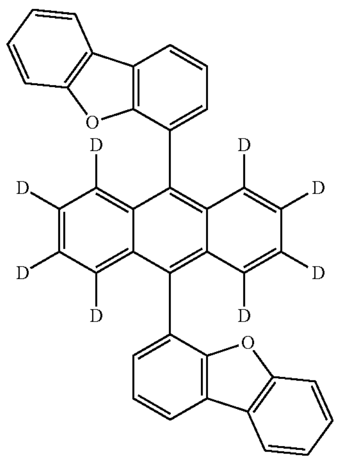
2-116
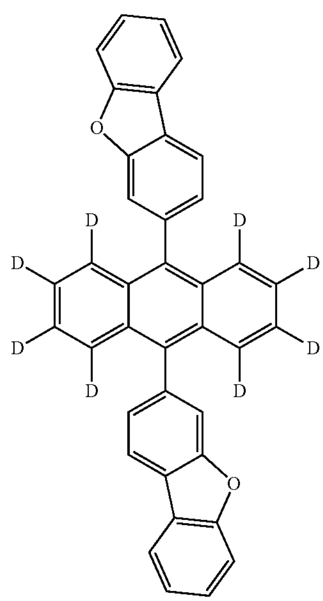
-continued
2-117
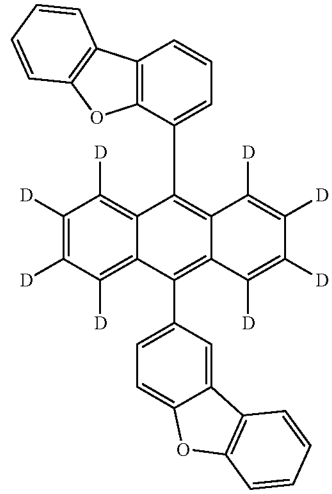
2-118
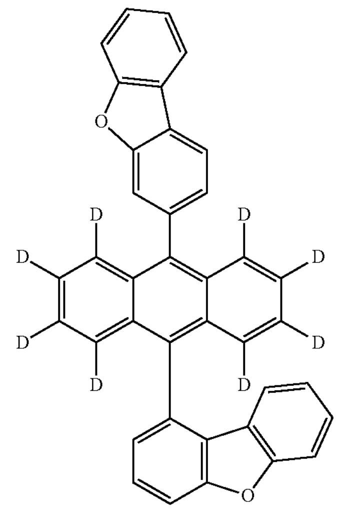
2-119
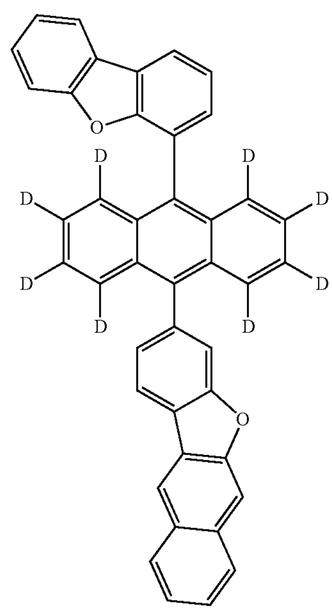

2-120
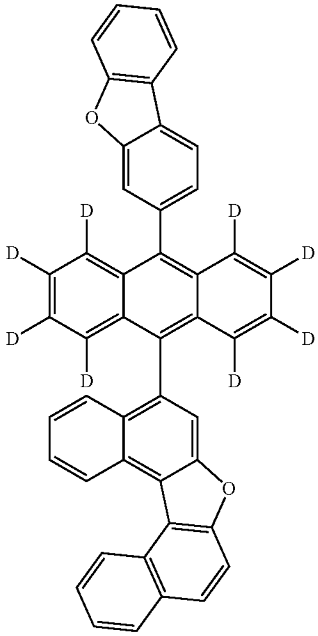
2-121
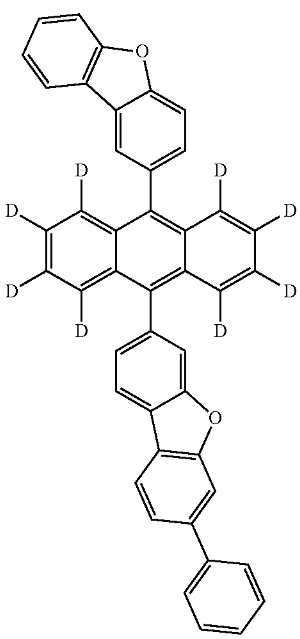
2-122
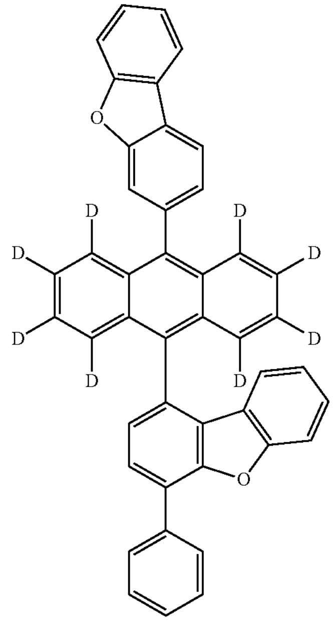
2-123
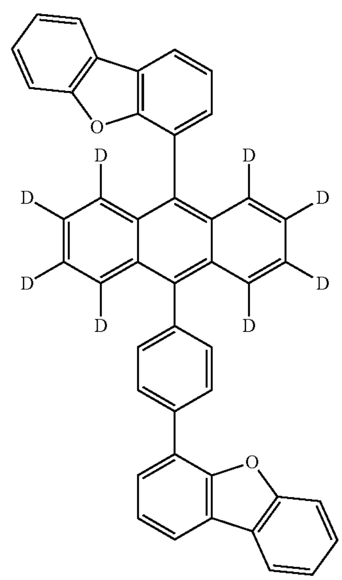

-continued
2-124
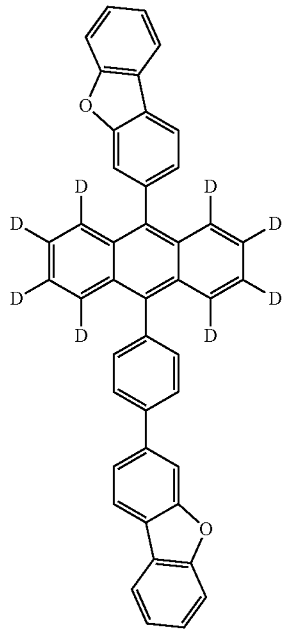
2-125
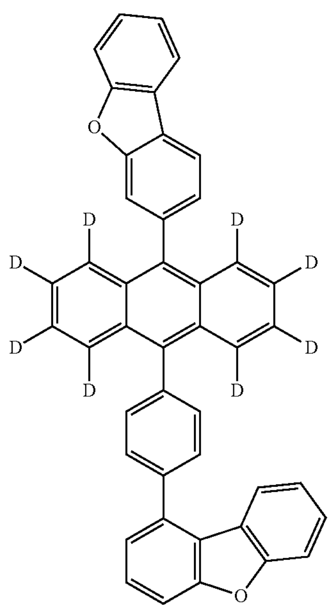
-continued
2-126
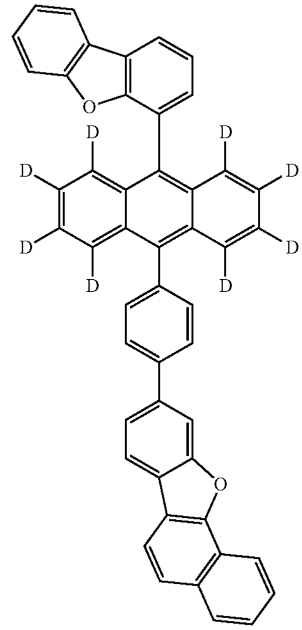
2-127
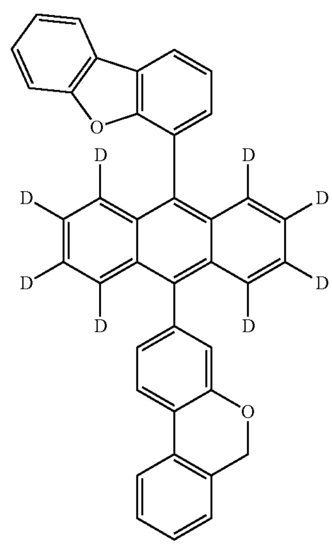

-continued
2-128
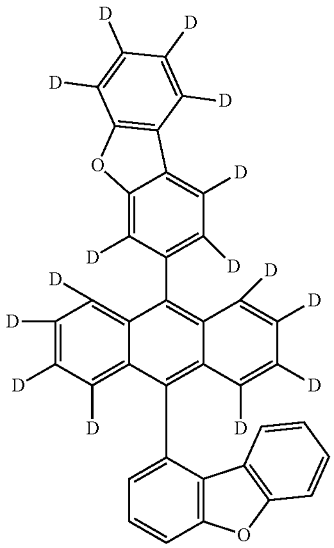
2-129
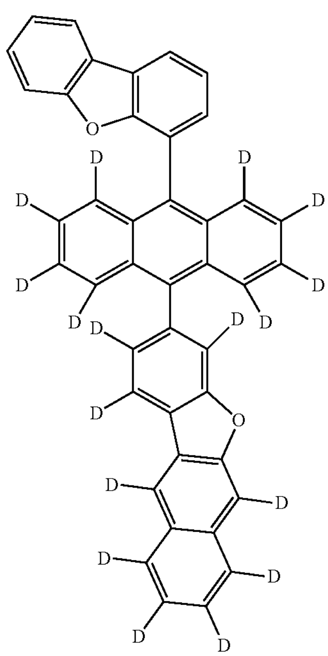
-continued
2-130
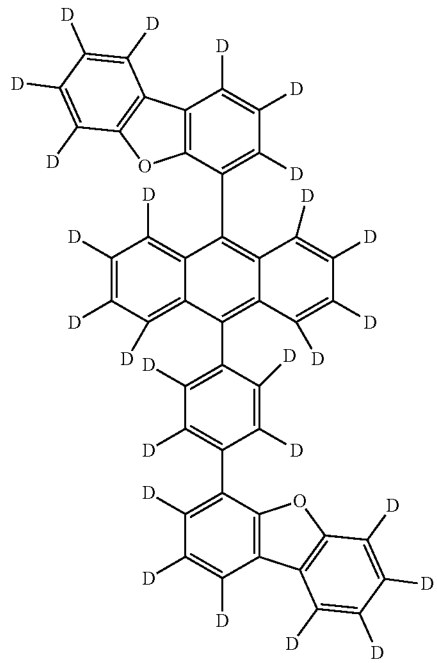
2-131
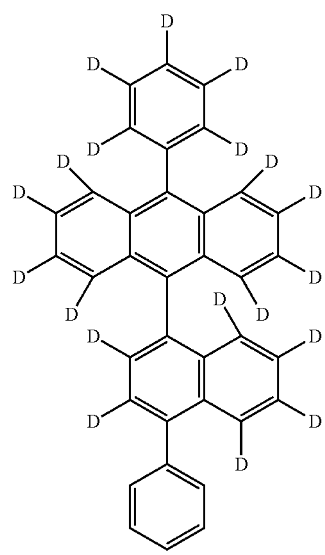

-continued
2-132
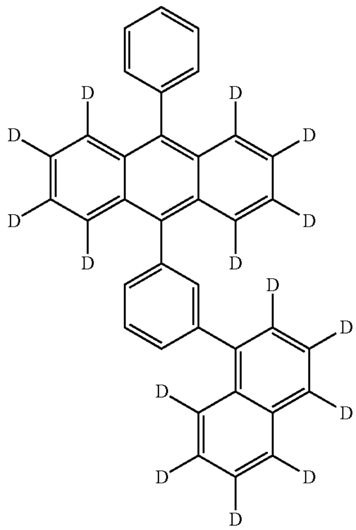
2-133
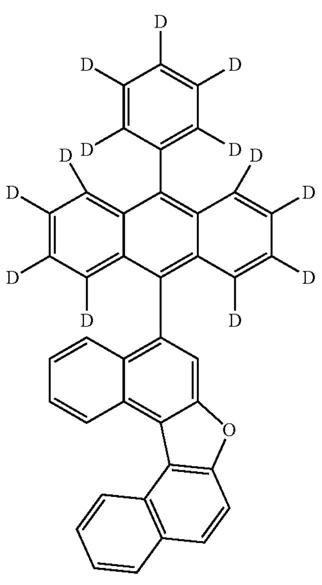
-continued
2-134
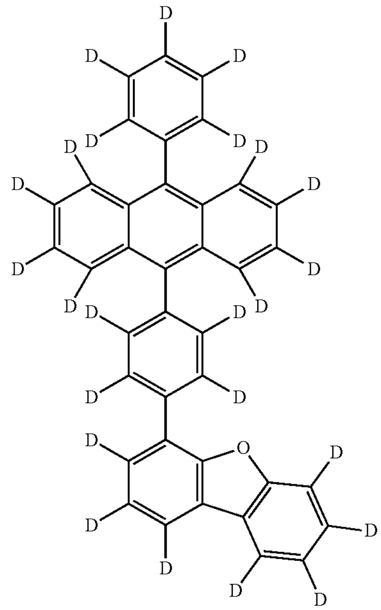
2-135
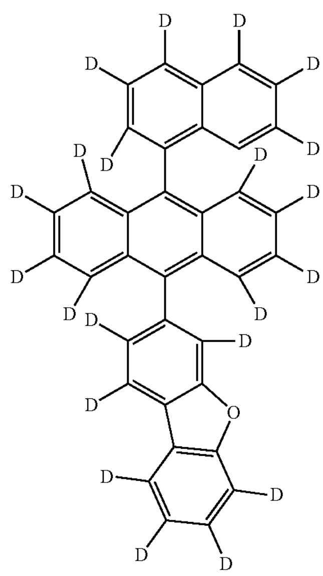

-continued
2-136
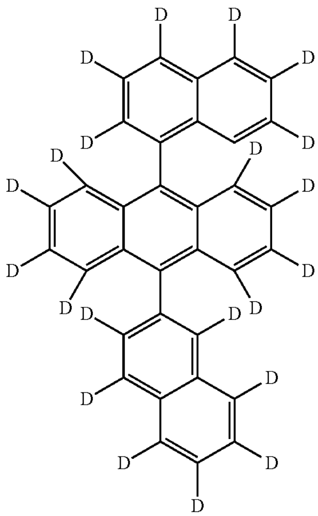
2-137
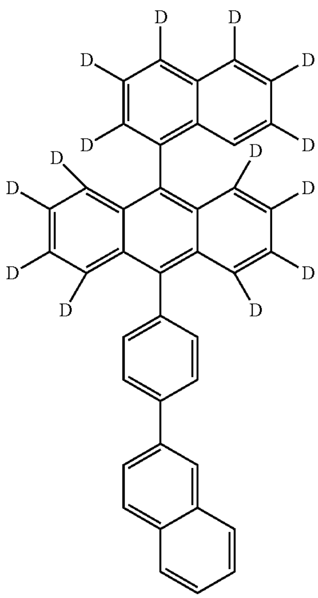
2-138
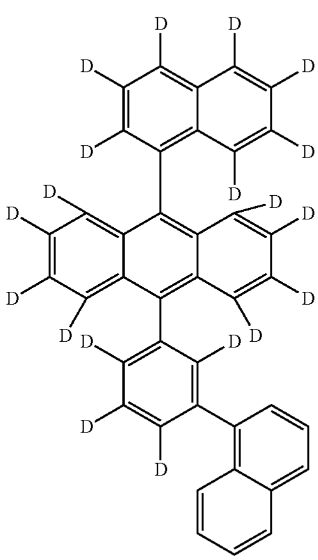
-continued
2-139
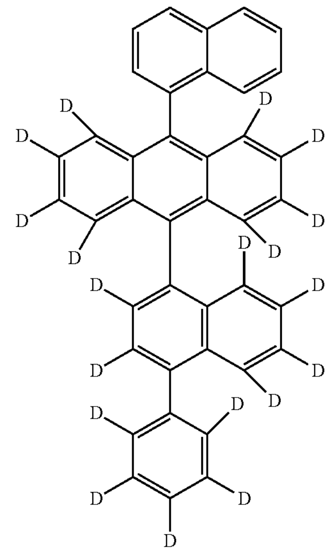
2-140
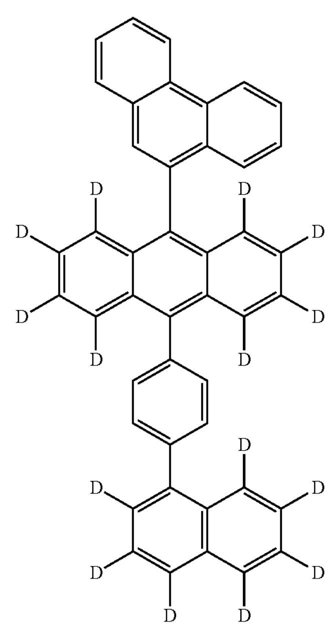

-continued
2-141
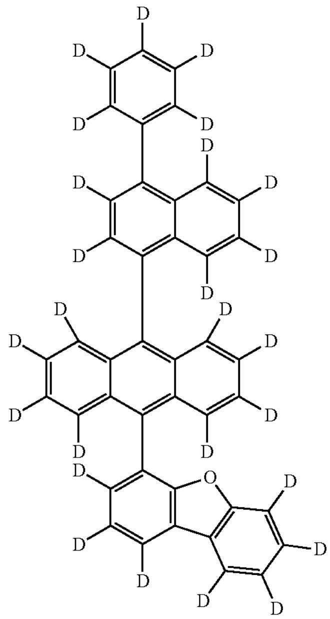
2-142
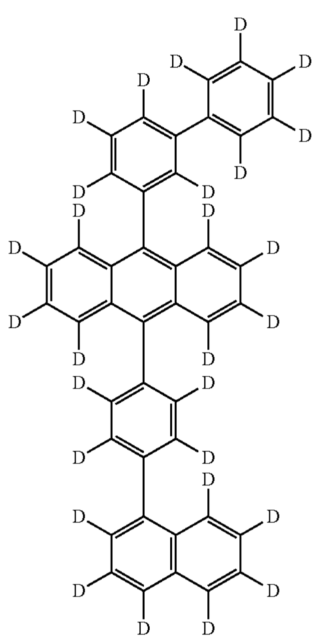
-continued
2-143
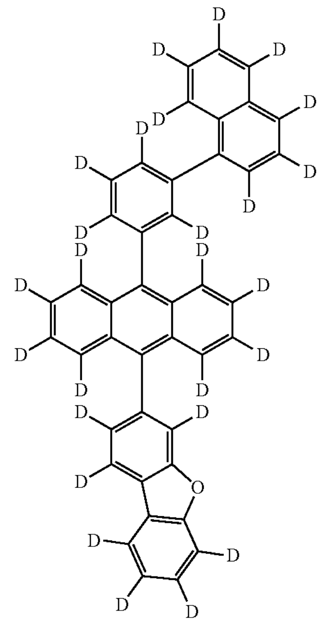
2-144
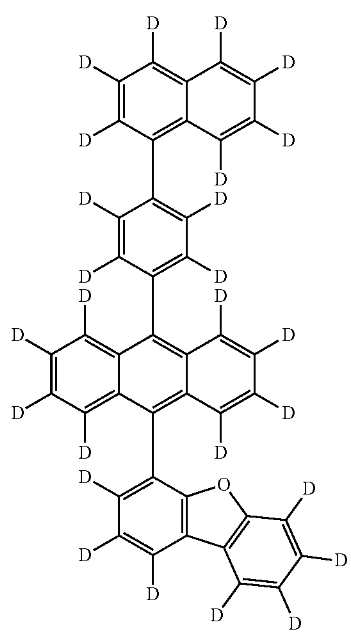

2-145
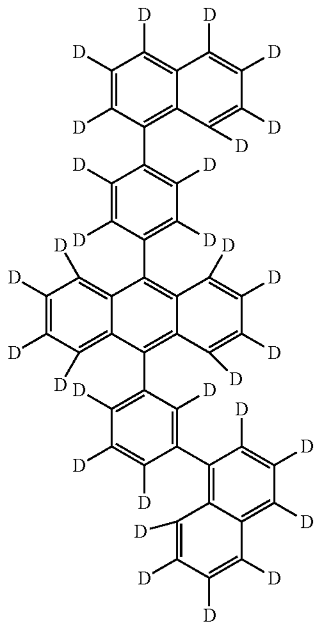
2-146
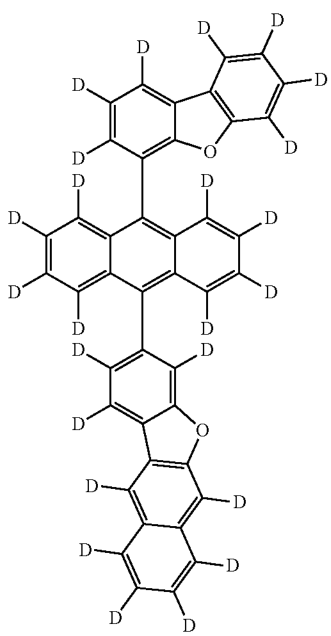
2-147
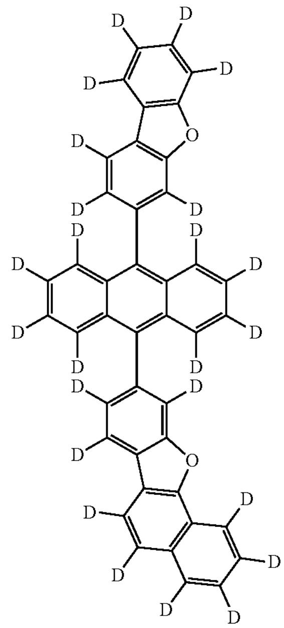
2-148
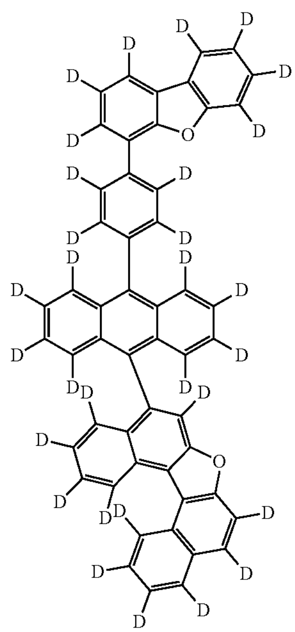

-continued
2-149
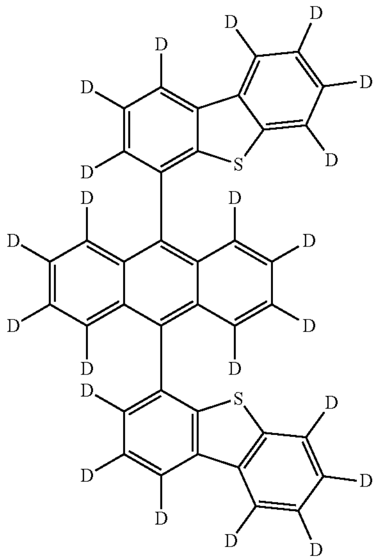
2-150
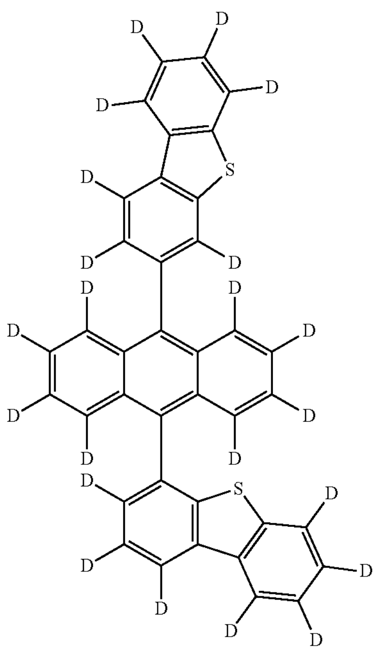
2-151
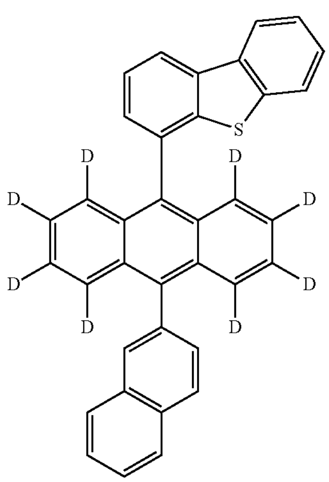
-continued
2-152
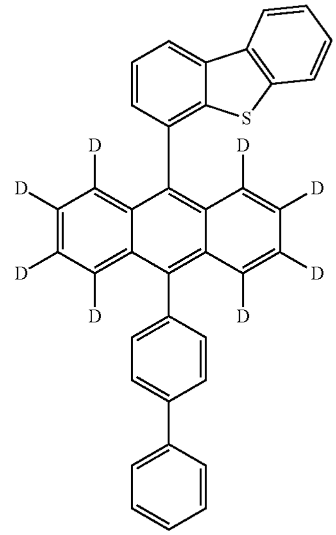
2-153
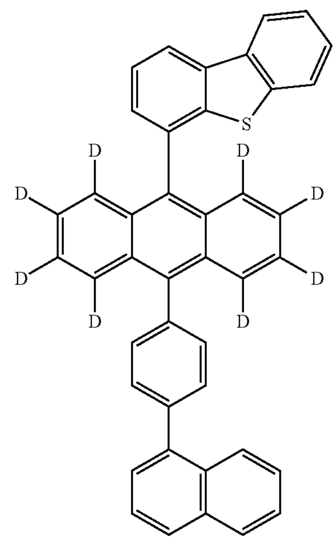
2-154
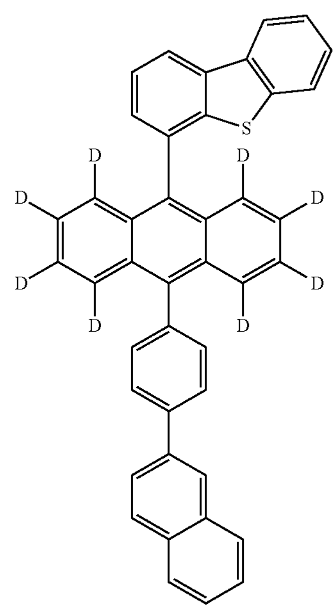

-continued
2-155
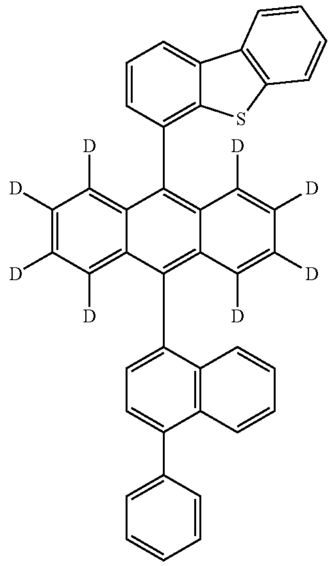
2-156
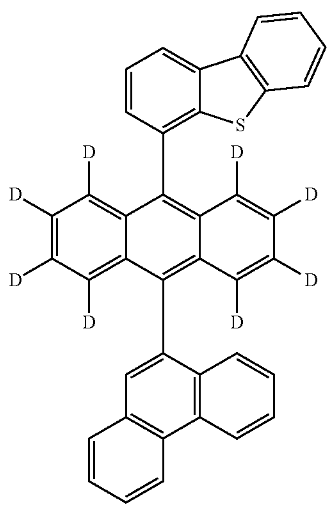
2-157
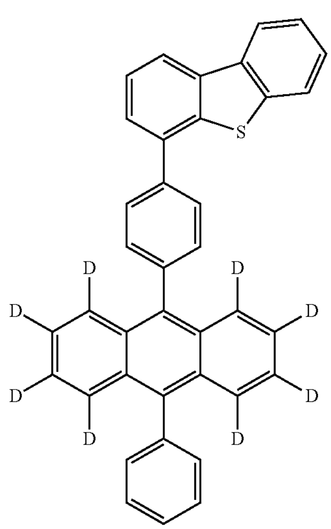
-continued
2-158
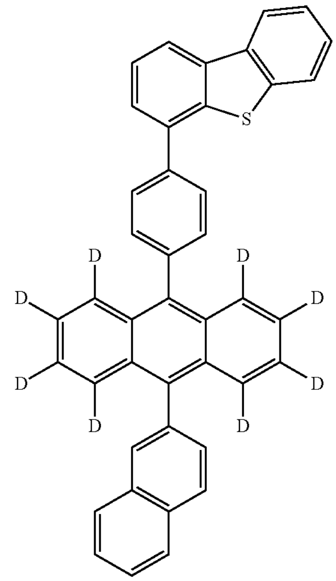
2-159
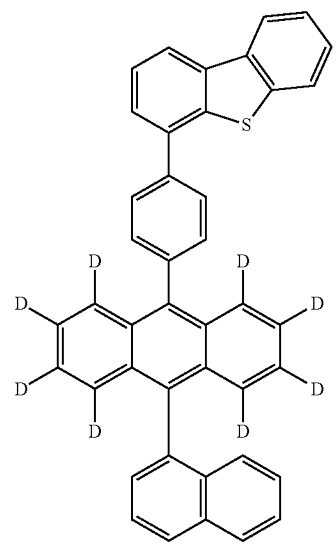
2-160
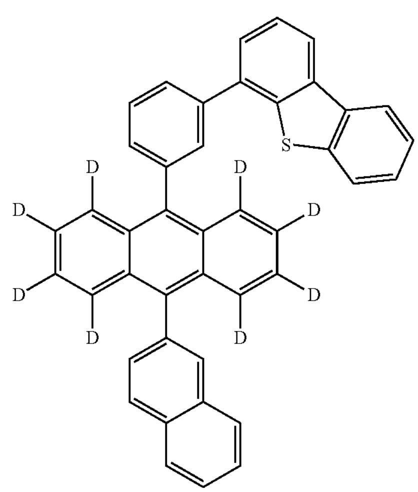

-continued
2-161
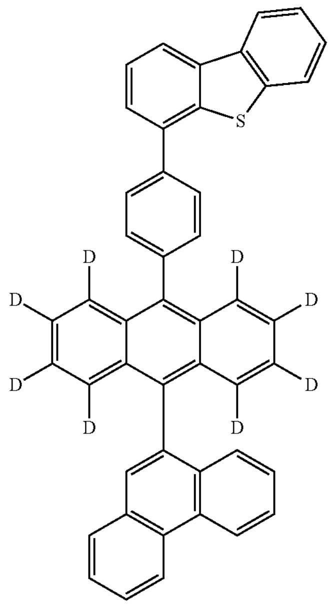
2-162
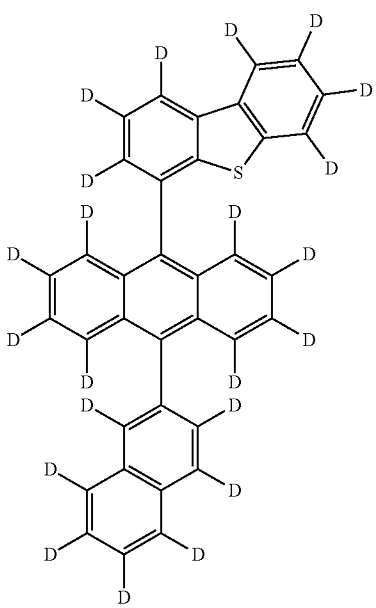
-continued
2-163
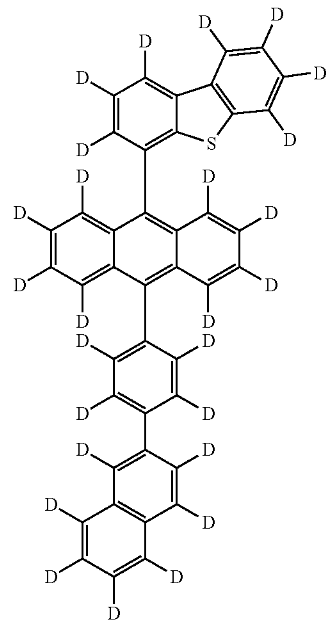
2-164
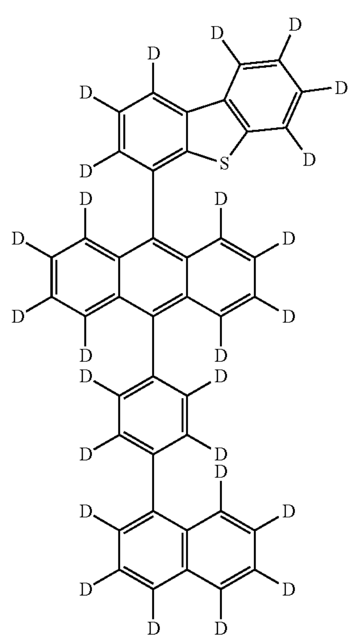

-continued
2-165
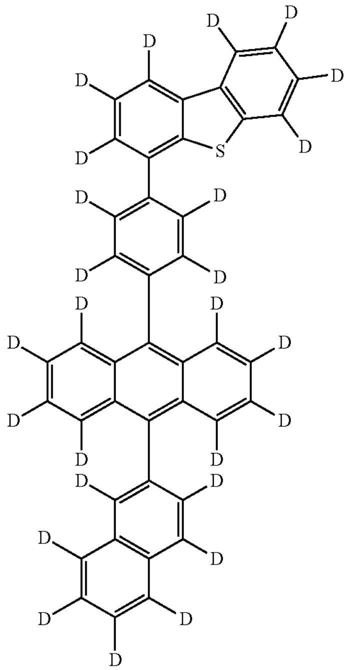
2-166
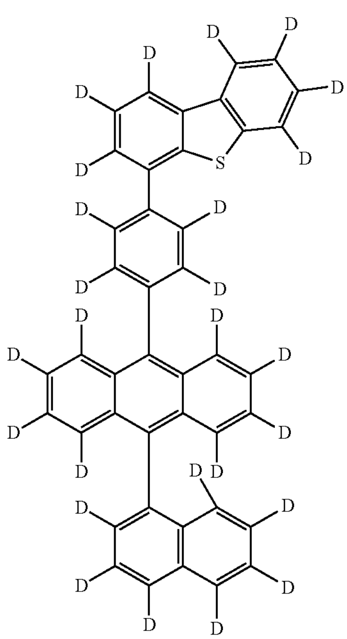
-continued
2-167
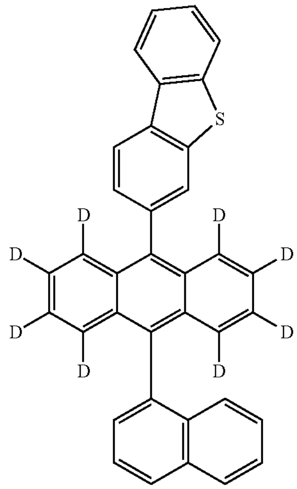
2-168
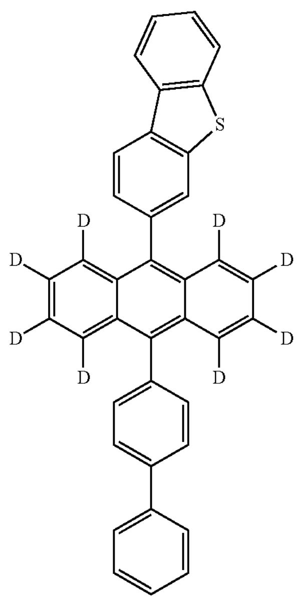

-continued
2-169
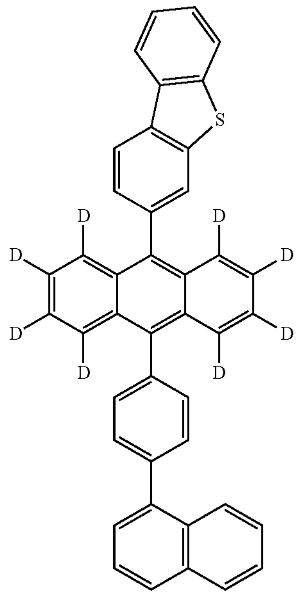
2-170
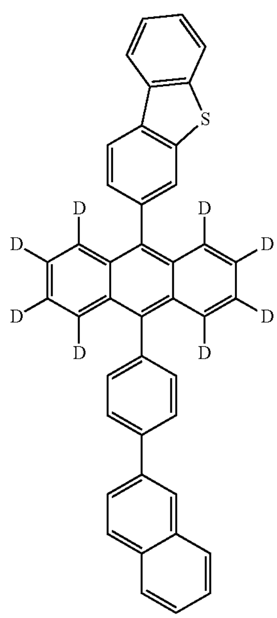
-continued
2-171
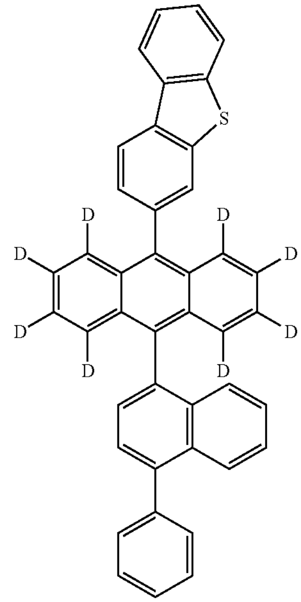
2-172
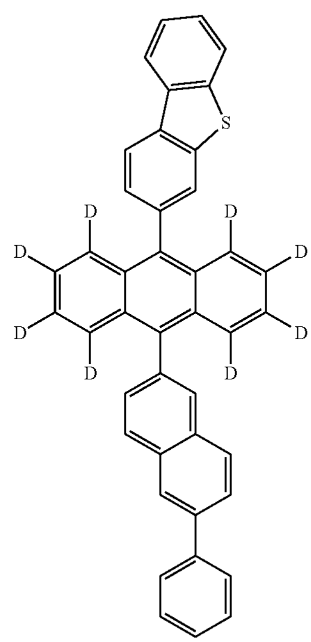

2-173
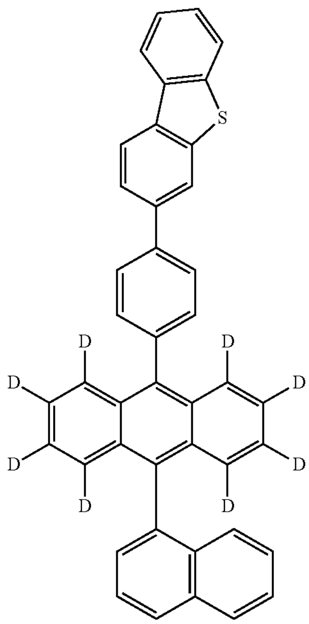
2-175
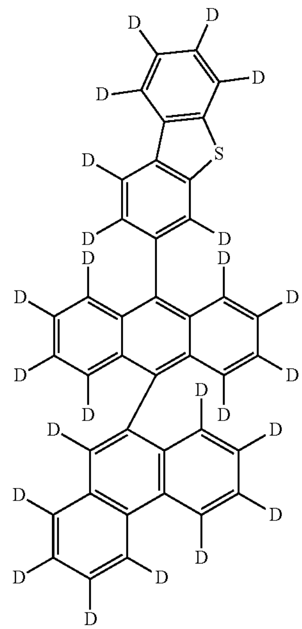
2-174
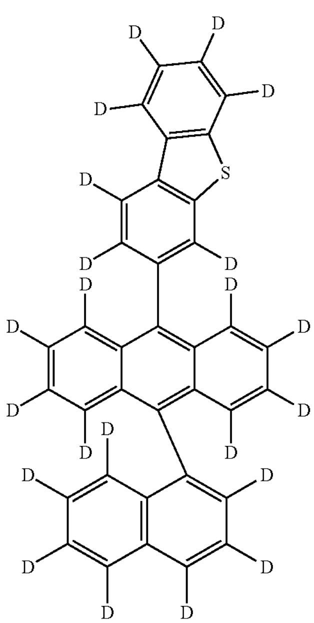
2-176
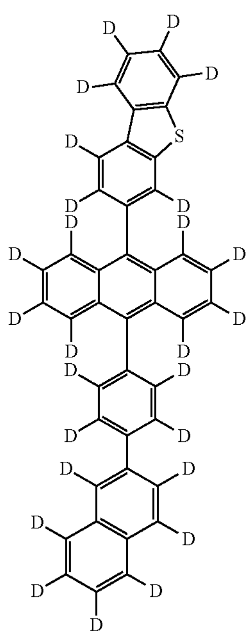

-continued
2-177
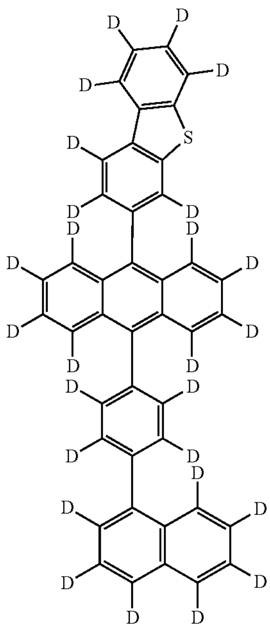
2-178
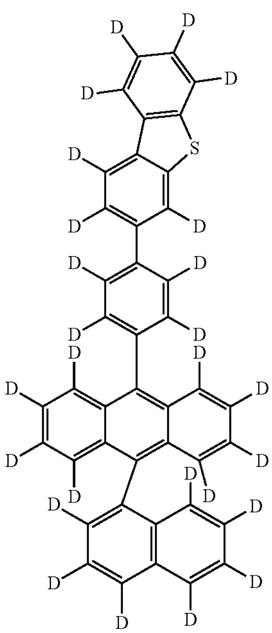
-continued
2-179
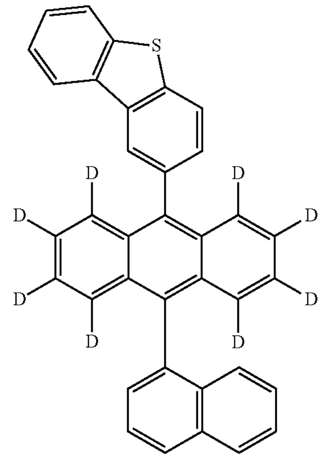
2-180
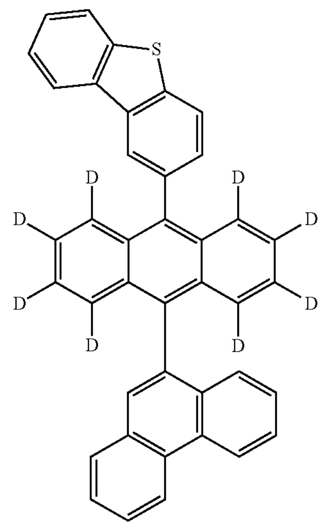
2-181
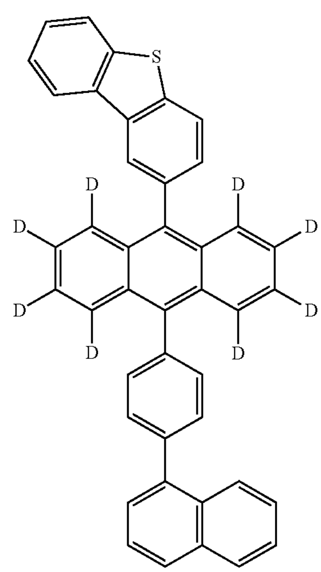

-continued
2-182
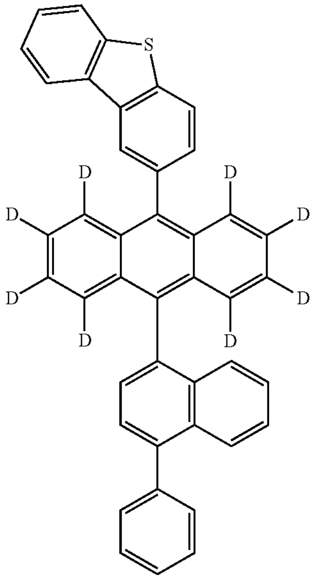
2-183
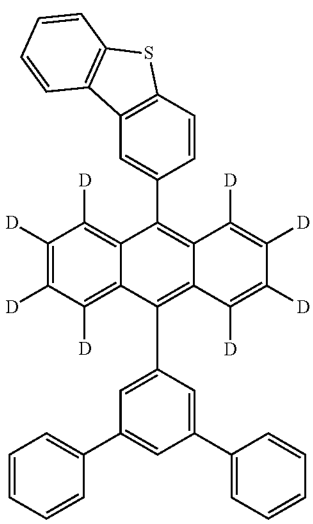
-continued
2-184
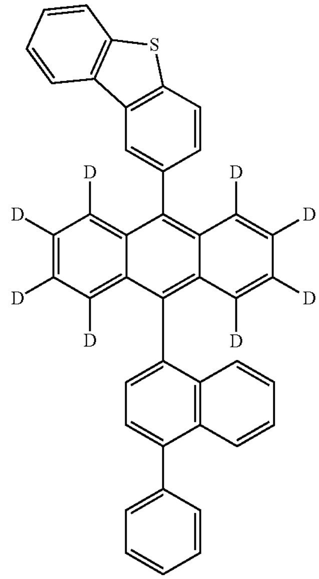
2-185
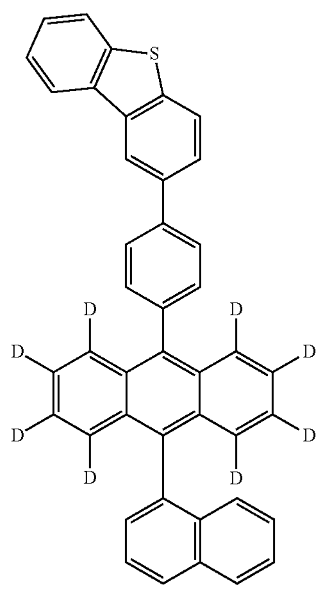

-continued
2-186
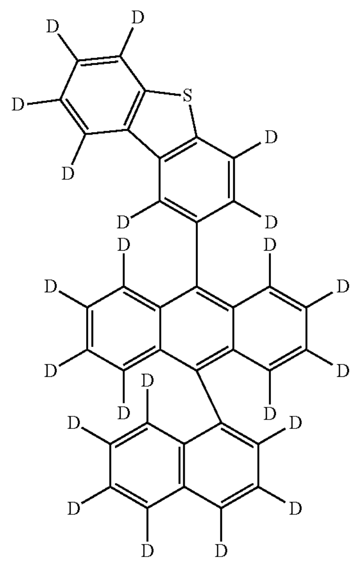
2-187
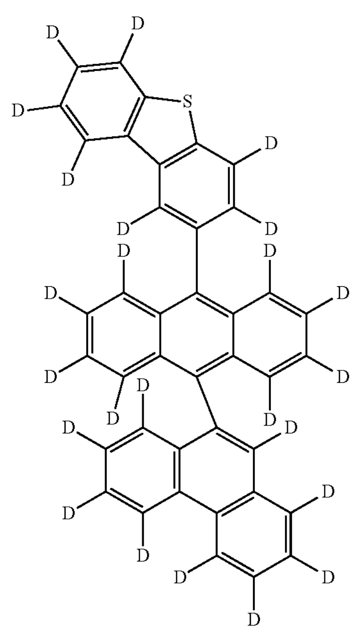
-continued
2-188
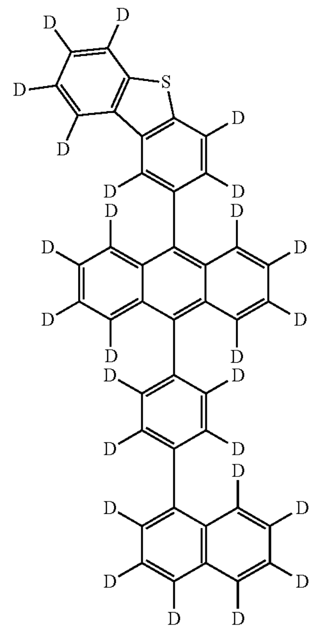
2-189
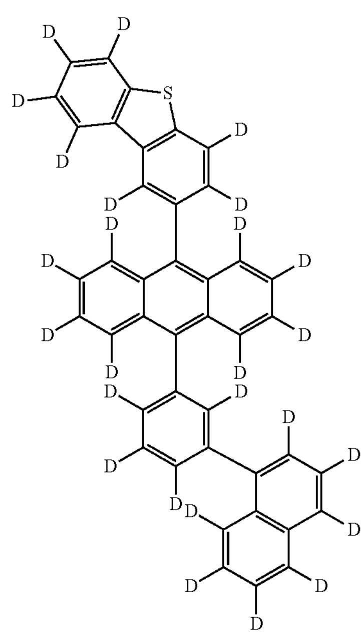

-continued
2-190
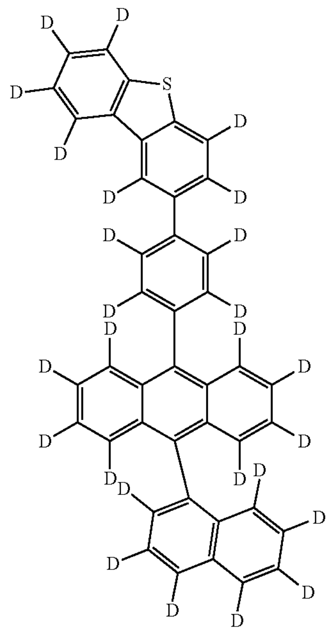
2-191
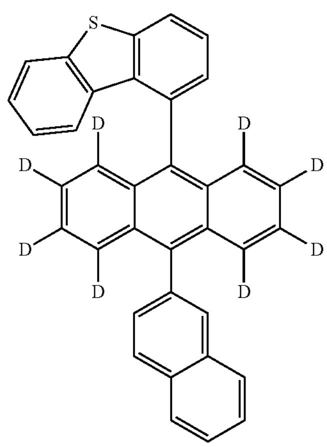
2-192
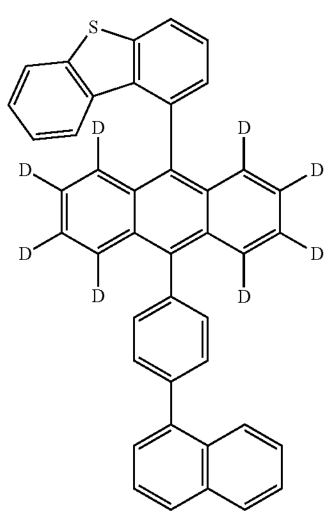
-continued
2-193
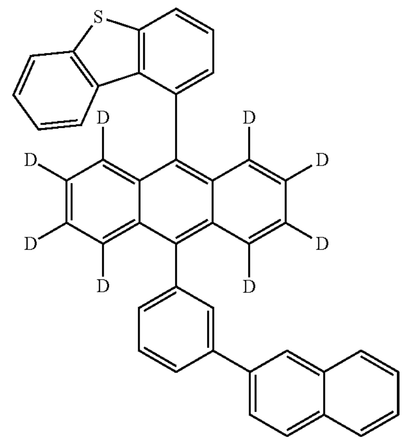
2-194
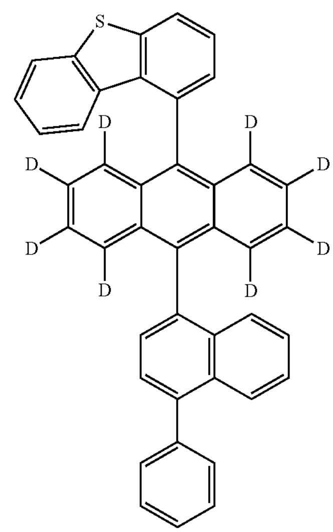
2-195
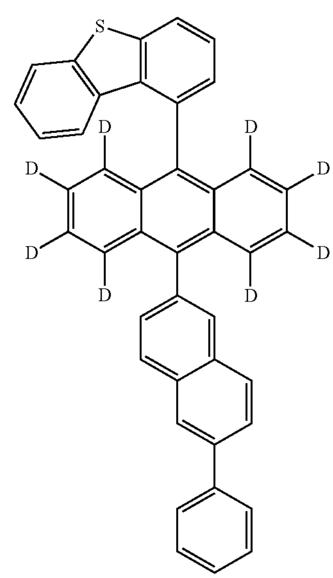

-continued
2-196
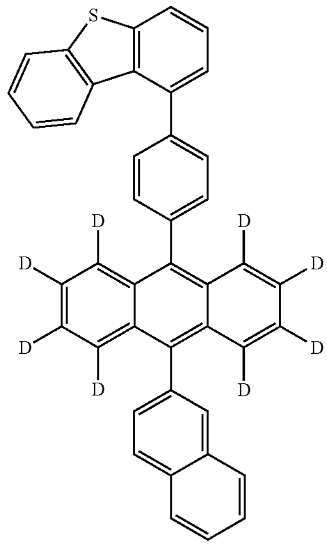
2-197
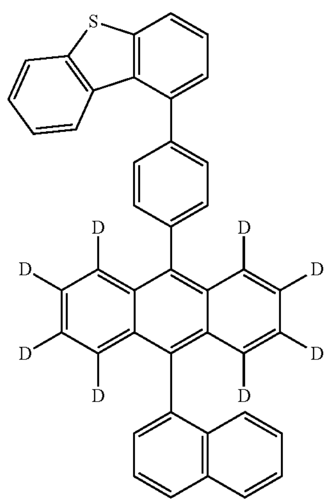
2-198
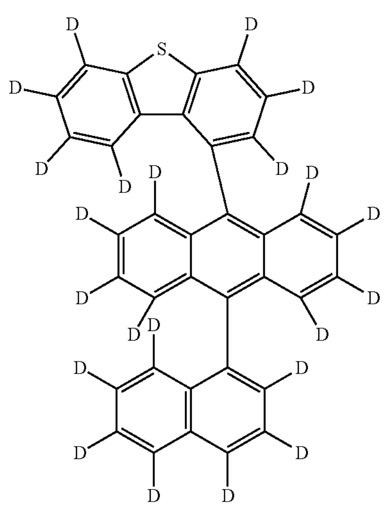
-continued
2-199
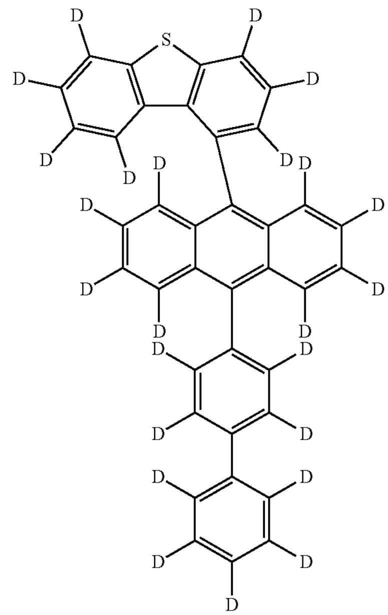
2-200
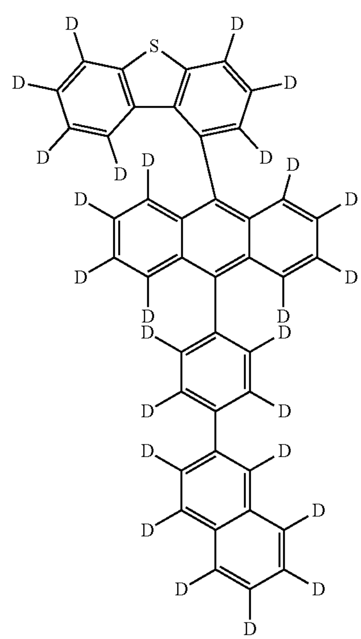

-continued
2-201
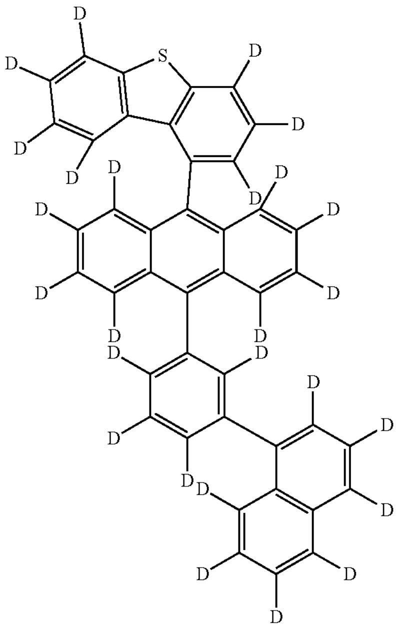
2-202
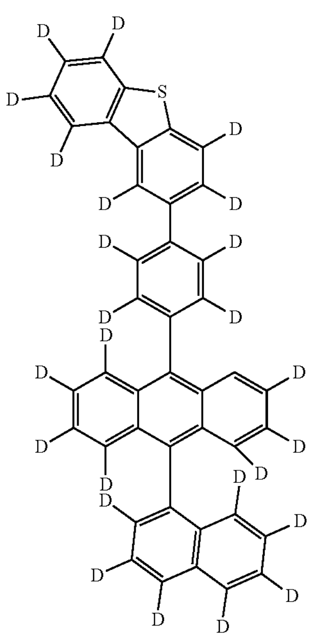
-continued
2-203
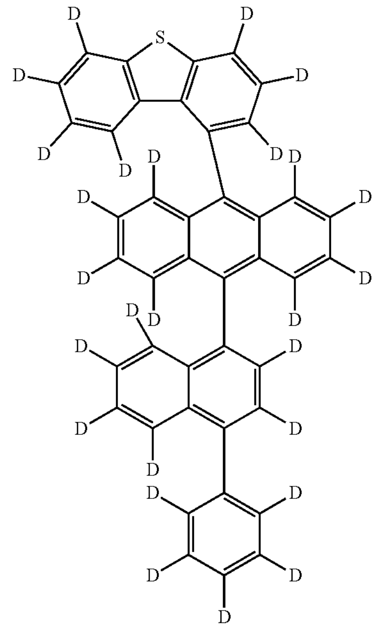
2-204
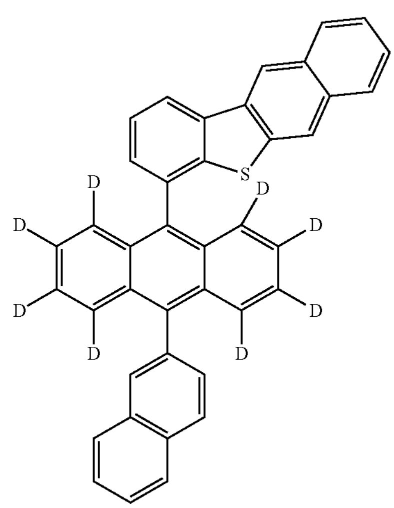

-continued
2-205
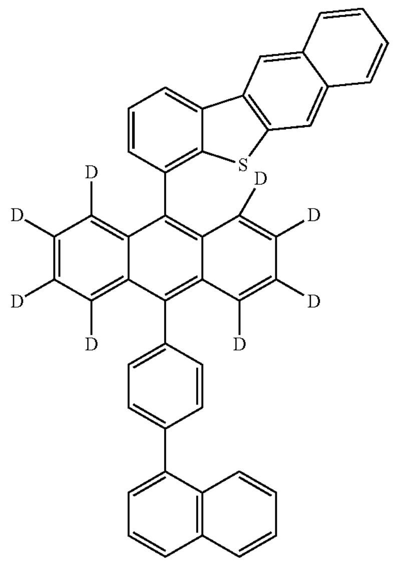
2-206
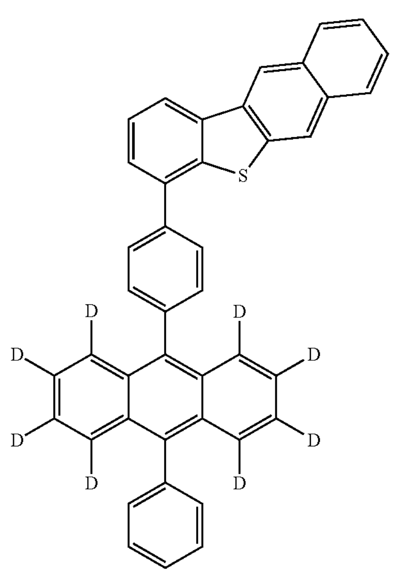
-continued
2-207
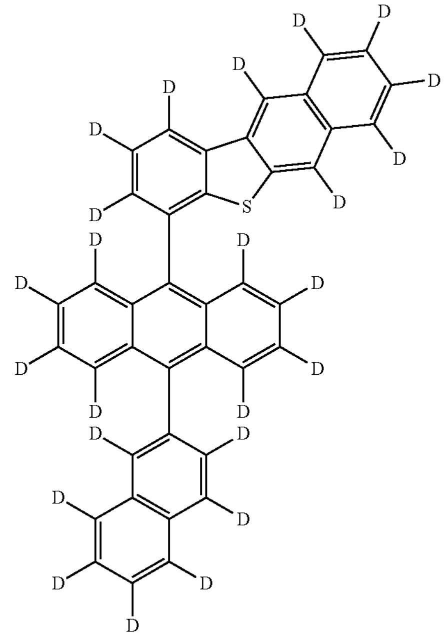
2-208
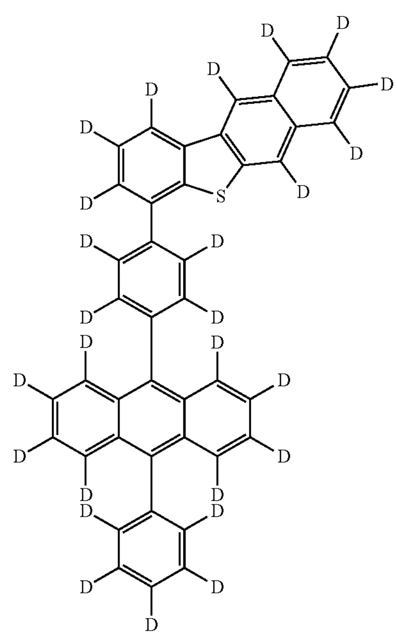

-continued
2-209
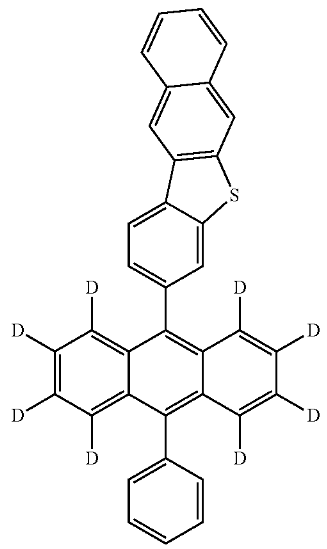
-continued
2-210
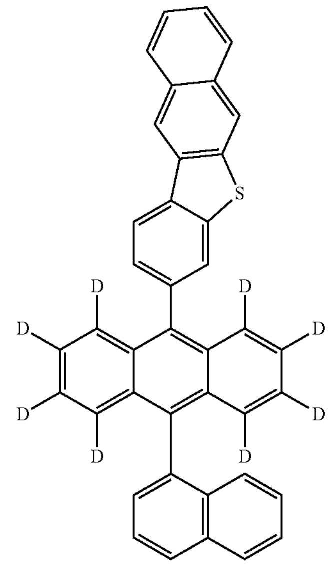
* * * * *